(12) United States Patent
Miller et al.

(10) Patent No.: US 11,824,454 B2
(45) Date of Patent: Nov. 21, 2023

(54) WAFER BIASING IN A PLASMA CHAMBER

(71) Applicant: Eagle Harbor Technologies, Inc., Seattle, WA (US)

(72) Inventors: Kenneth Miller, Seattle, WA (US); Timothy Ziemba, Bainbridge Island, WA (US); John Carscadden, Seattle, WA (US); Ilia Slobodov, Seattle, WA (US); James Prager, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

(21) Appl. No.: 17/366,000

(22) Filed: Jul. 1, 2021

(65) Prior Publication Data
US 2021/0408917 A1 Dec. 30, 2021

Related U.S. Application Data

(63) Continuation-in-part of application No. 17/213,230, filed on Mar. 26, 2021, now Pat. No. 11,689,107, and a continuation-in-part of application No. 17/033,660, filed on Sep. 25, 2020, now Pat. No. 11,303,269, and a continuation-in-part of application No. 16/941,532, (Continued)

(51) Int. Cl.
*H02M 3/335* (2006.01)
*H02M 7/5387* (2007.01)
*H02M 1/08* (2006.01)
*H03H 7/01* (2006.01)
*H05G 1/20* (2006.01)
*H03K 3/57* (2006.01)

(52) U.S. Cl.
CPC ........ *H02M 3/33523* (2013.01); *H02M 1/08* (2013.01); *H02M 7/5387* (2013.01); *H03H 7/01* (2013.01); *H05G 1/20* (2013.01); *H03K 3/57* (2013.01)

(58) Field of Classification Search
CPC .. H02M 3/33523; H02M 1/08; H02M 7/5387; H02M 1/0045; H02M 1/0054; H02M 3/01; H02M 3/33507; H02M 3/33573; H03H 7/01; H05G 1/20; H03K 3/57; H03K 5/13; H01J 37/32706; H01J 37/32146
See application file for complete search history.

(56) References Cited

U.S. PATENT DOCUMENTS 2,710,933 A * 6/1955 Dion .................... G05D 3/1472
                                                         318/489
5,654,679 A * 8/1997 Mavretic .................. H03H 7/40
                                                         333/32

(Continued)

*Primary Examiner* — Srinivas Sathiraju

(57) ABSTRACT

Some embodiments include methods and systems for wafer biasing in a plasma chamber. A method, for example, may include: generating a first high voltage by a first pulsed voltage source using DC voltages and coupling the first high voltage to a wafer in the plasma chamber via at least one direct connection, the at least one direct connection enabling ion energy control in the plasma chamber; generating one or more of low and medium voltages by a second pulsed voltage source; coupling, capacitively, the one or more of low and medium voltages to the wafer; and pulsing the first high voltage and the one or more of low and medium voltages to achieve a configurable ion energy distribution in the wafer.

14 Claims, 104 Drawing Sheets

Related U.S. Application Data filed on Jul. 29, 2020, now Pat. No. 11,387,076, and a continuation-in-part of application No. 16/937,948, filed on Jul. 24, 2020, now Pat. No. 11,430,635, which is a continuation-in-part of application No. 16/779,270, filed on Jan. 31, 2020, now Pat. No. 10,903,047, said application No. 16/941,532 is a continuation of application No. 16/722,085, filed on Dec. 20, 2019, now Pat. No. 10,777,388, application No. 17/366,000 is a continuation-in-part of application No. 16/721,396, filed on Dec. 19, 2019, now Pat. No. 11,075,058, said application No. 16/779,270 is a continuation of application No. 16/697,173, filed on Nov. 26, 2019, now Pat. No. 11,004,660, said application No. 17/213,230 is a continuation of application No. 16/555,948, filed on Aug. 29, 2019, now Pat. No. 10,978,955, application No. 17/366,000 is a continuation-in-part of application No. 16/537,513, filed on Aug. 9, 2019, now Pat. No. 11,227,745, said application No. 16/697,173 is a continuation of application No. 16/525,357, filed on Jul. 29, 2019, now Pat. No. 10,659,019, said application No. 16/721,396 is a continuation of application No. 16/524,967, filed on Jul. 29, 2019, now Pat. No. 10,811,230, said application No. 16/525,357 is a continuation-in-part of application No. 16/523,840, filed on Jul. 26, 2019, now Pat. No. 10,892,140, said application No. 16/524,967 is a continuation-in-part of application No. 16/523,840, filed on Jul. 26, 2019, now Pat. No. 10,892,140, said application No. 16/555,948 is a continuation-in-part of application No. 16/523,840, filed on Jul. 26, 2019, now Pat. No. 10,892,140, said application No. 16/722,085 is a continuation of application No. 16/114,195, filed on Aug. 27, 2018, now Pat. No. 10,304,661, said application No. 17/033,660 is a continuation of application No. 15/628,584, filed on Jun. 20, 2017, now Pat. No. 10,804,886.

(60) Provisional application No. 62/869,999, filed on Jul. 2, 2019, provisional application No. 62/799,738, filed on Jan. 31, 2019, provisional application No. 62/789,526, filed on Jan. 8, 2019, provisional application No. 62/789,523, filed on Jan. 8, 2019, provisional application No. 62/774,078, filed on Nov. 30, 2018, provisional application No. 62/717,523, filed on Aug. 10, 2018, provisional application No. 62/711,468, filed on Jul. 27, 2018, provisional application No. 62/711,457, filed on Jul. 27, 2018, provisional application No. 62/711,464, filed on Jul. 27, 2018, provisional application No. 62/711,347, filed on Jul. 27, 2018, provisional application No. 62/711,334, filed on Jul. 27, 2018, provisional application No. 62/711,406, filed on Jul. 27, 2018, provisional application No. 62/711,467, filed on Jul. 27, 2018, provisional application No. 62/553,187, filed on Sep. 1, 2017, provisional application No. 62/550,251, filed on Aug. 25, 2017, provisional application No. 62/352,830, filed on Jun. 21, 2016.

(56) References Cited

U.S. PATENT DOCUMENTS

| | | | | |
|---|---|---|---|---|
| 5,936,481 | A * | 8/1999 | Fujii | H03H 7/40 333/32 |
| 6,086,730 | A * | 7/2000 | Liu | C23C 14/34 204/192.15 |
| 6,942,813 | B2 * | 9/2005 | Ying | B82Y 10/00 134/1.1 |
| 8,500,963 | B2 * | 8/2013 | Ye | C23C 14/0623 204/192.15 |
| 2004/0173570 | A1 * | 9/2004 | Ying | H10N 50/01 257/E21.311 |
| 2004/0253486 | A1 * | 12/2004 | Chen | G11B 5/7369 |
| 2008/0099039 | A1 * | 5/2008 | Krassnitzer | H01J 37/32623 134/1.1 |
| 2008/0099326 | A1 * | 5/2008 | Ye | C23C 14/541 204/192.15 |
| 2009/0211898 | A1 * | 8/2009 | Chen | G11B 5/851 204/192.15 |
| 2010/0252729 | A1 * | 10/2010 | Jolliffe | H01J 49/025 250/281 |
| 2011/0177694 | A1 * | 7/2011 | Chen | H01J 37/321 156/345.24 |
| 2011/0248633 | A1 * | 10/2011 | Nauman | H01J 37/3429 315/246 |
| 2012/0129301 | A1 * | 5/2012 | Or-Bach | H01L 27/11898 438/129 |
| 2015/0288335 | A1 * | 10/2015 | Høyerby | H03F 1/0205 330/251 |
| 2015/0318846 | A1 * | 11/2015 | Prager | H03K 17/56 327/304 |
| 2016/0327029 | A1 * | 11/2016 | Ziemba | F03H 1/0087 |
| 2017/0366173 | A1 * | 12/2017 | Miller | H03K 3/57 |
| 2018/0226896 | A1 * | 8/2018 | Miller | H01J 37/32146 |
| 2018/0286636 | A1 * | 10/2018 | Ziemba | H01J 37/241 |
| 2018/0331655 | A1 * | 11/2018 | Prager | H03B 9/143 |
| 2019/0131110 | A1 * | 5/2019 | Ziemba | H01J 37/32128 |
| 2019/0157044 | A1 * | 5/2019 | Ziemba | H01J 37/32091 |
| 2019/0277804 | A1 * | 9/2019 | Prager | G01N 27/906 |
| 2019/0348258 | A1 * | 11/2019 | Koh | H01L 21/67069 |
| 2020/0051786 | A1 * | 2/2020 | Ziemba | H03K 17/08148 |
| 2021/0013874 | A1 * | 1/2021 | Miller | H02M 3/1588 |
| 2021/0091759 | A1 * | 3/2021 | Prager | H03H 11/02 |
| 2021/0152163 | A1 * | 5/2021 | Miller | H01J 37/3467 |
| 2021/0399721 | A1 * | 12/2021 | Prager | H03K 5/12 |
| 2021/0408917 | A1 * | 12/2021 | Miller | H02M 3/33573 |

* cited by examiner

US 11,824,454 B2

WAFER BIASING IN A PLASMA CHAMBER

BACKGROUND

The application of RF-excited gaseous discharges in thin film fabrication technology has become standard. The simplest geometry most commonly used is that of two planar electrodes between which a voltage is applied. A schematic representation of such a planar RF plasma reactor is shown in FIG. 55. The plasma is separated from each electrode by a plasma sheath.

Positive ions produced in the plasma volume are accelerated across the plasma sheaths and arrive at the electrodes with an Ion Energy Distribution Function (IEDF) which is determined by the magnitude and the waveform of the time dependent potential difference across the sheaths, the gas pressure, the physical geometry of the reactor, and/or other factors. This ion bombardment energy distribution may determine the degree of anisotropy in thin-film etching amount of ion impact induced damage to surfaces, etc.

SUMMARY

A pulse generator is disclosed that includes one or more of the following stages a driver stage, a transformer stage, a rectifier stage, and an output stage. The driver stage may include at least one of one or more solid state switches such as, for example, an insulated gate bipolar transistor (IGBT) or a metal-oxide-semiconductor field-effect transistor (MOSFET). The driver stage may also have a stray inductance less than 1,000 nH. The transformer stage may be coupled with the driver stage such as, for example, through a balance stage and may include one or more transformers. The rectifier stage may be coupled with the transformer stage and may have a stray inductance less than 1,000 nH. The output stage may be coupled with the rectifier stage. The output stage may output a signal pulse with a voltage greater than 2 kilovolts and a frequency greater than 5 kHz. In some embodiments, the output stage may be galvanically isolated from a reference potential.

A method is also disclosed that includes the following: generating a first input waveform having a first input frequency, a first input voltage, and a first input duration; outputting a first output pulse having a rise time less than 1,000 nanoseconds, a first output voltage greater than the first input voltage, and a pulse width substantially equal to the first input duration; turning off the first input waveform for a second input duration; generating a second input waveform having a second input frequency, a second input voltage, and a second input duration, wherein the second input duration is different than the first input duration; and outputting a second output pulse having a rise time less than 1,000 nanoseconds, a second output voltage greater than the second input voltage, and a pulse width substantially equal to the second input duration.

BRIEF DESCRIPTION OF THE FIGURES

These and other features, aspects, and advantages of the present disclosure are better understood when the following Detailed Description is read with reference to the accompanying drawings.

FIG. 520B illustrates a load voltage resulting from the square pulse, switch voltage shown in FIG. 20A during a second calibration step.

FIG. 84 is a circuit diagram of an RF plasma generator according to some embodiments.

FIG. 85 is a circuit diagram of an RF plasma generator according to some embodiments.

FIGS. 86A, 86B, 87A, and 87B are circuit diagrams of example resonant circuits.

Figure 88:
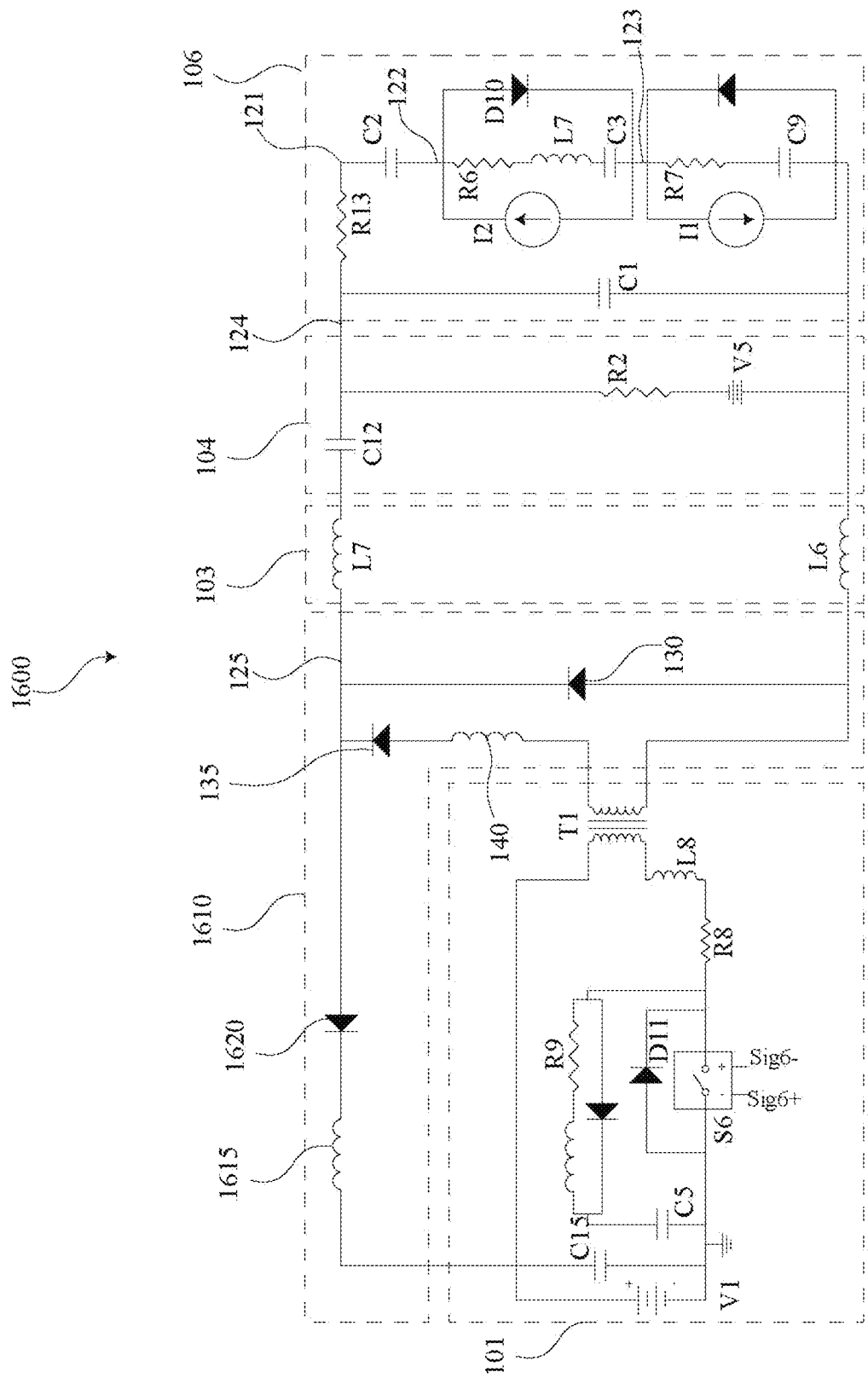

FIG. 88 is a circuit diagram of a bias generator with an energy recovery circuit according to some embodiments.

Figure 89:
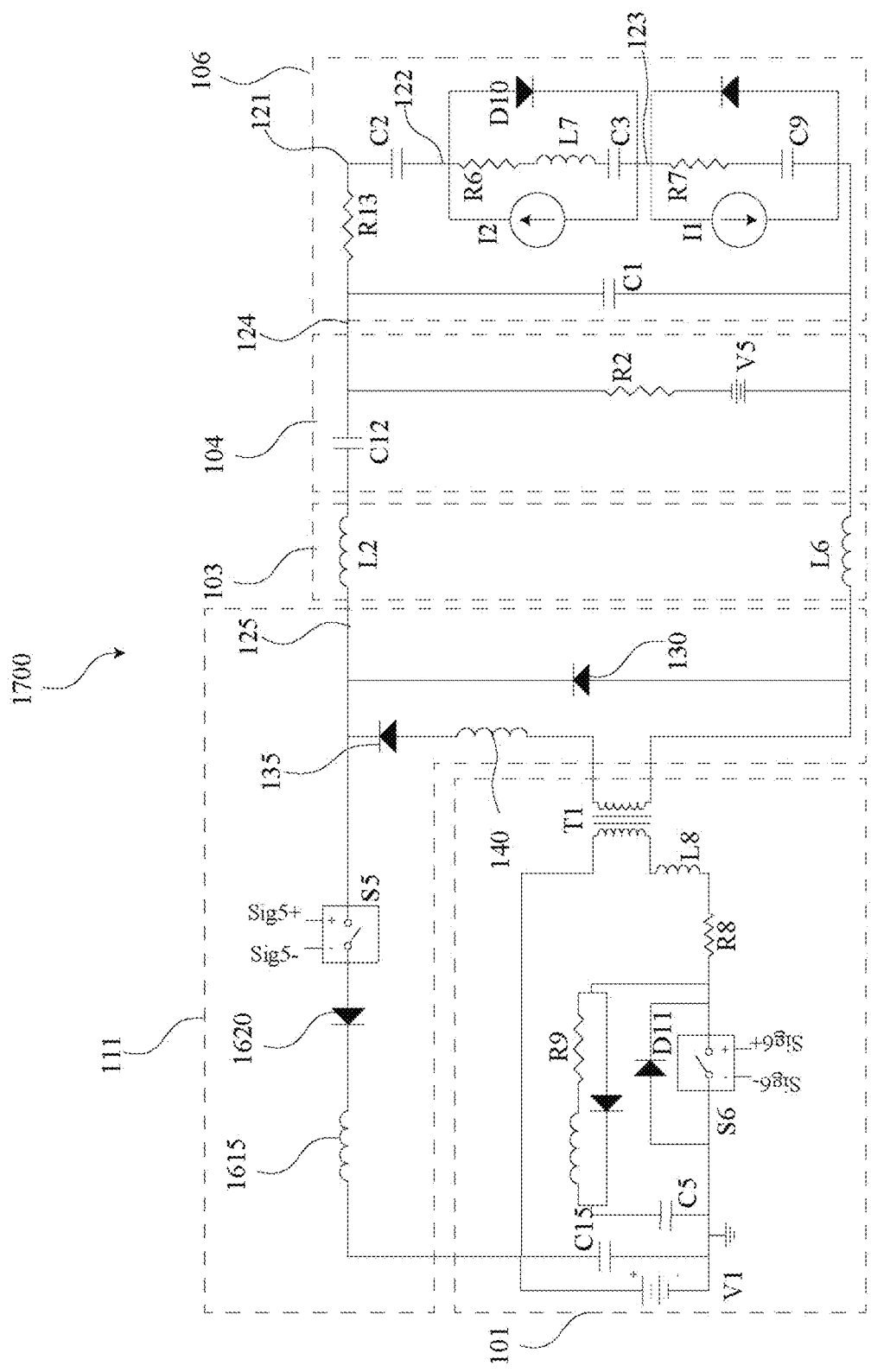

FIG. 89 is a circuit diagram of a bias generator with an active energy recovery circuit according to some embodiments.

Figure 90:
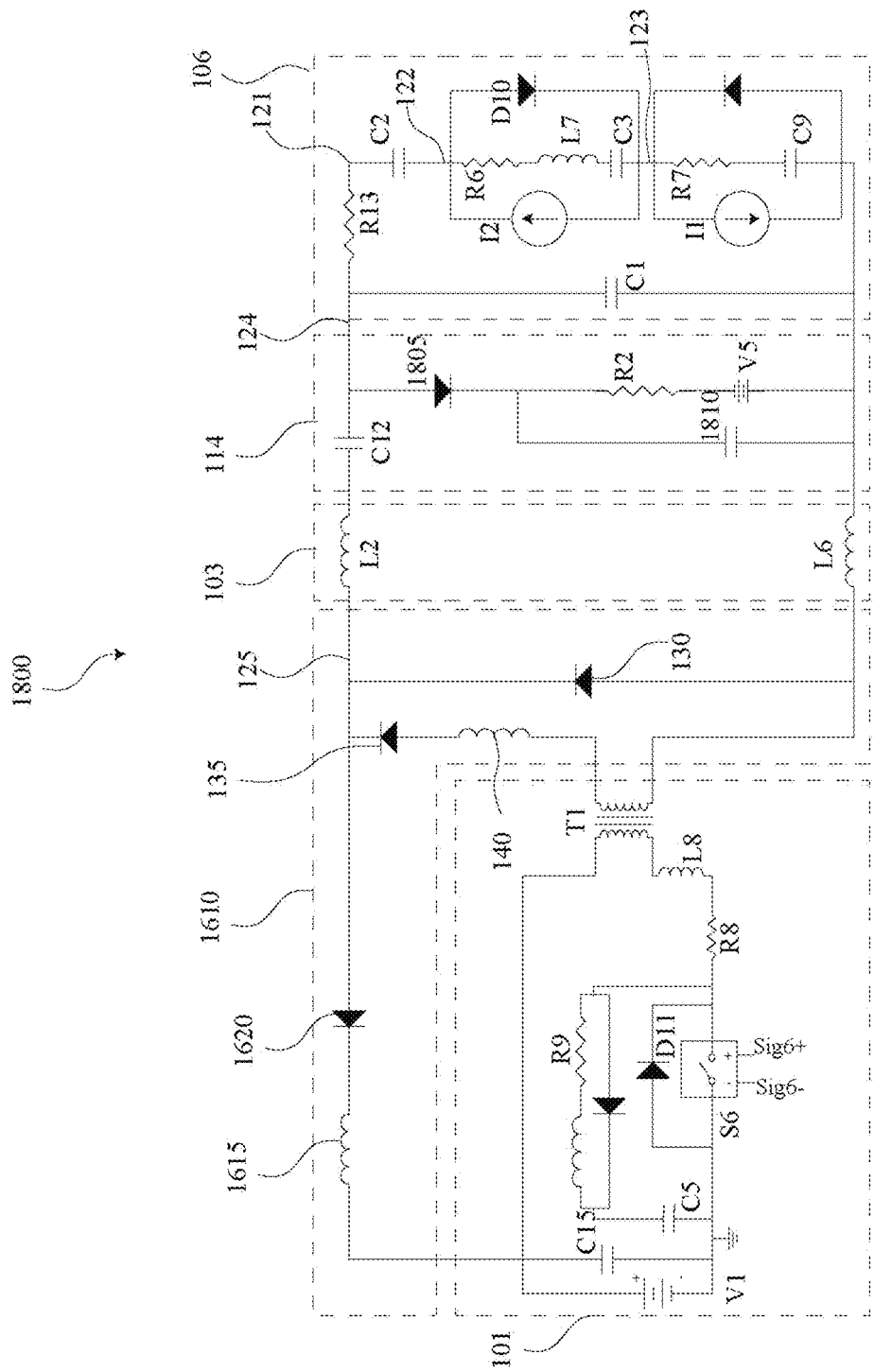

FIG. 90 is a circuit diagram of a bias generator that includes a passive bias compensation circuit an energy recovery circuit according to some embodiments.

Figure 91:
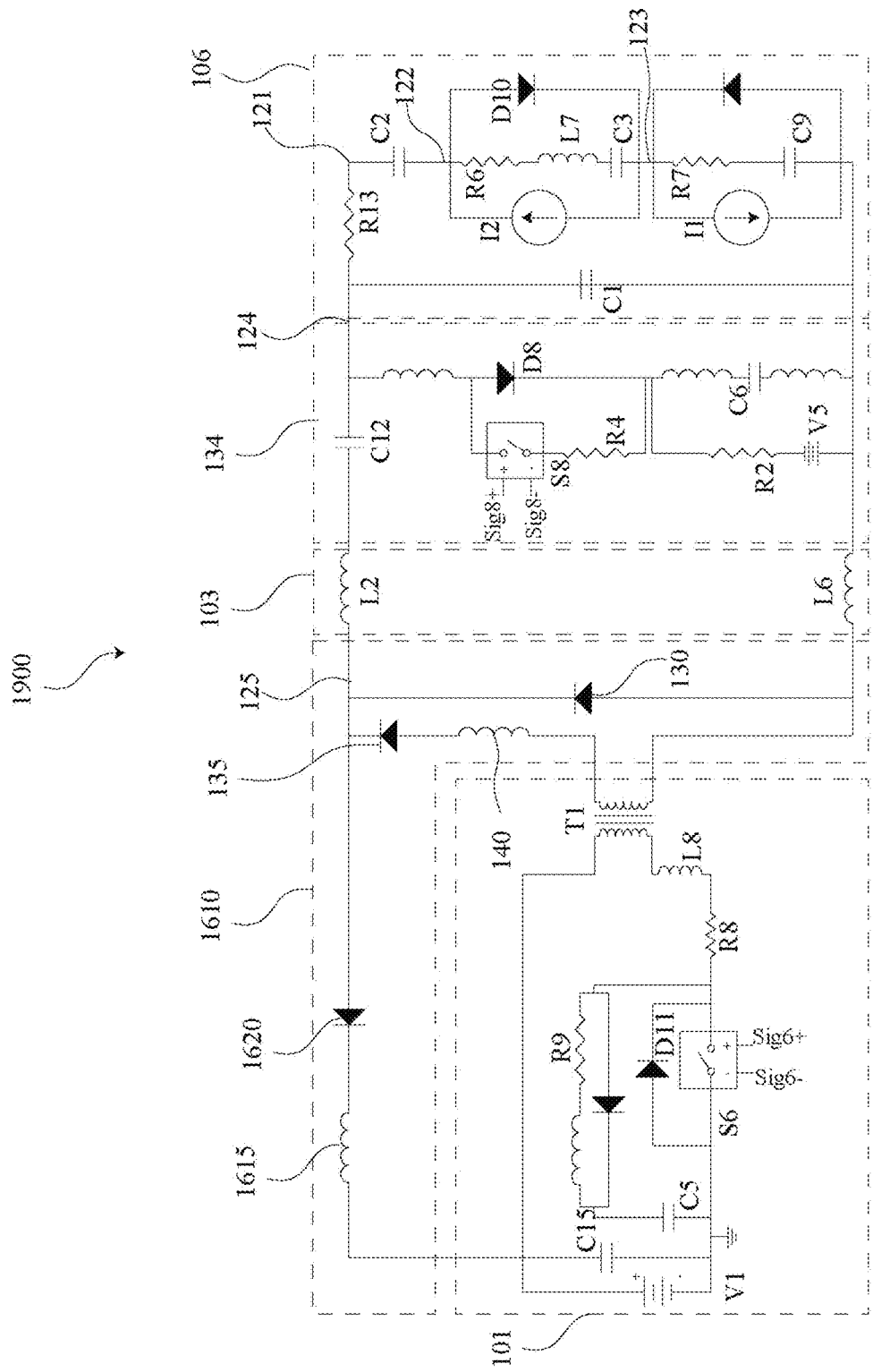

FIG. 91 is a circuit diagram of a bias generator that includes an active bias compensation circuit with an energy recovery circuit according to some embodiments.

Figure 92:
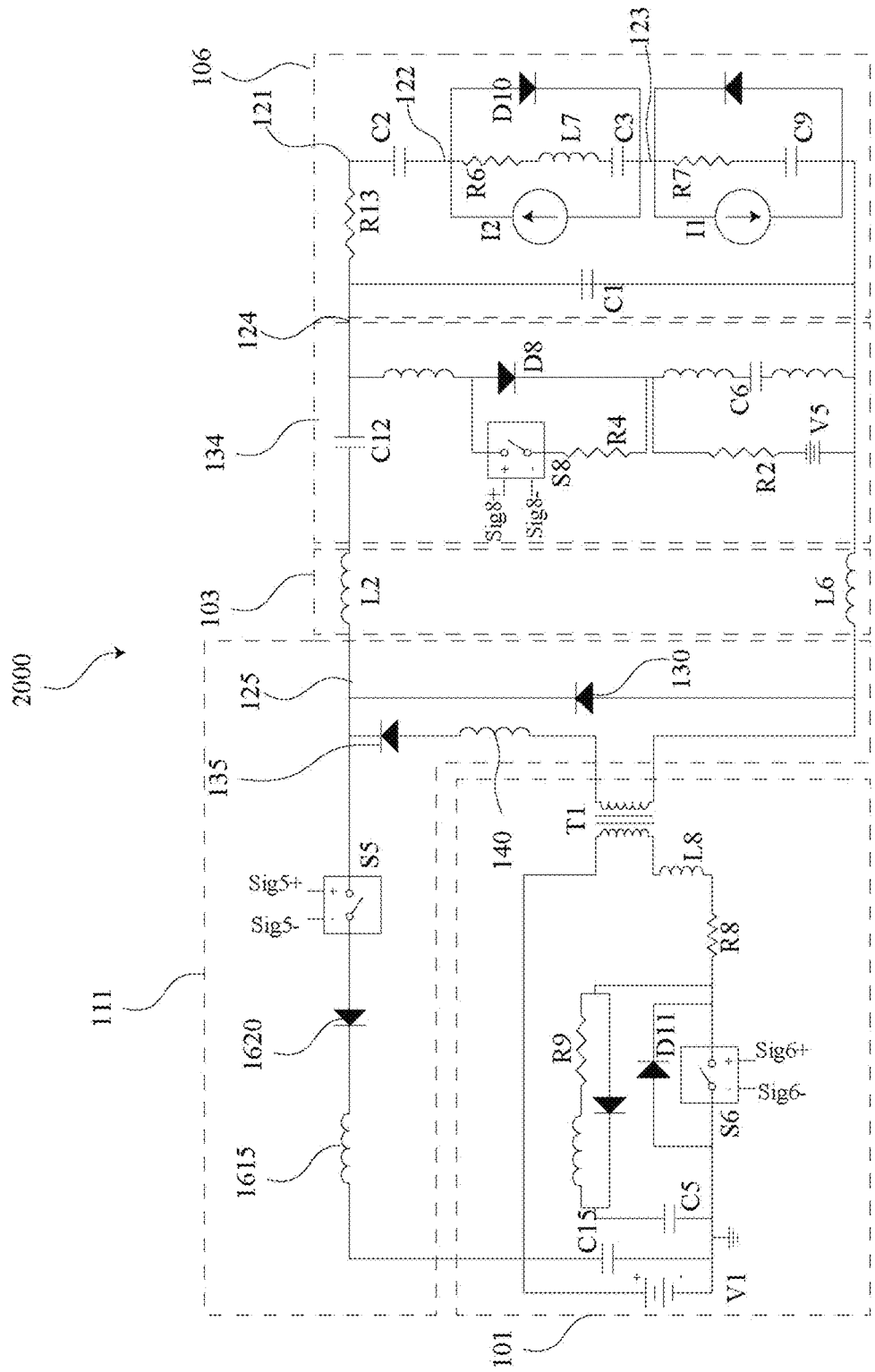

FIG. 92 is a circuit diagram of a bias generator that includes an active bias compensation circuit with an active energy recovery circuit according to some embodiments.

Figure 93:
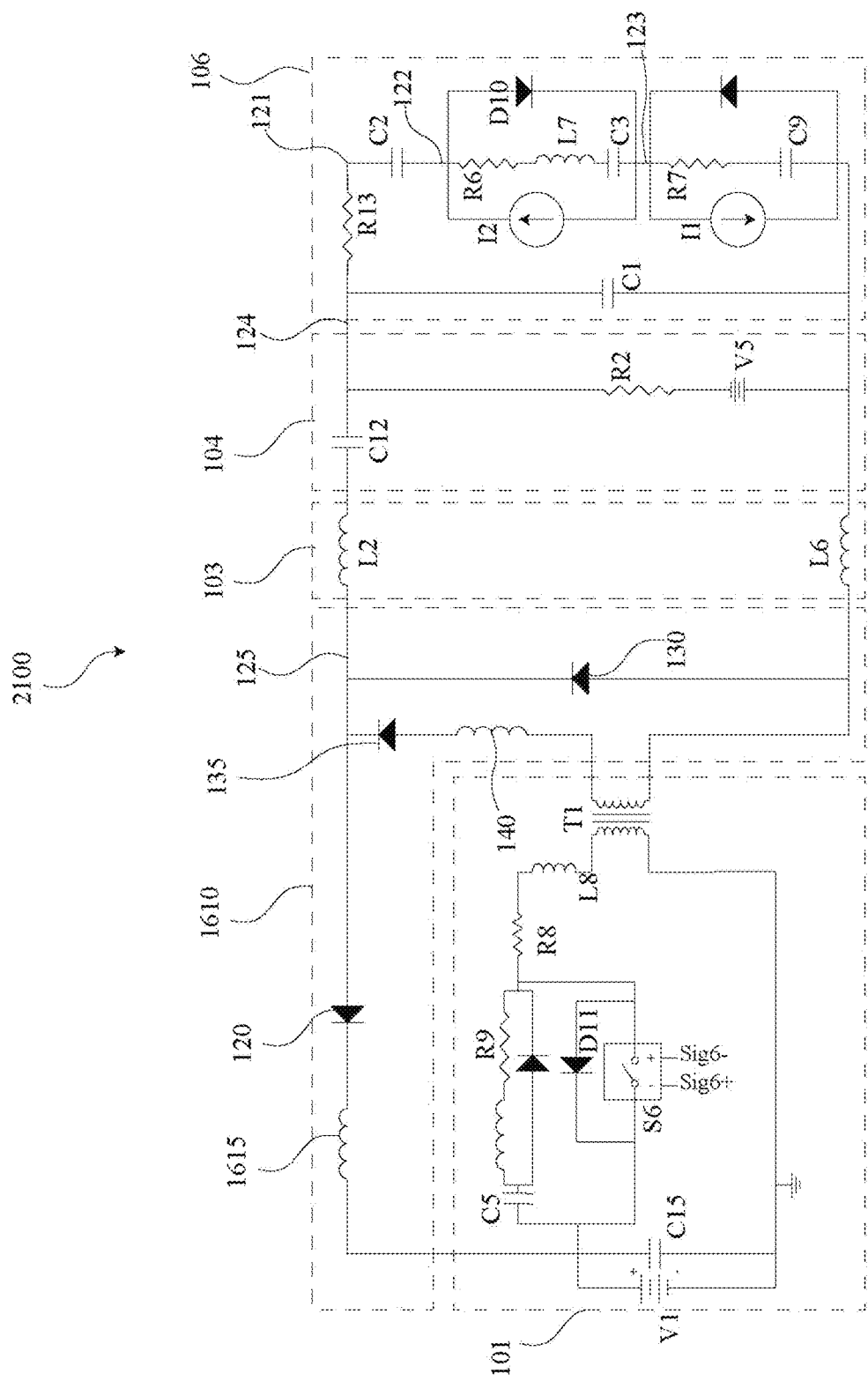

FIG. 93 is a circuit diagram of a bias generator with an energy recovery circuit according to some embodiments.

Figure 94:
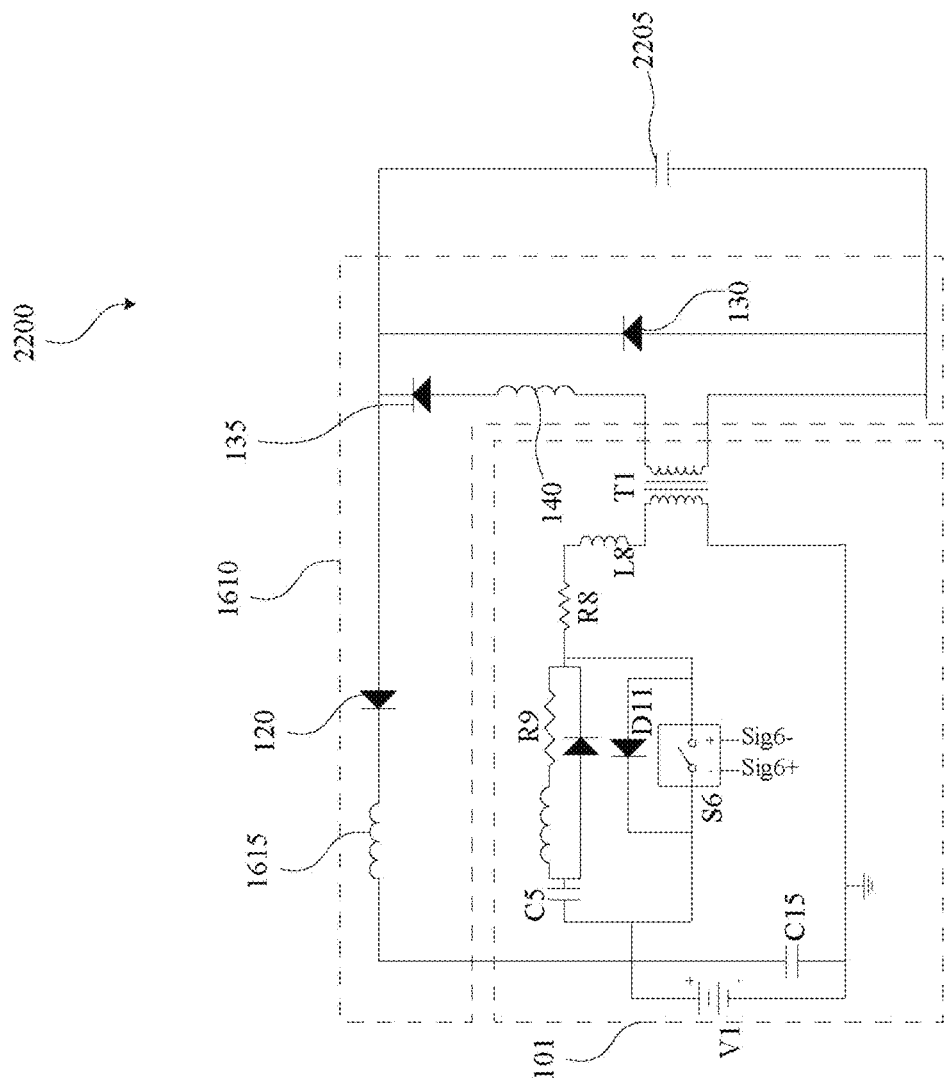

FIG. 94 is a circuit diagram of a bias generator with an energy recovery circuit driving a capacitive load according to some embodiments.

Figure 95:
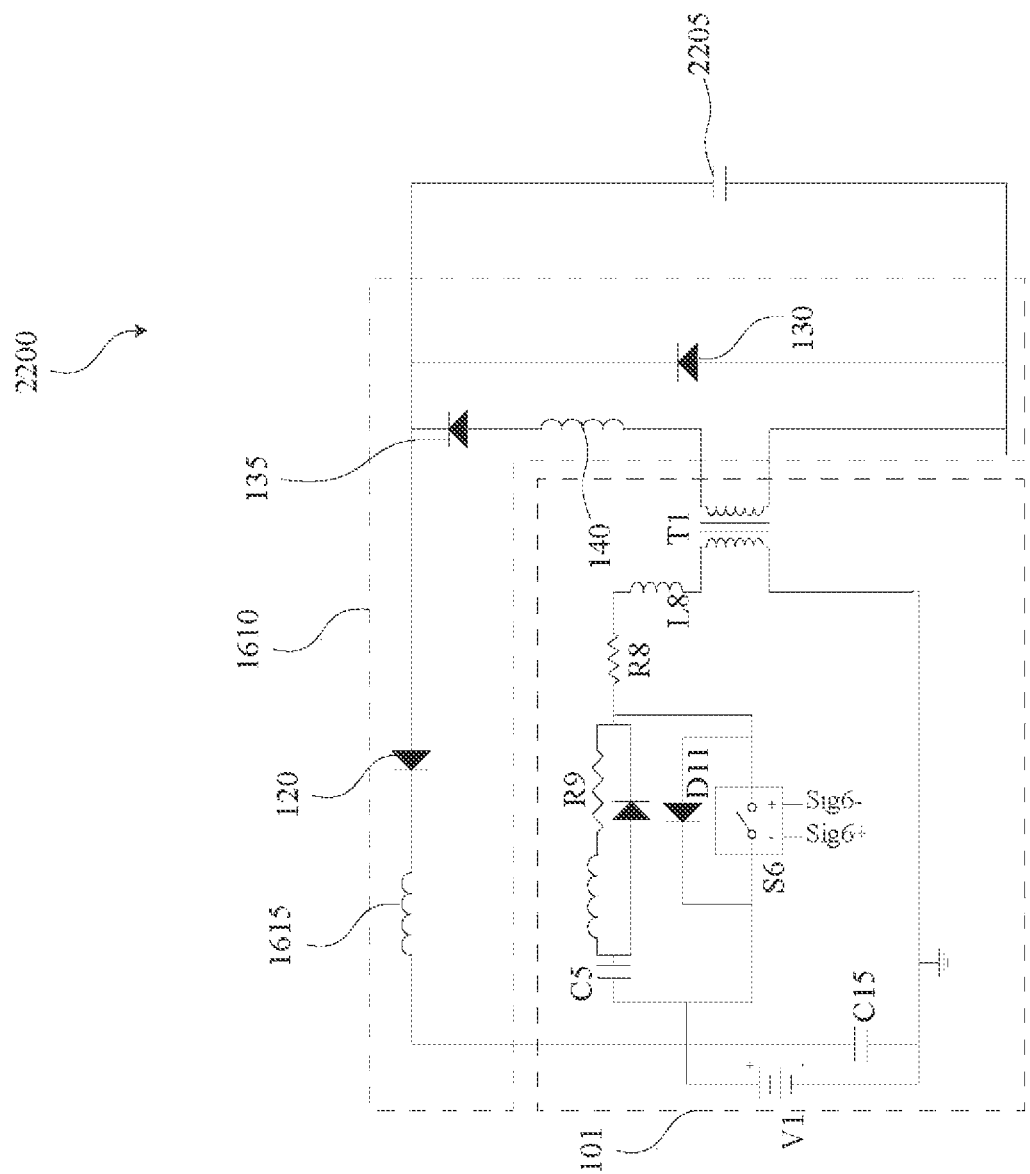

FIG. 95 is a block diagram of a high voltage switch with isolated power according to some embodiments.

Figure 96:
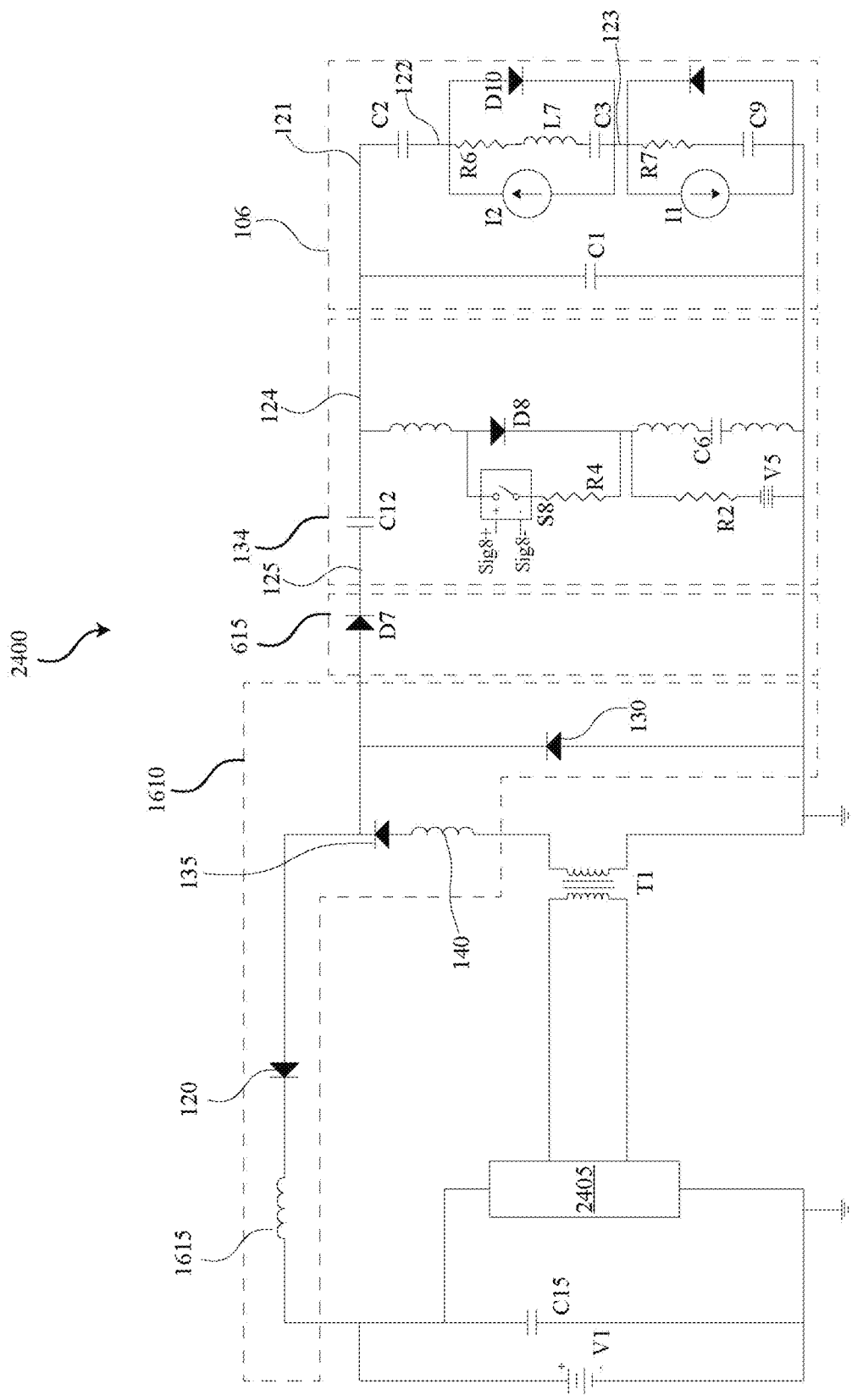

FIG. 96 is a circuit diagram of a bias generator that includes an RF source, the active bias compensation circuit, and the energy recovery circuit according to some embodiments.

Figure 97:
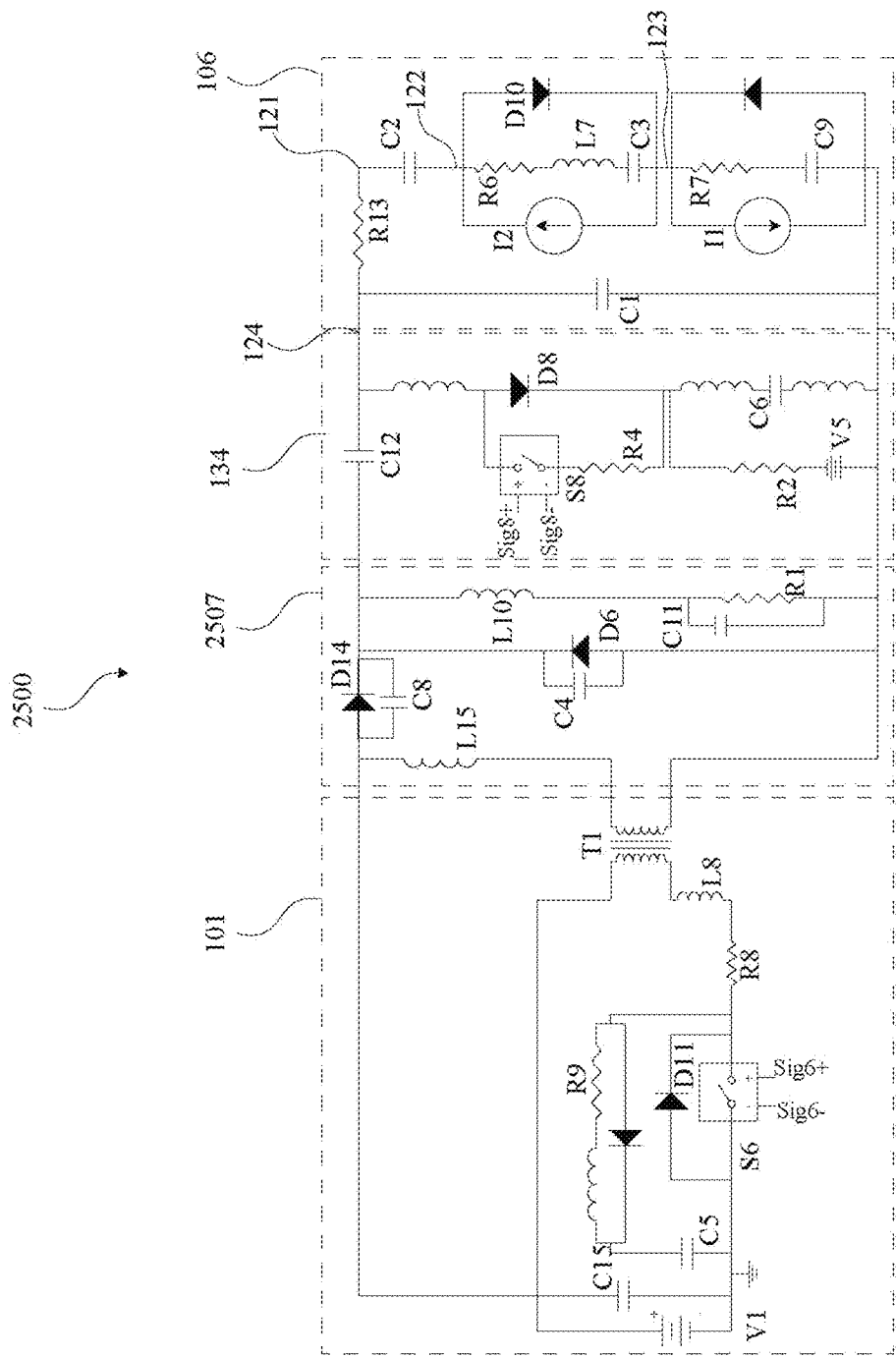

FIG. 97 shows another example bias generator according to some embodiments.

DETAILED DESCRIPTION

Systems and methods are disclosed to provide high voltage and/or high power output waveforms with programmable control from Direct Current (DC) to greater than 100 kHz pulses with controllable duty cycles from 0 to 100%. In some embodiments, a system can include a pulse generator that is galvanically isolated.

There are number of potential challenges that must be overcome when designing a high voltage pulse generator. For example, slow rise times can be detrimental to a high voltage pulse generator especially when switching at high frequencies. For example, a high frequency pulse generator may not be able to switch quickly enough if the rise time is longer than the pulse period because the pulse may not reach the peak voltage before being switched off again.

As another example, a high voltage pulse generator may also smooth a high frequency input signal to generate a high voltage output signal that has a voltage higher than the input signal. In order to accomplish such smoothing, may require that the input signal include at least one of a high frequency, fast rise times, and fast fall times. In some embodiments, the high frequency of the input signal may be five to ten times greater than the output signal. Moreover, the higher the input frequency of the input signal, the smoother the output signal.

In some embodiments, the pulse generator may generate high voltage pulses with fast rise times of various types such as, for example, square waves, sinusoidal waves, triangular waves, arbitrary waves, long single pulses, multiple pulses, etc.

In some embodiments, a pulse generator may generate high voltage pulses having an arbitrary waveform that has a fast rise time (e.g., less than 1 µs). In some embodiments, a pulse generator may generate a high voltage pulses that have a variable duty cycle or user controlled duty cycle.

In some embodiments, a pulse generator can output high voltage greater than 0.5 kV, 1.0 kV, 2.0 kV, 5.0 kV, 10 kV, 15 kV, 20 kV, 25 kV, 50 kV, 100 kV, or 1,000 kV.

In some embodiments, the input signal may be greater than about 50 kHz or 100 kHz.

Embodiments described within this document do not include, for example, DC-DC converters, despite that some embodiments may be capable of generating a DC output. For example, a pulse generator does not simply convert a source of direct current (DC) from one voltage level to another. Indeed, embodiments described within this document are different than other pulse generators and/or different than DC-DC converters. For example, embodiments described within this document are not optimized for converting direct current from one voltage to another level. As another example, a pulse generator may produce pulses with long pulse widths, fast rise times, and/or fast fall times, but does not in general produce a DC output signal. Instead, some embodiments described within this document may produce high voltage pulses with fast rise times and/or fast fall times. Some embodiments described within this document may produce high voltage pulses having a long high voltage pulse or with a long pulse width that have a fast rise time and/or a fast fall time. Some embodiments described within this document may produce high frequency and high voltage pulses with any waveform shape. As another example, embodiments described within this document may produce one or more waveforms and/or signals with specifically designated very low frequency components as well as waveforms with specifically designated very high frequency components. Moreover, in some embodiments, a pulse generator may produce waveforms that are galvanically isolated from a reference potential (e.g., ground).

Figure 1:
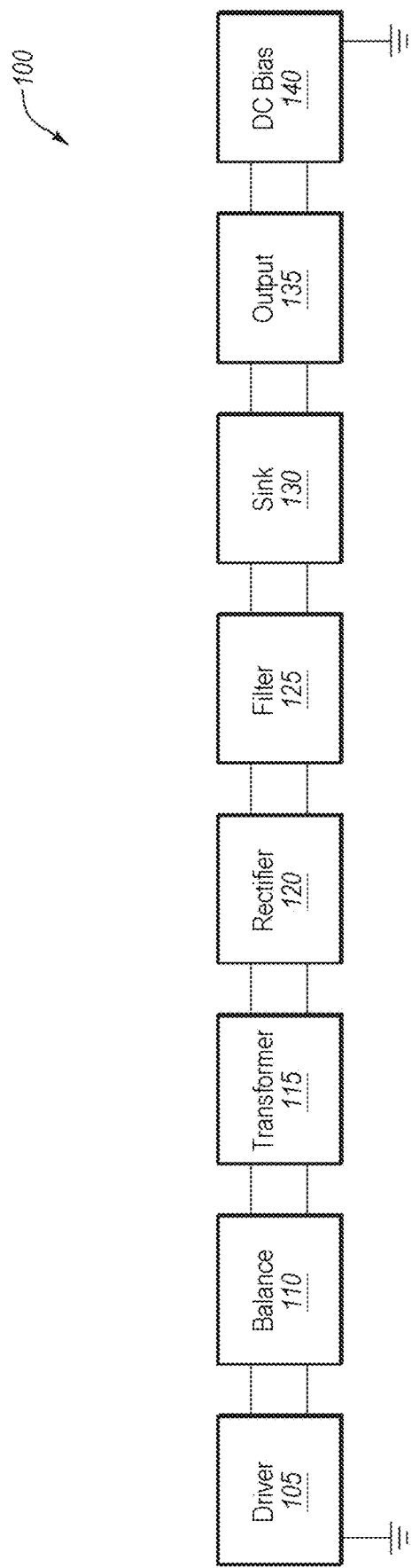
FIG. 1 is an example block diagram of a pulse generator according to some embodiments.

FIG. 1 is an example block diagram of a pulse generator 100 according to some embodiments. The pulse generator 100 may include one or more stages or blocks as shown in the figure. One or more of these stages may be removed, replaced with another stage, and/or combined with another stage. A driver stage 105 that includes any components or devices that may push or pull current. The driver stage 105 is coupled with a balance stage 110. The balance stage 110 can be used, for example, to keep a transformer stage 115 from saturating due to imbalanced current. The driver stage may include one or more energy sources, switches, bridges, etc. The one or more switches may include, for example, one or more IGBTs, switches, solid state switches, MOSFET, may be used to switch the energy source. As another example, the driver stage may include a waveform generator that may be used to produce an input waveform. In some embodiments, a waveform that is to be amplified may be provided to the driver from an external source. In some embodiments, an IGBT circuit(s) may be used with the driver stage 105 such as, for example, the IGBT circuit discussed in U.S. patent application Ser. No. 13/345,906, entitled Efficient IGBT Switching the entirety of which is incorporated by reference in its entirety.

Figure 4:
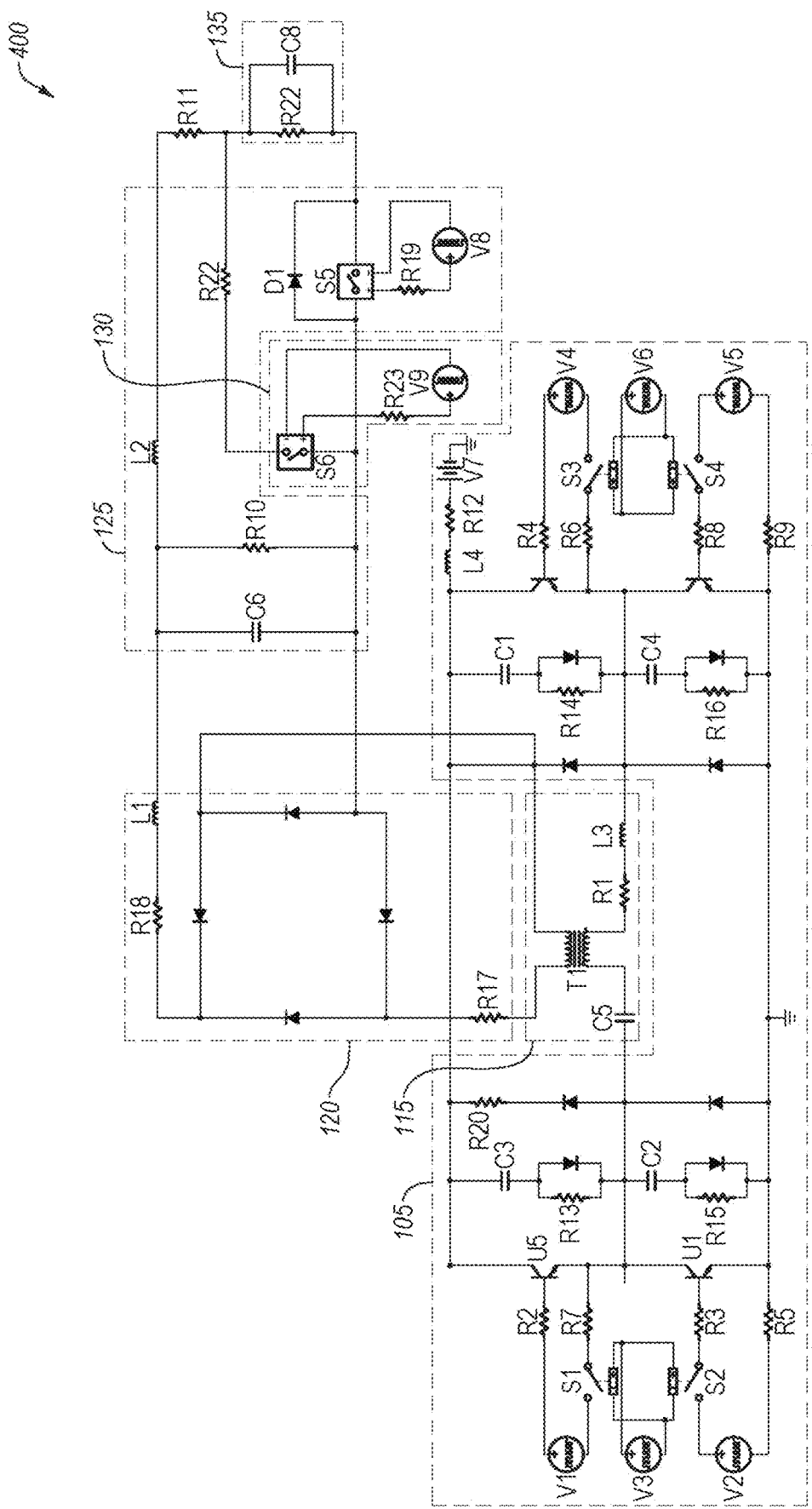
FIG. 4 is an example circuit diagram that may comprise all or part of a pulse generator according to some embodiments described in this document.

In some embodiments, the driver stage 105 may include an H-bridge, a half bridge, or a full bridge. An example of a full bridge configuration is shown in FIG. 4. Any number of configurations of input sources may be used without limitation. Various other configurations or circuits may be included such as, for example, resonant topologies and push-pull topologies.

At fixed voltage, the time rate of change of current through a given circuit may be inversely proportional to the inductance of the circuit. Thus, in some embodiments, in order to produce fast rise times, the driver stage 105, for example, may have a low total inductance. In some embodiments, the driver stage 105 may have a total inductance below 1,000 nH. In some embodiments, the inductance of all components, circuits, elements, etc. prior to a transformer or transformers of a transformer stage may have a total inductance less than 1,000 nH. In some embodiments, the inductance of all components, circuits, elements, etc. including the primary winding of one of more transformers of the transformer stage 115 may have an inductance less than 1,000 nH. In some embodiments, the inductance of all components, circuits, elements, etc. om the driver stage 105 and the balance stage 110 may have a total inductance less than 1,000 nH.

In some specific embodiments, the driver stage 105 may have a total inductance below 1,000 nH. In some specific embodiments, the inductance of all components, circuits, elements, etc. prior to a transformer or transformers of a transformer stage may have a total inductance less than 1,000 nH. In some specific embodiments, the inductance of all components, circuits, elements, etc. including the primary winding of one of more transformers of the transformer stage 115 may have an inductance less than 1,000 nH. In some specific embodiments, the inductance of all components, circuits, elements, etc. om the driver stage 105 and the balance stage 110 may have a total inductance less than 1,000 nH.

The balance stage 110 may also be coupled with the transformer stage 115 that may include one or more transformers each having any number of coils. The transformer stage 115 may also increase the voltage from the driver stage 105 and/or the balance stage 110 depending on the number of winds on either side of the transformer stage 115. The transformer stage 115 may provide, for example, galvanic isolation between the driver stage 105 and the output stage 135. The transformer stage 115 may also provide, for example, step up from the input voltage provided by the driver stage 105 to an increased voltage output.

The transformer stage 115 may be coupled with a rectifier stage 120. The filter stage 125 may be coupled with the rectifier stage 120. The filter stage 125 may include any number of components such as, for example, active components (e.g., switches, diodes, etc.) and/or passive components (e.g., inductors, capacitors, resistors, etc.)

The transformer stage may include a transformer that transforms an input signal into a high voltage output signal. The high voltage output signal may have a voltage of 500 volts, 1,000 volts, 2000 volts, 10,000 volts and/or 100,000 volts, or higher.

The sink stage 130 may be placed after the filter stage 125 as shown in FIG. 1 or placed before the filter stage 125. The sink stage 130 may, for example, dump energy, sink current, and/or rapidly reverse current flow of any energy stored in the filter stage 125 and/or the output stage 135.

The output stage 135 may be coupled with the sink stage 130 as shown in FIG. 1 or may be coupled with the filter stage 125 and/or the rectifier stage 120. The output stage 135 may include the load and/or the device to which the output signal is sent. The output stage 135 may be galvanically isolated form a reference signal, from ground, and/or from the driver stage 105. In some embodiments, the output stage can be floating or biased to any potential desired (e.g., with the DC bias stage 140). In some embodiments, the output stage 135 may output a signal with a rise time of less than 100 ns and/or a fall time of less than 100 ns.

The DC bias stage 140 may be coupled with the output stage 135 and may include any voltage source and/or power source. The DC bias stage 140, for example, may be connected with a reference signal, ground, and/or the driver stage. In some embodiments, the DC bias stage 140 may reference the potential of the output stage 135 to the potential of the driver stage 105 of the pulse generator 100. The DC bias stage 140, for example, may be coupled to the rectifier stage 120, the filter stage 125, the sink stage 130, and/or the output stage 135. The DC bias stage 140, for example, may be of any polarity and/or may include any voltage. In some embodiments, the DC bias stage 140 may provide a DC bias signal, for example, having a voltage greater than 0.01 kV, 0.1 kV, 1 kV, 3 kV, 10 kV, 30 kV, or 100 kV. In some specific embodiments, the DC bias voltage may be greater than 0.1 kV or 1 kV.

Figure 2A:
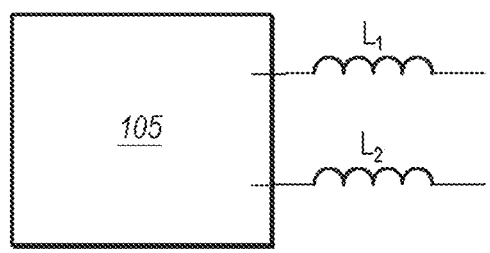
FIG. 2A is an example driver stage according to some embodiments described in this document.

FIG. 2A is an example driver stage 105 according to some embodiments described in this document. The driver stage 105, for example, may include any device or components that may push or pull current in the pulse generator 100. The driver stage 105, for example, may include one or more high voltage power supplies or voltage sources that may provide an input voltage of 50 volts, 100 volts, 200 volts, 300 volts, 400 volts, 500 volts, 600 volts, 700 volts, 800 volts, 900 volts, etc. to over 4500 volts. The driver stage 105, for example, may include one or more solid state switches such as, for example, one or more IGBTs and/or one or more MOSFETs that can be used to the switch the high voltage power supply. In some embodiments, the solid state switches may operate at voltages up to 2 kV or up to 4.5 kV.

In some embodiments, the driver stage 105 may include one or more H-bridge circuits and/or half-bridge circuits operated in parallel. Each H-bridge circuit may include, for example, one or more solid state switches. Moreover, the driver stage 105, for example, may or may not be coupled with a reference signal and/or with ground potential. The one or more solid state switches, for example, may switch at a frequency of 0.1 kHz, 1 kHz, 10 kHz, 100 kHz, 1,000 kHz, 10,000 kHz, etc.

In FIG. 2A, the stray inductance, L1 and L2, of the driver stage 105 singularly or in combination may be less than 1 nH, 10 nH, 100 nH, 1,000 nH, 10,000 nH, etc. In some specific embodiments, the stray inductance L1 and/or L2 may be less than 100 nH or 1,000 nH. In some specific embodiments, the stray inductance, L1 and L2, may represent and/or include all inductance such as, for example, stray inductance in the circuit, inductors, inductance in components, etc.

In some embodiments, the driver stage 105 may include one or more power sources that may provide voltage at 50 volts, 100 volts, 200 volts, 300 volts, 400 volts, 500 volts, 600 volts, 700 volts, 800 volts, 900 volts, etc. to over 4500 volts. In some specific embodiments, the voltage provided by the one or more power sources in the driver stage 105 may be greater than 100 V or 500 V.

Figure 2B:
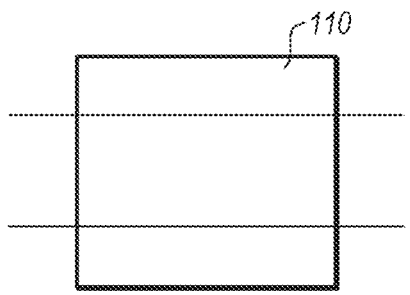
FIG. 2B is an example balance stage according to some embodiments described in this document.

FIG. 2B is an example balance stage 110 according to some embodiments described in this document. In FIG. 2B, the balance stage 110 is not used and/or may not include, for example, any active or passive components except, possibly, a connection between the driver stage 105 and the transformer stage.

Figure 2C:
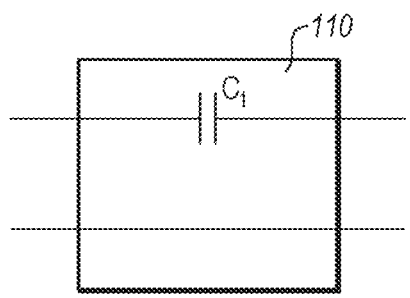
FIG. 2C is an example balance stage according to some embodiments described in this document.

FIG. 2C is another example balance stage 110 according to some embodiments described in this document. In this example, the balance stage 110 includes blocking capacitor C1, which may keep the transformer stage 115 from saturating due to imbalanced current from the driver stage 105. The blocking capacitor C1 may have a capacitance value of greater than 1 µF, 10 µF, 100 µF, 1,000 µF, 10,000 µF, etc.

Figure 2D:
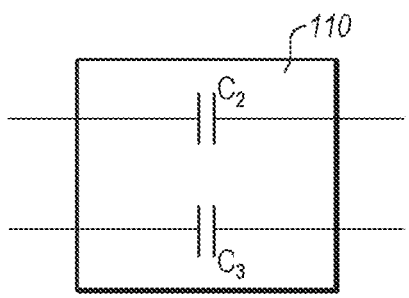
FIG. 2D is an example balance stage according to some embodiments described in this document.

FIG. 2D is another example balance stage 110 according to some embodiments described in this document. In this example, the balance stage 110 includes blocking capacitor C2 and blocking capacitor C3, which may keep the transformer stage 115 from saturating due to imbalanced current from the driver stage 105. The blocking capacitor C2, for example, may have a capacitance value of greater than 1 µF, 10 µF, 100 µF, 1,000 µF, 10,000 µF, etc. The blocking capacitor C3 may have a capacitance value of greater than 1 µF, 10 µF, 100 µF, 1,000 µF, 10,000 µF, etc.

Figure 2E:
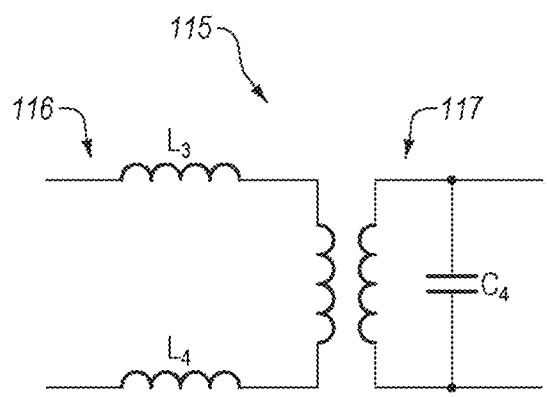
FIG. 2E is an example transformer stage according to some embodiments described in this document.

FIG. 2E is an example transformer stage 115 according to some embodiments described in this document. The transformer stage 115, for example, may include one or more transformers. A transformer of the transformer stage 115, for example, may step up the voltage provided by the driver stage 105 to a higher voltage such as for example, over 500 volts, 1500 volts, 2500 volts, 50,000 volts, 250,000 volts, etc.

The transformer, for example, may include a primary side 116 and a secondary side 117. The primary side 116 may have a total effective series stray inductance L3 and L4 that may have an inductance singularly or in combination of less than 10 nH, 100 nH, 1,000 nH, or 10,000 nH. In some specific embodiments, the total effective series stray inductance L3 and L4 may be less than 1,000 nH. In some specific embodiments, the secondary side 117 may have a total effective parallel stray capacitance C4 of less than 1 pF, 10 pF, 100 pF, 1,000 pF, 10,000 pF, etc. In some specific embodiments, the total effective parallel stray capacitance C4 may be less than 100 pF or 1,000 pF.

The transformer stage 115 may comprise any type of transformer. In some embodiments, the transformer may include primary windings on the primary side 116 and secondary windings on the secondary side 117 that are both wrapped around a magnetic core such as, for example, a ferrite core. The ratio ($N_s/N_p$) of the number secondary windings ($N_s$) to the number of primary windings ($N_p$) may be greater than 2, 4, 5, 5.5, 8, 10, 150, 600, etc.

In some embodiments, the transformer stage 115 may include one or more transformers arranged in parallel with each other.

In some embodiments, the transformer stage 115 may output a voltage greater than 1 kV, 2 kV, 5 kV, 10 kV, 30 kV, 100 kV, 300 kV, or 1,000 kV.

Figure 2F:
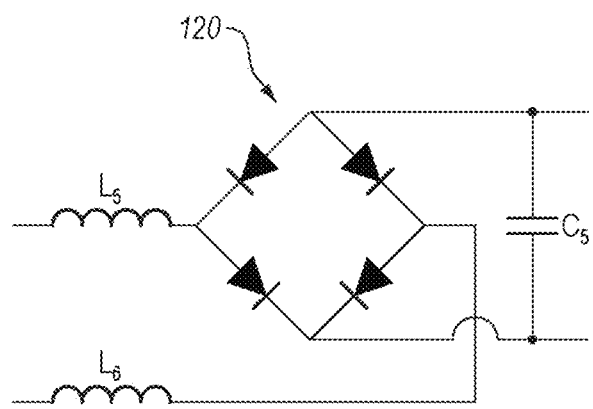
FIG. 2F is an example rectifier stage according to some embodiments described in this document.

FIG. 2F is an example rectifier stage 120 according to some embodiments described in this document. The rectifier stage 120 may include, for example, total effective series stray inductance L5 and L6 singularly or in combination of less than 10 nH, 100 nH, 1,000 nH, 10,000 nH, etc. In some specific embodiments, the effective series stray inductance L5 and L6 singularly or in combination may be less than 1,000 nH. In some other specific embodiments, the effective series stray inductance L5 and L6 singularly or in combination may be less than 100 nH. In some embodiments, the rectifier stage 120 may include total effective parallel stray capacitance C5 of less than 1 pF, 10 pF, 100 pF, 1,000 pF, 10,000 pF, etc. In some specific embodiments, the capacitance of the total effective parallel stray capacitance C5 may be less than 1,000 pF. In some specific embodiments, the capacitance of the total effective parallel stray capacitance C5 may be less than 200 pF. The rectifier stage 120 may also include a plurality of diodes, that may be used in series and/or parallel configurations that are designed and have specifications sufficient for high voltage and/or high power applications.

The rectifier stage 120 may include any type of rectifier such as, for example, a single phase rectifier, a single phase half wave rectifier, a single phase full wave rectifier, a full wave rectifier, a three-phase rectifier, a three-phase half wave circuit, a three-phase bridge rectifier, a two pulse bridge, a twelve pulse bridge, etc. In some embodiments, more than one rectifier may be used in series and/or parallel.

Figure 3A:
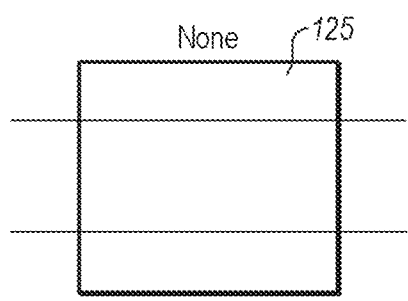
FIG. 3A is an example filter stage according to some embodiments described in this document.
Figure 3B:
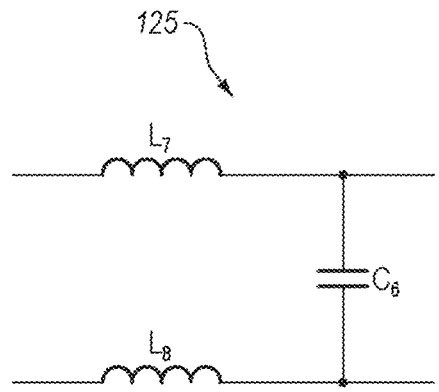
FIG. 3B is an example filter stage according to some embodiments described in this document.
Figure 3C:
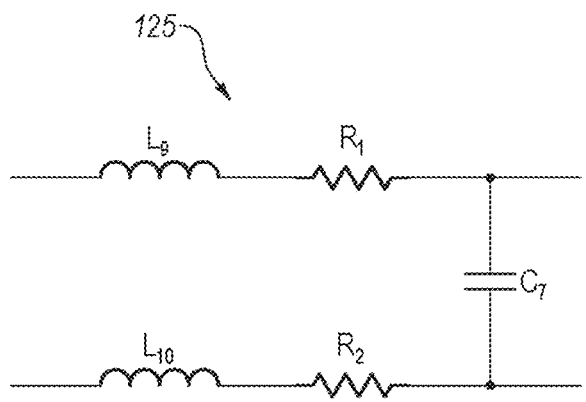
FIG. 3C is an example filter stage according to some embodiments described in this document.

The filter stage 125 may include a number of different configurations depending on the type of specification and/or application. Three examples are shown in FIG. 3A, FIG. 3B, and FIG. 3C. In some embodiments, the filter may include only passive elements such as, for example, inductors, capacitors, resistors, etc. Various other configurations may be used.

FIG. 3A is an example filter stage 125 according to some embodiments described in this document. In this configuration, the filter stage 125 does not include any components. In this configuration, the output of the rectifier stage 120 may be tied directly with the output stage 135 and/or the load. This filter stage may be used to produce an output signal that includes at least one of fast rise times, fast fall times, and high frequencies, etc.

FIG. 3B is an example filter stage 125 according to some embodiments described in this document. In this configuration, the filter stage 125 may include total effective series inductance L7 and L8 singularly or in combination of less than 0.1 µH, 1 µH, 10 µH, 100 µH, 1,000 µH, 10,000 µH, etc. In some specific embodiments, the total effective series inductance L7 and L8 singularly or in combination may be less than 30 µH. The filter stage 125 may include total effective parallel capacitance C6 of less than 0.01 nF, 0.1 nF, 1 nF, 10 nF, 100 nF, 1,000 nF, etc. In some specific embodiments, the total effective parallel capacitance C6 may be less than 300 µF or 30 µF. This configuration, for example, may be used to smooth an input waveform provided by the driver stage 105 and/or allow for an arbitrary waveform.

FIG. 3C is an example filter stage 125 according to some embodiments described in this document. In this configuration, the filter stage 125 may include total effective series inductance L9 and L10 singularly or in combination of less than 0.1 µH, 1 µH, 10 µH, 100 µH, 1,000 µH, 10,000 µH, etc. In specific embodiments, the total effective series inductance L9 and L10 singularly or in combination may be less than 30 µH.

In some embodiments, the filter stage 125 may include total effective parallel capacitance C7 of less than 0.01 nF, 0.1 nF, 1 nF, 10 nF, 100 nF, 1,000 nF, etc. In some specific embodiments, the total effective parallel capacitance C7 may be less than 300 µH or 30 µH. The filter stage 125 may include, for example, total effective parallel resistance R1 and R2 singularly or in combination of less than 0.1 Ohms, 1 Ohms, 10 Ohms, or 100 Ohms. In some specific embodiments, the total effective parallel resistance R1 and R2 singularly or in combination may be less than 10 Ohms or less than 1 Ohm. This configuration, for example, may be used to smooth an input waveform provided by the driver stage 105 and/or allow for an arbitrary waveform.

Various other configurations of filter stage 125 may be used.

Figure 3D:
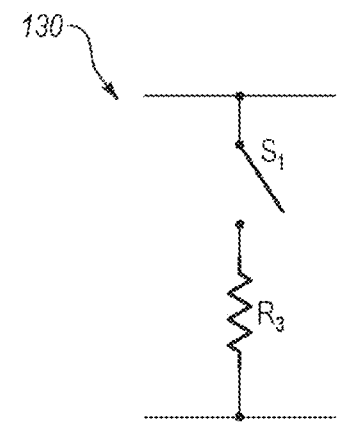
FIG. 3D is an example sink stage according to some embodiments described in this document.

FIG. 3D is an example sink stage 130 according to some embodiments described in this document. Sink stage 130 may include a switch S1 and a resistance R3. The resistance R3 may include stray resistance and/or a resistor that may be used to limit the current flowing through switch S1. When the switch S1 is closed, the sink stage 130 may rapidly dump energy that may be stored in the filter stage 125 and/or the output stage 135 such as, for example, any energy stored in a capacitor in the filter stage 125 and/or the output stage 135. In some embodiments, the sink stage 130 may be located between the filter stage 125 and the rectifier stage 120. In other embodiments the sink stage 130 may be disposed between the filter stage 125 and the output stage 135.

FIG. 4 is an example circuit diagram 400 that may comprise all or part of a pulse generator according to some embodiments described in this document. The circuit diagram 400 includes driver stage 105, transformer stage 115, rectifier stage 120, filter stage 125, sink stage 130, and output stage 135.

In some embodiments, the output stage 135 can be galvanically isolated from ground, from the driver stage, and/or from any reference potential.

In this embodiment, the filter stage 125 includes a switch S5. The output of the rectifier stage 120 can then be directly switched by the switch S5.

The sink stage 130 may include switch S6. In some embodiments, switch S5 and switch S6 may be fast switches that open and close within 1 µs or faster. In some embodiments, the switch S5 and/or the switch S6 are switches that may operate at high frequencies.

Figure 5A:
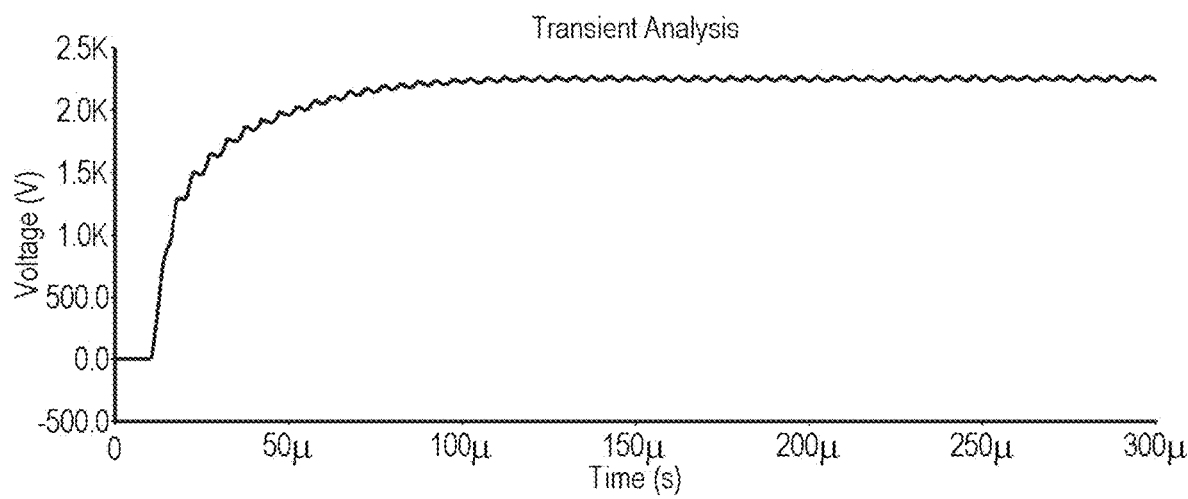
FIGS. 5A, 5B and 5C are example graphs of an output pulse according to some embodiments described in this document.
Figure 5B:
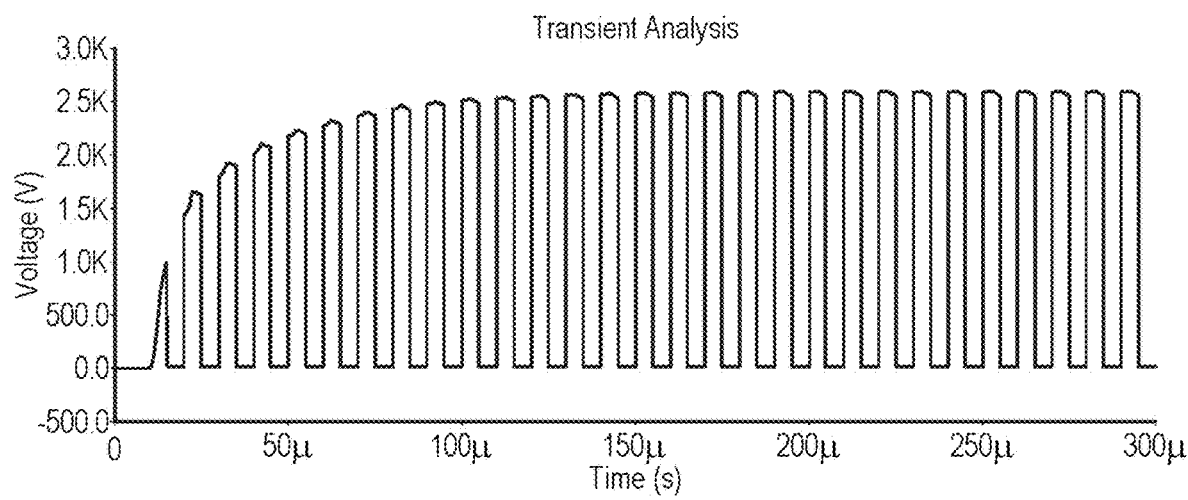
Figure 5C:
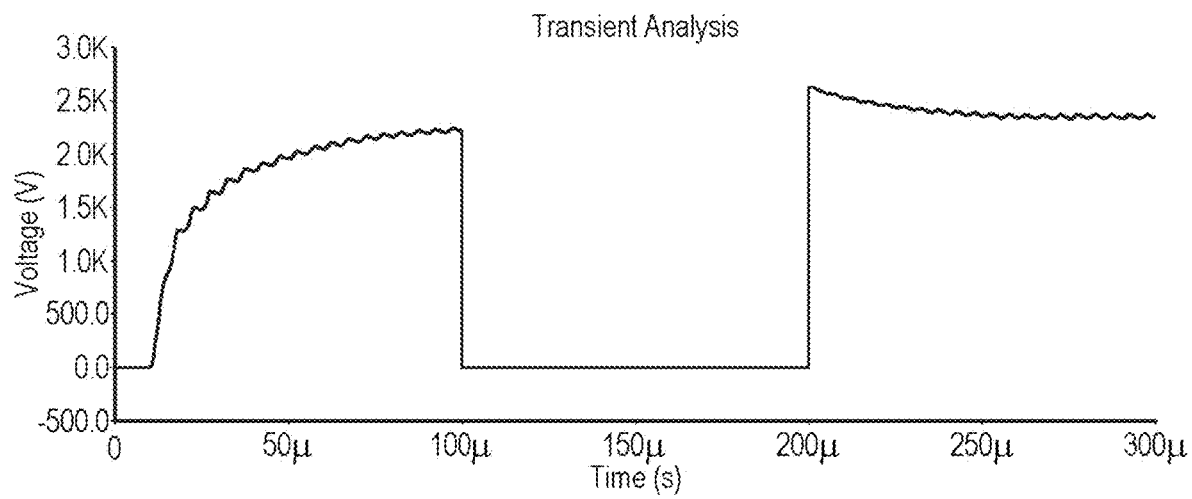

When the switch S5 is closed DC power can be sourced to the output stage 135 (or the load R22 and/or R11). A graph of the voltage over time at the output stage 135 is shown in FIG. 5A. If switch S5 is switched on and off, then a pulsed waveform can be sourced to the output stage 135 as shown in FIG. 5B and FIG. 5C. Switch S6 can be opened when switch S5 closes and closed when switch S5 opens. When switch S6 is closed, capacitance can be drained from the load capacitance represented as C8. The switches used by switch S5 and/or switch S6 may operate at high power, high frequency, with variable duty cycle, at variable pulse widths, etc.

Switch S5 and/or switch S6 may include one or more solid state switches such as, for example, one or more MOSFETs and/or one or more IGBTs. Moreover, in some embodiments, switch S5 and/or switch S6 may also include one or more switches stacked, arranged in parallel, and/or arranged in series.

In some embodiments, a controller may be included that controls the operation and/or timing of switch S5 and/or switch S6 as the duty cycle, pulse width, and/or frequency are changed and to ensure that switch S5 is closed when switch S6 is open and vice-versa. These switches may include solid state switches and/or IGBT circuits discussed in U.S. patent application Ser. No. 13/345,906, entitled Efficient IGBT Switching the entirety of which is incorporated into this document by reference in its entirety.

In some embodiments, the emitter of switch S5 and/or switch S6 may not be referenced back to ground. That is, the emitter of switch S5 and/or switch S6 may be galvanically isolated from all or part of the circuit. Moreover, the gate of switch S5 and/or switch S6 may be isolated using a fiber optic receiver and/or a fiber optic device.

In some embodiments, the size, shape, frequency, and/or duty cycle of pulses produced by the pulse generator may be controllable (or varied by user input). For example, the pulses can vary from a DC output to a 10 MHz output with duty cycles from 0% to 100%. In some embodiments, the galvanic isolation allows the output waveform potential to be set to arbitrary potential levels with respect to other system potentials. In some embodiments galvanic isolation may be 500 V, 1 kV, 2 kV, 3 kV, 5 kV, 10 kV, 20 kV, 100 kV, etc. with respect to other potentials. Some embodiments include a combination of two or more output stages to both provide and to sink high power and/or currents to and from the load. The combination of output stages may allow for precise control of arbitrary pulses to be delivered to both resistive and capacitive loads.

FIGS. 5A, 5B and 5C illustrate the variability of the output from a pulse generator. FIG. 5A is an example graph of a DC output pulse of over 2 kV. FIG. 5B is an example graph of an output pulse of over 2 kV pulsing at 100 kHz. And FIG. 5C is an example graph of an output pulse of over 2 kV pulsing at 5 kHz. Various other frequencies and/or amplitudes may be output using embodiments described in this document.

Figure 6:
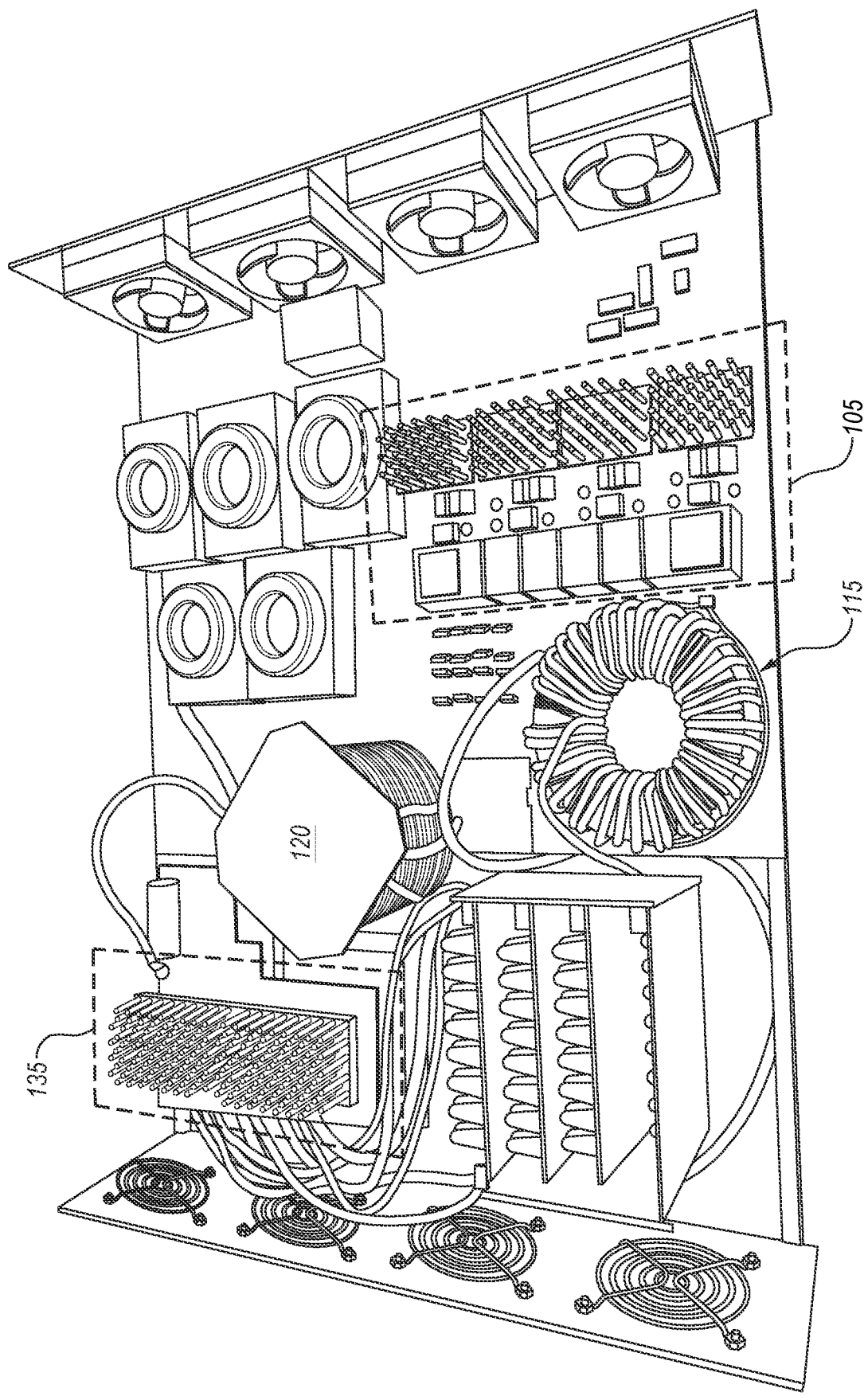
FIG. 6 is an example pulse generator according to some embodiments described in this document.

FIG. 6 is an example pulse generator according to some embodiments described in this document. The pulse generator includes an output stage 135, a rectifier stage 120, a transformer stage 115, and a driver stage 105.

Figure 7A:
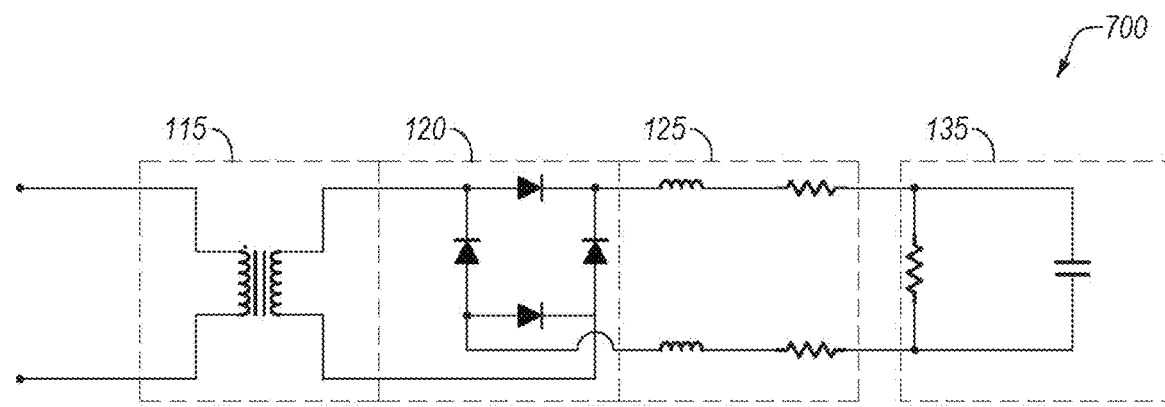
FIG. 7A is an example circuit diagram of a portion of a pulse generator according to some embodiments described in this document.

FIG. 7A is an example circuit diagram 700 of a portion of a pulse generator according to some embodiments described in this document. The circuit diagram 700 shows a transformer stage 115 that includes a 1:5.5 transformer. The circuit diagram 700 also shows a rectifier stage 120, a filter stage 125, and an output stage 135. The filter stage 125 in this example includes circuit elements that include two 125 µH inductors and two 10 ohm resistors. While this example shows specific circuit elements with specific values, various other elements may be included. The output stage 135 includes a 250 Ohm load with 2 nF capacitance.

Figure 7B:
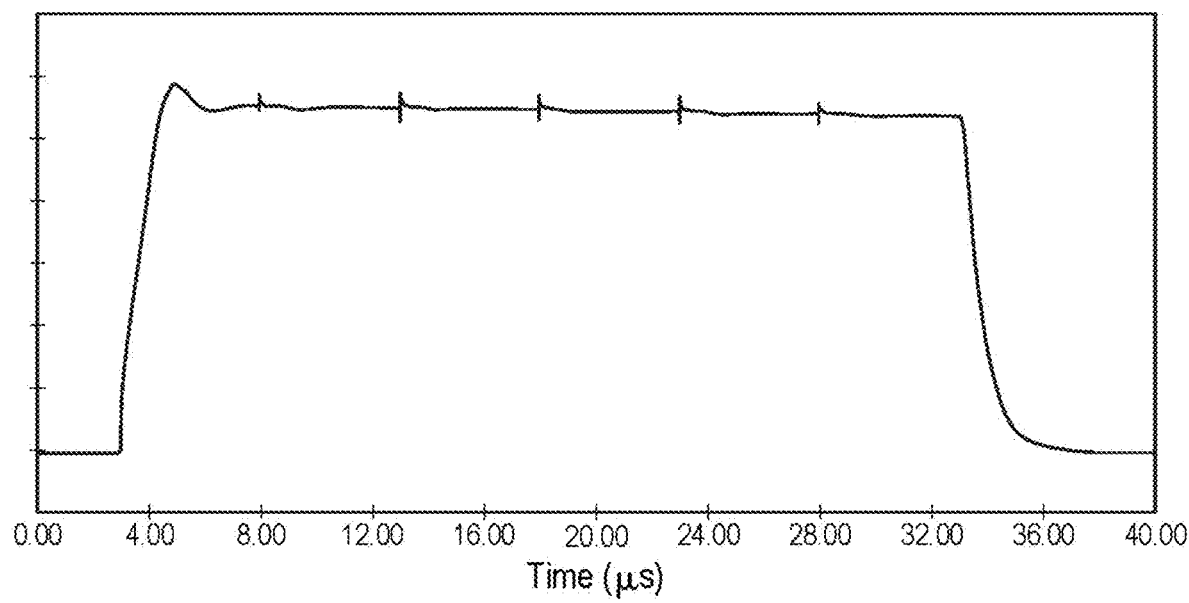
FIG. 7B is an example of an output waveform produced from the pulse generator shown in FIG. 7A.

FIG. 7B is an example of an output waveform produced from the portion of a pulse generator shown in FIG. 7A. The input waveform may include a low voltage (e.g., less than 200 V) input square waveform that may be provided via $V_{CH}$ and/or the driver stage 105. The input square waveform in this example was square wave with 5 µs pulse widths such as, for example, the waveform shown in FIG. 11A. As shown, the output waveform has an approximately 2 µs rise time and/or a very clean pulse.

Figure 8A:
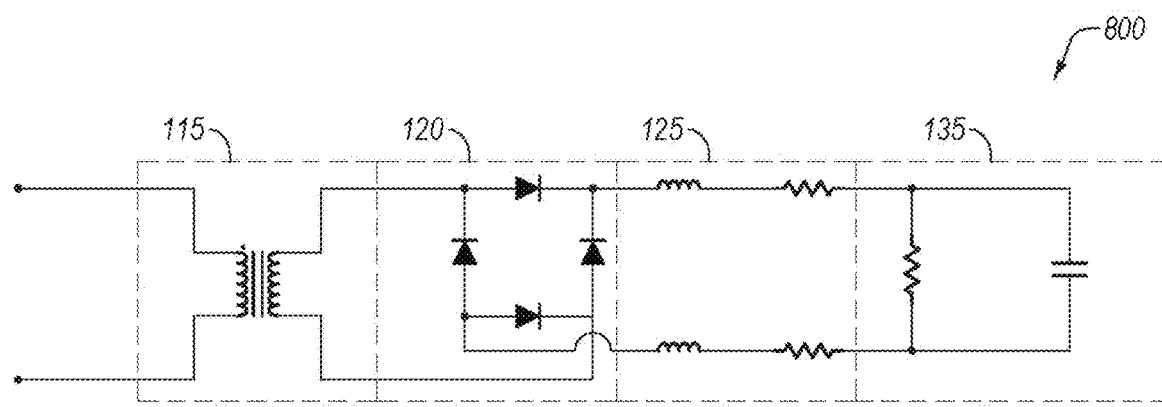
FIG. 8A is an example circuit diagram of a portion of a pulse generator according to some embodiments described in this document.

FIG. 8A is an example circuit diagram 800 of a portion of a pulse generator according to some embodiments described in this document. The circuit diagram 800 shows a transformer stage 115 that includes a 1:5.5 transformer. The circuit diagram 800 also shows a rectifier stage 120, a filter stage 125, and an output stage 135. The filter stage 125 in this example includes circuit elements that include two 480 µH inductors and two 10 ohm resistors. While this example shows specific circuit elements with specific values, various other elements may be included. The output stage 135 includes a 1 kOhm load with 470 µF capacitance.

Figure 8B:
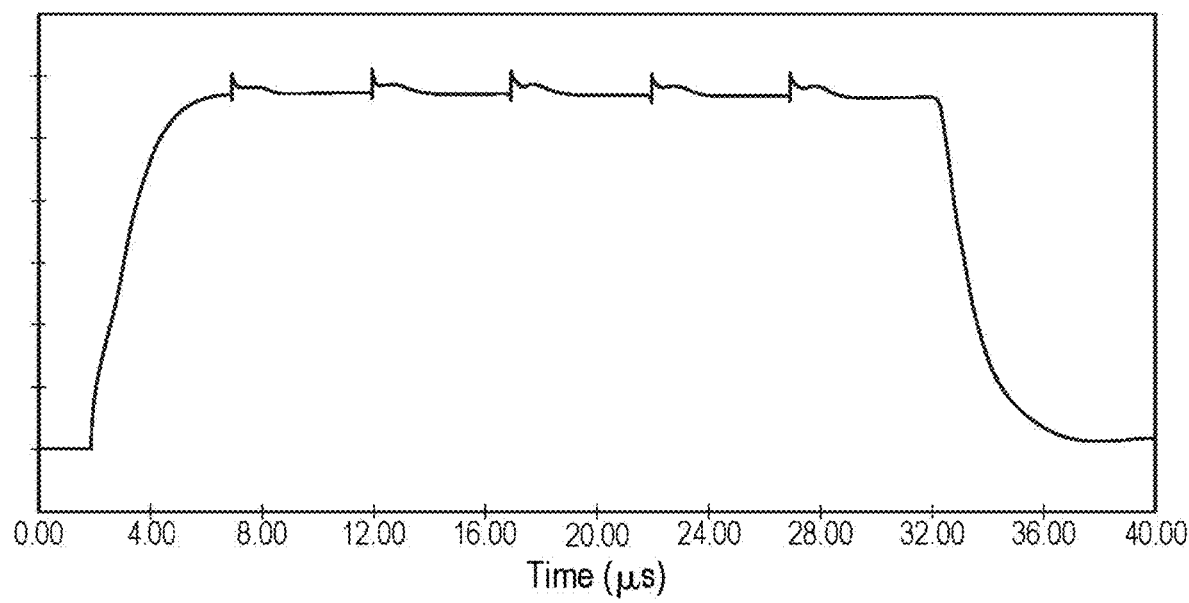
FIG. 8B is an example of an output waveform produced from the pulse generator shown in FIG. 8A.

FIG. 8B is an example of an output waveform produced from the pulse generator shown in FIG. 8A. The input waveform may include a low voltage (e.g., less than 200 V) input square waveform that may be provided via $V_{CH}$ and/or the driver stage 105. The input square waveform in this example was square wave with 5 µs pulse widths such as, for example, the waveform shown in FIG. 11A. As shown, the output waveform has an approximately 2 µs rise time and/or a relatively clean pulse.

Figure 9A:
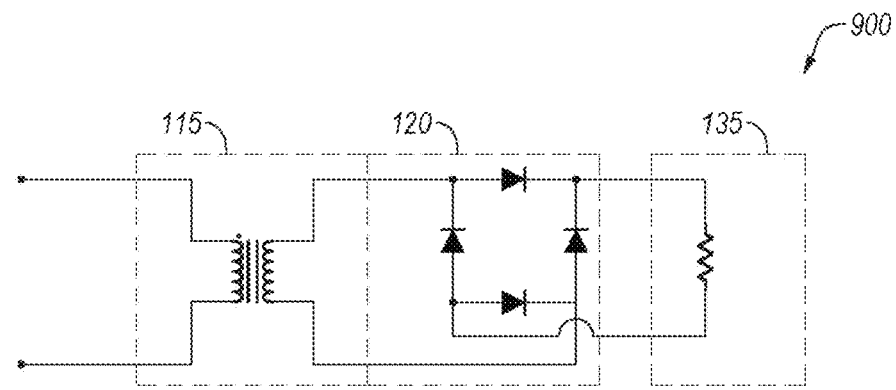
FIG. 9A is an example circuit diagram of a portion of a pulse generator according to some embodiments described in this document.

FIG. 9A is an example circuit diagram 900 of a portion of a pulse generator according to some embodiments described in this document. The circuit diagram 900 shows a transformer stage 115 that includes a 1:5.5 transformer. The circuit diagram 900 also shows a rectifier stage 120 and an output stage 135, but no filter stage 125. The output stage 135 includes a 250 Ohm load.

Figure 9B:
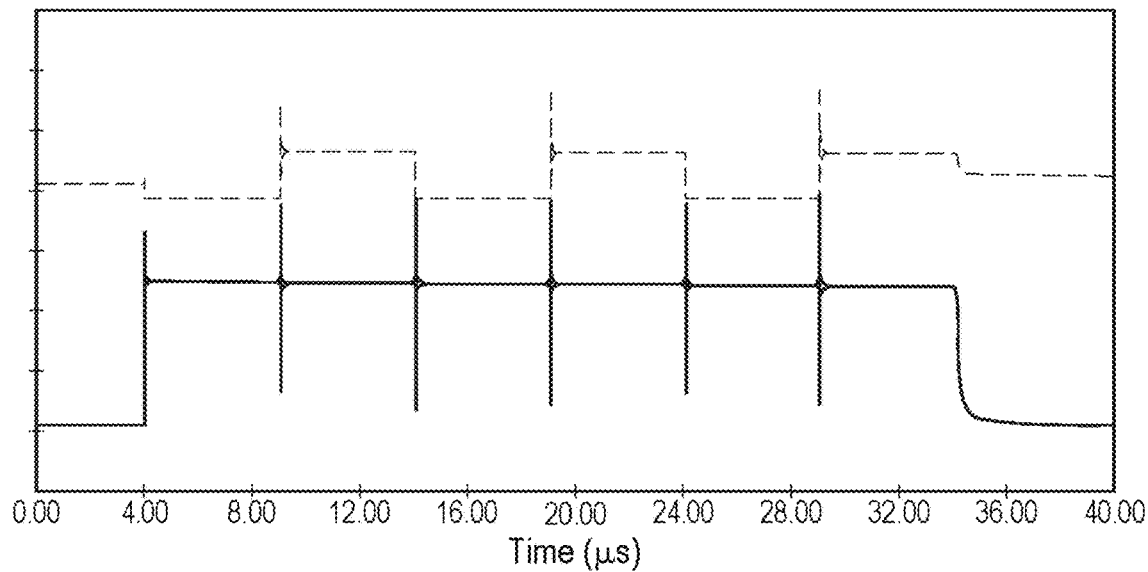
FIG. 9B is an example of an output waveform produced from the pulse generator shown in FIG. 9A.

FIG. 9B is an example of an output waveform produced from the pulse generator shown in FIG. 9A compared with the input waveform. A 200 V input square wave (dashed) was provided via $V_{CH}$. As shown, the output waveform (solid) has a very sharp rise time and maintains a relatively clean flat top with some slight ripple.

Figure 9C:
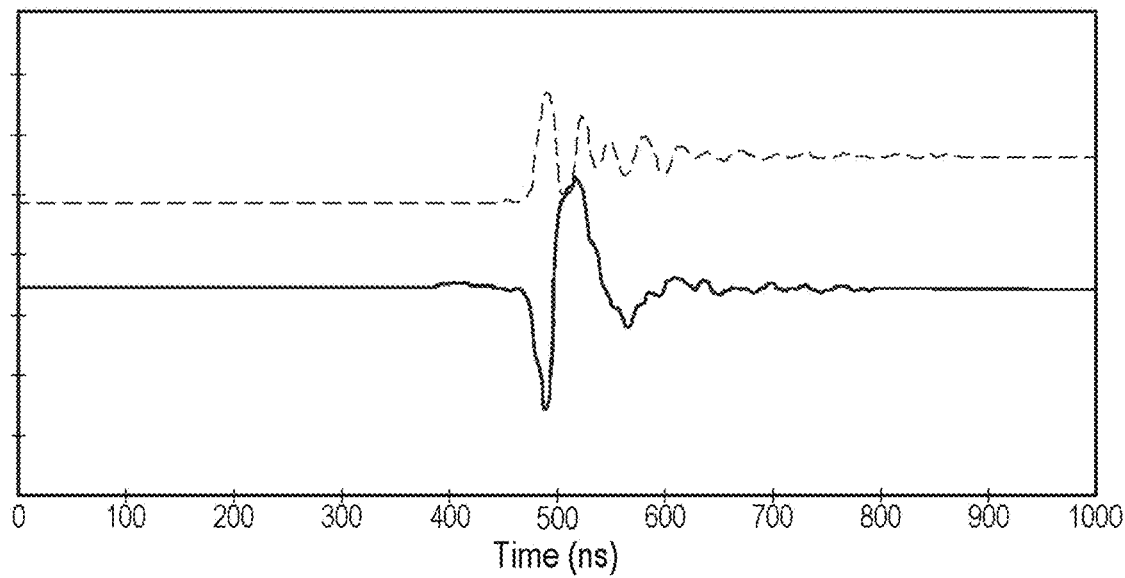
FIG. 9C is another example of an output waveform produced from the pulse generator shown in FIG. 9A.

FIG. 9C is an example of an output waveform produced from the pulse generator shown in FIG. 9A compared with the input waveform into the transformer stage 115. The input waveform may include a low voltage (e.g., less than 200 V) input square waveform that may be provided via $V_{CH}$. As shown, the output waveform has a very sharp rise time and maintains a relatively clean flat top with some slight ripple.

Figure 10A:
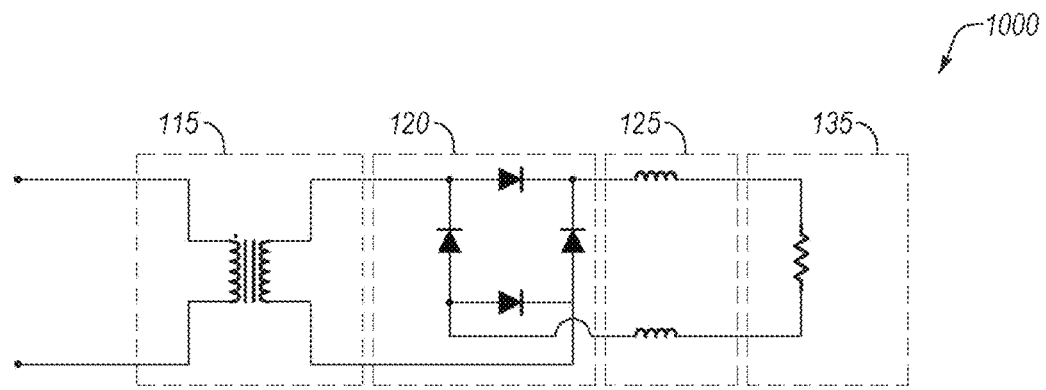
FIG. 10A is an example circuit diagram of a portion of a pulse generator according to some embodiments described in this document.

FIG. 10A is an example circuit diagram 1,000 of a portion of a pulse generator according to some embodiments described in this document. The circuit diagram 1,000 shows a transformer stage 115 that includes a 1:5.5 transformer. The circuit diagram 1,000 also shows a rectifier stage 120, a filter stage 125, and an output stage 135. The filter stage 125 in this example includes circuit elements that include two 450 µH inductors. While this example shows specific circuit elements with specific values, various other elements may be included. The output stage 135 includes a 250 Ohm load.

Figure 10B:
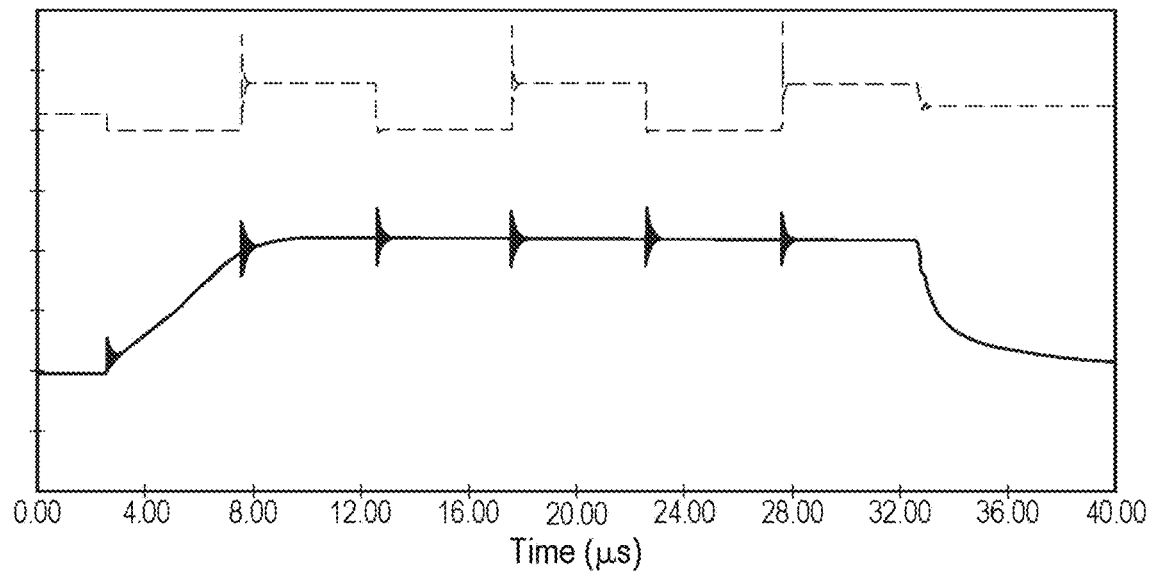
FIG. 10B is an example of an output waveform produced from the pulse generator shown in FIG. 10A compared with the input waveform.

FIG. 10B is an example of an output waveform produced from the pulse generator shown in FIG. 10A compared with the input waveform. A 200 V input square wave (dashed) was provided via $V_{CH}$. As shown, the output waveform (solid) has a sharp rise time and maintains a clean flat top with some slight ripple.

Figure 10C:
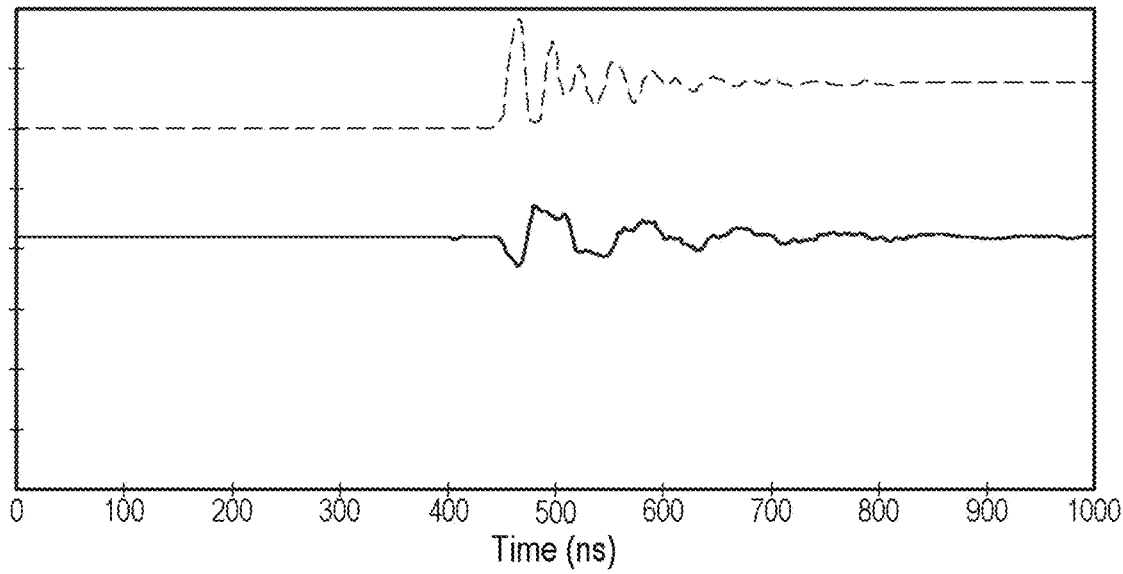
FIG. 10C is an example of an output waveform produced from the pulse generator shown in FIG. 10A compared with the input waveform.

FIG. 10C is an example of an output waveform produced from the pulse generator shown in FIG. 10A compared with the input waveform. A 200 V input wave (dashed) with an arbitrary shape was provided via $V_{CH}$. As shown, the output waveform has a very sharp rise time and maintains a relatively clean flat top with some slight ripple.

Figure 11A:
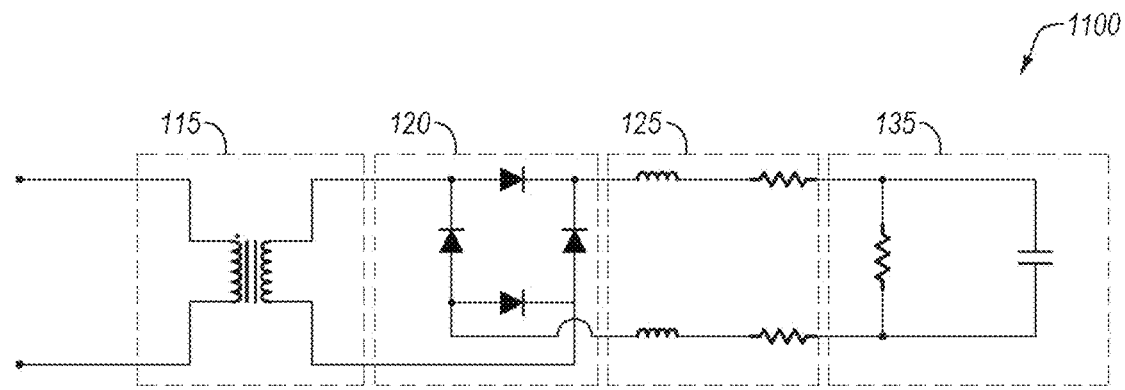
FIG. 11A is an example circuit diagram of a portion of a pulse generator according to some embodiments described in this document.

FIG. 11A is an example circuit diagram 1100 of a portion of a pulse generator according to some embodiments described in this document. The circuit diagram 1100 shows a transformer stage 115 that includes a 1:5.5 transformer. The circuit diagram 1100 also shows a rectifier stage 120, a filter stage 125, and an output stage 135. The filter stage 125 in this example includes circuit elements that include two 125 µH inductors and two 10 ohm resistors. While this example shows specific circuit elements with specific values, various other elements may be included. The output stage 135 includes a 250 Ohm load with 2 nF capacitance.

Figure 11B:
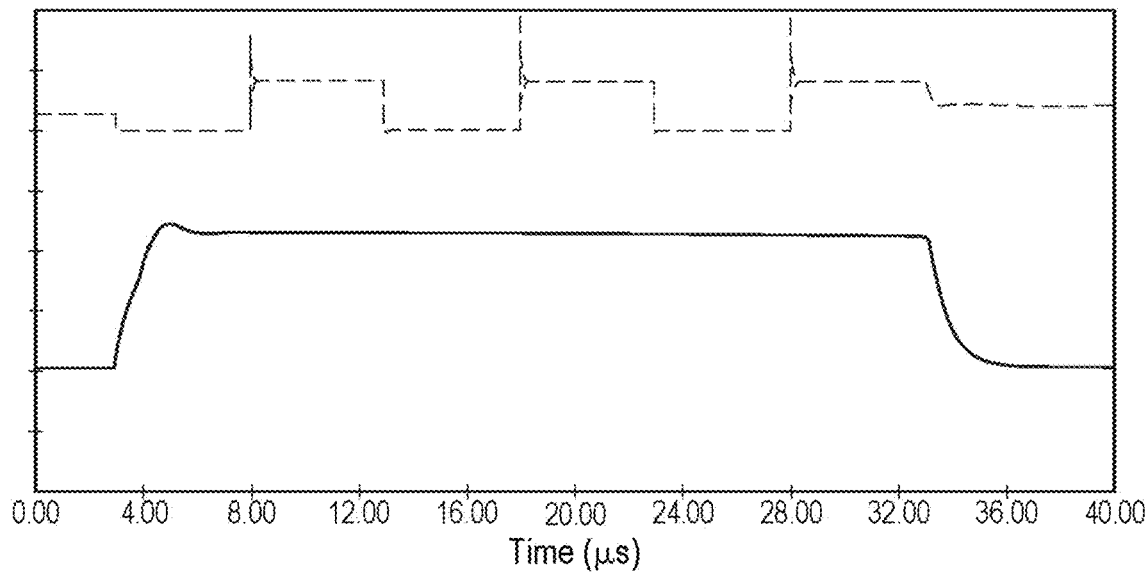
FIG. 11B is an example of an output waveform produced from the pulse generator shown in FIG. 11A compared with the input waveform.

FIG. 11B is an example of an output waveform produced from the pulse generator shown in FIG. 11A compared with the input waveform. A 200 V input square wave (dashed) was provided via $V_{CH}$. As shown, the output waveform (solid) has a sharp rise time and maintains a clean flat top with very little ripple.

Figure 11C:
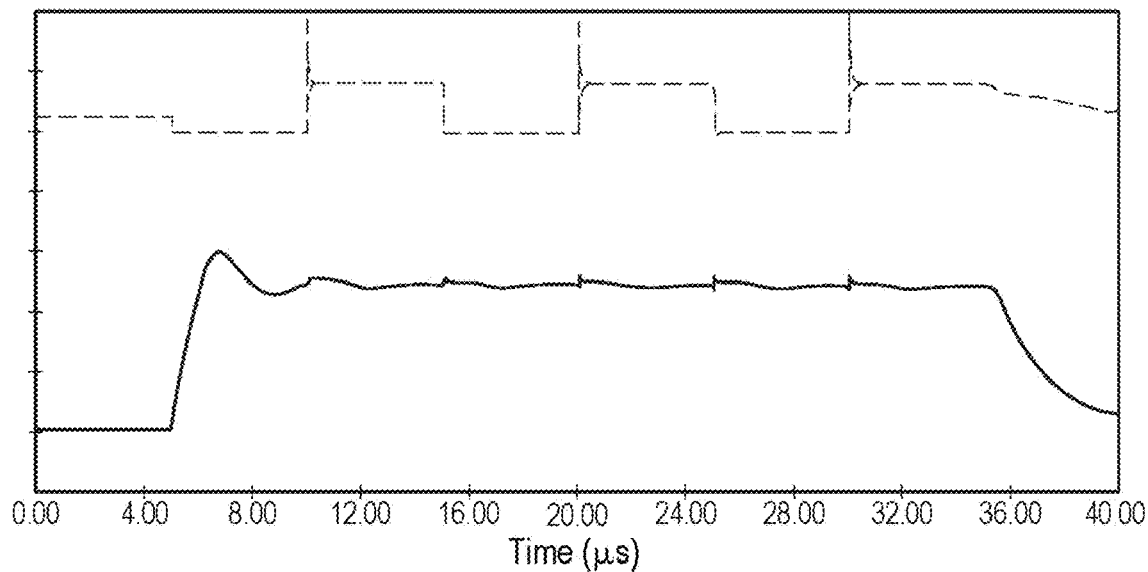
FIG. 11C is an example of an output waveform produced from the pulse generator shown in FIG. 11A compared with the input waveform.

FIG. 11C is an example of an output waveform produced from the pulse generator shown in FIG. 11A compared with the input waveform with the load resistor, $R_L$, replaced with a 1 kOhm resistor. In this example, the output waveform is substantially similar yet with the waveform in FIG. 11B but with a higher overshoot and with more ringing.

Figure 12A:
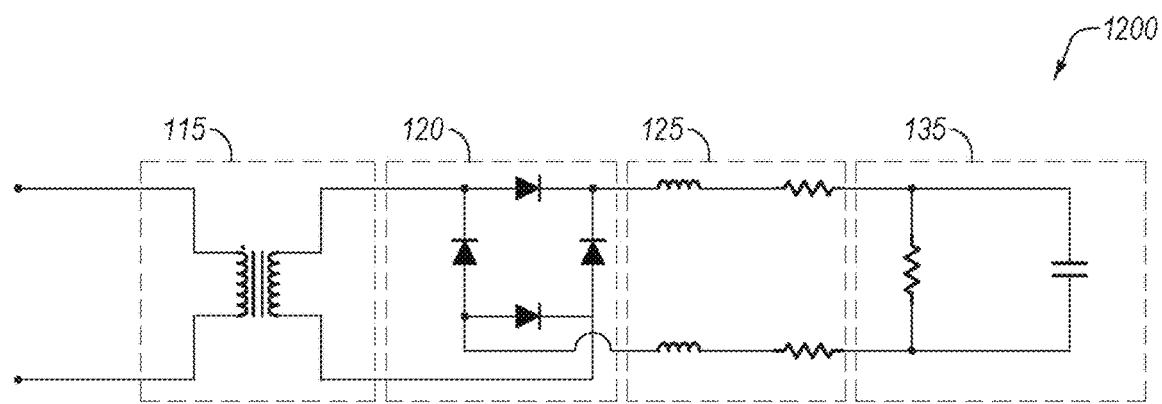
FIG. 12A is an example circuit diagram 1200 of a portion pulse generator according to some embodiments described in this document.

FIG. 12A is an example circuit diagram 1200 of a portion of a pulse generator according to some embodiments described in this document. The circuit diagram 1200 shows a transformer stage 115 that includes a 1:5.5 transformer. The circuit diagram 1200 also shows a rectifier stage 120, a filter stage 125, and an output stage 135. The filter stage 125 in this example includes circuit elements that include a single 125 μH inductor and a single 10 ohm resistor. While this example shows specific circuit elements with specific values, various other elements may be included. The output stage 135 includes a 250 Ohm load with 2 nF capacitance.

Figure 12B:
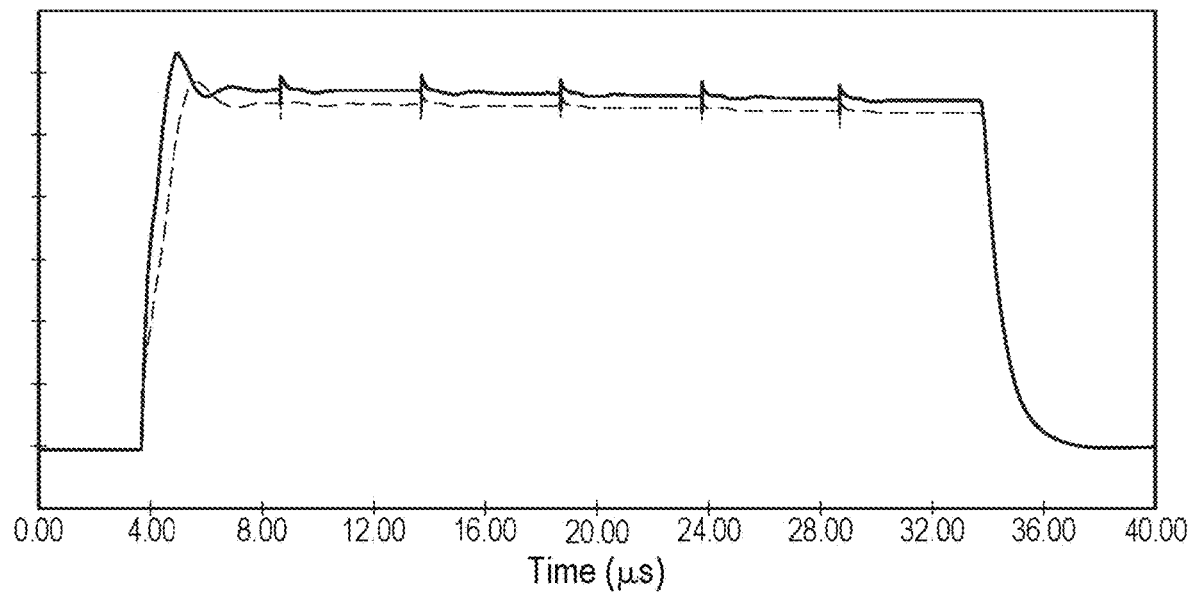
FIG. 12B is an example of an output waveform produced from the pulse generator shown in FIG. 12A compared with the output waveform produced from the pulse generator shown in FIG. 11A.

FIG. 12B is an example of an output waveform produced from the pulse generator shown in FIG. 12A compared with the output waveform produced from the pulse generator shown in FIG. 11A. The removal of one inductor and one resistor can provide for a faster rise time and/or a higher output voltage.

Some embodiments include a pulse generator that produces a square wave with one or more of the following waveform specifications: a frequency range of 0.1 Hz to 10 MHz, a pulse width range of 10 ns to 10 s, a rise time (and/or a fall time) of 1 ns to 100 μs, a duty cycle between 0 and 100%, a flat top ripple range between 0 and 200%, and an output voltage of more than 1 kV, 2 kV, 5 kV, 10 kV, 30 kV, 100 kV, 300 kV, 1,000 kV.

Embodiments described within this document may include a pulse generator that produces an arbitrary and/or variable waveform with one or more of the following waveform specifications: a frequency range of 0.1 Hz to 10 MHz, a pulse width range of 10 ns to 10 s, a rise time and/or a fall time of 1 ns to 100 μs, a duty cycle between 0 and 100%, a dI/dt between 10 A/s to 1,000 kA/μs and an output voltage of more than 1 kV, 2 kV, 5 kV, 10 kV, 30 kV, 100 kV, 300 kV, 1,000 kV.

Embodiments described within this document may include a pulse generator that produces both high frequency pulses (e.g., pulses with a frequency greater than 10 kHz) and low frequency pulses (e.g., pulses with a frequency less than 1 Hz or a DC pulse). Such a pulse generator may also output voltages above 2 kV.

Embodiments described within this document may include a pulse generator that produces a high voltage DC pulse with a rise time of less than 10 μs (or a rise time less than 1 μs), an output voltage greater than 1 kV, and/or a ripple between 2% and 50%.

Figure 13A:
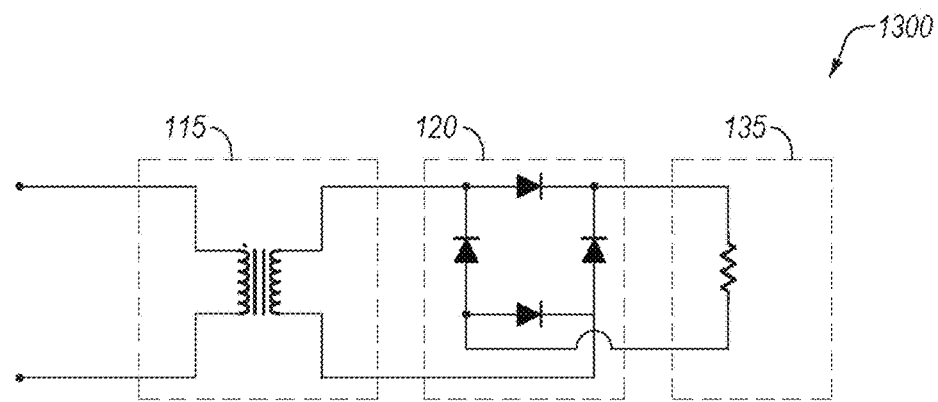
FIG. 13A is an example circuit diagram of a portion of a pulse generator according to some embodiments described in this document.

FIG. 13A is an example circuit diagram 1300 of a portion of a pulse generator according to some embodiments described in this document. The circuit diagram 1300 shows a transformer stage 115 that includes a 1:5.5 transformer. The circuit diagram 1300 also shows a rectifier stage 120 and an output stage 135, but no filter stage 125. The output stage 135 includes a 250 Ohm load.

Figure 13B:
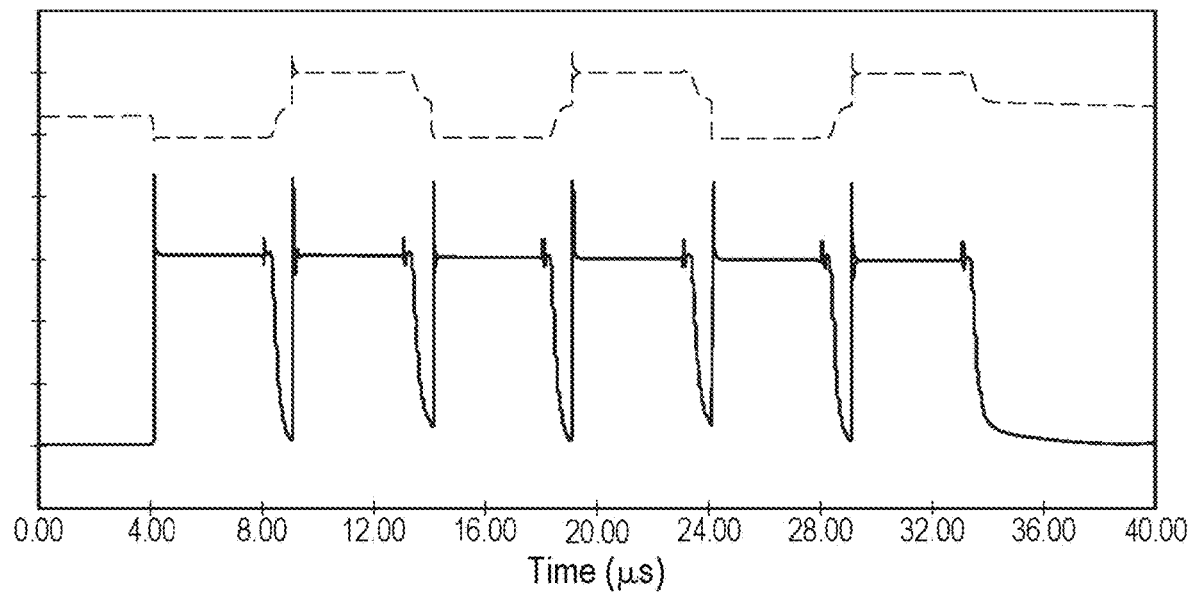
FIG. 13B is an example of an output waveform produced from the pulse generator shown in FIG. 13A.

FIG. 13B is an example of an output waveform compared with the input waveform. A 50 V input square wave (dashed) was provided via $V_{CH}$. As shown, the output waveform (solid) has a very sharp rise time (e.g., about 50 ns) and has a high duty cycle (e.g., about 70%). Various other duty cycles may be used such as, for example, duty cycles of any percentage between 0% and 100%. In some embodiments, the duty cycle may change over time.

Figure 14A:
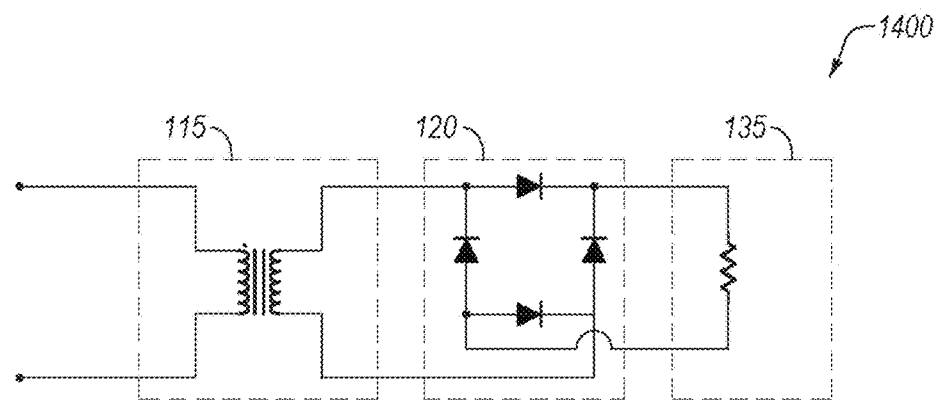
FIG. 14A is an example circuit diagram of a portion of a pulse generator according to some embodiments described in this document.

FIG. 14A is an example circuit diagram 1400 of a portion of a pulse generator according to some embodiments described in this document. The circuit diagram 1400 shows a transformer stage 115 that includes a 1:5.5 transformer. The circuit diagram 1400 also shows a rectifier stage 120 and an output stage 145, but no filter stage 125. The output stage 145 includes a 250 Ohm load.

Figure 14B:
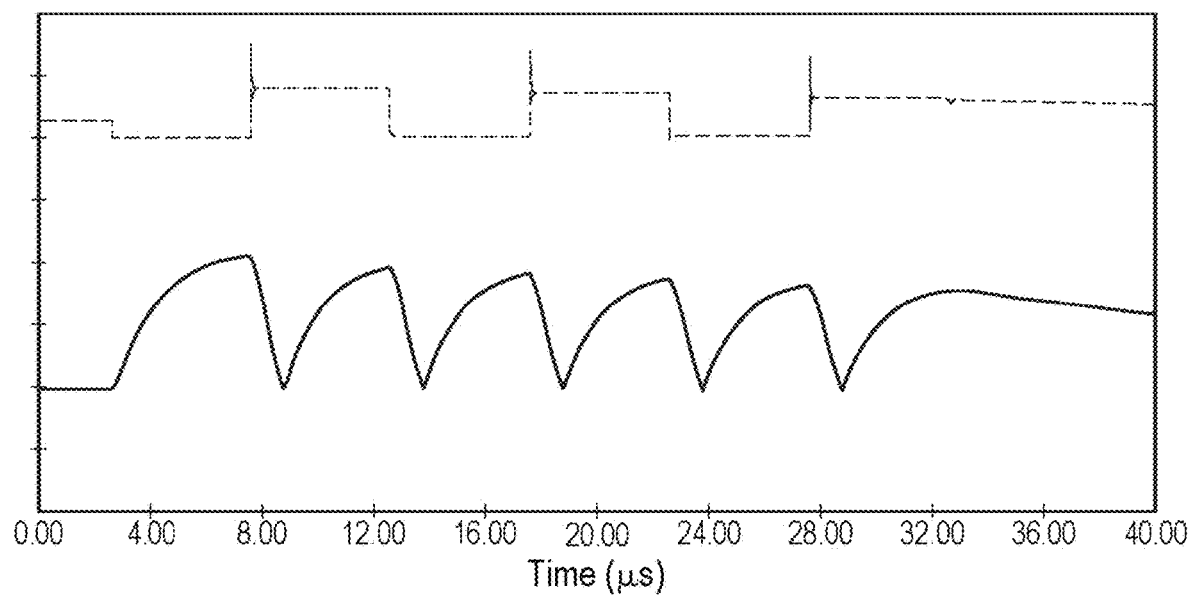
FIG. 14B is an example of an output waveform produced from the pulse generator shown in FIG. 14A.

FIG. 14B is an example of an output triangular wave waveform compared with the square wave input waveform. A 200 V input square wave (dashed) was provided via $V_{CH}$.

As shown, the triangular wave output waveform (solid) has a gradual rise time (e.g., about 4 μs) and a gradual fall time, which creates the triangular wave shape. The output waveform has an amplitude of 1,000 volts.

In some embodiments, a pulse generator may produce a plurality of pulses at high frequency (e.g., greater than 2 kHz) and high voltage (e.g., greater than 2 kV) for a period of time, pause for a period of time, and then begin pulsing at another frequency or the same frequency and high voltage for another period of time. The pulse generator may repeat this process over and over again. In some embodiments, the frequency and/or voltage of each set of pulses may vary.

In some embodiments, the various pulse generators described in this document may generate high voltage pulses (greater than 2 kV), with fast rise times (e.g., less than 100 ns) as well as with long and/or variable pulse widths and/or variable duty cycles. Pulse generators often cannot generate pulses that are a combination of fast features (e.g., fast rise times) and slow features (e.g., long pulses). Some embodiments described in this document can combine fast features with slow features.

Figure 15:
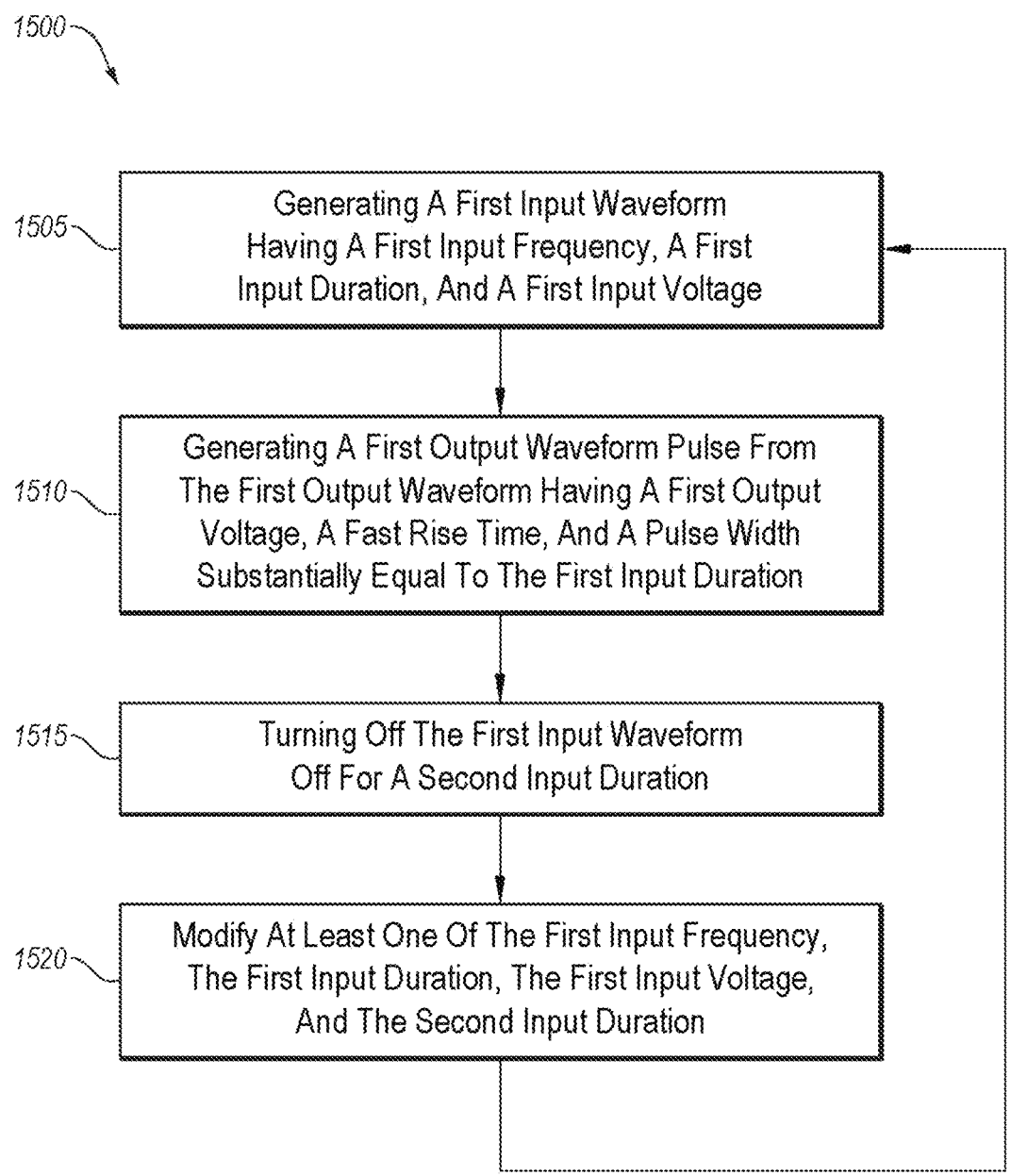
FIG. 15 is a flowchart of a process for producing an arbitrary pulse width output signal according to some embodiments described in this document.
Figure 16:
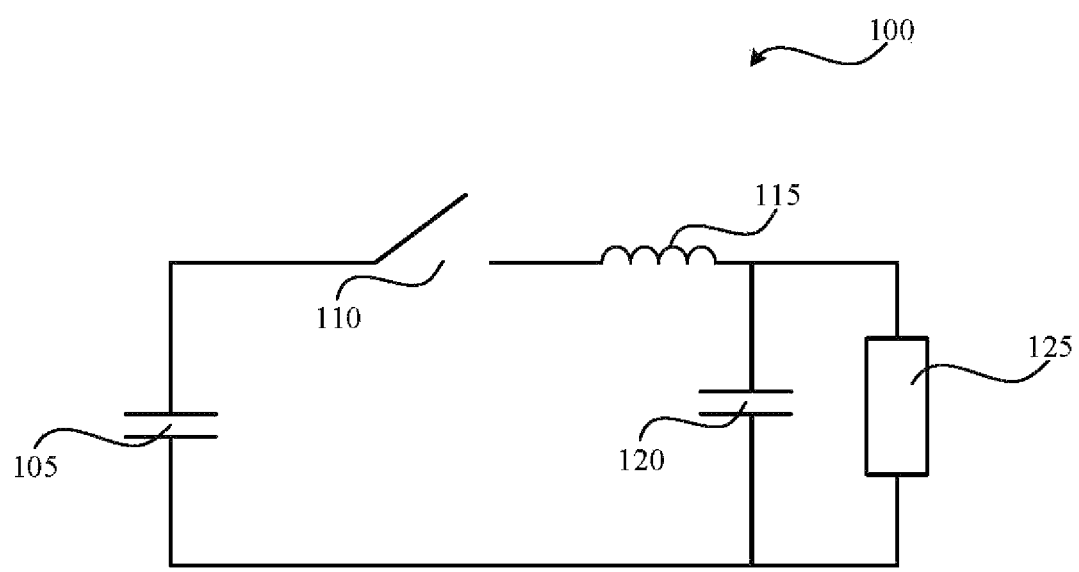
FIG. 16 is a block diagram of a switching circuit according to some embodiments.

FIG. 15 is a flowchart of a process 1500 for producing an arbitrary pulse width output signal according to some embodiments described in this document. Process 1500 begins at block 1505 where a first input waveform is generated that has a first input frequency, a first input duration, and a first input voltage. In some embodiments, the first input waveform may be generated from the driver stage 105. For example, the first input waveform may have a voltage of 200 volts to 2,000 volts and/or has a frequency greater than 10 kHz. The first duration may include any period of time. In some embodiments, the first duration may be longer than two periods of the first input frequency. In some embodiments, the first duration may be between 10 μs and 10 seconds.

At block 1510 a first output waveform is generated from the first output waveform having at least one of a first output voltage, a fast rise time, and/or a pulse width substantially equal to the first input duration. In some embodiments, the first output voltage may be directly proportional with the first input voltage. In some embodiments, the first output voltage may be greater than 2 kV. In some embodiments, the fast rise time may include a rise time less than about 5 μs or less than about 100 ns. Various other fast rise times and/or output voltages may be used.

At block 1515 the first input waveform may be turned off for a second input duration. The first input waveform may be considered turned off when the waveform produces zero volts or a voltage at a DC bias voltage level. The second input duration, for example, may include any period of time. For example, the second input duration may be longer than the rise time and/or the first input duration. As another example, the second input duration may be less than one period of the first input frequency. The second input duration may include any period of time.

At block 1520, at least one of the first input frequency, the first input duration, the first input voltage, and the second input duration may be modified so a subsequent pulse may have a different output voltage, a different output duration, and/or a different period of time when the pulse produces zero volts or a voltage at a DC bias level.

After block 1520, the process 1500 may be repeated any number of times without limitation. In some embodiments, during at least one cycle of process 1500 none of the first input duration, the first input voltage, and the second input duration may be modified in block 1520.

The fast switching found in the driver stage 105 and the low inductance in various stages of a pulse generator may allow for fast rise times and/or variable pulse widths. Embodiments described within this document may also produce, for example, high voltage pulses with variable duty cycle and/or variable frequency.

In some embodiments, more than one pulse generator may be combined in any combination such as, for example, in serial and/or in parallel. In some embodiments, two pulse generators may be used with opposite polarities and configured substantially identically to create a square wave.

Systems and methods are disclosed to provide high voltage switching that generates clean square waveforms at a load with negligible ringing and/or overshoots at switching transitions. These systems and methods include pre-pulsing techniques that can mitigate ringing and/or voltage and current overshoots that can be caused by stray inductance and/or stray capacitance, and/or the interaction between the two, in a switching circuit. Further, these individual clean square pulses can then be combined to form longer square pulse outputs of up to DC duration. In some embodiments, a continuous applied current may be applied to the load. In some embodiments, square pulses can be combined to create two or more chains of pulses with variable or set pulse widths and/or the pulses are repeated at a set repetition frequency.

While some embodiments of the invention are described in conjunction with high voltage pulsing applications, embodiments are not limited to high voltage applications or pulsing applications. Indeed, in addition to high voltage applications (e.g., greater than 1 kV) some embodiments can extend to applications with voltages as low as 10 volts or 100 volts or 500 volts. In addition, some embodiments may extend to non-pulsing applications such as, for example, DC-DC converters, AC-DC converters, computers, electric cars, motor drives, inverters, solar power inverters, wind power inverters, etc.

Ringing can include oscillations of a pulsed signal that may dissipate after step response. In some cases, ringing may have a dissipation time that is greater than the length of the pulse. FIG. 17B is an example, of a square wave pulse with ringing. Ringing can be defined by the frequency of the oscillations, the overshoot voltage (e.g., the maximum voltage overshoot measured relative to the flat top voltage), and/or the dissipation time (e.g., the amount of time for the ringing to dissipate). It may be impossible to completely eliminate ringing, but it can be significantly reduced. Negligible ringing, for example, may include ringing that has an overshoot voltage less than about 1%, 5%, 10%, or 20% of the flattop voltage of the pulse.

Figure 30:
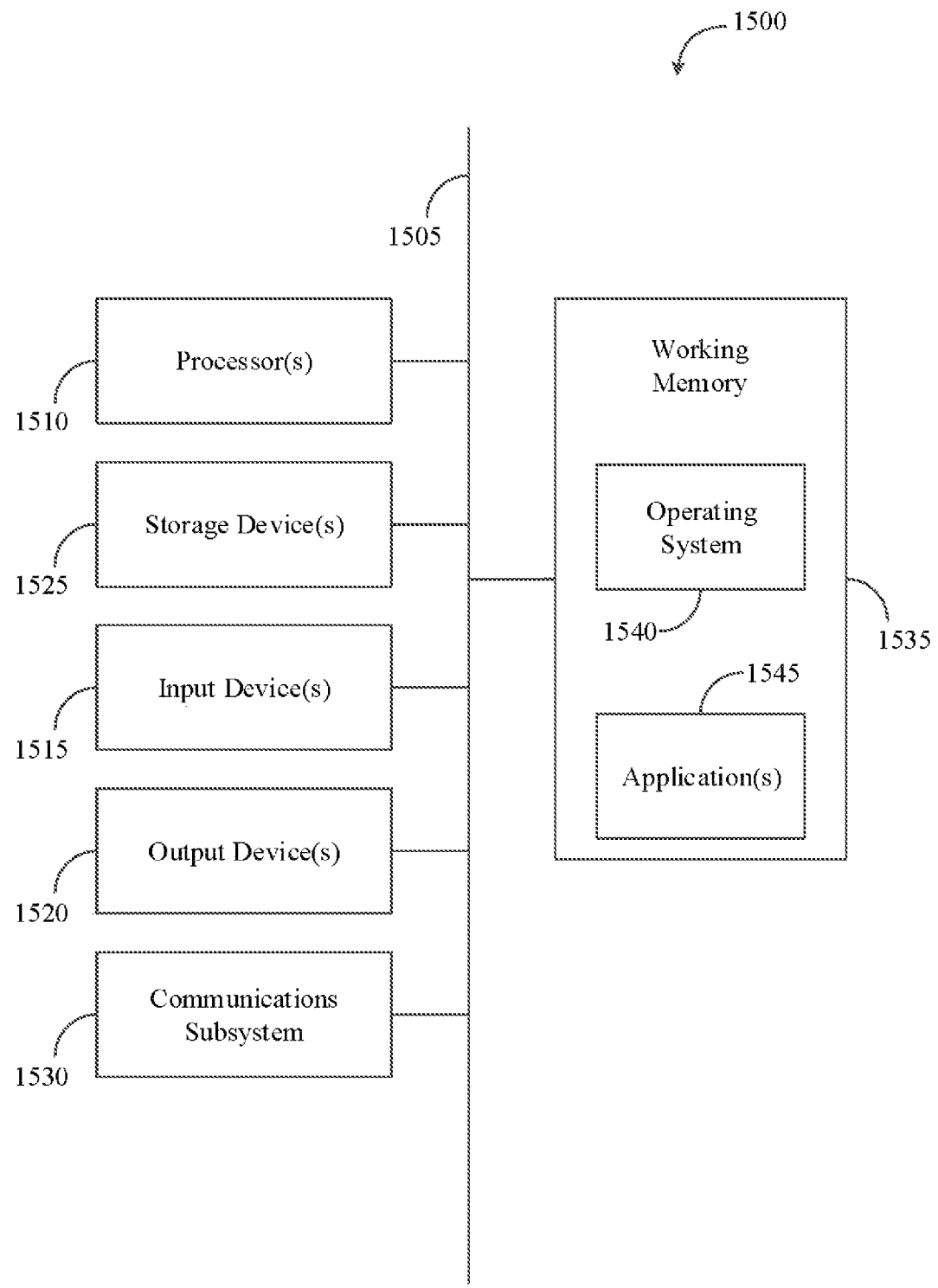
FIG. 30 shows an illustrative computational system for performing functionality to facilitate implementation of embodiments described herein.

FIG. 30 is a block diagram of a switching circuit 100. The switching circuit 100 includes a storage capacitor 105 (or high voltage power supply, or a battery), a switch 110, stray inductance 115, stray capacitance 120, and a load 125. The storage capacitor 105, for example, may represent any type of device that can store and release high voltage pulses when the switch 110 is closed. In addition, the storage capacitor 105 may include capacitance associated with any device that is used to store and release high voltage pulses when the switch 110 is closed. Any input voltage may be read across the storage capacitor 105. In some embodiments, the switch 110, including any other switch described in this document, may include any type of solid state switch such as, for example, IGBT, MOSFET, FETs, SiC, GAN, etc. switches.

The stray inductance 115 represents any inductance found within the switching circuit 100 including inductance associated with the switch 110. This may include inductance associated with any transformers, connections to the load 125, inductance within the load 115, and inductance in any other circuit elements. The stray capacitance 120 represents any capacitance found within the switching circuit 100 including capacitance associated with the switch 110. This includes capacitance associated with any transformers, connections to the load 125, capacitances within the load 115, and capacitance in any other circuit elements.

The load 125 may represent any type of load across which output voltage may be read and/or recorded. In some embodiments, the load may be resistive, capacitive, inductive, or any combination thereof. In some embodiments, an output voltage may be read across the stray capacitance 120.

Figure 17A:
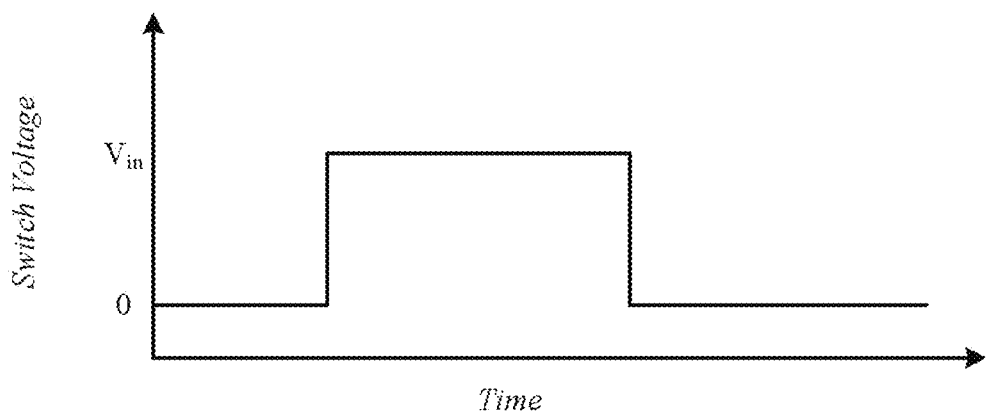
FIG. 17A illustrates a square pulse, switch voltage.
Figure 17B:
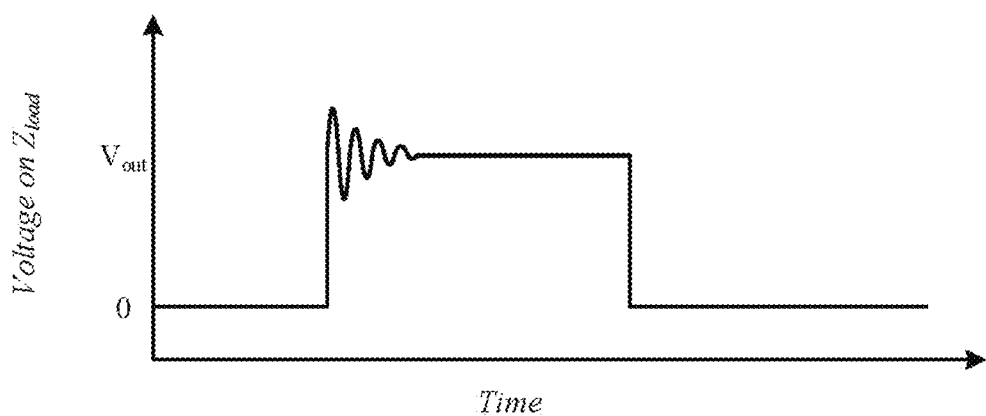
FIG. 17B illustrates a square pulse, load voltage resulting from the square pulse, switch voltage shown in FIG. 17A.

FIG. 17A illustrates switch voltage over time taking the form of a square pulse. The switch voltage, for example, may be a measure of the voltage between the switch 110 and all or part of the stray inductance 115. The square pulse may, for example, be generated by the storage capacitor 105 as a result of closing and opening of the switch 110. The square pulse, for example, may have a voltage greater than 100 V, 1 kV, 10 kV, or 100 kV and rise times of about 1-50 ns, 1-200 ns, or 1-10,000 ns.

FIG. 17B illustrates load voltage over time. As shown, the load voltage is a square pulse with a ringing feature where the voltage level over and under shoots the flat top output voltage $V_{out}$ for a period of time until a steady state flat top output voltage $V_{out}$ is achieved. The ringing may occur, for example, at the beginning of the square pulse and/or at the turn on portion of the square pulse. The amplitude of the ringing may be as much as triple the flat top output voltage $V_{out}$. The ringing may exhibit just an overshoot or just an undershoot, or any combination of undershoots and/or overshoots. In general, the ringing will decay away after some period that may be significantly less than or greater than the duration of the underlying pulse. This ringing can, for example, cause damage to the load or switching circuitry.

Ringing, for example, may result from the interaction between "stray" (or "parasitic") reactive circuit elements in the switching circuit. FIG. 30 is a block diagram of a switching circuit 100 showing the stray capacitance 120 and the stray inductance 115 represented as circuit components. Assuming, for example, the stray inductance 115 and the stray capacitance 120 are small (e.g., stray inductance, $L_s$, is less than about 1 nH, and/or the stray capacitance, $C_s$, may be less than about 1 pF, 10 pF, 100 pF), the intended behavior is as follows: When the switch 110 is closed the voltage on the storage capacitor 105 (e.g., the flat top output voltage $V_{out}$) is applied to the load 125. The load 125 may have an impedance $Z_{load}$. The current, found from $V_{charge}/Z_{load}$, flows through the switch 110 (e.g., when dI/dt=0). The switch 110 may open, at which point the voltage on the load 125 may return to zero. In some embodiments, the stray capacitance, $C_S$, and/or the stray inductance, $L_S$, may be negligible in comparison with other circuit elements. In some, but not all situations, the value of the storage capacitor 105 may be generally large enough to maintain a nominally constant voltage on the load 125 while the switch 110 is closed. The storage capacitor 105 may equivalently be a storage battery 105, or any other equivalent voltage source that maintains a relatively constant voltage during the operation of switch 110.

In some embodiments, $L_s$ and/or $C_s$ may be considered to be small and/or negligible when their presence does not meaningfully alter the desired behavior of the circuit. For example, this may occur when the quantity $(L_s C_s)^{0.5}$ is small compared to the switch transition time. The switch transition time may, for example, include the time it takes for the switch to transition from on to off, or off to on, or equivalently from conducting to non-conducting, or non-conducting to conducting. For example, small might be 1% or 10% or 100% of the switch transition time. In some embodiments, $(L_s C_s)^{0.5}$ may be approximately the quarter cycle ring time of $L_s$ and $C_s$.

Ringing may begin to arise when stray inductance 115 and stray capacitance 120 become non-negligible relative to the switching speed, such as, for example, in ranges of 1 nH to 10 µH and 1 pF to 1 µF, respectively. As current starts to flow through stray inductance 115, magnetic energy is stored inductively. The current passing through the stray inductance 115 continues to rise until the voltage on the stray capacitance 120 reaches the voltage on the storage capacitor 105, when the current reaches its maximum level, which may, for example, be greater than $V_{charge}/Z_{load}$. The inductance of the stray inductance 115 maintains current-flow in the forward direction, overcharging the stray capacitance 120 to a value greater than the flat top output voltage $V_{out}$ that would otherwise be applied directly to the load were the stray capacitance and inductance negligible. Depending on various parameters of the circuit, ringing may continue for multiple cycles as seen in FIG. 17 and/or may be quickly damped to flat top output voltage $V_{out}$ after the initial voltage overshoot.

In some embodiments, $L_s$ and $C_s$ may be considered non-negligible when their presence alters the circuit performance in a measurable or important way. For example, this may occur when the quantity $(L_s C_s)^{0.5}$ is large compared to the switch transition time. The switch transition time may, for example, include the time it takes for the switch to transition from on to off, or off to on, or equivalently from conducting to non-conducting, or non-conducting to conducting. For example, large might be 1, 10, or 100 times the switch transition time. In some embodiments, $(L_s C_s)^{0.5}$ may be approximately the quarter cycle ring time of $L_s$ and $C_s$.

The stray inductance 115 and/or the stray capacitance 120 are not intentional circuit elements. Instead, the stray inductance 115 and/or the stray capacitance 120 are generally distributed throughout the switching circuit 100 and/or may result from the physical geometry of the output traces, wires, and/or other components through which magnetic and electric energy may be stored or flow when the circuit is operated.

The ringing may be a result of the underdamped interaction between the stray capacitance 120 and the stray inductance 115. These elements have a natural ringing frequency, with a quarter period T/4. During switching timescales (the time it takes the switch to transition from open to closed), the switch may act as a resistive damping element and can mitigate ringing during its transition. However, as switching timescales approach or fall below the quarter period T/4, the switch is no longer resistive on the timescale of the ringing. When striving for fast rise times, generally on the order of 1,000 ns or less, the ringing may be worse than with slower rise times because the switches transition faster and there is less of a damping effect created by the switch. Further, once the switch has closed, there is minimal additional damping, and the stray inductance and capacitance are free to interact and ring. In addition, while the resistive damping of the switch can be considered a loss channel, the resulting ringing of a fast switch may also be considered an electrical loss. Some embodiments may improve the efficiency of a switching system by mitigating at least some or all of these types of switching losses.

In some embodiments, a short pre-pulse may be provided to a load prior to the main pulse by quickly closing the switch 110. This short pre-pulse may, for example, reduce or eliminate any ringing. In some embodiments, the pre-pulse may have a pulse width $t_{pp}$. In some embodiments, there may be a delay between the pre-pulse and the main pulse of $t_{delay}$. In some embodiments, the length of $t_{pp}$ and $t_{delay}$ may vary depending on the load 125, the stray capacitance 120, the stray inductance 115, and/or the flat top output voltage $V_{out}$. In some embodiments, the length of $t_{pp}$ and/or $t_{delay}$ may have a length less than about 1,000 ns. For example, $t_{pp}$ may have pulse width of 1 ns, 10 ns, 50 ns, 100 ns, 200 ns, 500 ns, 1,000 ns, etc. For example, $t_{delay}$ may be a delay of 0.1 ns, 1 ns, 10 ns, 50 ns, 100 ns, 200 ns, 500 ns, 1,000 ns, etc. In some embodiments, $t_{delay}$ may be less than $t_{pp}$.

In some embodiments, the pre-pulse switch may remain open after the main switch is closed. In this embodiment, $T_{delay}$ may be longer than $T_{pp}$ and/or may be as long or nearly as long as the pulse width of the main pulse.

In some embodiments, a pre-pulse may be produced that provides a short initial pulse to inject only enough charge from the storage capacitor 105 to charge the stray capacitance 120 (through the stray inductance 115) to the flat top output voltage $V_{out}$, and, for example, not higher. This total amount of energy is $\frac{1}{2} C_{stray} * V_{out}^2$, or a total charge of $Q = C_{stray} * V_{out}$, in addition to any current flowing through $Z_{load}$. The switch is closed for a time $t_{pp}$, usually on the order, for example, of 10-1,000 ns, and then reopened. During this time, the output voltage rises to the flat top output voltage $V_{out}$. The switch is held open for an appropriate time $t_{delay}$, for example, between 1 ns and 100 ns, and then the switch is closed again. The output that results is a pulse with greatly reduced overshoot and/or ringing and variable pulse width. Typical reductions in the overshoot and ringing would be greater than a factor of 2, and in some instances greater than a factor of 200. By charging stray capacitance 120 to the correct voltage with the initial pulse, when the switch is closed a second time, current does not need to flow to charge stray capacitance 120, which already sits at the flat top output voltage $V_{out}$. This eliminates the problem of the extra stored magnetic energy in the stray inductance 115 because when the switch is reclosed, the current flowing through the stray inductance 115 is identically $V_{out}/Z_{load}$, the steady-state value. The pre-pulse accomplishes two main things: injecting enough energy to only just charge stray capacitance 120 to the correct voltage, and ensure that the current through the stray inductance 115 is $V_{out}/Z_{load}$ when the switch re-closes. In some embodiments, the duration and delay settings of the pre-pulse may be set to accomplish these two items.

Figure 18:
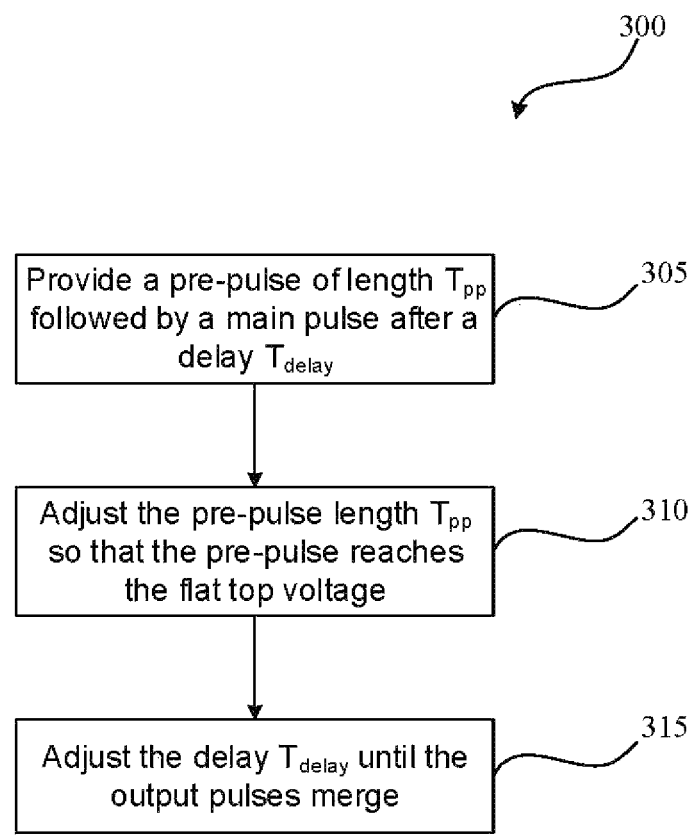
FIG. 18 is a flowchart of a process for calibrating a pre-pulse system according to some embodiments.

FIG. 18 is a flowchart of a process 300 for calibrating a pre-pulse system. Although illustrated as discrete blocks, various blocks may be divided into additional blocks, combined into fewer blocks, or eliminated, depending on the desired implementation. In some embodiments, the process 300 may be controlled by any processor or controller such as, for example, computational unit 1500 shown in FIG. 29. In some embodiments, the input devices of the computational unit 1500 may include one or more voltage or current sensors.

Figure 19A:
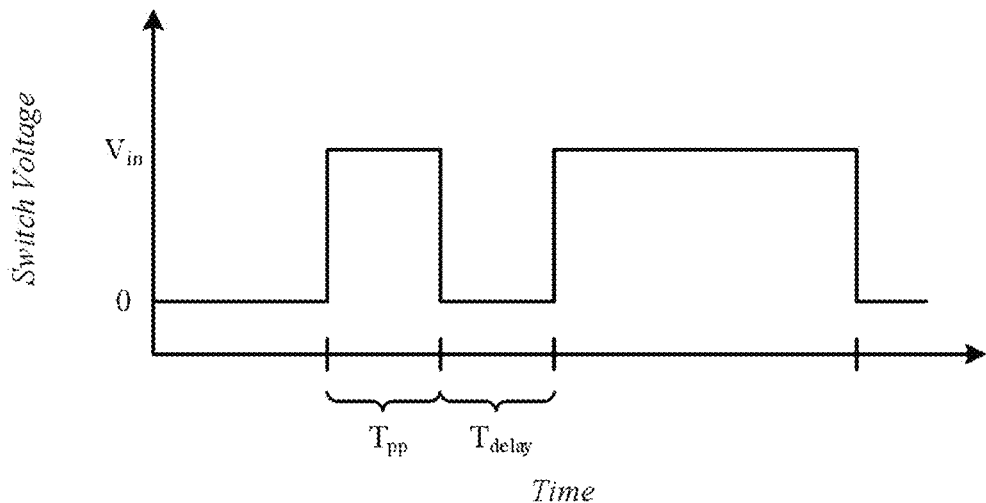
FIG. 19A illustrates a square pulse, switch voltage.
Figure 19B:
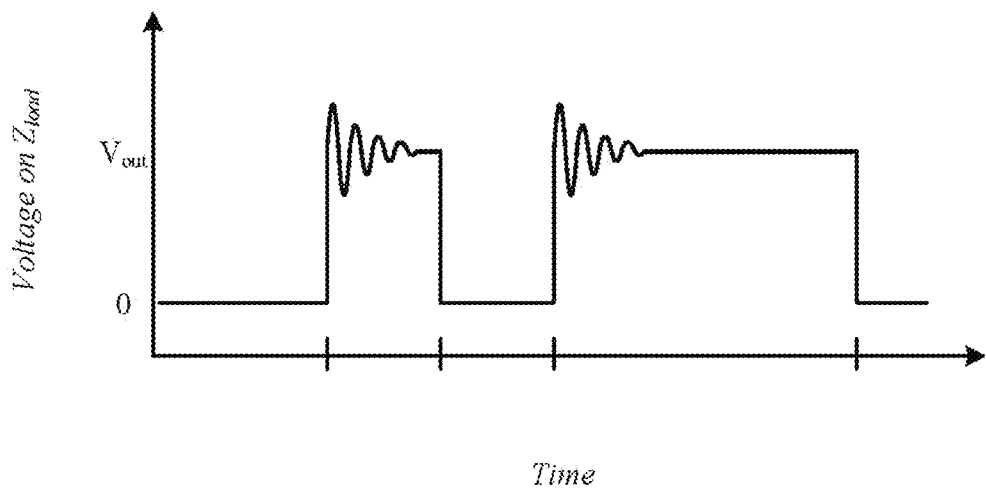
FIG. 19B illustrates a square pulse, load voltage resulting from the square pulse, switch voltage shown in FIG. 19A.

The process 300 starts at block 305, where a pre-pulse of length $T_{pp}$ may be followed by a main pulse after a delay $T_{delay}$. FIG. 19A shows an example pre-pulse and main pulse at a point between the switch 110 and the stray inductance 115. FIG. 19B shows the result output pulse at the load 125. As shown in FIG. 19B, at block 305 $T_{pp}$ may be set, for example, such that ringing and/or voltage overshoot may clearly be seen on the output pulse corresponding with the pre-pulse. In addition, the $T_{delay}$ may be set, for example, so that the main pulse is clearly separated from the pulse in the output waveform.

Figure 20A:
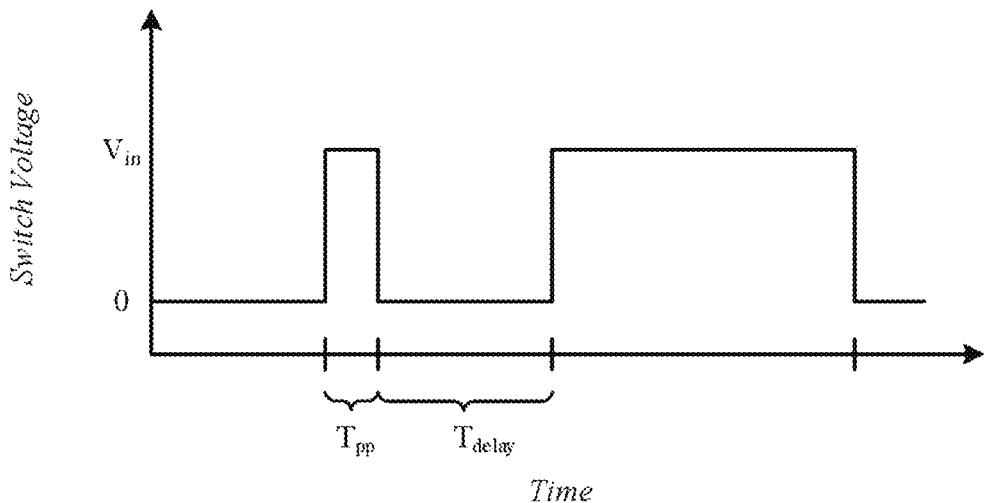
FIG. 20A illustrates a square pulse, switch voltage during a second calibration step.
Figure 20B:
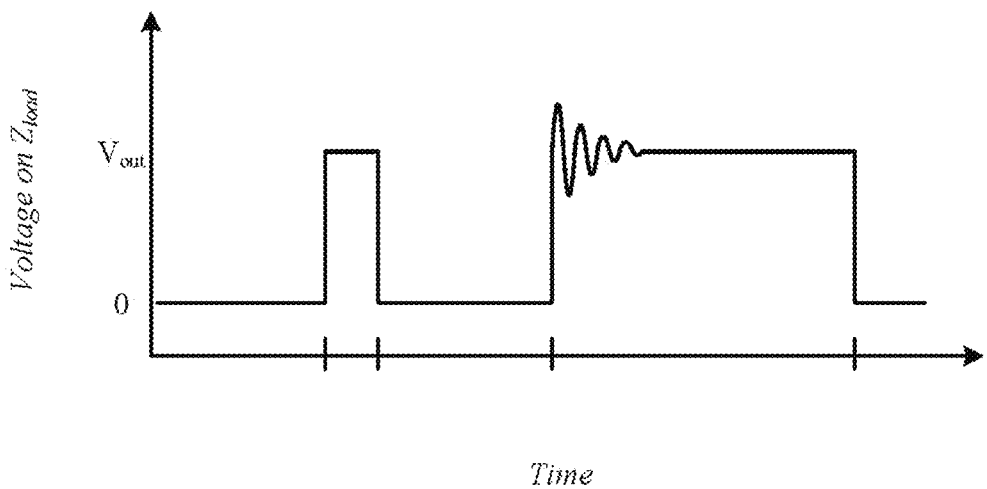

At block 310 the pre-pulse length $T_{pp}$ may be adjusted until the voltage reaches the flat top output voltage $V_{out}$, or a voltage that is substantially close to $V_{out}$. This adjustment may ensure that the amount of energy injected into the output while the switch is closed is enough to charge $C_{stray}$ to $V_{charge}$. $V_{out}$ and $V_{charge}$ may be substantially equal except for circuit losses such as, for example, losses in a switch or the output. An example of this input pulse is shown in FIG. 20A and the resulting output pulse is shown in FIG. 20B. For example, if the output voltage is less than $V_{out}$, the pre-pulse length $T_{pp}$ may be lengthened. As another example, if the output voltage is greater than $V_{out}$ the pre-pulse length $T_{pp}$ may be shortened. For example, the output may be shortened by 10%, 5%, or 1%.

Figure 21A:
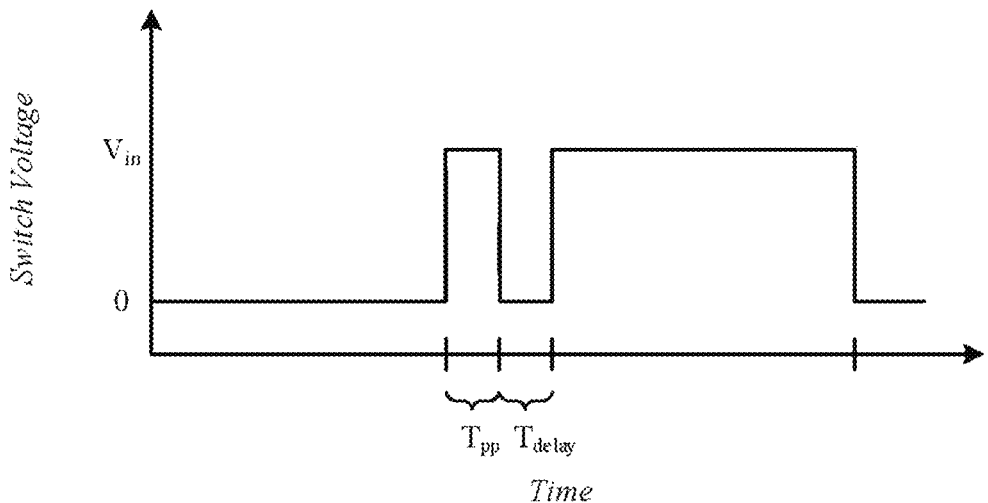
FIG. 21A illustrates a square pulse, switch voltage during a third calibration step.
Figure 21B:
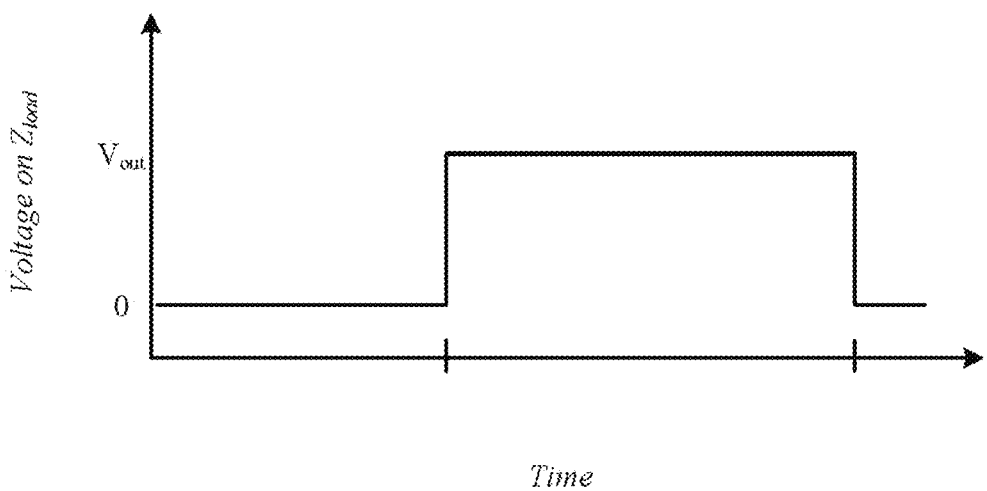
FIG. 21B illustrates a load voltage resulting from the square pulse, switch voltage shown in FIG. 21A during a third calibration step.

At block 315 the delay $T_{delay}$ may be adjusted until the output pulses merge as shown in FIG. 21A and FIG. 21B. The delay $T_{delay}$ may be adjusted using small incremental steps. The delay $T_{delay}$, for example, may be incremented to a new shorter delay $T_{delay}$, a new pre-pulse and pulse may be initiated by closing the switch 110, and a pre-pulse and pulse may be read from across the load 125. If the output pulses have not yet merged, the new shorter delay $T_{delay}$ may be incremented to a new even shorter delay $T_{delay}$, a new pre-pulse and pulse initiated by closing the switch 110, and the pre-pulse and pulse read from the load 125. This can be repeated until the pre-pulse and the pulse merge.

For example, the incremental adjustment may be some fraction of the initial delay $T_{delay}$. For example, if the initial delay $T_{delay}$ is 50 nanoseconds, the delay $T_{delay}$ may be incremented by the delay $T_{delay}$ divided by 100. In this example, the incremental delay may be 0.5 nanoseconds. As another example, if the initial delay $T_{delay}$ is 50 nanoseconds, then the delay $T_{delay}$ may be incremented by the delay $T_{delay}$ divided by 50. In this example, the incremental delay may be 1.0 nanoseconds.

In some embodiments, new pre-pulses and/or pulses may be generated, recorded, and/or analyzed before and/or after the various blocks of process 300.

Figure 22:
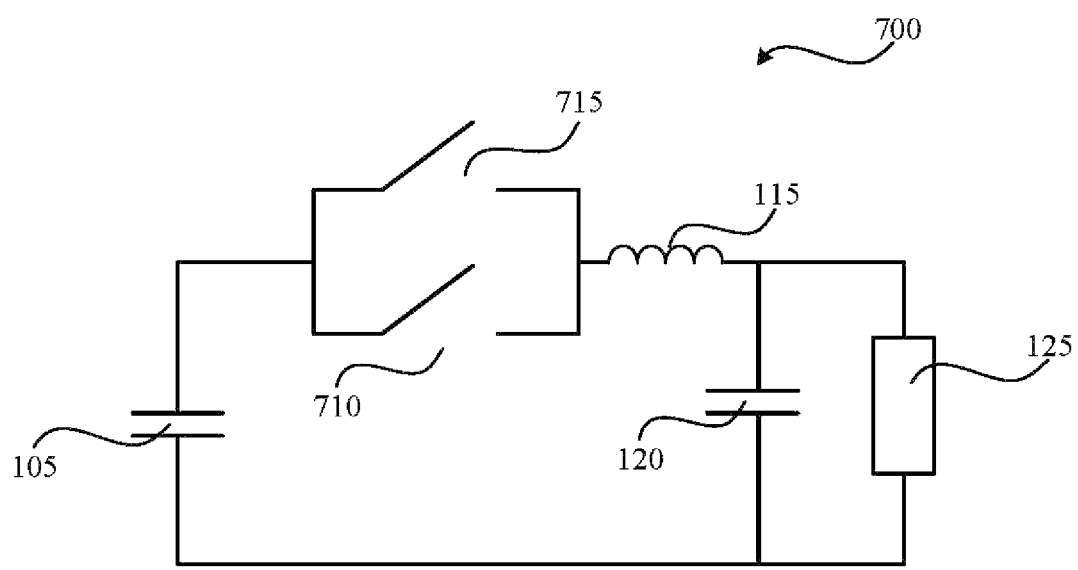
FIG. 22 is a block diagram of a load with two switches according to some embodiments.

FIG. 22 is a block diagram of a switching circuit 700 with two switches according to some embodiments. In this example, the switching circuit 700 may include a main switch 710 and a pre-pulse switch 715 rather than the switch 110. The pre-pulse switch 715 may be used to create the pre-pulse and/or to inject energy to charge the stray inductance 115. The main switch 710 may be open while the pre-pulse switch 715 is closed for the period of time $t_{pp}$. After the pre-pulse switch 715 has opened, the main switch 710 may be closed after delay $T_{delay}$. One of the reasons for pre-pulse switch 715 is to allow greater flexibility in the setting of $t_{pp}$ and $t_{delay}$. Not all switches that might be used in this invention allow for fast enough transitions that only a single switch can be used to set both the needed pre-pulse parameters as well as the main switch parameters.

Figure 23:
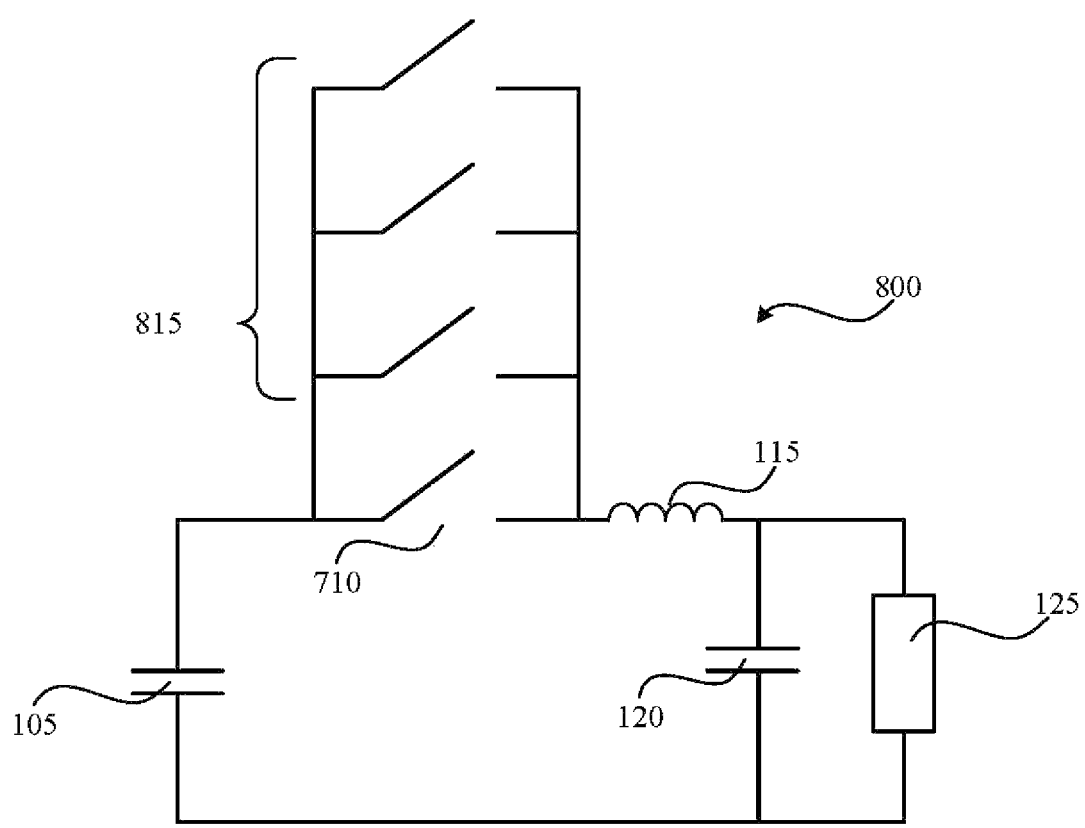
FIG. 23 is a block diagram of a load with a plurality of switches according to some embodiments.

FIG. 23 is a block diagram of a switching circuit 800 with a main switch 710 and a plurality of pre-pulse switches 815 according to some embodiments. In some embodiments, the main switch 810 may comprise one or more switching components. In some embodiments, the plurality of switches 815 may comprise one or more switching components. In some embodiments, the main switch 810 and the plurality of pre-pulse switches 815 may comprise one or more switching components.

Figure 24:
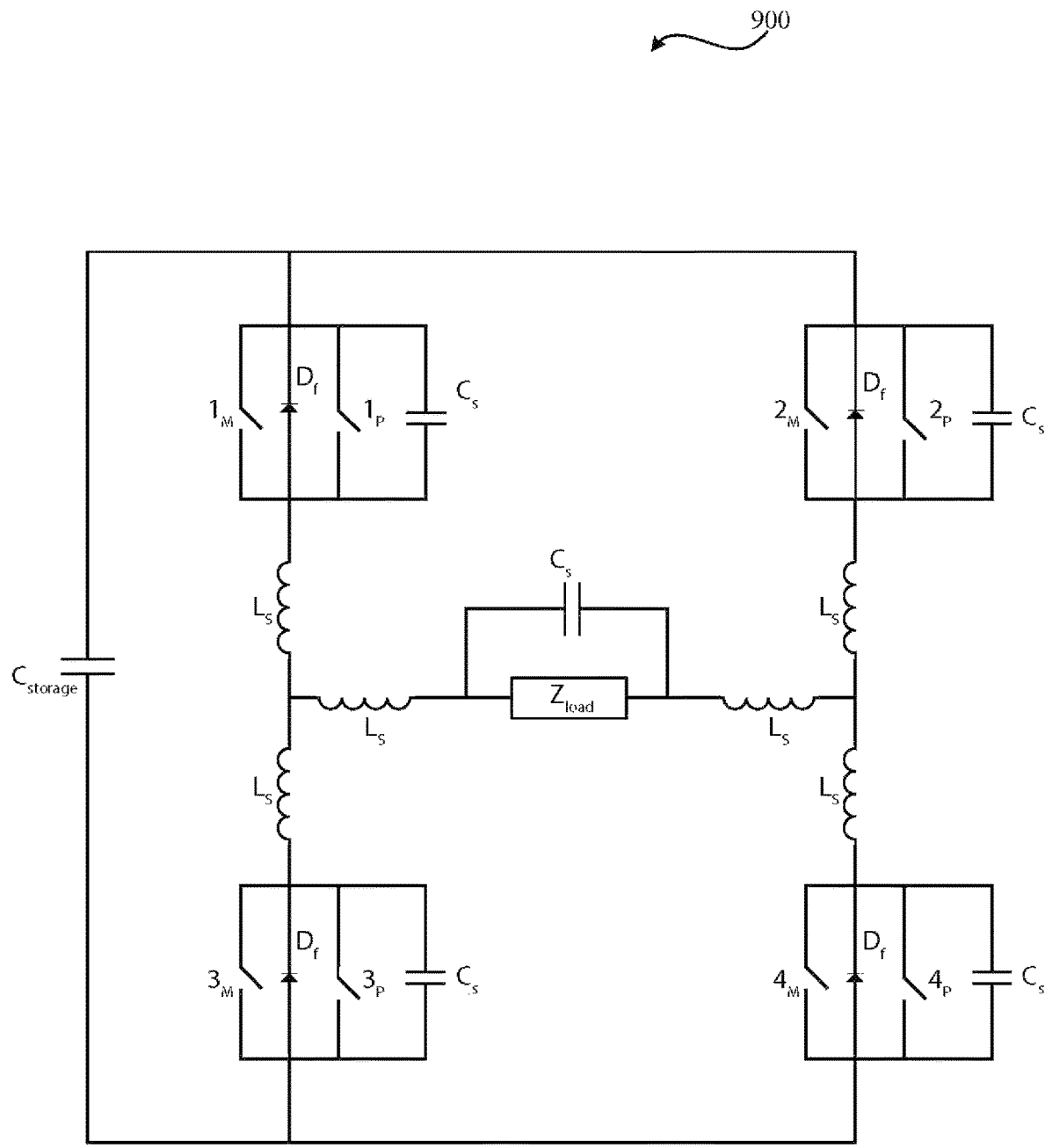
FIG. 24 is a block diagram of an H-bridge switching topology including pre-pulse switches according to some embodiments.

FIG. 24 is a block diagram of an H-bridge switching topology 900 including pre-pulse switches according to some embodiments. In order to drive a load with a bipolar square pulse (+V to −V rather than 0 to V), an H-bridge switching topology can be used as shown in FIG. 24. The pre-pulse switches are labeled in FIG. 24 with a subscript "P": $1_P$, $2_P$, $3_P$, and $4_P$. The main switches are labeled in FIG. 24 with a subscript "M": $1_M$, $2_M$, $3_M$, and $4_M$. The general functionality of the H-bridge is such that switches 1 and 4 closes at the same time, causing current to flow through the load in one direction. After these switches open, switches 2 and 3 close, and current flows the opposite direction through the load. In general, although this does not have to be the case, switches 1 and 4 receive the same gate signal, as do switches 2 and 3. In some embodiments, any time switch $1_M$ is closed, so is switch $4_M$. In some embodiments, any time switch $2_M$ is closed, so is switch $3_M$. In some embodiments, any time switch $1_P$ is closed, so is switch $4_P$. In some embodiments, any time switch $2_P$ is closed, so is switch $3_P$.

The H-bridge also has values for stray inductance, $L_s$, and stray capacitance, $C_s$, labeled in FIG. 24 as $L_s$ and $C_s$, respectively. Each instance of $L_s$ and $C_s$ may have a different value. The specific values of all the stray inductance, $L_s$, and stray capacitance, $C_s$, in some embodiments, may not of particular importance, since the pre-pulse settings allow for a wide variety of stray inductance, $L_s$, and stray capacitance, $C_s$, to be compensated for. In addition, stray inductance, $L_s$, and stray capacitance, $C_s$, may appear in many additional places in the circuit. Although the behavior may be more complicated than the switching circuit in FIG. 24, the result may be similar. As either switch pair closes, the $L_s$ of the current path through the load causes an overshoot in the voltage of $C_s$, and thus a voltage spike on $Z_{load}$. Some embodiments can be used to mitigate these voltage spikes in the same way as in the simple switching topologies described above. Note that the placement of $C_s$ and $L_s$ in FIG. 24 is an example of stray components at some relevant locations, but is not meant to be an exhaustive description of all stray components that may be found within a switching circuit. In some embodiments, a freewheeling diode $D_f$ can be placed as shown in parallel between each group of main and pre-pulse switches.

Figure 25A:
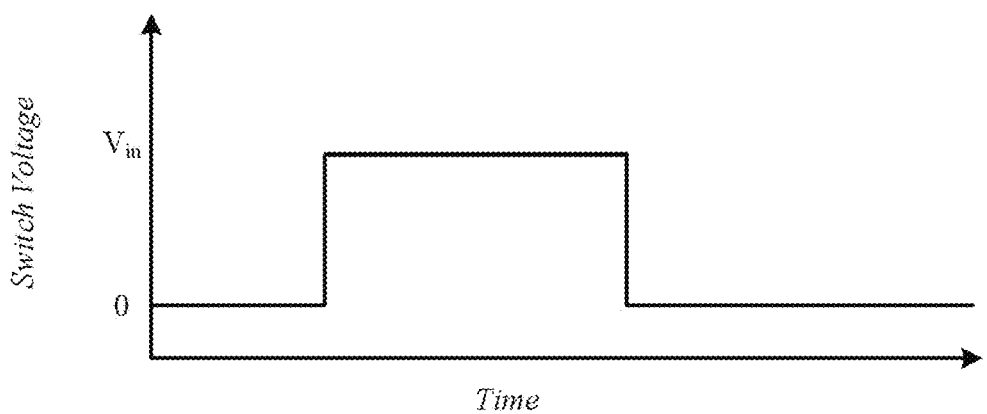
FIG. 25A illustrates a square pulse, switch voltage across two switches in FIG. 9.
Figure 25B:
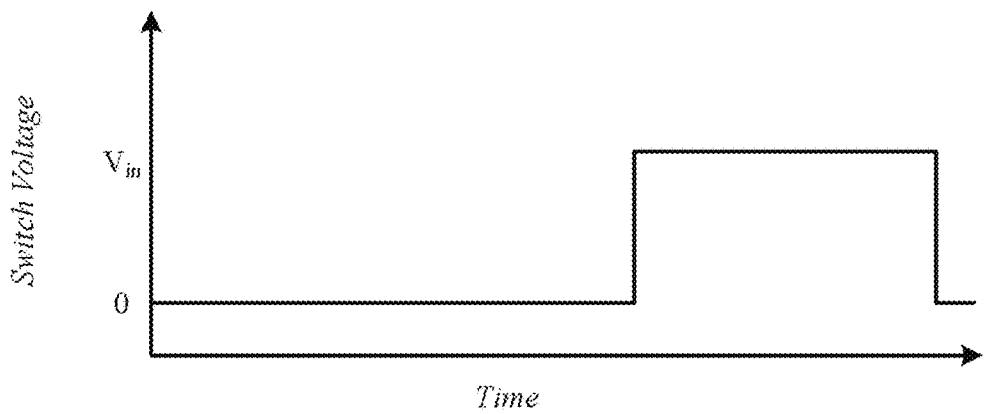
FIG. 25B illustrate a square pulse, switch voltage across two different switches in FIG. 9.
Figure 25C:
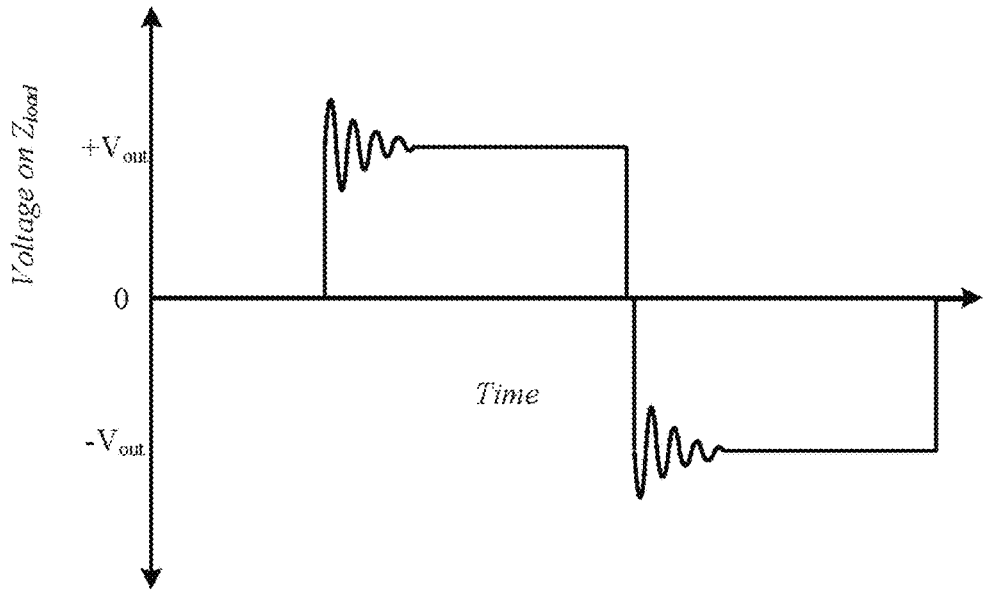
FIG. 25C illustrates a voltage across a load from the square pulses shown in FIG. 10A and FIG. 25B.

FIG. 25A and FIG. 25B illustrates a square pulse at switches $1_M$ and $4_M$ and $2_M$ and $3_M$ respectively. The closing of switches $1_M$ and $4_M$ creates a positive square pulse on $Z_{load}$ as shown as the first pulse in FIG. 25C. The closing of switches $2_M$ and $3_M$ create a negative square pulse on $Z_{load}$ as shown in the second pulse in FIG. 25C. In this example, the pre-pulse switches ($1_P$, $2_P$, $3_P$, $4_P$) are not used. The main switches ($1_M$, $2_M$, $3_M$, $4_M$) form an H-Bridge without the pre-pulse switches. In this case, the output square pulse profile will look as it does in FIG. 25C. As each switch pair closes, the stray inductance, $L_s$, in series with the closed switches and the load will overcharge the stray capacitor $C_s$, creating the voltage overshoots and ringing visible on the $Z_{load}$.

Figure 26A:
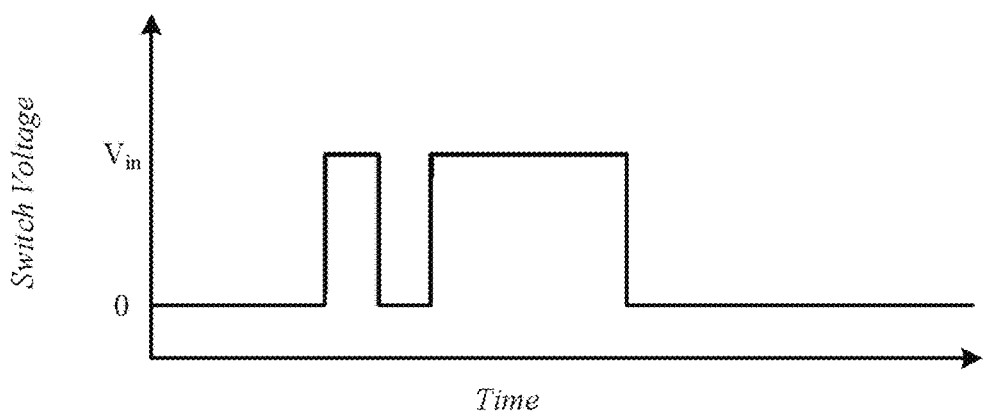
FIG. 26A illustrates a square pulse, switch voltage across two switches in FIG. 9.

FIG. 26A illustrates a square pre-pulse and square pulse at switches $1_P$ and $4_P$ (pre-pulses) and $1_M$ and $4_M$. The closing of switches $1_P$ and $4_P$ creates a pre-pulse and closing of the switches $1_M$ and $4_M$ creates a positive square pulse on $Z_{load}$ as shown in the first square wave of FIG. 26C.

Figure 26B:
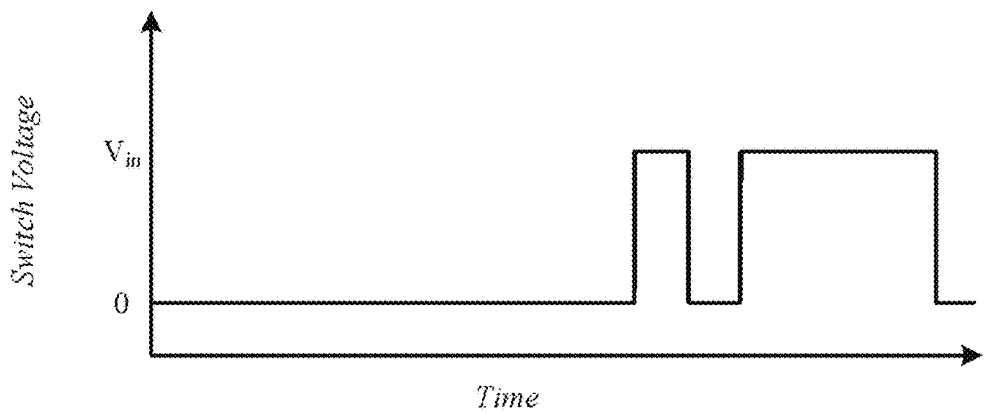
FIG. 26B illustrate a square pulse, switch voltage across two different switches in FIG. 9.
Figure 26C:
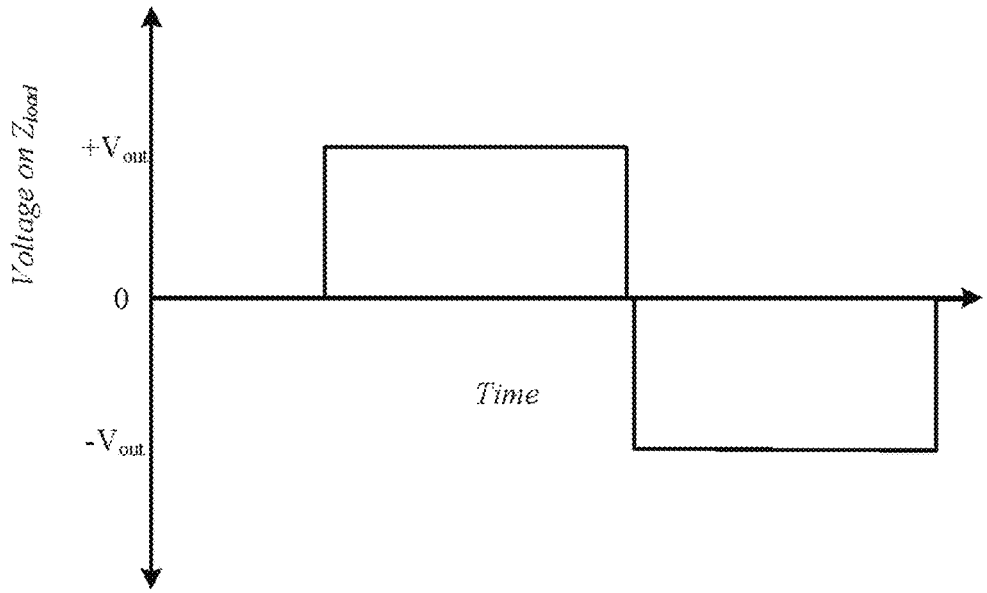
FIG. 26C illustrates a voltage across a load from the square pulses shown in FIG. 11A and FIG. 26B.

FIG. 26B illustrates a square pre-pulse and square pulse at switches $2_P$ and $3_P$ (pre-pulses) and $2_M$ and $3_M$. The closing of switches $2_P$ and $3_P$ creates a pre-pulse and closing of the switches $2_M$ and $3_M$ create a negative square pulse on $Z_{load}$ as shown as the second pulse in FIG. 26C. When the pre-pulse switches are enabled, the input pulses just before the $N_M$ (N=1, 2, 3, or 4, in this configuration, but could be any integer depending on the number of switches) switches close, the $N_P$ switches close briefly for the short pre-pulse duration $T_{pp}$ to charge the stray capacitance, $C_s$, and/or the stray inductance, Ls. These then reopen and all switches are open for $T_{delay}$. After $T_{delay}$, the pair of $N_M$ Main switches closes, applying a square pulse to the $Z_{load}$ and the already-charged stray capacitance, $C_s$, and/or the stray inductance, Ls. This method, when calibrated, for example, with process 300, may yield the output waveform on $Z_{load}$ as shown in FIG. 11C

Figure 27:
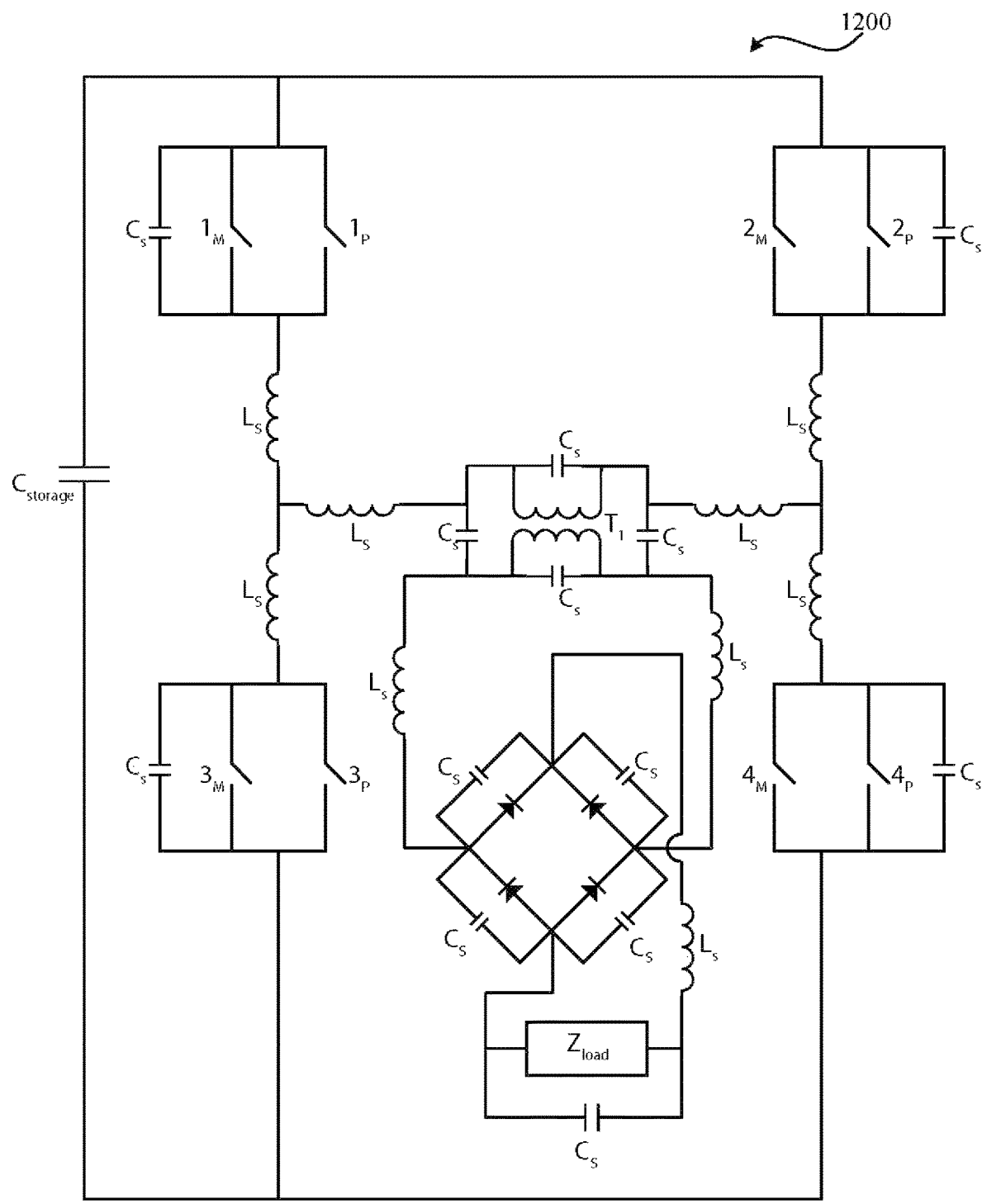
FIG. 27 is a block diagram of an H-bridge switching topology including pre-pulse switches and a rectified output according to some embodiments.

FIG. 27 is a block diagram of an H-bridge switching circuit 1200 including pre-pulse switches and a rectified output according to some embodiments. While the rest of the H-Bridge, including the setup of pre-pulse switches, is the same as in FIG. 24 a full-bridge rectifier may be placed between the switches and the load. This design ensures that every pulse applied to the load is polarized in the same direction, rather than bipolar. The diodes have an associated parallel $C_s$, inherent to standard diodes, which must be addressed in addition to the $C_s$ across the load. Note that as before, the placement of stray capacitance, $C_s$, and stray inductance, $L_s$, in the H-bridge switching circuit 1200 is an example of stray components at some relevant locations, but is not meant to be an exhaustive description of all stray components that the pre-pulse method attempts to address. For example, $C_s$ often appears across all of the switches, and all of the diodes used in the circuit, including all of the main switches, and all of the pre-pulse switches. In addition, numerous other elements may exist in the circuit, that contain $C_s$ and $L_s$, including various snubber elements that appear across the switches, and transformers that separate the load from the switches.

Each instance of $L_s$ and $C_s$ shown in FIG. 27 may have a different value. The specific values of all the stray inductance, $L_s$, and stray capacitance, $C_s$, in some embodiments, may not of particular importance, since the pre-pulse settings allow for a wide variety of stray inductance, $L_s$, and stray capacitance, $C_s$, to be compensated for. In addition, stray inductance, $L_s$, and stray capacitance, $C_s$, may appear in many additional places in the circuit.

Figure 28A:
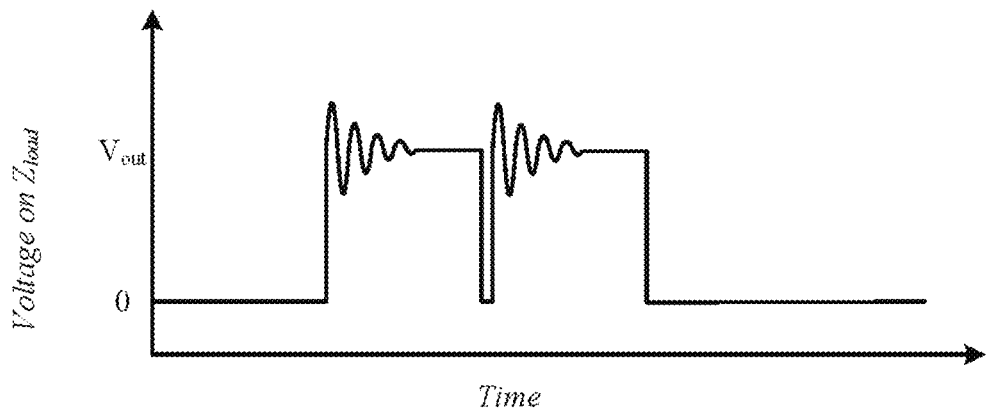
FIG. 28A illustrates a load voltage.

If the pre-pulse method is calibrated in the standard H-Bridge configuration such as, for example, in a manner as described in conjunction with process 300, and the rectifier is inserted afterward, the stray capacitance of the diodes may alter the output conditions enough to require recalibration. If this is the case, the output waveform across $Z_{load}$ may appear as shown in FIG. 28A. Calibration such as, for example, using process 300, may, for example, allow the pre-pulse switches to close for a different $T_{pp}$ that injects enough energy to charge the new value for $C_s$. This will result in the voltage waveform on $Z_{load}$ as seen in FIG. 28B.

In some embodiments, in the rectified output may include Transformer $T_1$ as shown in FIG. 27. The Transformer $T_1$ (e.g., a high voltage transformer) is disposed, prior to the rectifier. This could, for example, create a higher-voltage output pulse, and may result in additional $C_s$ and $L_s$ that may require additional calibration of the pre-pulse $T_{pp}$ and $T_{delay}$ parameters to achieve the output waveforms as in FIG. 28B.

Figure 28B:
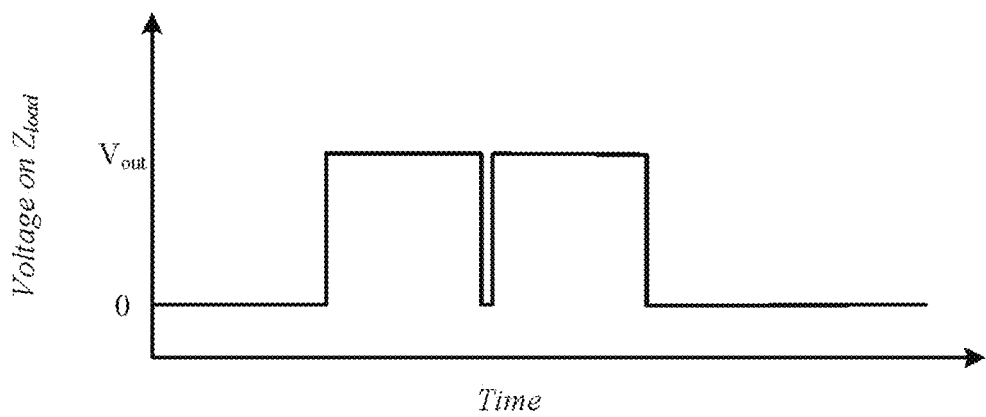
FIG. 28B illustrates a square pulse, switch voltage.
Figure 29A:
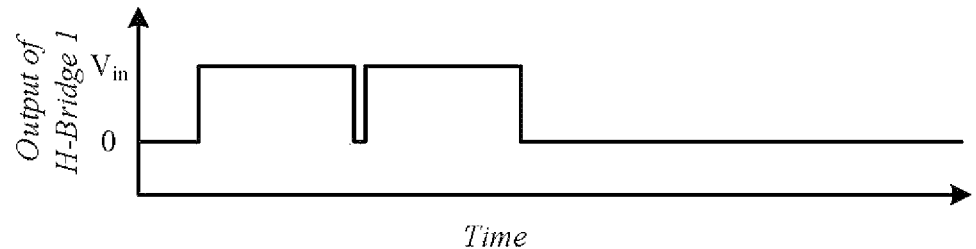
FIG. 29A illustrates a first square pulse, switch voltage at the load.
Figure 29B:
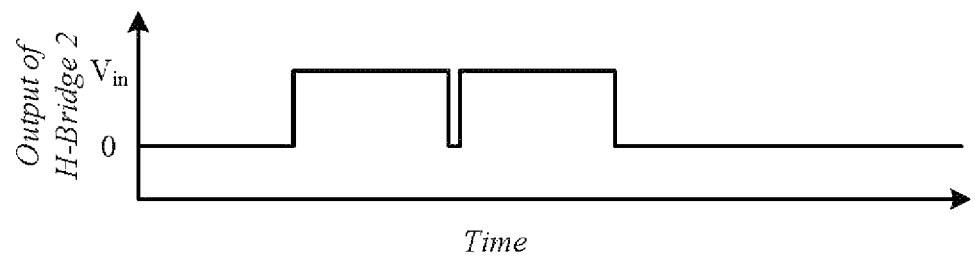
FIG. 29B illustrates a second square pulse, switch voltage at the load.
Figure 29C:
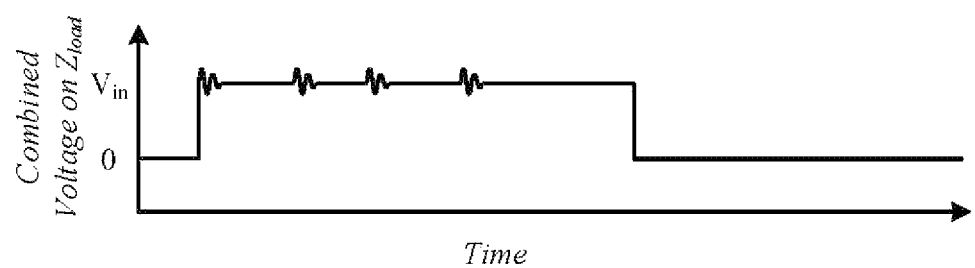
FIG. 29C illustrates a load voltage.
Figure 29D:
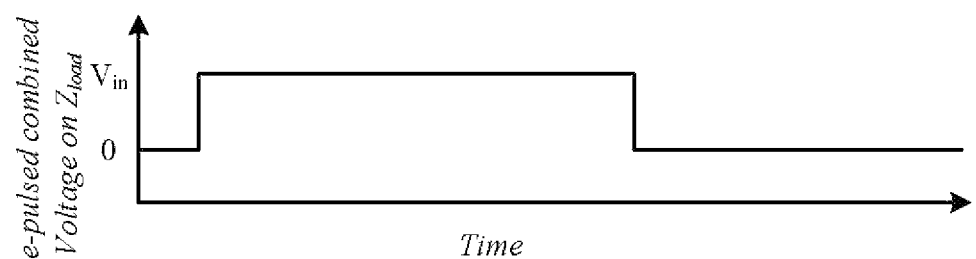
FIG. 29D illustrates a load voltage.

The rectified waveforms in FIG. 28B, and reproduced as FIG. 28A, exhibit a common issue in rectified square pulses from an H-Bridge: the "trenching" between output pulses. When attempting to create an arbitrarily long, single-sided output pulse by rectifying consecutive H-Bridge bipolar pulses, the trenching can be seen as a dip in the output waveform (after the rectifier) that occurs between switching cycles. This may possibly result from the time period between switching cycles, when all switches are open. While it is possible to reduce this time period to be on the order of 1 ns, 10 ns, 100 ns, 1000 ns, the risk is the increased chance of "shoot-through", which is the condition in which, either due to a drive circuitry jitter or something else, all four switches are closed at once. This may possibly create a short, low-impedance path through switches 1 and 3 (and/or switches 2 and 4) through which $C_{storage}$ may quickly discharge. The resulting high currents may, for example, damage traces, wires, or other delicate drive circuitry components nearby. As a result, this trench may possibly be a feature of the H-Bridge rectified output.

In some embodiments, this trenching problem can be solved by combining the output of two H-Bridge units phased relative to each other. The setup can be visualized as similar to switching circuit 1200 shown in FIG. 27 with a second rectified H-Bridge in parallel with the one shown as switching circuit 1200, and/or connected to the load. The phasing relationship between these two H-Bridges can be seen in FIG. 28A and FIG. 28B. The two pulses may be delayed/phased enough relative to each other such that the trenches of one H-Bridge output are present only when the other waveform has a flat-top. The phasing shown is not the only way to phase the H-Bridges. Although the duty-cycle in these plots is approaching 100%, a similar output could be achieved by duty cycles closer to 50%.

Upon applying the two phased waveforms in parallel to $Z_{load}$, the combined output in FIG. 28C will appear across the load. When the switches transition, there will be additional ringing atop the waveform. This is due to the fact that when one H-Bridge switches, it is switching "into" the output of the other H-Bridge. This may manifest itself, for example, as a change in the stray capacitance seen by the switching H-Bridge. Upon recalibration of the pre-pulse parameters, the waveform shown in FIG. 28D may appear on $Z_{load}$. Proper pre-pulse operation greatly reduces the ringing seen on the waveform. Ringing should be reduced by a factor of two, if not much more. Similarly, the residual depth of any remaining trench like feature should be reduced by a factor of two, if not more.

This configuration may be operated with a transformer (e.g., a pulsed transformer), with only the pre-pulse calibration parameters needing to change.

In some embodiments, the calibration of the pre-pulse parameters may be load dependent. This may be because of the critical condition that the current through $L_s$ be $V_{charge}/Z_{load}$ when the main switch closes. If the pre-pulse timing is calibrated with some load $Z_{load}$, this is akin to stating that the current through $L_s$ when the main switch closes, given the current calibration, is $V_{charge}/Z_{load}$. However, if the output impedance is changed to $Z_2$ where $Z_2 \neq Z_{load}$, then the parameters $T_{pp}$ and $T_{delay}$ may need to be recalibrated such that the current through the stray inductance is now $V_{charge}/Z_2$ when the main switch closes. This means, for example, that without recalibration, a change in load impedance, either due to a physical change by the operator or in the case of a dynamic load, will result in a waveform that exhibits ringing/overshoot behavior. In some embodiments, the current flowing through stray inductance $L_s$ may be substantially the same as the currently flowing through load $Z_{load}$. For example, the current flowing through stray inductance $L_s$ may be within 80%-120% of the current flowing through the load $Z_{load}$. Alternatively or additionally, the current flowing through stray inductance $L_s$ may be within 20%-200% of the current flowing through the load $Z_{load}$.

The gate drive circuitry of any supply using the pre-pulse method may be driven by an FPGA or equivalent microcontroller such as, for example, the computational system 1500. Calibration, for example, may occur in real-time. Which may, for example, allow for real-time adjusting of the pre-pulse calibration parameters to achieve square pulse pulses with greatly reduced ringing on a dynamic load. The output current and voltage can be measured, and this information allows the FPGA to make an accurate, pulse-by-pulse estimate of the load impedance. Through either a table of pre-programed values or an equation or set of equations and conditions, the FPGA can alter the parameters of $T_{pp}$ and $T_{delay}$ to remove ringing from the waveform on the load as the load changes, without having to go through the three-step calibration process.

Along with on-the-fly and/or real-time adjustment of the pre-pulse parameters, the integration of FPGA control allows for manipulation of other output characteristics via front-panel control. A user would be able to adjust output parameters such as pulse width, duty cycle, frequency, voltage, etc., either directly or indirectly through the setting of various front panel parameters. In addition, the FPGA would be able to monitor for fault conditions (over-current due to load shorting, etc.) and shut down the supply safely to avoid damage to the supply or load The computational system 1500 (or processing unit) illustrated in FIG. 29 can be used to perform and/or control operation of any of the embodiments described herein. For example, the computational system 1500 can be used alone or in conjunction with other components. As another example, the computational system 1500 can be used to perform any calculation, solve any equation, perform any identification, and/or make any determination described here. The computation system 1500 may include all or some of the components shown in FIG. 29. In some embodiments, the computation system 1500 may be programmed on an FPGA.

The computational system 1500 may include any or all of the hardware elements shown in the FIG. and described herein. The computational system 1500 may include hardware elements that can be electrically coupled via a bus 1505 (or may otherwise be in communication, as appropriate). The hardware elements can include one or more processors 1510, including, without limitation, one or more general-purpose processors and/or one or more special-purpose processors (such as digital signal processing chips, graphics acceleration chips, and/or the like); one or more input devices 1515, which can include, without limitation, a mouse, a keyboard, and/or the like; and one or more output devices 1520, which can include, without limitation, a display device, a printer, and/or the like. In some embodiments, the output device 1520 may include, for example, switch 110.

In some embodiments, an input device 1515 may include a voltage meter that can is configured to read the output voltage across a load (e.g., load 125). The input device 1515 may input the voltage wave forms shown in FIG. 17B, FIG. 19B, FIG. 20B, and/or FIG. 21B. Numerous additional voltage and or current waveforms derived from the circuit may be input into the computer, as may many other circuit parameters such as component temperatures, ambient temperature, etc.

The computational system 1500 may further include (and/or be in communication with) one or more storage devices 1525, which can include, without limitation, local and/or network-accessible storage and/or can include, without limitation, a disk drive, a drive array, an optical storage device, a solid-state storage device, such as random-access memory ("RAM") and/or read-only memory ("ROM"), which can be programmable, flash-updateable, and/or the like. The computational system 1500 might also include a communications subsystem 1530, which can include, without limitation, a modem, a network card (wireless or wired), an infrared communication device, a wireless communication device, and/or chipset (such as a Bluetooth® device, an 802.6 device, a Wi-Fi device, a WiMAX device, cellular communication facilities, etc.), and/or the like. The communications subsystem 1530 may permit data to be exchanged with a network (such as the network described below, to name one example) and/or any other devices described herein. In many embodiments, the computational system 1500 will further include a working memory 1535, which can include a RAM or ROM device, as described above.

The computational system 1500 also can include software elements, shown as being currently located within the working memory 1535, including an operating system 1540 and/or other code, such as one or more application programs 1545, which may include computer programs of the invention, and/or may be designed to implement methods of the invention and/or conFIG. systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 1525 described above.

In some cases, the storage medium might be incorporated within the computational system 1500 or in communication with the computational system 1500. In other embodiments, the storage medium might be separate from the computational system 1500 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 1500 and/or might take the form of source and/or installable code, which, upon compilation and/or installation on the computational system 1500 (e.g., using any of a variety of generally available compilers, installation programs, compression/decompression utilities, etc.), then takes the form of executable code.

Systems and methods are disclosed to generate high voltage waveforms with arbitrary pulse widths, voltages, and/or shapes. In some embodiments, a high voltage waveform generator may include a pulser (e.g., a nanosecond pulser) and a generator circuit. For example, a nanosecond pulser may produce a burst of high voltage pulses having a burst period $T_{br}$ and each pulse of the burst of pulses having a pulse width $T_p$. The generator circuit may produce an output pulse from the input burst of high voltage pulses. The output pulse, for example, may have a pulse width approximately the same as the burst period $T_{br}$. The output pulse, for example, may have a voltage that is a function of (e.g., proportional to) the pulse width $T_p$ of each pulse of the burst of pulses. The output pulse, for example, may have a voltage that is a function of (e.g., proportional to) the voltage $V_p$ of the input pulses, or the frequency of the input pulses, $f_p$.

In some embodiments, the peak power of the output pulses may be greater than about 1 kW, 10 kW, 100 kW, 1,000 kW, 10,000 kW, etc.

In some embodiments, the pulser may produce a burst train. Each burst train, for example, may include a plurality of bursts and each of the plurality of bursts may include a plurality of pulses. Each burst of the plurality of bursts (e.g., N bursts) may have a burst period (e.g., $T_{br1}$, $T_{br2}$, $T_{br3}$, ... $T_{brN}$). The resulting output of the high voltage waveform generator may include a plurality of pulse widths (e.g., $PW_{br1}$, $PW_{br2}$, $PW_{br3}$, ... $PW_{brN}$) proportional (e.g., roughly equal) to each burst period. In some embodiments, the burst periods may vary resulting in variable output pulse widths. In some embodiments, the output voltage amplitude may be proportional to the pulse width of each pulse within a burst. The voltage of each output pulse may also be proportional to the voltage and frequency of the input pulse burst.

Figure 31:
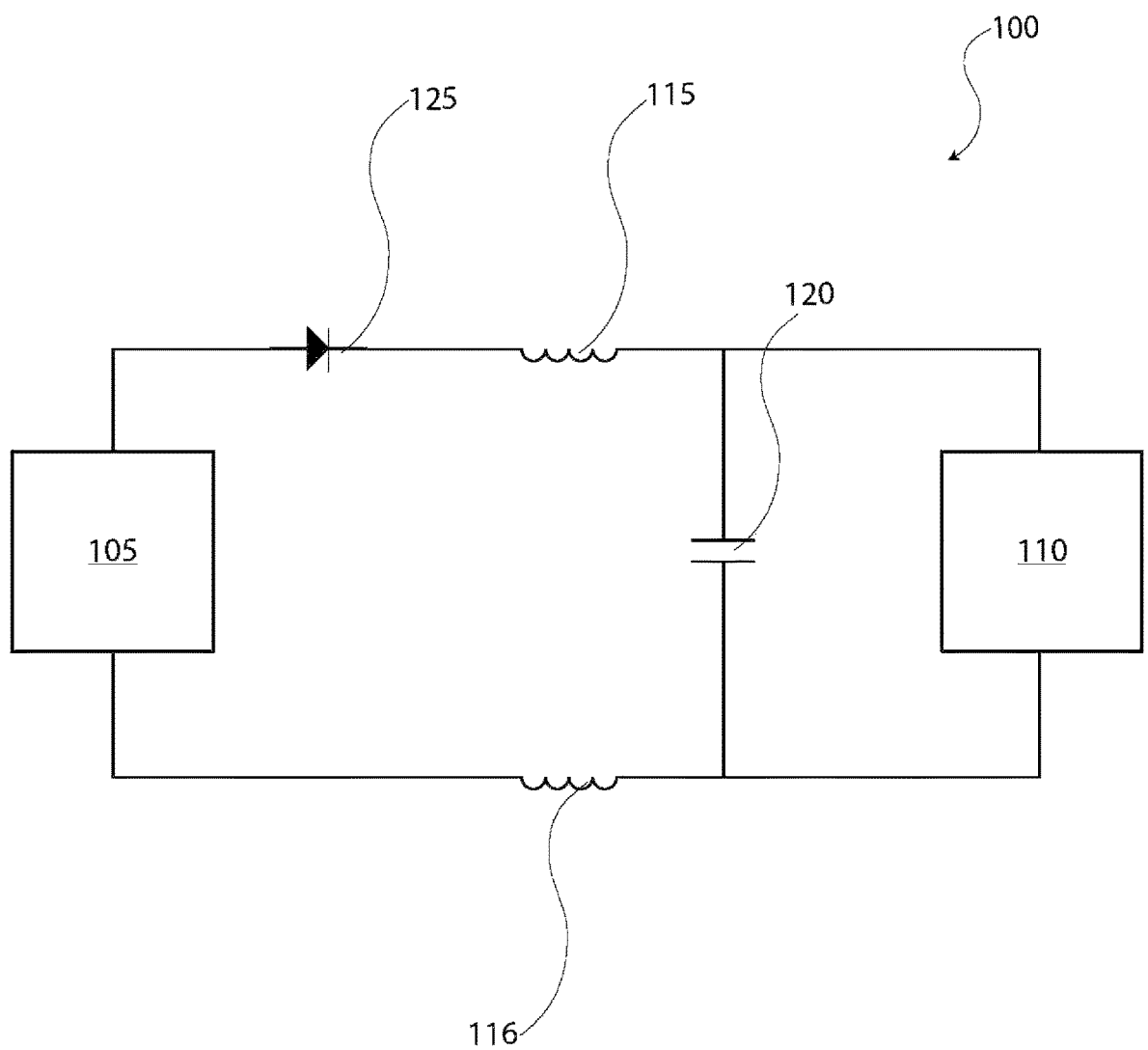
FIG. 31 is a block diagram of an example high voltage waveform generator according to some embodiments.

FIG. 31 is a block diagram of an example high voltage waveform generator 100 according to some embodiments. The high voltage waveform generator 100 may include a nanosecond pulser 105 and a load 110. The nanosecond pulser 105 may be electrically and/or inductively coupled with the load 110 via the diode 125, a generator inductor 115, and/or a generator capacitor 120. An additional inductor 116 may also be included. The shape of the waveform across the load 110 may be set by the pulse width of the nanosecond pulser 105 and/or the pulse frequency (or burst period) of the nanosecond pulser 105, and/or the pulse voltage of the nanosecond pulser 105.

In some embodiments, the additional inductor 116 may not be included. In some embodiments, the additional inductor 116 and the generator inductor 115 may not be included.

The nanosecond pulser 105, for example, may include any device capable of producing pulses greater than 500 V, peak current greater than 10 Amps, and/or pulse widths of less than about 10,000 ns, 1,000 ns, 100 ns, 10 ns, etc. As another example, the nanosecond pulser 105 may produce pulses with an amplitude greater than 1 kV, 5 kV, 10 kV, 50 kV, 200 kV, etc. As another example, the nanosecond pulser 105 may also produces pulse with rise times less than about 5 ns, 50 ns, or 300 ns, etc.

The nanosecond pulser 105 may, for example, include any pulser described in U.S. patent application Ser. No. 14/542,487, titled "HIGH VOLTAGE NANOSECOND PULSER", which is incorporated into this disclosure in its entirety for all purposes.

The nanosecond pulser 105 may, for example, include any pulser described in U.S. Pat. No. 9,601,283, titled "EFFICIENT IGBT SWITCHING", which is incorporated into this disclosure in its entirety for all purposes.

The nanosecond pulser 105 may, for example, include any pulser described in U.S. patent application Ser. No. 15/365,094, titled "HIGH VOLTAGE TRANSFORMER", which is incorporated into this disclosure in its entirety for all purposes.

The nanosecond pulser 105 may, for example, include a high voltage switch. For example, the nanosecond pulser 105 may, for example, include any switch described in U.S. Patent Application Ser. No. 62/717,637, filed Aug. 10, 2018, titled "HIGH VOLTAGE SWITCH WITH ISOLATED POWER", which is incorporated into this disclosure in its entirety for all purposes.

In some embodiments, the nanosecond pulser 105 may include one or more solid state switches such as, for example, an IGBT, a MOSFET, a SiC MOSFET, SiC junction transistor, FETs, SiC switches, GaN switches, photoconductive switch, etc.

In some embodiments, the generator inductor 115, for example, may include any inductor having an inductance less than about 3 µH. In some embodiments, the generator inductor 115 may represent stray inductance within the circuit such as, for example, within leads from the nanosecond pulser to other components in the circuit, or other circuit components. In some embodiments, the generator inductor 115 may have an inductance less than 1 µH, 0.1 µH, and 10 nH, 1 µH, 10 µH, 50 µH, etc.

In some embodiments, the additional inductor 116, for example, may include any inductor having an inductance less than about 3 µH. In some embodiments, the additional inductor 116 may represent stray inductance within the circuit such as, for example, within leads from the nanosecond pulser to other components in the circuit, or other circuit components. In some embodiments, the additional inductor 116 may have an inductance less than 1 µH, 0.1 µH, 10 nH, 1 µH, 10 µH, 50 µH, etc.

The generator capacitor 120, for example, may include any capacitor having a capacitance less than about 1 µF. For example, the generator capacitor 120 may have a capacitance be less than 1 µF, 10 µF, 100 nF, 100 pF, etc. The generator capacitor 120 may represent stray capacitance within the circuit such as, for example, within the leads, or between other generator circuit components, or it may represent capacitance contained within the load 110.

In this example, when the nanosecond pulser 105 is turned on and produces a high voltage pulse (e.g., a pulse greater than about 500 V, 5 kV, 10 kV, 15 kV, etc.), energy from the pulse is injected into the generator inductor 115. The energy from the generator inductor 115 can then charge the generator capacitor 120. When the nanosecond pulser 105 is turned off, the energy in the generator inductor 115 can continue to charge the generator capacitor 120. If the pulse width of the high voltage pulse is long enough to completely charge the generator capacitor 120, the voltage across the generator capacitor 120 can be twice the voltage of the high voltage pulse. By varying the pulse width, the frequency, and/or the voltage of the high voltage pulses, the voltage across the generator capacitor 120 can be varied. For example, the voltage across the generator capacitor 120 may be proportional to the pulse width, frequency, and/or voltage of the high voltage pulse from the nanosecond pulser 105 as shown by the waveforms shown in FIGS. 8A, 8B, 8C, and 8D.

In some embodiments, the phrase "charge the inductor" can be used to describe energy is passed through the inductor and/or energy is stored within the inductor.

In some embodiments, generator inductor 115 may not be used to regulate how much energy charges the generator capacitor 120. Some energy from the nanosecond pulser 105 may end up in the generator inductor 115, however, much of the energy will just pass through the generator inductor 115 into the generator capacitor 120. Thus, in some embodiments, the generator inductor 115 and/or the additional inductor 116 may not be included.

Figure 32:
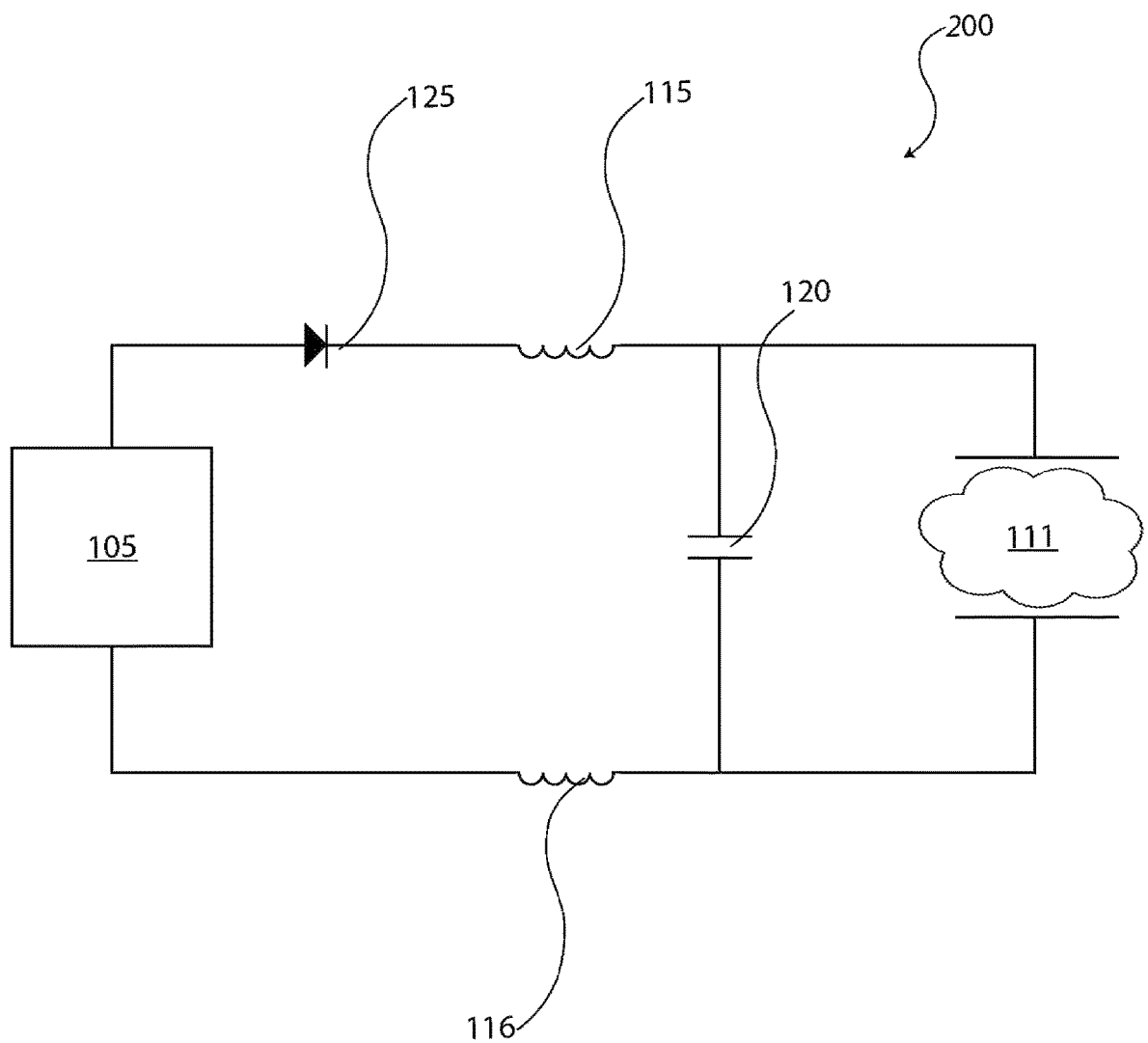
FIG. 32 is a block diagram of an example high voltage waveform generator according to some embodiments.
Figure 33A:
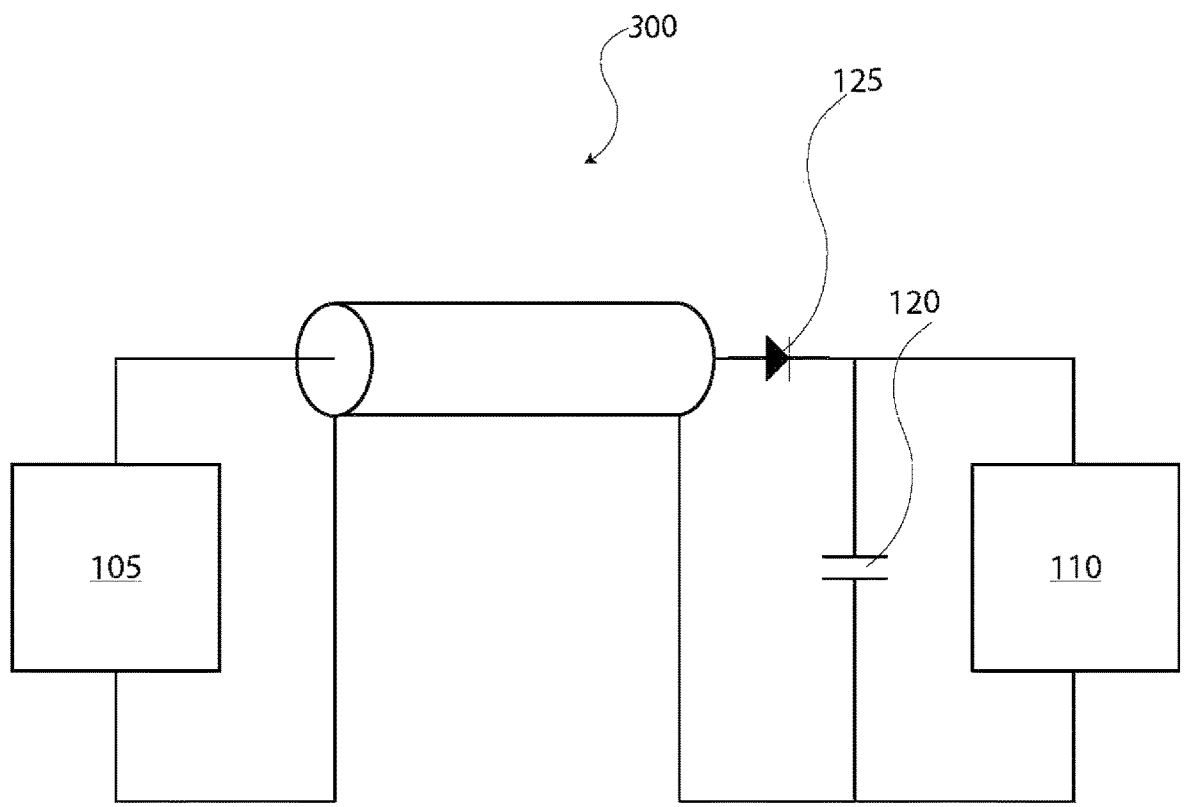
FIGS. 33A and 33B are block diagrams of example high voltage waveform generators according to some embodiments.
Figure 33B:
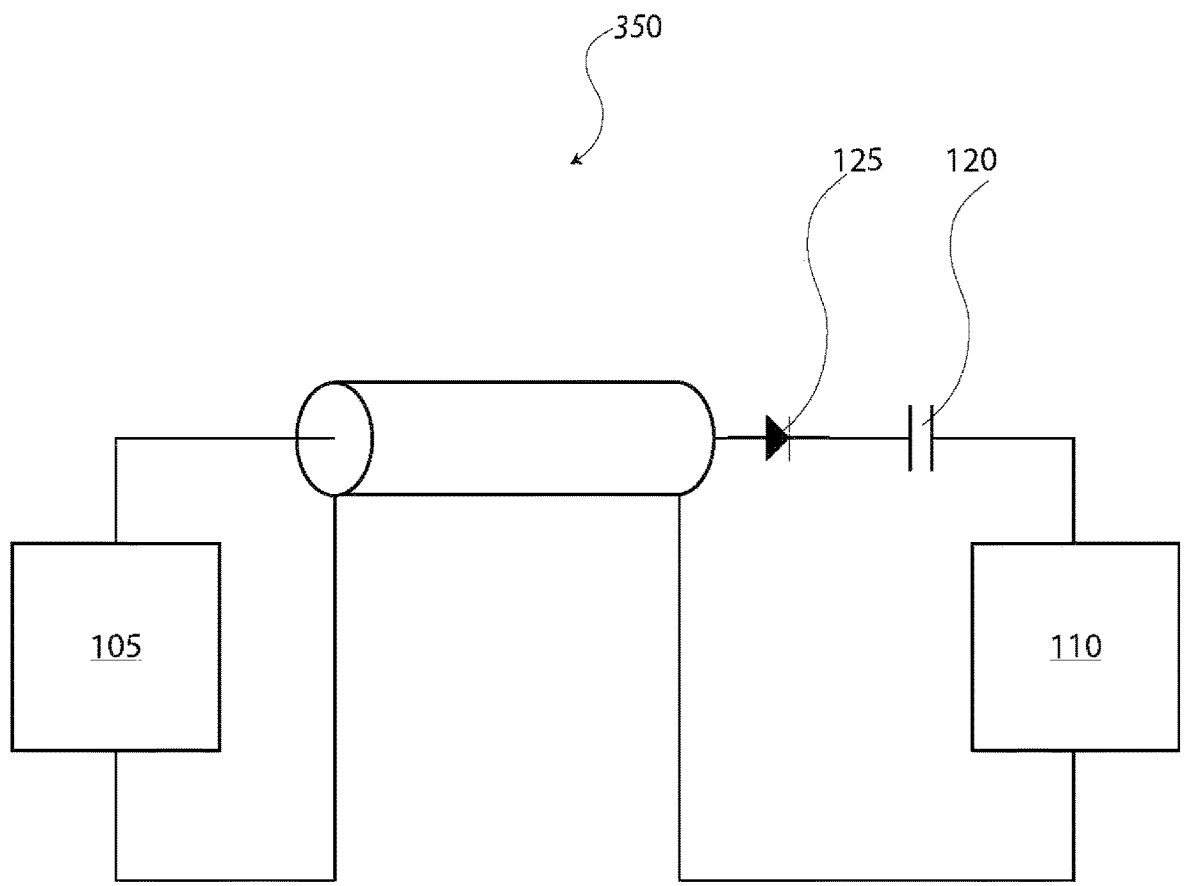

FIG. 32 is a block diagram of an example high voltage waveform generator 200 according to some embodiments. In this example, the load is a plasma 111. The inductors 115 and/or 116 may not be present, or may consist of just the stray circuit inductance. The capacitance 120 may be part of the plasma's capacitance. The plasma may have a number of unique characteristics, such as, for example, a capacitance, an electron mobility, and an ion mobility that differs from the electron mobility. In this example, output pulses of variable voltages may be applied to the plasma 111. The plasma 111 may include any type of plasma that may include charged ions and/or charged radicals. In some embodiments, the plasma may be used in a semiconductor fabrication process. In some applications, the output pulse amplitude may be used to control the energy of the plasma ions. In some applications, the ions may be used to etch various materials. These materials may include wafers used in the manμFacture of semiconductors. In some embodiments, the high voltage waveform generator 200 can be used to control the voltage applied across a plasma 111 or a plasma sheath.

FIG. 3A is a block diagram of an example high voltage waveform generator 300 according to some embodiments. In this example, the high voltage waveform generator 300 may include a driving cable 124 such as, for example, a coax cable or a twin lead cable.

In some embodiments, the generator capacitor 120, for example, may be in series with the load 110 as shown by circuit 350 in FIG. 3B.

Figure 34A:
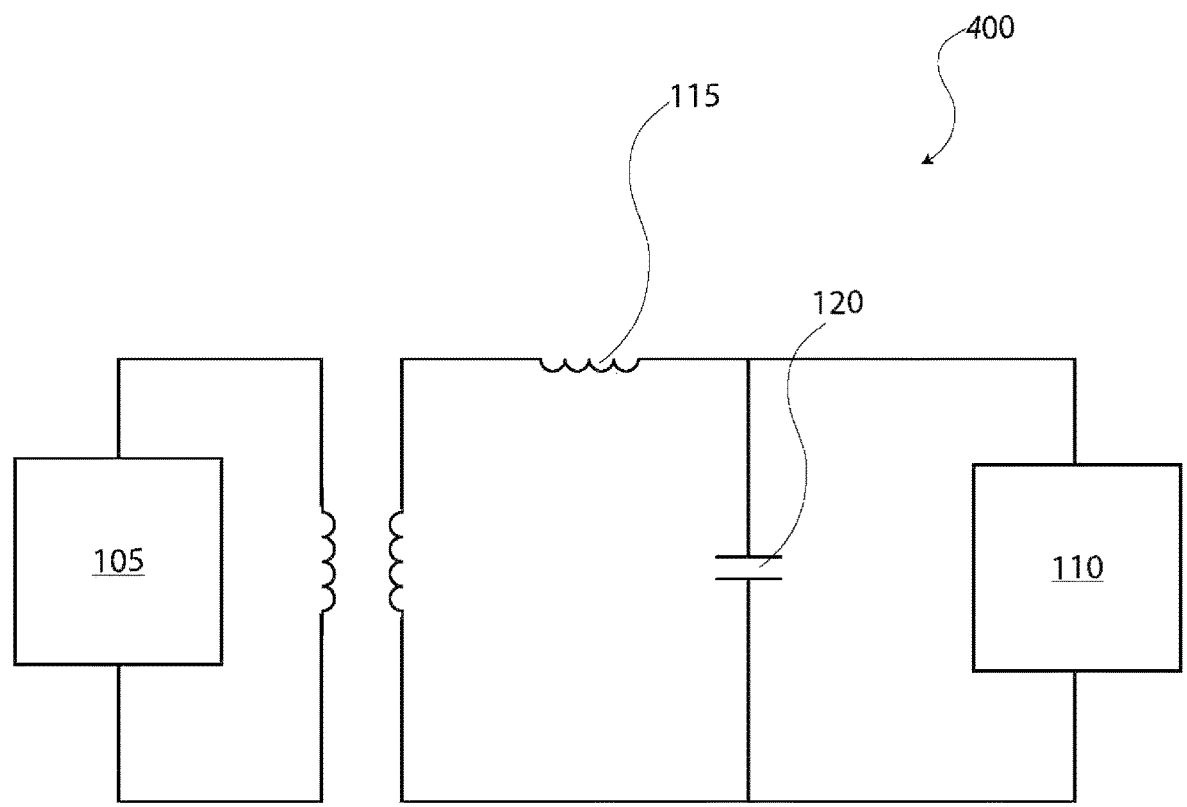
FIGS. 34A and 34B are block diagrams of example high voltage waveform generators according to some embodiments.

FIG. 34A is a block diagram of an example high voltage waveform generator 400 according to some embodiments. In this example, the high voltage waveform generator 400 includes a transformer 121 between the nanosecond pulser 105 and the load 110. Either the generator L and or C may be present, and/or C might be in series with the load 110, for example. In some embodiments, the pulse generator 105 may also contain a transformer that may galvanically isolate the pulser output from its input.

Figure 34B:
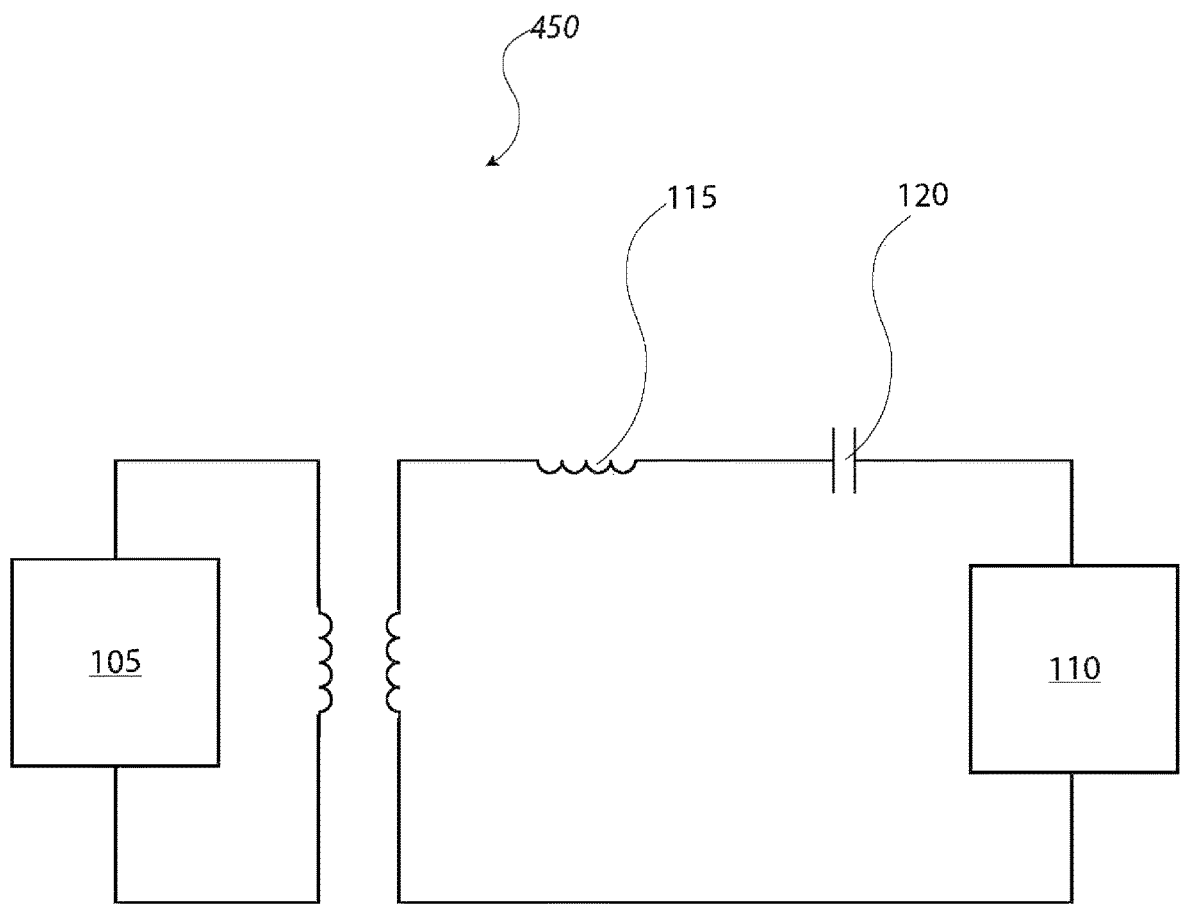

In some embodiments, the generator capacitor 120 may be in series with the load 110 as shown in circuit 450 as shown in FIG. 34B.

Figure 35A:
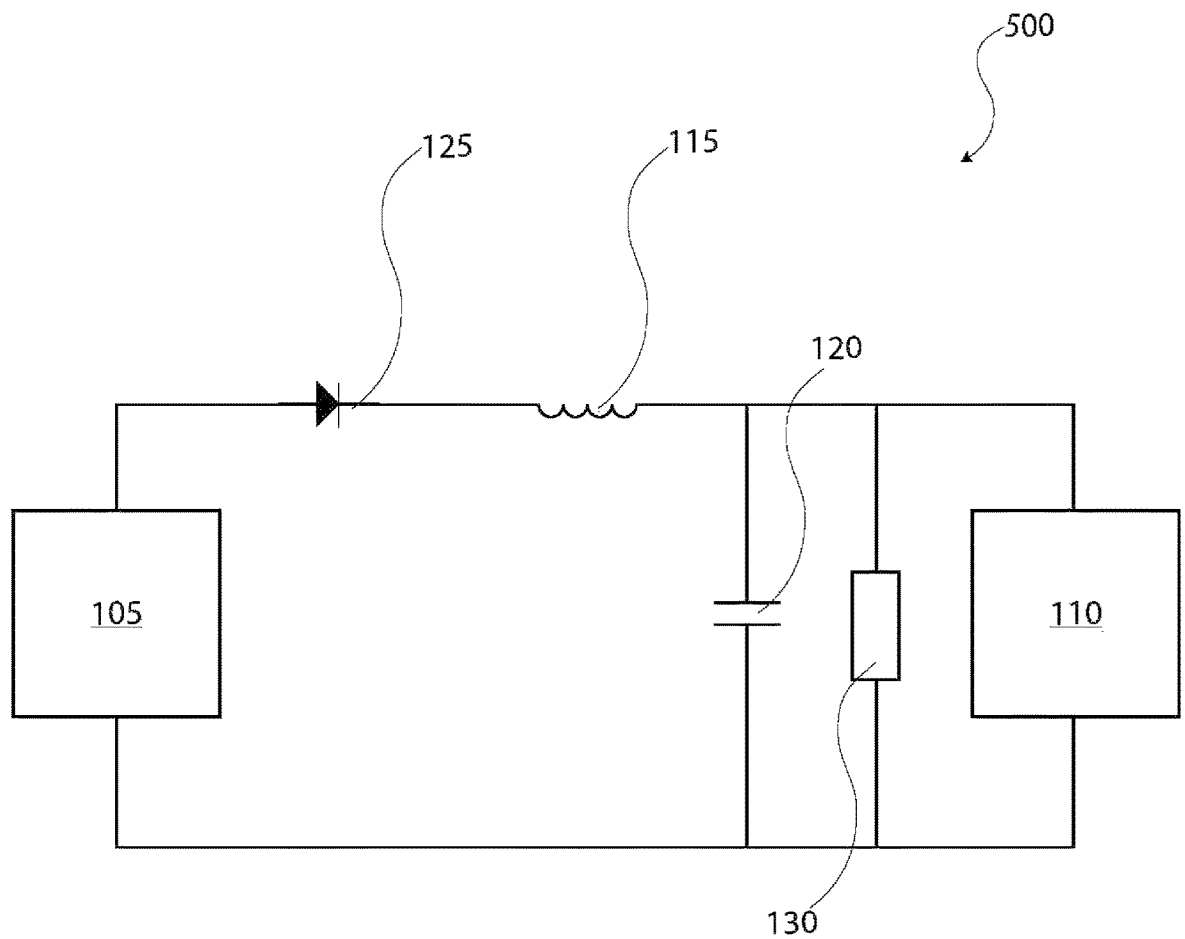
FIGS. 35A and 35B are block diagrams of example high voltage waveform generators according to some embodiments.

FIG. 35A is a block diagram of an example high voltage waveform generator 500 according to some embodiments. In this example, the high voltage waveform generator 500 includes a pulldown resistor 130. A switch may also be included in series with the pulldown resistor 130. The pulldown resistor 130 may, for example, include any embodiment described in U.S. patent application Ser. No. 15/941,731, titled "HIGH VOLTAGE PASSIVE OUTPUT STAGE CIRCUIT", which is incorporated into this disclosure in its entirety for all purposes.

Figure 35B:
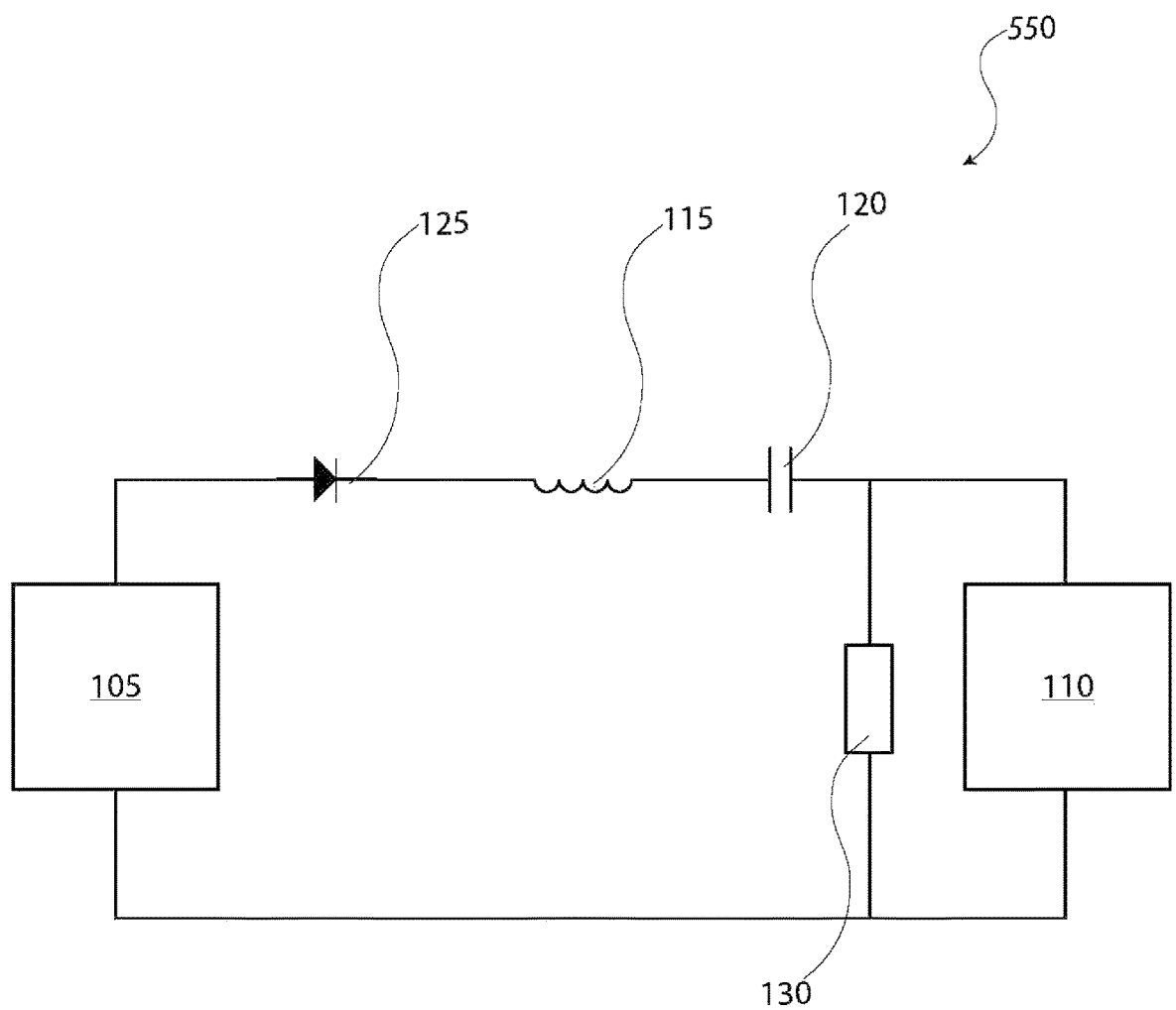

In some embodiments, the generator capacitor 120 may be in series with the load 110 as shown in circuit 550 in FIG. 35B. In some embodiments, the generator capacitor 120 may be part of the load 110 and/or include all or part of the capacitance of the load 110. In some embodiments, the pull down resistor 130 may be placed before the generator capacitor 120, the effective load capacitance 115, and/or the diode 125, i.e. placed closer to generator 105.

Figure 36:
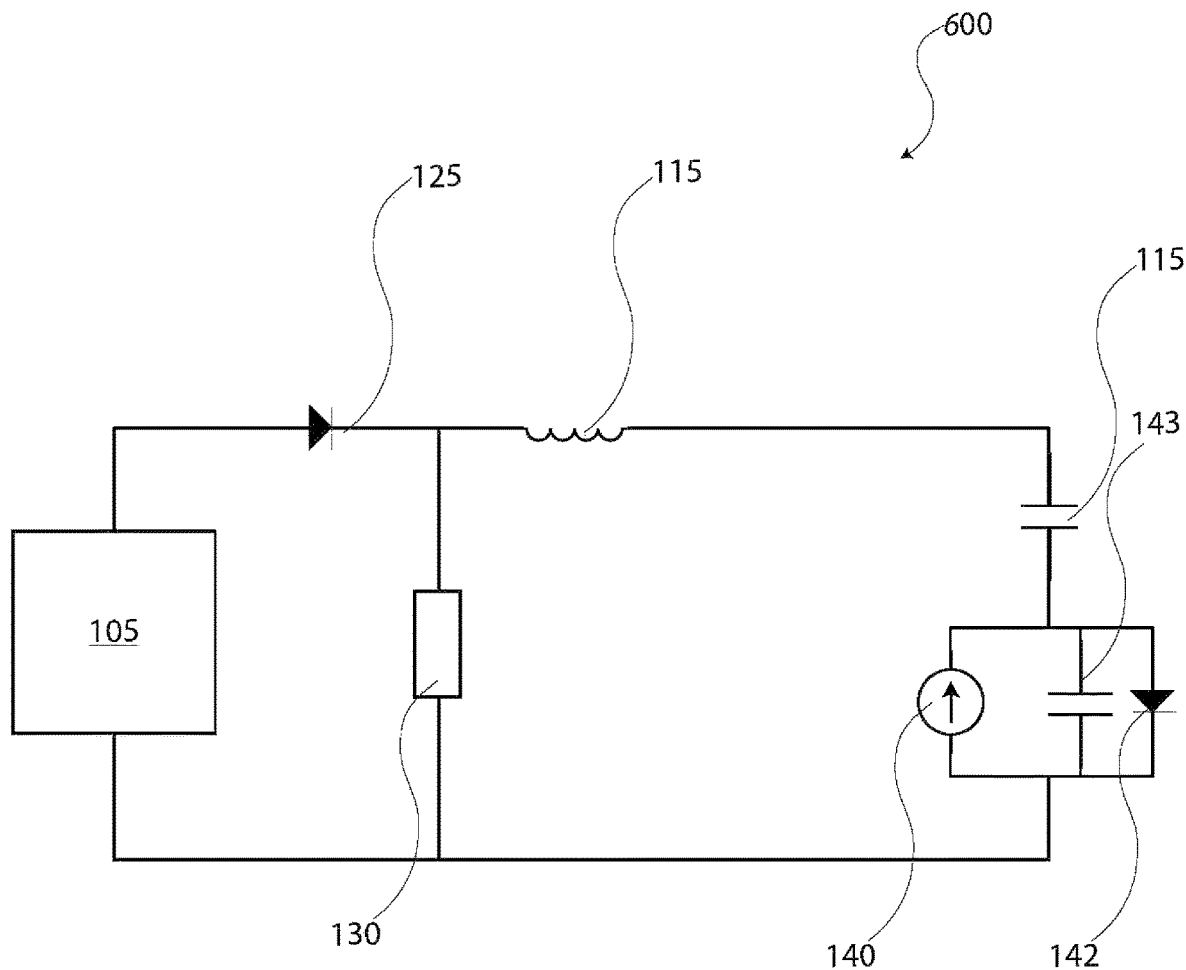
FIG. 36 is a block diagram of an example high voltage waveform generator according to some embodiments.

FIG. 36 is a block diagram of an example high voltage waveform generator 600 according to some embodiments. In this example, the high voltage waveform generator 600 may include a load having an effective load capacitance 115, an effective load current generator 140, and/or an effective load diode 142 and an effective system inductance 115. A plasma, for example, may be idealized by the effective current generator 140, the effective load diode 142, and the effective load capacitance 143. In some embodiments, the effective current generator 140 can represent the plasma ion current. In some embodiments, the ion plasma current can flow fairly steadily between the input pulses, for around the duration of the output pulse. In some embodiments, the effective load capacitance 143 can represent the capacitance formed in the plasma. In some embodiments, effective load capacitance 115 can represent the capacitance across the material/item/component being treated by the plasma, for example a semiconductor wafer being etched. In some embodiments, the effective load diode 142 can represent the electron mobility within the plasma, and/or the flow of current through the plasma driven by the input nanosecond pulses, that occurs around the duration of the input pulse burst.

Figure 37:
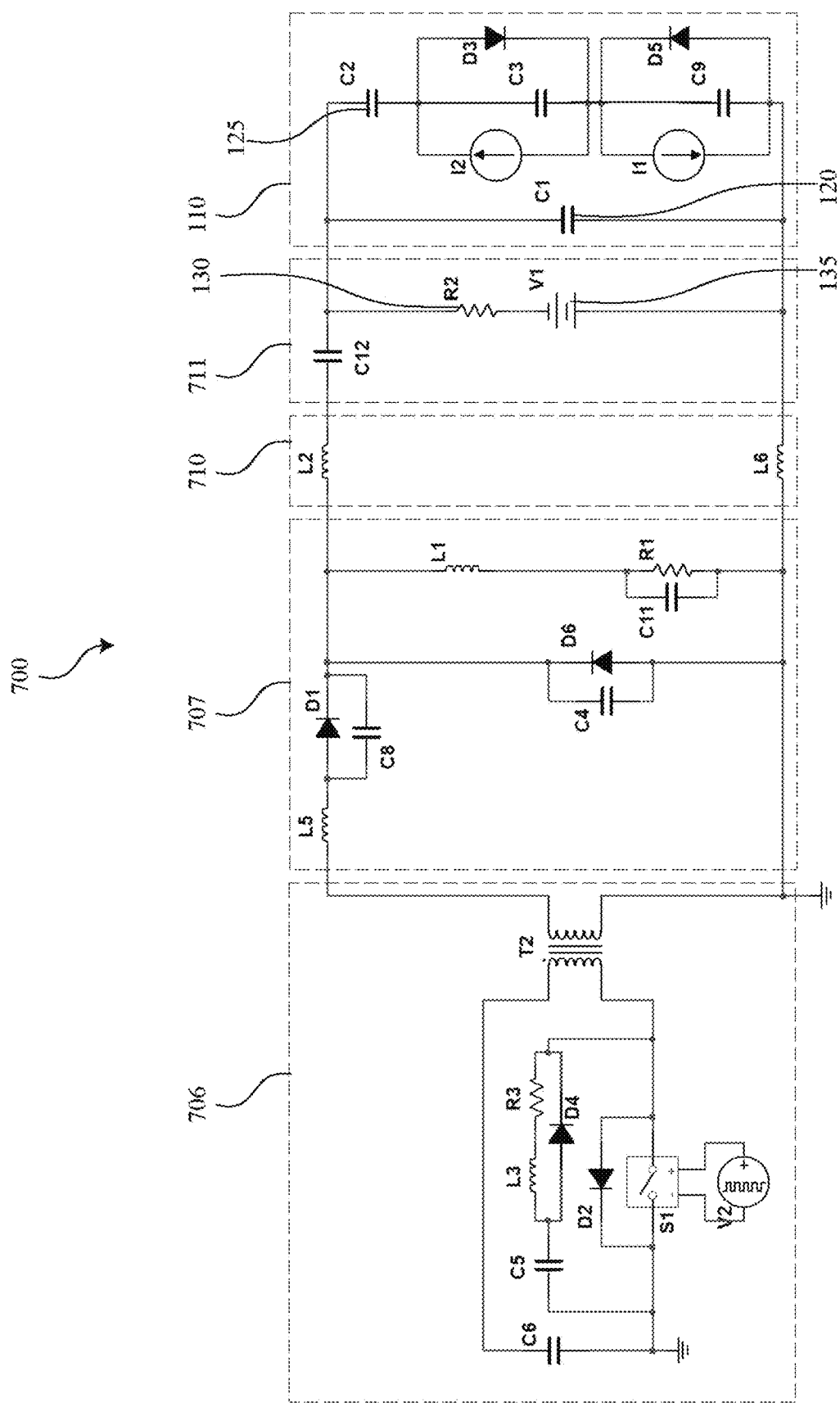
FIG. 37 is a circuit diagrams of an example high voltage waveform generator according to some embodiments.

FIG. 37 shows another example high voltage waveform generator 700 according to some embodiments. The high voltage waveform generator 700 can be generalized into five stages (these stages could be broken down into other stages or generalized into fewer stages). The high voltage waveform generator 700 includes pulser and transformer stage 706, a resistive output stage 707, a lead stage 710, a blocking capacitor and DC bias power supply stage 711, and a load stage 110.

In this example, the load stage 110 may represent an effective circuit for a plasma deposition system, plasma etch system, or plasma sputtering system. In some embodiments, the capacitance of capacitor C1 and/or capacitor C12 may be less than about 50 μF, 10 μF, 1 μF, 100 nF, etc. The capacitor C2 may represent the capacitance of the dielectric material upon which a wafer may sit. In some embodiments, the capacitor C2 may be less than about 50 μF, 10 μF, 1 μF, 100 nF, etc. The capacitor C3 may represent the sheath capacitance of the plasma to the wafer. In some embodiments, the capacitor C3 may be less than about 50 μF, 10 μF, 1 μF, 100 nF, etc. The capacitor C9 may represent capacitance within the plasma between a chamber wall and the top surface of the wafer. The current source I2 and the current source I1 may represent the ion current through the sheath.

In this example, the resistive output stage 707 may include one or more inductive elements represented by inductor L1 and/or inductor L5. The inductor L5, for example, may represent the stray inductance of the leads in the resistive output stage 707. Inductor L1 may be set to minimize the power that flows directly from the pulser and transformer stage 706 into resistor R1. In some embodiments, the resistance of resistor R1 can be less than about 2,000 Ohms, 200 Ohms, 20 Ohms, 2 Ohms, etc.

In some embodiments, the inductor L2, inductor L5, and/or inductor L6 may have an inductance less than about 100 μH, 10 μH, 1 μH, 100 nH, etc.

In some embodiments, the resistor R1 may dissipate charge from the load 110, for example, on fast time scales (e.g., 1 ns, 10 ns, 100 ns, 250 ns, 500 ns, 1,000 ns, etc. time scales). The resistance of resistor R1 may be low to ensure the pulse across the load 110 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 2000 pF, 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 706 can be ganged up in parallel and coupled with the resistive output stage 707 across the inductor L1 and/or the resistor R1. Each of the plurality of pulser and transformer stages 706 may each also include diode D1 and/or diode D6. In some embodiments, the inductance of inductor L1 can be less than about 1,000 μH, 100 μH, 10 μH, etc.

In some embodiments, the capacitor C8 may represent the stray capacitance of the blocking diode D1. In some embodiments, the capacitor C4 may represent the stray capacitance of the diode D6.

In some embodiments, the DC bias power supply stage 711 may include DC a voltage source V1 that can be used to bias the output voltage either positively or negatively. In some embodiments, the capacitor C12 isolates/separates the DC bias voltage from the resistive output stage and other circuit elements. The capacitor C12 may be referenced as either a blocking capacitor and/or a bias capacitor. In some embodiments, capacitor C12 may comprise a single capacitive element, or numerous capacitive elements combined. In some embodiments, capacitor C12 may allow for a potential shift from one portion of the circuit to another. In some embodiments, the potential shift capacitor C12 establishes may be used to hold a wafer in place using electrostatic forces. In some embodiments, the capacitance of capacitor C12 may be less than about 1000 µF, 100 µF, 10 µF, 1 µF, etc.

Resistance R2 may protect/isolate the DC bias supply from the high voltage pulsed output from the pulser and transformer stage 706. In some embodiments, the DC bias power supply stage may contain additional elements such as switches, diodes, and capacitors, to help keep the electrostatic forces holding a wafer in place fairly constant in time, as the output pulse cycles on and off such as, for example, U.S. Patent Application Ser. No. 62/711,406, filed Aug. 10, 2018, titled "NANOSECOND PULSER BIAS COMPENSATION", which is incorporated into this disclosure in its entirety for all purposes.

In some embodiments, the pulser and transformer stage 706 may include a plurality of switches and a plurality of signal generators. A plurality of switches, for example, may allow the nanosecond pulser to produce higher frequency pulses.

In some embodiments, the voltage source V2 provides a consistent DC voltage that is switched by switch S1. Switch S1, for example, may include one or more solid state switches such as, for example, an IGBT, a MOSFET, a SiC MOSFET, SiC junction transistor, FETs, SiC switches, GaN switches, photoconductive switch, etc. Switch S1 may switch so fast that the switched voltage may never be at full voltage. For example, if voltage source V2 provides a DC voltage of 500 V, then the switch S1 may be turned on and turned off so quickly that the voltage across the switch is less than 500 V. In some embodiments, a gate resistor coupled with the switch S1 may be set with short turn on pulses.

Figure 38A:
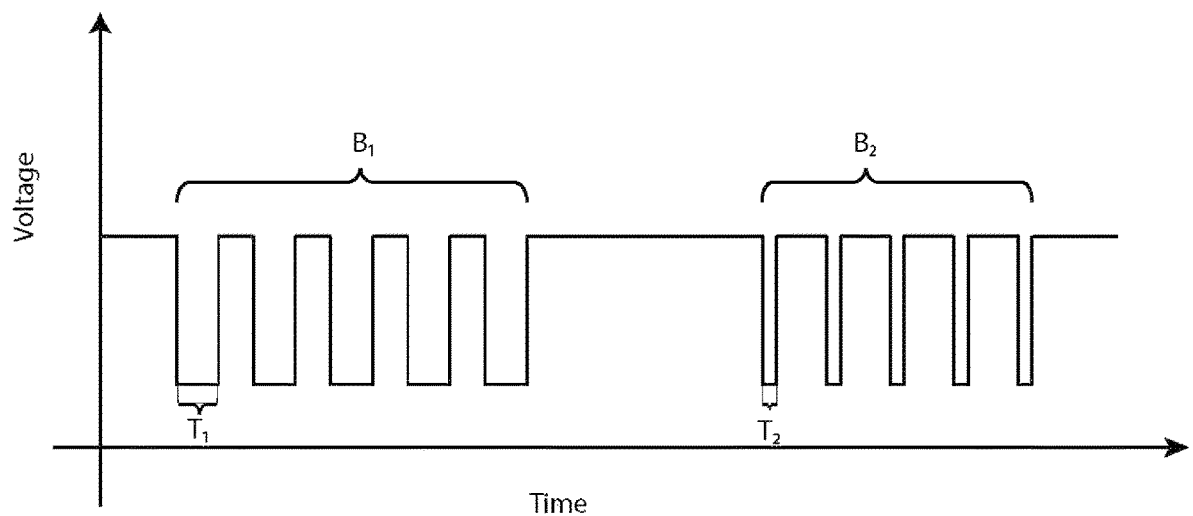
FIG. 38A illustrates an example pulser waveform and an example high voltage waveform generator output waveform according to some embodiments.
Figure 38B:
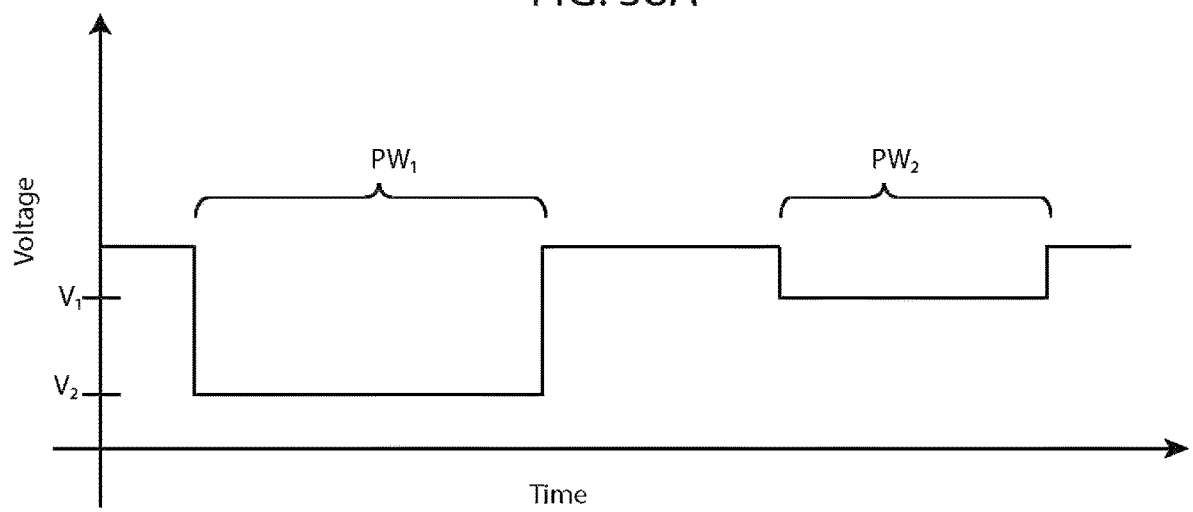
FIG. 38B illustrates an example high voltage waveform generator output waveform according to some embodiments.

FIG. 38A illustrates an example pulser waveform and FIG. 38B illustrates an example high voltage waveform generator output waveform according to some embodiments. In this example, the waveform produced by the pulser include two bursts: a first burst with a burst period $B_1$ with each pulse having a pulse width $T_1$; and a second burst with a burst period $B_2$ with each pulse having a pulse width $T_2$. The waveform output is the output of the waveform generator based on the waveform produced by the pulser. In this example, the waveform generator outputs two pulses: a first pulse having a pulse width $PW_1$ and a voltage $V_1$; and a second pulse having a pulse width $PW_2$ and a voltage $V_2$. In this example, the $PW_1$ is the same length as the burst period $B_1$ within 10%; and the first pulse voltage $V_1$ is a function of (e.g., proportional to) the pulse width $T_1$. In addition, the $PW_2$ is the same length as the burst period $B_2$ within 10%; and the first pulse voltage $V_2$ is a function of (e.g., proportional to) the pulse width $T_2$. $PW_1$ and $PW_2$ may have widths that deviate from $B_1$ and $B_2$ due to circuit phase delays, and the charging and discharging of various circuit elements. However, the input and output lengths are strongly correlated, with the input burst lengths being used to control the output pulse lengths. Load properties will also impact the exact correlation between the input burst width and the output pulse width. The flatness of the output pulses may also vary based on the circuit elements selected, and/or may show a natural oscillation/response to the input pulses that comprise the burst.

In some embodiments, the time between pulses can be any value. In some embodiments, the time between pulses can be on the order of the pulse width of an individual pulse.

In some embodiments, the frequency of the pulses within each burst may be greater than about 1 kHz, 10 kHz, 100 kHz, 1,000 kHz, etc.

Figure 38C:
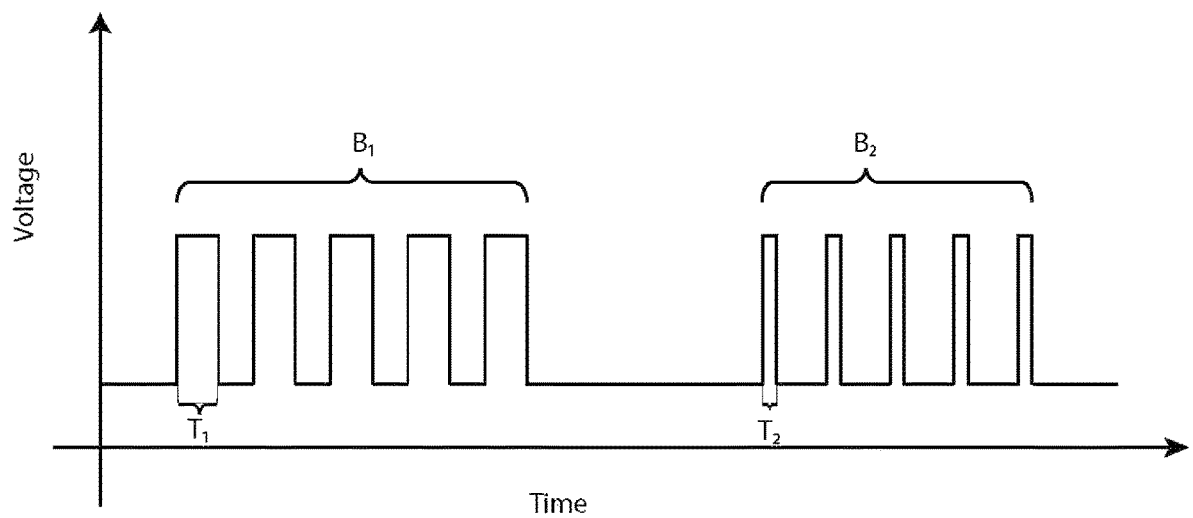
FIG. 38C illustrates an example pulser waveform according to some embodiments.
Figure 38D:
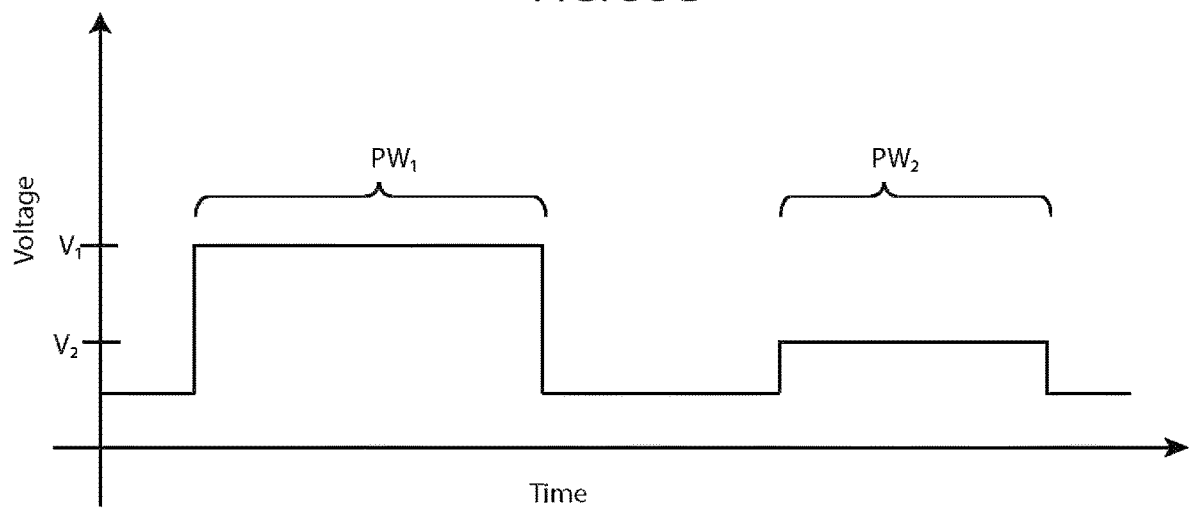
FIG. 38D illustrates an example high voltage waveform generator output waveform according to some embodiments.

FIG. 38C illustrates an example pulser waveform and FIG. 38D illustrates an example high voltage waveform generator output waveform according to some embodiments. In this example, the input waveforms are inverted in comparison with those shown in FIG. 38A, resulting in inverted output waveforms shown in FIG. 38D. In this example, the pulse widths of the output pulses $PW_1$ and $PW_2$ are substantially similar to the burst period $B_1$ and $B_2$. The waveforms shown in FIGS. 9, 10, and 11 can likewise be inverted. The flatness of the output pulses may also vary based on the circuit elements selected, and/or may show a natural oscillation/response to the input pulses that comprise the burst.

Figure 39A:
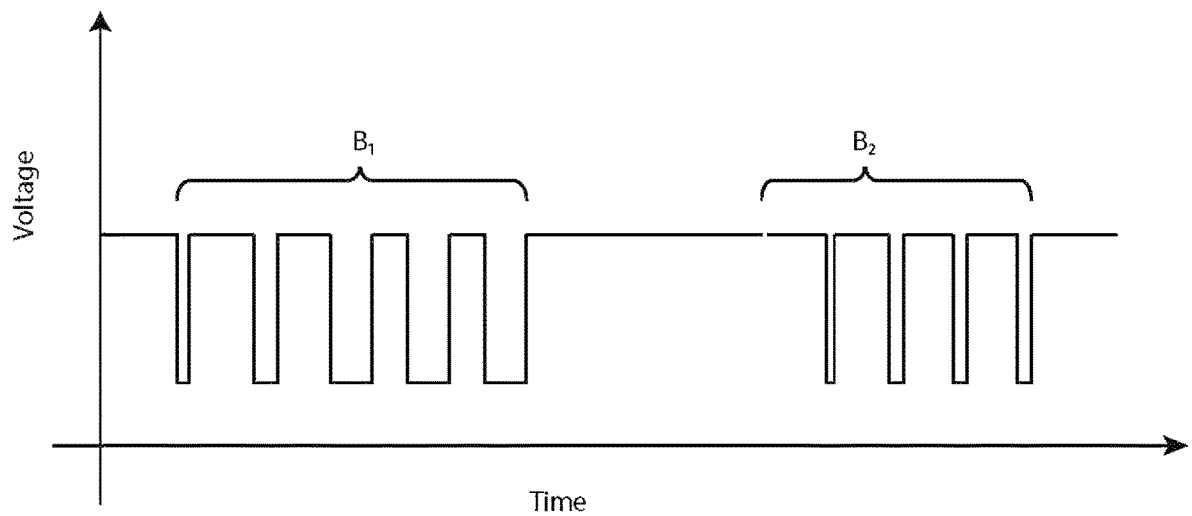
FIGS. 39A and 39B illustrate an example pulser waveform and an example high voltage waveform generator output waveform according to some embodiments.
Figure 39B:
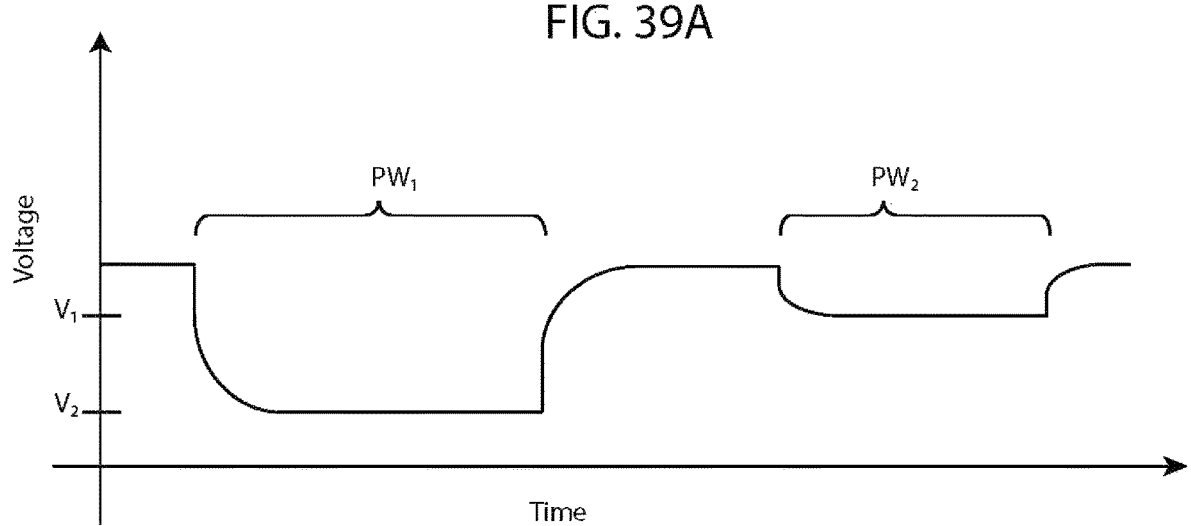

FIG. 39A illustrates an example waveform produced by the pulser and FIG. 39B illustrates an example high voltage waveform generator output waveform according to some embodiments. In this example, the first two pulses of the first burst of the pulser output as shown in FIG. 39A are shorter than the other pulses within the burst. This results in an output pulse that slowly ramps up to $V_2$ or $V_1$ as shown in FIG. 39B. This may be done to limit the peak output current and/or energy from the pulser.

The output waveforms shown in FIGS. 8B, 8D, and 9B may be referred to as a form of 'bi-level' control, where the intent is to apply a series of 1 or more output pulses of one voltage alternating with a series of one or more output pulses with a different voltage. For example, this may allow high energy ions to interact with a surface/material, followed by low energy ions interacting with a surface/material.

Figure 40A:
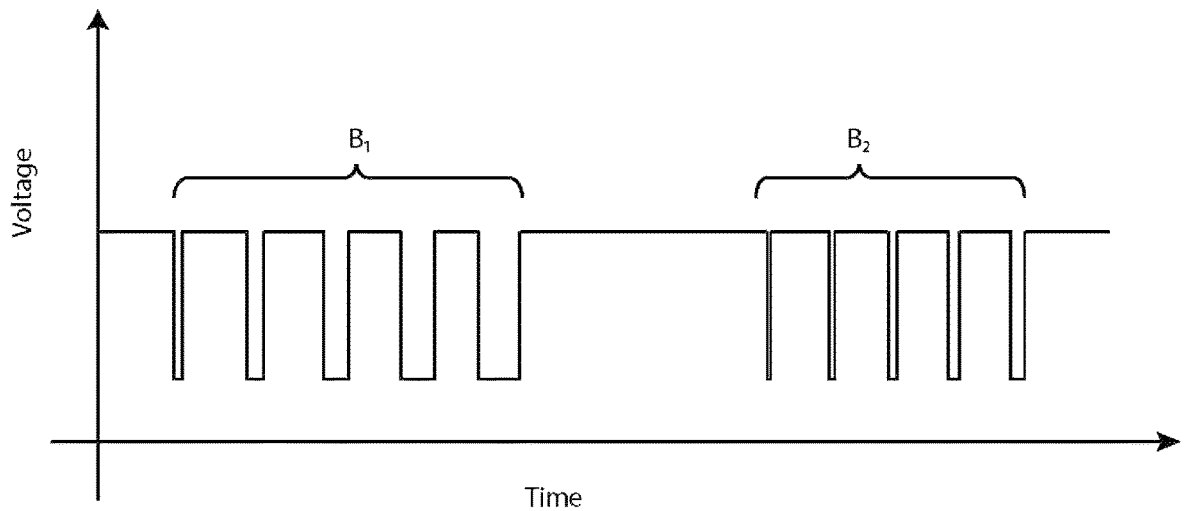
FIGS. 40A and 40B illustrate an example pulser waveform and an example high voltage waveform generator output waveform according to some embodiments.
Figure 40B:
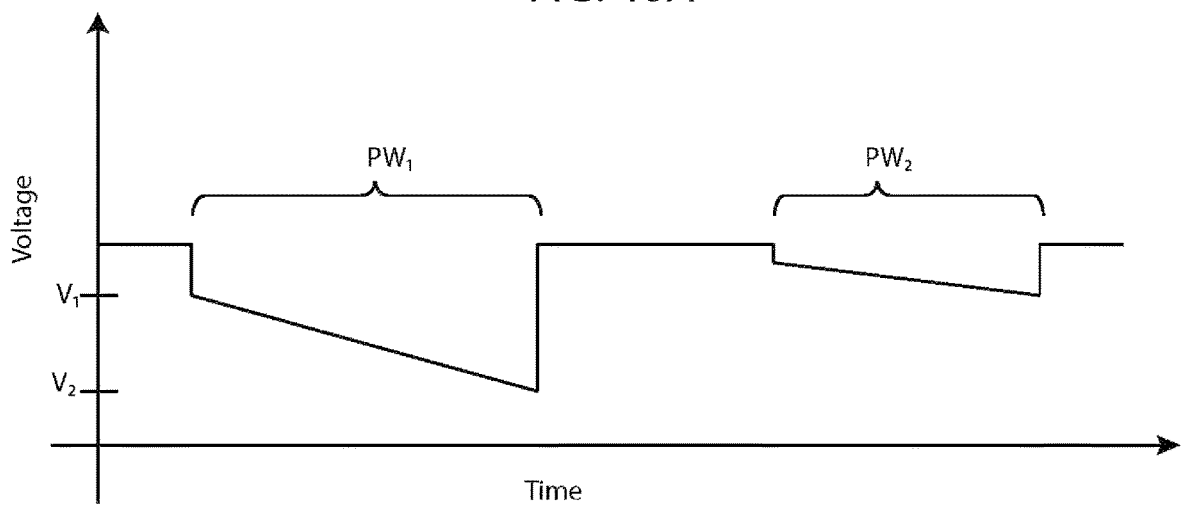

FIG. 40A illustrates an example waveform produced by the pulser and FIG. 40B illustrates an example high voltage waveform generator output waveform according to some embodiments. In this example, the pulse width of each pulse within a burst increases linearly as shown in FIG. 40A resulting in an output waveform voltage that similarly decreases linearly as shown in FIG. 40B.

Figure 41A:
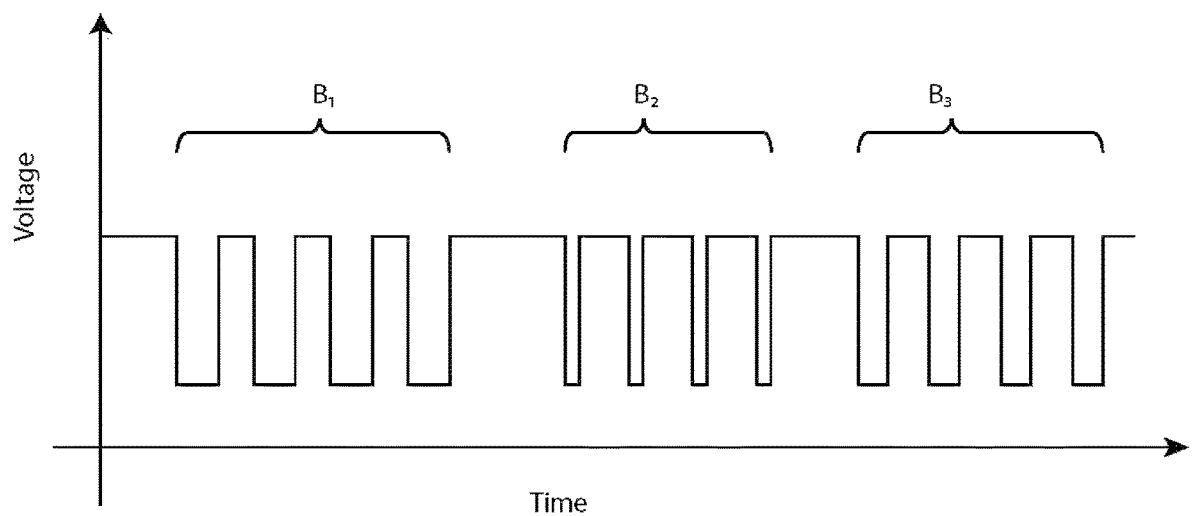
FIGS. 41A and 41B illustrate an example pulser waveform and an example high voltage waveform generator output waveform according to some embodiments.
Figure 41B:
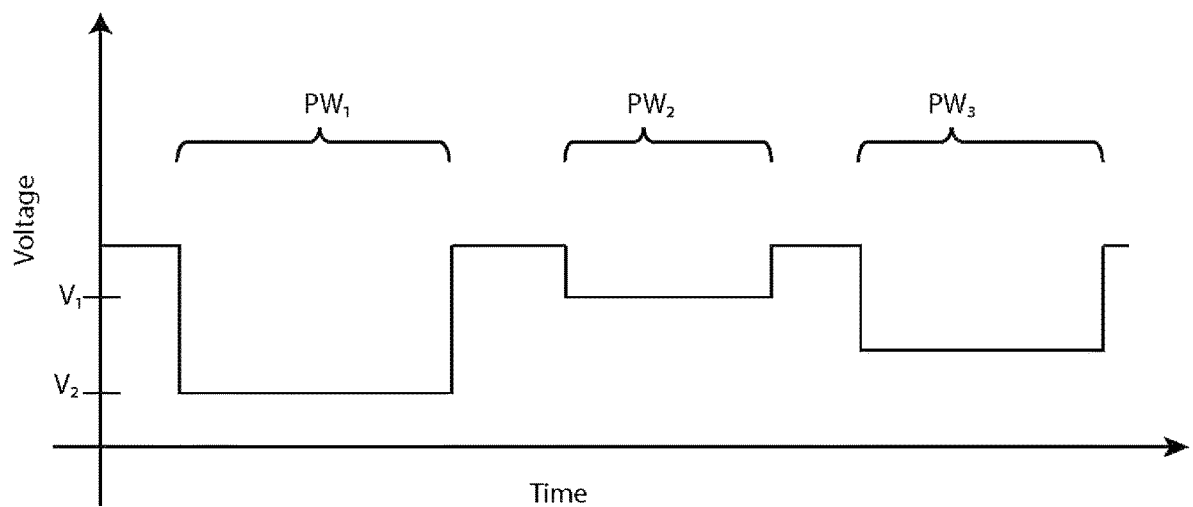

FIG. 41A illustrates an example waveform produced by the pulser and FIG. 41B illustrates an example high voltage waveform generator output waveform according to some embodiments. In this example, three bursts having three different burst widths and the pulses within each burst have different pulse widths as shown in FIG. 41A. This results in three output pulses with three different pulse widths and different voltages as shown in FIG. 41B.

The shape of the output waveform can be dictated by the pulse width of each pulse within a burst and/or the burst width. Any shape of output waveform may be produced by varying these parameters. Such shapes may be repeated and interleaved with any other set of output pulse shapes, and may be done so in a repetitive manner. In some embodiments, the shape of the output waveform can be controlled/set by varying the voltage of the individual pulses. Varying the pulse width may vary the pulse voltage as well.

In some embodiments, multiple nanosecond pulsers may be phased together. For example, the nanosecond pulser 105 may include one or more pulsers phased together in parallel. This may, for example, generate output pulses from the waveform generator at higher frequencies.

Figure 42:
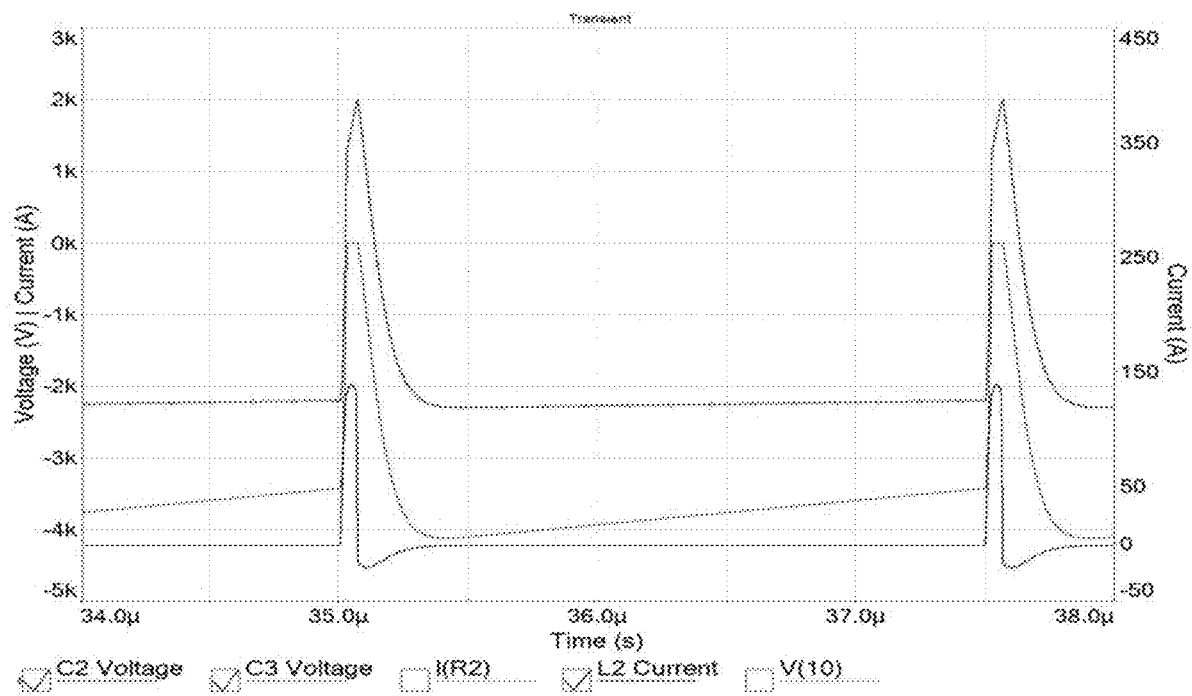
FIG. 42 illustrates example waveforms within various circuit elements of a high voltage waveform generator according to some embodiments.

FIG. 42 illustrates example waveforms within various circuit elements of a high voltage waveform generator according to some embodiments. The waveforms shown in FIG. 42 relate to the components shown in FIG. 37.

Figure 43:
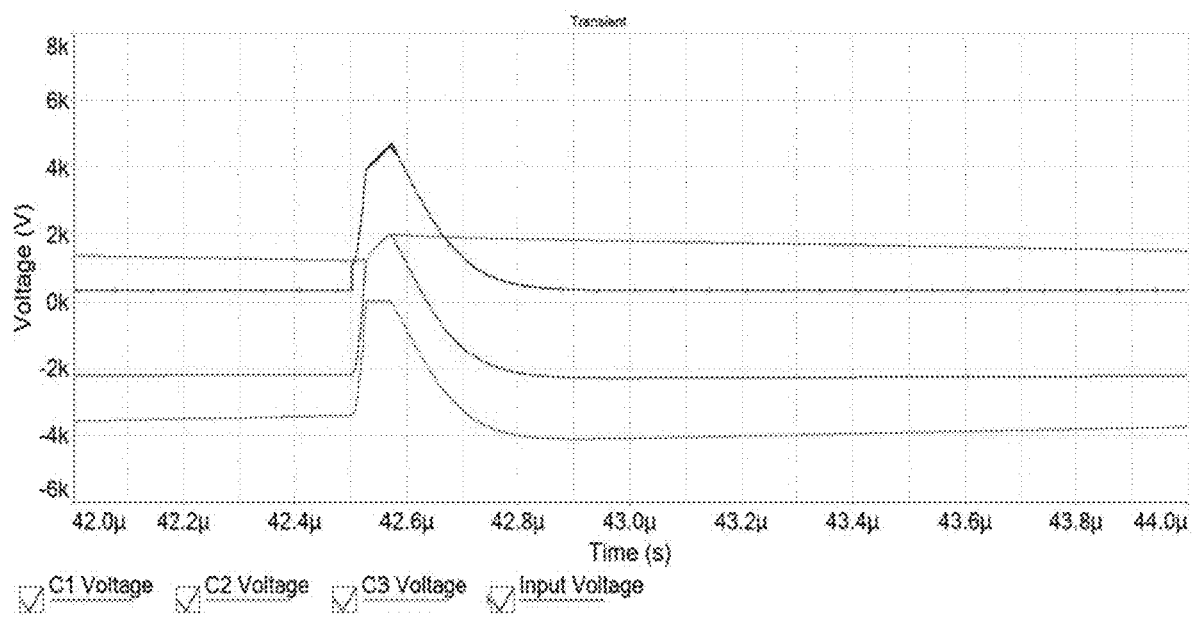
FIG. 43 illustrates example waveforms within various circuit elements of a high voltage waveform generator according to some embodiments.
Figure 44:
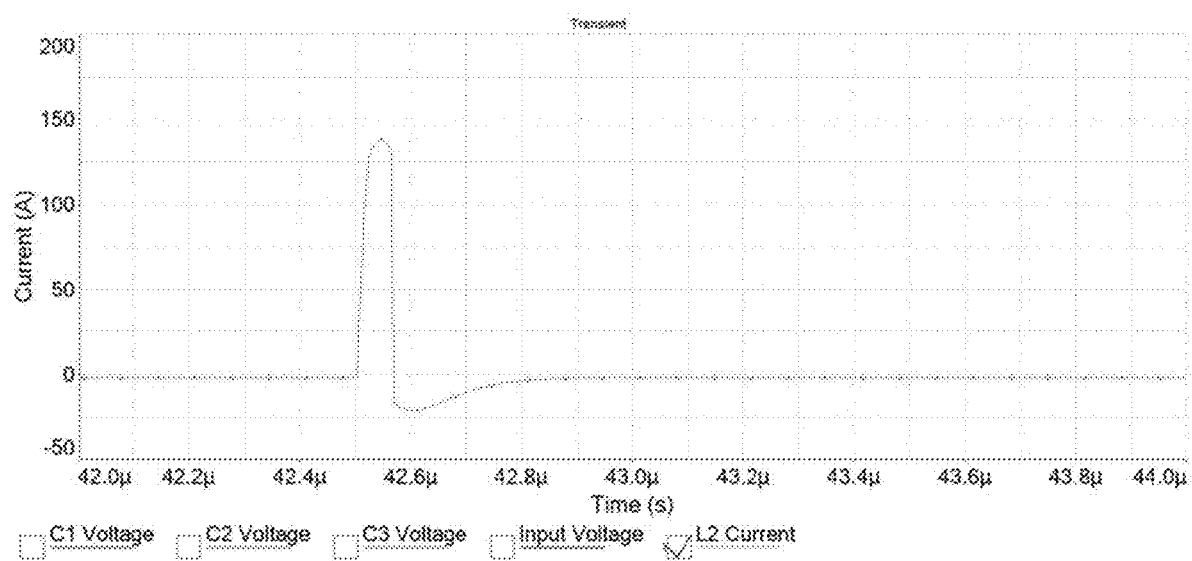
FIG. 44 illustrates example waveforms within various circuit elements of a high voltage waveform generator according to some embodiments.

FIG. 43 and FIG. 44 illustrates example waveforms within various circuit elements of a high voltage waveform generator according to some embodiments. The waveforms shown in FIG. 42 relate to the components shown in FIG. 37.

In some embodiments, a high voltage waveform generator may use real time feedback to adjust the output voltage of an output waveform. For example, a circuit can determine that the voltage of an output waveform is lower than expected, in response the pulse width of the nanosecond pulser may be adjusted to produce the desired output pulse. Alternatively, the number of pulses within a burst may be adjusted, and/or their frequency may be adjusted.

In some embodiments, a plurality of pulsers may be used in a high voltage waveform generator 750. For example, a first pulser and a second pulser can be phased together with one or more switches. Linking together these pulses can be done to increase the frequency of the pulses provided to the load. In some embodiments, each of the pulsers may produce a different drive voltage.

In some embodiments, the resistor at the gate of one or more MOSFETs within the pulser may be selected to enable a working range between high levels and low levels in bi-level operation. In some embodiments, the resistor at the gate of one or more MOSFETs may provide short circuit protection. In some embodiments, different gate voltages may be applied to one or more MOSFETs within the pulser.

Figure 45A:
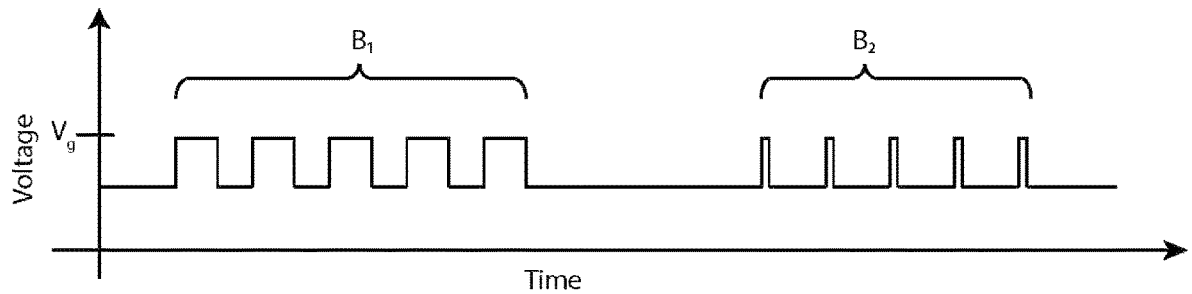
FIGS. 45A, 45B, 45C, and 45D show example pulses produced by a pulser.
Figure 45B:
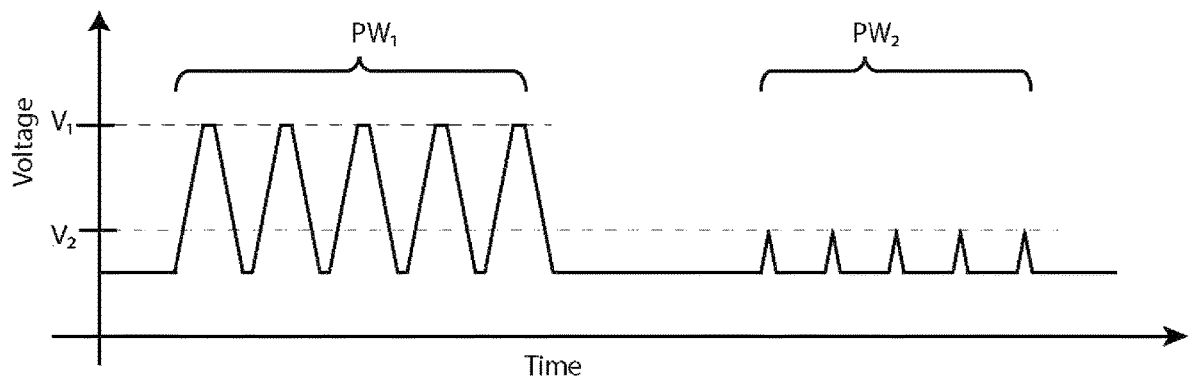
Figure 45C:
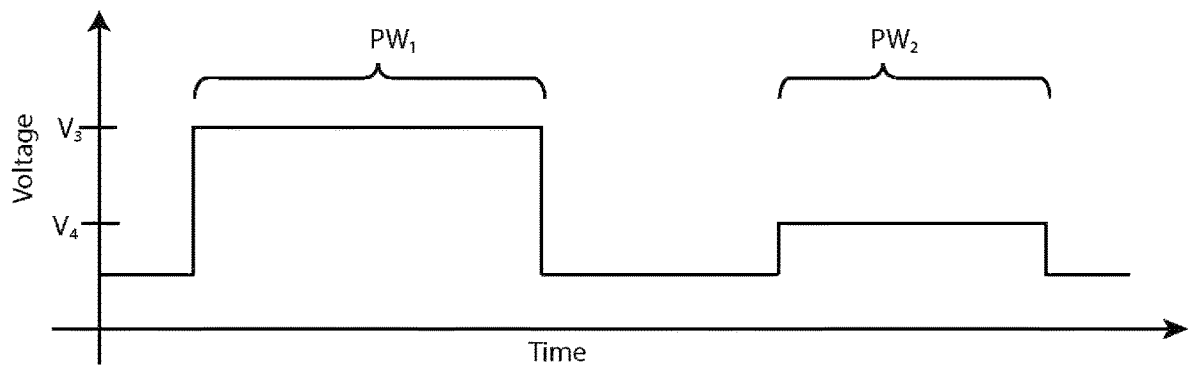

In some embodiments, the turn on time of one or more switches within the nanosecond pulser 105 may result in lower output voltage from the pulser when the pulse width is less than the rise time. This is illustrated in FIG. 45C. $V_3$, for example, may be 5 kV or greater and $V_4$, for example, may be greater than 200 volts.

Figure 45D:
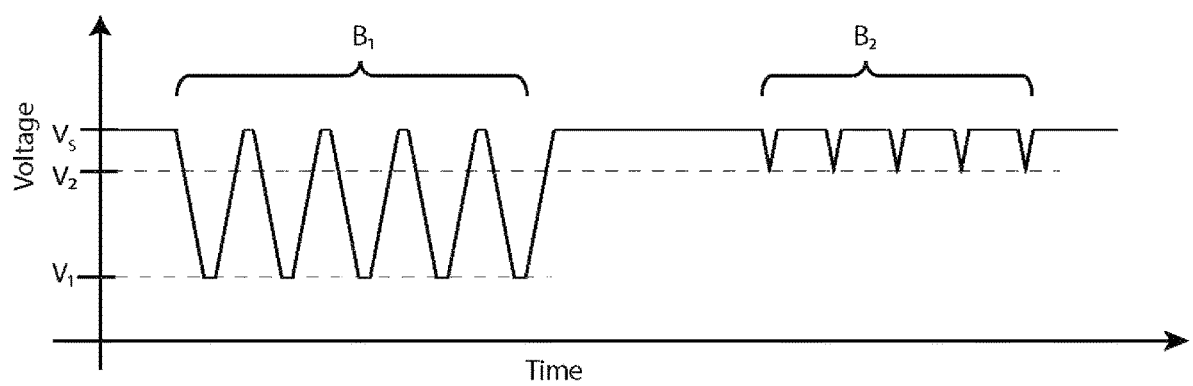

A pulser may include a high voltage DC input and a low voltage DC waveform for controlling the solid-state switches or gate voltage. The waveform shown in FIG. 45A shows the gate voltage with two bursts each having a burst period, $B_1$ and $B_2$, and the pulses within each burst having a different pulse width. The waveform in FIG. 45B shows example pulses produced by the pulser (e.g., the voltage across R1 in FIG. 37). The voltage of the pulses within the first burst are at $V_1$ and the pulses within the second burst are at $V_2$. The pulse voltages in the second burst are lower because the gate voltage pulse widths are shorter. Specifically, the gate voltage pulses are sufficiently short that the pulser switches do not have time to fully turn on, (e.g., reach their peak output voltage) before the pulse switches are turned back off by the gate input pulse. The waveform in FIG. 45D is the voltage across the switch in the pulser (e.g., switch S1 in FIG. 37). The switches are gated on for a sufficiently short period that the voltage across the switch is never able to fall to the low level that it would normally be for a switch fully turned on and in full conduction. The resulting output waveform shown in FIG. 45C has two voltage levels. The second voltage level is a function of the pulse width of the gate voltage waveform (FIG. 45A). Because the pulse widths of the second pulses are shorter than the switch rise time, or the switch turn-on time, or the switch time needed to reach full conduction, lower voltage pulses are produced by the pulser. The second voltage level in FIG. 45C is a function of the pulse width and the voltage produced by the pulser shown in FIG. 45B. The gate resistance of one or more switches in the pulser may determine the rise time and voltage of the pulses provided by the pulser.

In some embodiments, the output voltage shown in FIG. 45C is a function of single pulses shown in FIG. 45A. In some embodiments, output voltage control is provided using the switches to control output voltage. Some embodiments may enable very fast, nanosecond timescale, output voltage modulation, at bi-level voltage output. This can, for example, allow for fast voltage modulation (e.g., greater than 1 MHz).

Systems and methods are disclosed to produce different high voltage pulses on different electrodes. For example, each of a plurality of pulse generators (e.g., nanosecond pulsers, RF generators, or HV switches) can be electrically coupled with a respective one of a plurality of electrodes. The plurality of pulse generators can produce a different voltage, ion energy, or electric field on the electrodes. This can be done for any number of reasons such, for example, to compensate for plasma chamber defects, wafer discontinuities, or reduce wafer edge defects. In one example, the plurality of pulse generators systems may be used to produce a different electric field profile at the edge of a wafer than in the middle of the wafer.

Figure 46:
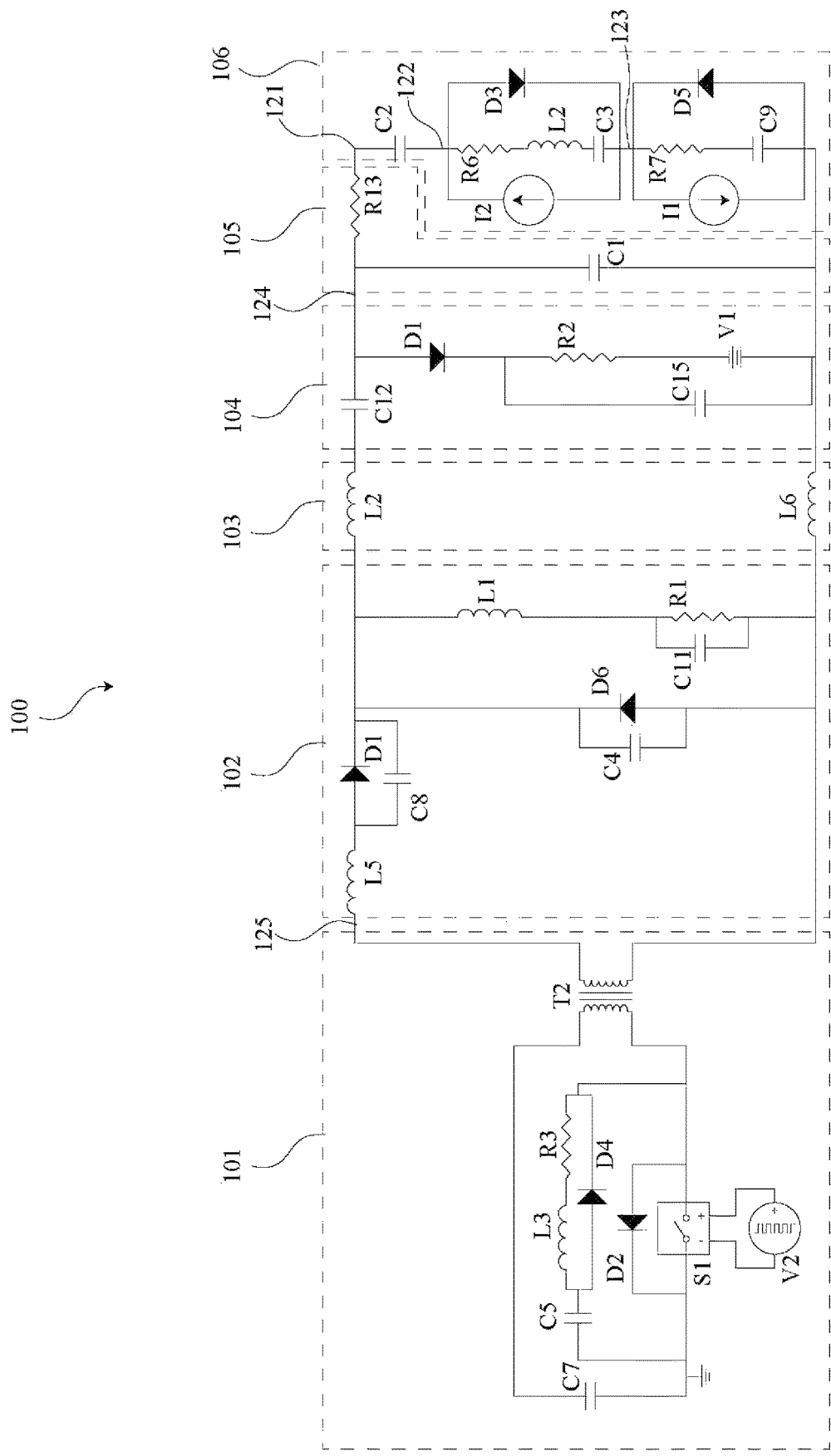
FIG. 46 is a circuit diagram of a nanosecond pulser according to some embodiments.

FIG. 46 is a circuit diagram of a nanosecond pulser system 100 according to some embodiments. The nanosecond pulser system 100 can be implemented within a high voltage nanosecond pulser system. The nanosecond pulser system 100 can be generalized into five stages (these stages could be broken down into other stages or generalized into fewer stages and/or may or may not include the components shown in the figure). The nanosecond pulser system 100 includes a pulser and transformer stage 101, a resistive output stage 102, a lead stage 103, a DC bias compensation circuit 104, and a load stage 106.

In some embodiments, the nanosecond pulser system 100 can produce pulses from the power supply with voltages greater than 2 kV, with rise times less than about 20 ns, and frequencies greater than about 10 kHz.

In some embodiments, the pulser and transformer stage 101 can produce a plurality of high voltage pulses with a high frequency and fast rise times and fall times. In all of the circuits shown, the high voltage pulser may comprise a nanosecond pulser.

In some embodiments, the pulser and transformer stage 101 can include one or more solid state switches S1 (e.g., solid state switches such as, for example, IGBTs, a MOSFETs, a SiC MOSFETs, SiC junction transistors, FETs, SiC switches, GaN switches, photoconductive switches, etc.), one or more snubber resistors R3, one or more snubber diodes D4, one or more snubber capacitors C5, and/or one or more freewheeling diodes D2. One or more switches and or circuits can be arranged in parallel or series.

In some embodiments, the load stage 106 may represent an effective circuit for a plasma deposition system, plasma etch system, or plasma sputtering system. The capacitance C2 may represent the capacitance of the dielectric material upon which a wafer may sit or capacitance C2 may represent the capacitance between an electrode and a wafer which are separated by a dielectric material. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the plasma sheaths.

In some embodiments, the resistive output stage 102 may include one or more inductive elements represented by inductor L1 and/or inductor L5. The inductor L5, for example, may represent the stray inductance of the leads in the resistive output stage 102. Inductor L1 may be set to minimize the power that flows directly from the pulser and transformer stage 101 into resistor R1.

In some embodiments, the resistor R1 may dissipate charge from the load stage 106, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 106 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 5 nF, 2 nF, 1 nF, 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 101 can be arranged in parallel and coupled with the resistive output stage 102 across the inductor L1 and/or the resistor R1. Each of the plurality of pulser and transformer stages 101 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias compensation circuit 104 may include a DC voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from the pulser and transformer stage 101.

In this example, the DC bias compensation circuit 104 is a passive bias compensation circuit and can include a bias compensation diode D1 and a bias compensation capacitor C15. The bias compensation diode C15 can be arranged in series with offset supply voltage V1. The bias compensation capacitor C15 can be arranged across either or both the offset supply voltage V1 and the resistor R2. The bias compensation capacitor C15 can have a capacitance less than 100 nH to 100 μF such as, for example, about 100 μF, 50 μF, 25 μF, 10 μF, 2μ, 500 nH, 200 nH, etc.

In some embodiments, the bias capacitor C12 may allow for a voltage offset between the output of the pulser and transformer stage 101 (e.g., at the position labeled 125) and the voltage on the electrode (e.g., at the position labeled 124). In operation, the electrode may, for example, be at a DC voltage of –2 kV during a burst, while the output of the nanosecond pulser alternates between +6 kV during pulses and 0 kV between pulses.

The bias capacitor C12, for example, 100 nF, 10 nF, 1 nF, 100 μF, 10 μF, 1 μF, etc. The resistor R2, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor C15 and the bias compensation diode D1 may allow for the voltage offset between the output of the pulser and transformer stage 101 (e.g., at the position labeled 125) and the voltage on the electrode (e.g., at the position labeled 124) to be established at the beginning of each burst, reaching the needed equilibrium state. For example, charge is transferred from bias capacitor C12 into bias compensation capacitor C15 at the beginning of each burst, over the course of a plurality of pulses (e.g., about 5-100 pulses), establishing the correct voltages in the circuit.

In some embodiments, the DC bias compensation circuit 104 may include one or more high voltage switches placed across the bias compensation diode D1 and coupled with the power supply V1. In some embodiments, a high voltage switch may include a plurality of switches arranged in series to collectively open and close high voltages.

A high voltage switch may be coupled in series with either or both an inductor and a resistor. The inductor may limit peak current through high voltage switch. The inductor, for example, may have an inductance less than about 100 μH such as, for example, about 250 μH, 100 μH, 50 μH, 25 μH, 10 μH, 5 μH, 1 μH, etc. The resistor, for example, may shift power dissipation to the resistive output stage 102. The resistance of resistor may have a resistance of less than about 1,000 ohms, 500 ohms, 250 ohms, 100 ohms, 50 ohms, 10 ohms, etc.

In some embodiments, a high voltage switch may include a snubber circuit.

In some embodiments, the high voltage switch may include a plurality of switches arranged in series to collectively open and close high voltages. For example, the high voltage switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, a high voltage switch may be open while the pulser and transformer stage 101 is pulsing and closed when the pulser and transformer stage 101 is not pulsing. When the high voltage switch is closed, for example, current can short across the bias compensation diode C15. Shorting this current may allow the bias between the wafer and the chuck to be less than 2 kV, which may be within acceptable tolerances.

In some embodiments, the pulser and transformer stage 101 can produce pulses having a high pulse voltage (e.g., voltages greater than 1 kV, 10 kV, 20 kV, 50 kV, 100 kV, etc.), high pulse repetition frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

Figure 47:
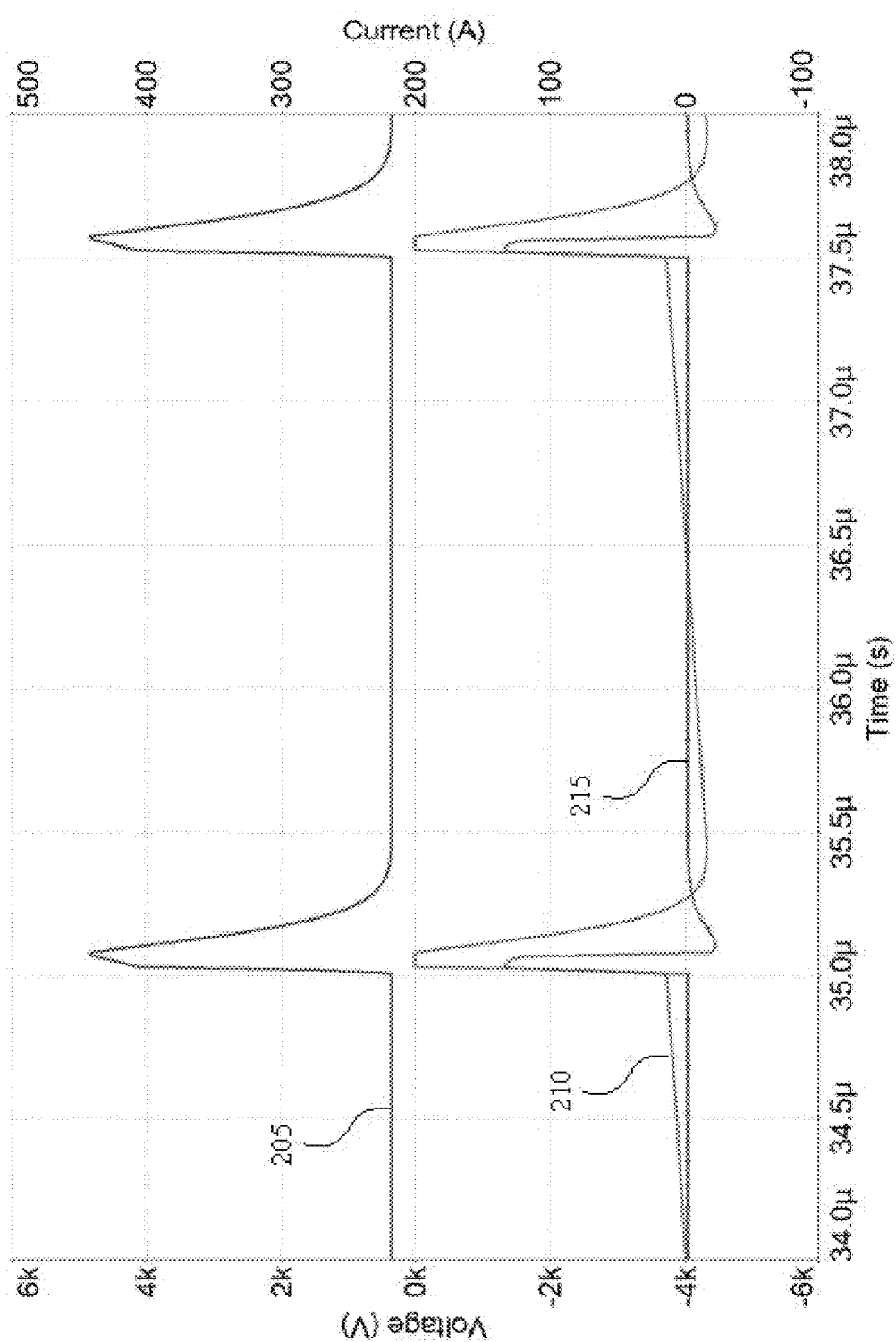
FIG. 47 shows example waveforms produced by the nanosecond pulser.

FIG. 47 shows example waveforms produced by the nanosecond pulser system 100. In these example waveforms, the pulse waveform 205 may represent the voltage provided by the pulser and transformer stage 101. As shown, the pulse waveform 205 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 210 may represent the voltage at the surface of a wafer represented in the circuit shown in FIG. 46 by the point between capacitor C2 and capacitor C3 or the voltage across capacitor C3. The pulse waveform 215 represent the current flowing from the pulser and transformer stage 101 to the plasma. The nanosecond pulser system 100 may or may not include either or both diodes D1 or D2.

During the transient state (e.g., during an initial number of pulses not shown in the figure), the high voltage pulses from the pulser and transformer stage 101 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage pulser to fully charge. Once the capacitor C2 is charged the circuit reaches a steady state, as shown by the waveforms in FIG. 2.

In steady state and when the switch S1 is open, the capacitor C2 is charged and slowly dissipates through the resistive output stage 102, as shown by the slightly rising slope of waveform 210. Once the capacitor C2 is charged and while the switch S1 is open, the voltage at the surface of the waver (the point between capacitor C2 and capacitor C3) is negative. This negative voltage may be the negative value of the voltage of the pulses provided by the pulser and transformer stage 101. For the example waveform shown in FIG. 47, the voltage of each pulse is about 4 kV; and the steady state voltage at the wafer is about −4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the pulser is high as shown in the pulse waveform 205) as the capacitor C2 is charged. In addition, the voltage at the point between capacitor C2 and capacitor C3 (e.g., at the surface of the wafer) changes to about zero as the capacitor C2 charges, as shown in waveform 210. Thus, the pulses from the high voltage pulser produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by the resistive output stage 102, that may rapidly discharge the stray capacitance C1, and may allow the voltage at the point between capacitor C2 and capacitor C3 to rapidly return to its steady negative value of about −4 kV as shown by waveform 210. The resistive output stage may allow the voltage at the point between capacitor C2 and capacitor C3 to exists for about % of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Various other waveforms may be produced by the nanosecond pulser system 100.

Figure 48:
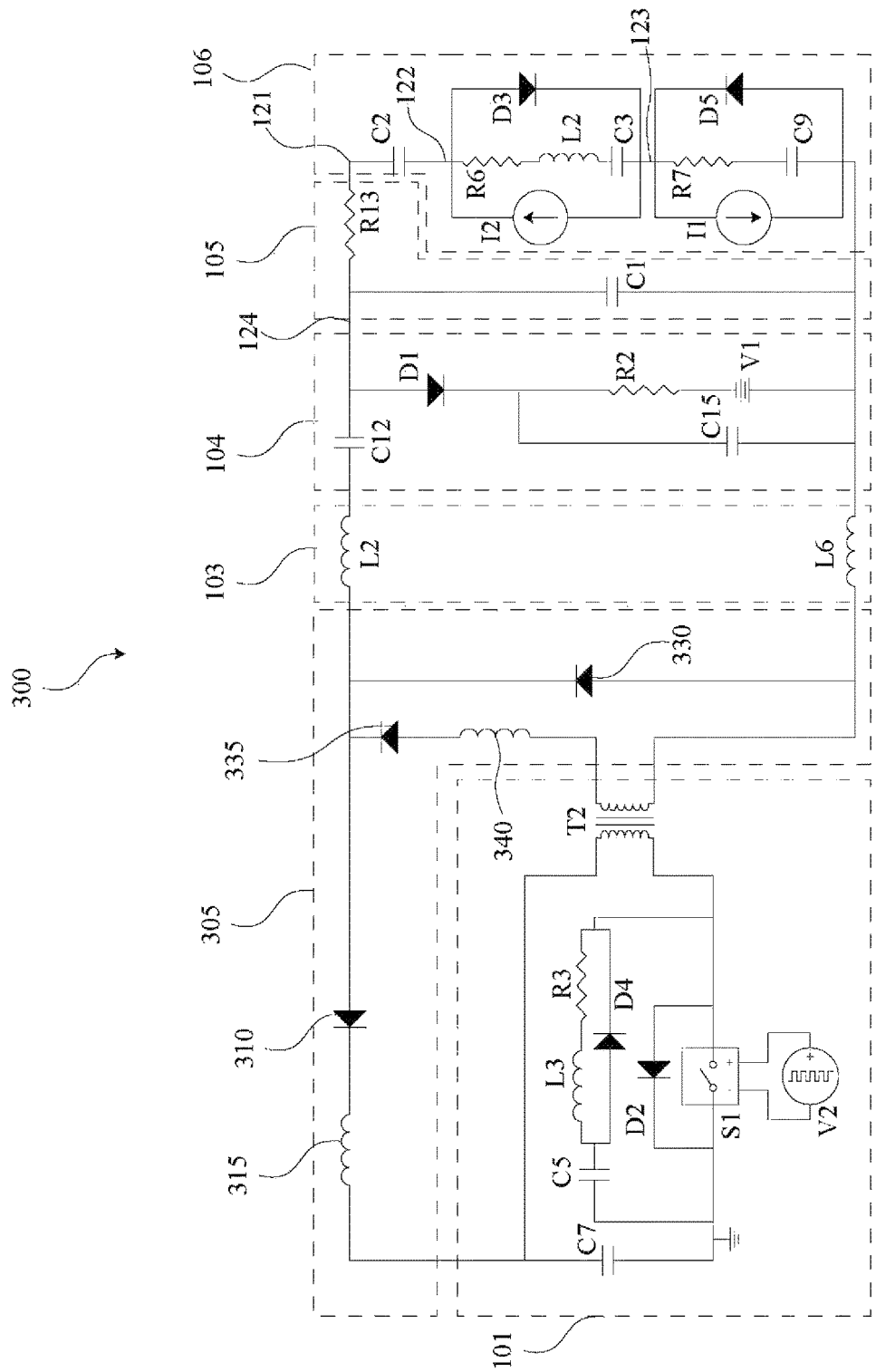
FIG. 48 is another example of a nanosecond pulser according to some embodiments.

FIG. 48 is a circuit diagram of a nanosecond pulser system 300 with the pulser and transformer stage 101 and an energy recovery circuit 305 according to some embodiments. The energy recovery circuit, for example, may replace the resistive output stage 102 shown in FIG. 46. In this example, the energy recovery circuit 305 may be positioned on or electrically coupled with the secondary side of the transformer T1. The energy recovery circuit 305, for example, may include a diode 330 (e.g., a crowbar diode) across the secondary side of the transformer T1. The energy recovery circuit 305, for example, may include diode 310 and inductor 315 (arranged in series), which can allow current to flow from the secondary side of the transformer T1 to charge the power supply C7. The diode 310 and the inductor 315 may be electrically connected with the secondary side of the transformer T1 and the power supply C7. In some embodiments, the energy recovery circuit 305 may include diode 335 and/or inductor 340 electrically coupled with the secondary of the transformer T1. The inductor 340 may represent the stray inductance and/or may include the stray inductance of the transformer T1.

When the nanosecond pulser is turned on, current may charge the load stage 106 (e.g., charge the capacitor C3, capacitor C2, or capacitor C9). Some current, for example, may flow through inductor 315 when the voltage on the secondary side of the transformer T1 rises above the charge voltage on the power supply C7. When the nanosecond pulser is turned off, current may flow from the capacitors within the load stage 106 through the inductor 315 to charge the power supply C7 until the voltage across the inductor 315 is zero. The diode 330 may prevent the capacitors within the load stage 106 from ringing with the inductance in the load stage 106 or the DC bias compensation circuit 104.

The diode 310 may, for example, prevent charge from flowing from the power supply C7 to the capacitors within the load stage 106.

The value of inductor 315 can be selected to control the current fall time. In some embodiments, the inductor 315 can have an inductance value between 1 μH-500 μH.

In some embodiments, the energy recovery circuit 305 may include an energy recovery switch that can be used to control the flow of current through the inductor 315. The energy recovery switch, for example, may be placed in series with the inductor 315. In some embodiments, the energy recovery switch may be closed when the switch S1 is open and/or no longer pulsing to allow current to flow from the load stage 106 back to the high voltage load C7.

In some embodiments, the energy recovery switch may include a plurality of switches arranged in series to collectively open and close high voltages. For example, the energy recovery switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the nanosecond pulser system 300 may produce similar waveforms as those shown in FIG. 47.

Figure 49A:
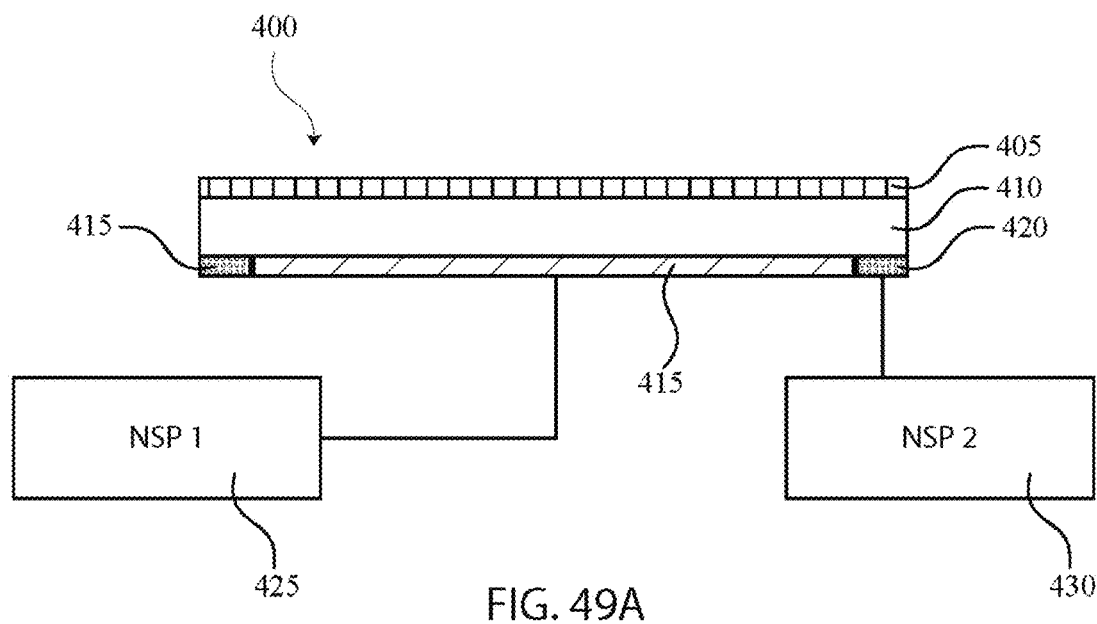
FIG. 49A and FIG. 49B are block diagrams of a spatially variable wafer bias power system according to some embodiments.
Figure 49B:
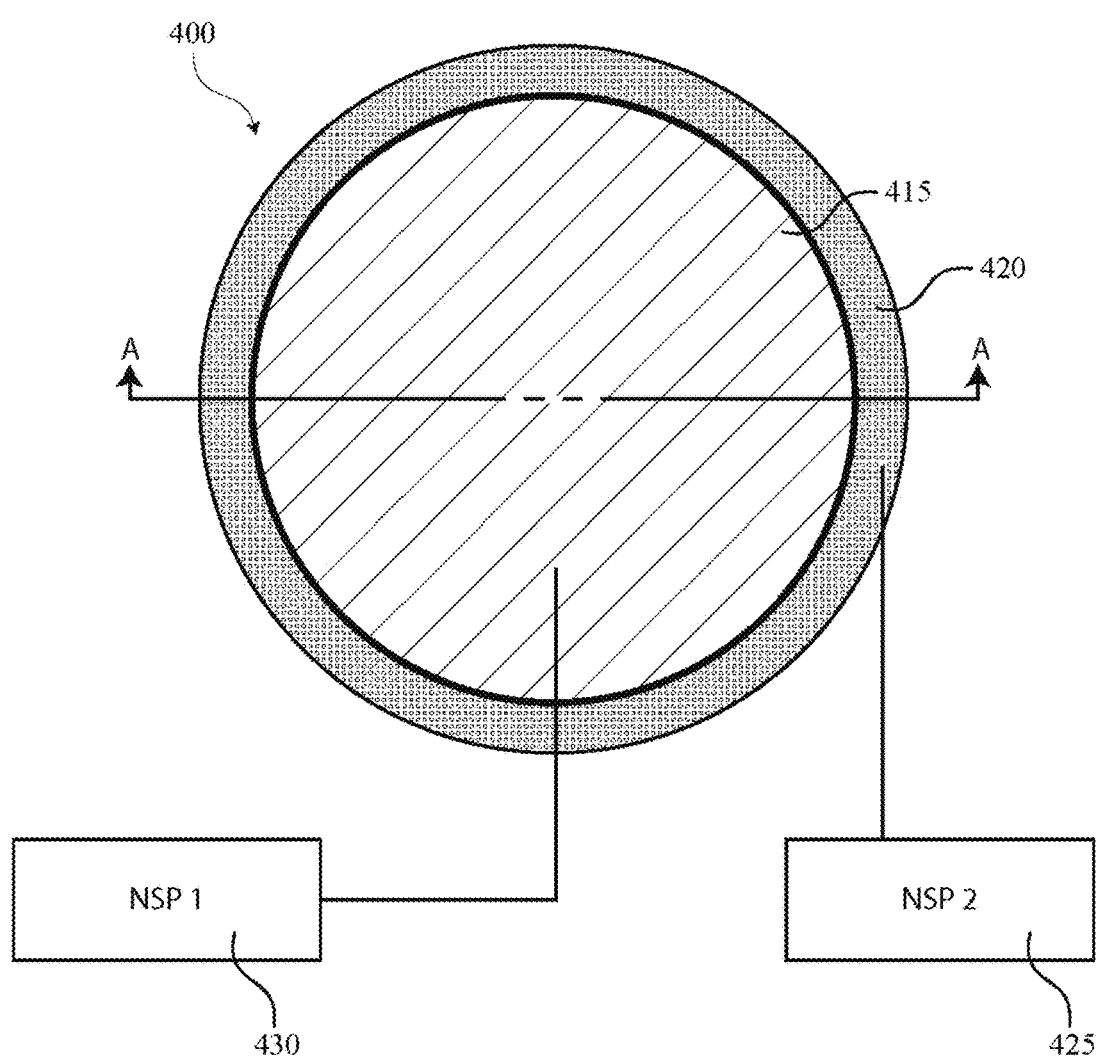

FIG. 49A is a cutaway side view block diagram and FIG. 49B is a top view block diagram of a spatially variable wafer bias power system 400 according to some embodiments. The cutaway side view shown in FIG. 49A is along the line A shown in FIG. B. The spatially variable wafer bias power system 400 includes two electrodes: a first electrode 415 and a second electrode 420. A wafer 405 may be placed on a wafer platform 410 above both the first electrode 415 and the second electrode 420. The wafer platform 410 may comprise a dielectric material such as, for example, a ceramic. The first electrode 415 may be disc shaped with a diameter that is smaller than the diameter of either or both the wafer platform 410 or the wafer 405. The second electrode 420 may have a donut shape with an aperture diameter that is slightly greater than the diameter of the first electrode 415 and an exterior diameter that is substantially similar to either or both the diameter of the wafer platform 410 or the wafer 405. The first electrode 415 may be placed within the aperture of the second electrode 420.

In some embodiments, the gap between the first electrode 415 and the second electrode 420 may be less than about 0.1 mm, 1.0 mm, 5.0 mm, etc. In some embodiments, the space between the first electrode 415 and the second electrode 420 may be filled with air, vacuum, insulating gas, solid dielectric material, or other insulating material.

In some embodiments, the thickness of the first electrode 415 and the second electrode 420 may be substantially the same thickness. In some embodiments, the first electrode 415 and the second electrode 420 may have different thickness.

In some embodiments, the second electrode 420 may have an area that is 5% to 50% of the area of the wafer platform.

In some embodiments, the first electrode 415 and the second electrode 420 may comprise the same material or different material.

In some embodiments, a first high voltage pulser 425 may be coupled with the first electrode 415 and a second high voltage pulser 430 may be coupled with the second electrode 420. For example, the first high voltage pulser 425 and the second high voltage pulser 430 may include the pulser and transformer stage 101 of nanosecond pulser system 100.

In some embodiments, the first high voltage pulser 425 and the second high voltage pulser 430 may provide different pulses. For example, the peak voltage provided by the second high voltage pulser 430 to the second electrode 420 may be different than the peak voltage provided by the first high voltage pulser 425 to the first electrode 415. As another example, the pulse repetition frequency provided by the second high voltage pulser 430 to the second electrode 420 may be different than the pulse repetition frequency provided by the first high voltage pulser 425 to the first electrode 415. As another example, the ion current provided by the second high voltage pulser 430 to the second electrode 420 may be different than the ion current provided by the first high voltage pulser 425 to the first electrode 415.

In some embodiments, the first high voltage pulser 425 and the second high voltage pulser may provide substantially the same pulses. For example, the peak voltage provided by the second high voltage pulser 430 to the second electrode 420 may be substantially the same as the peak voltage provided by the first high voltage pulser 425 to the first electrode 415. As another example, the pulse repetition frequency provided by the second high voltage pulser 430 to the second electrode 420 may be substantially the same as the pulse repetition frequency provided by the first high voltage pulser 425 to the first electrode 415. As another example, the ion current provided by the second high voltage pulser 430 to the second electrode 420 may be substantially the same as the ion current provided by the first high voltage pulser 425 to the first electrode 415.

The first high voltage pulser 425 may include any or all components of the nanosecond pulser system 100. The first high voltage pulser 425 may include any or all components of the nanosecond pulser system 300. In some embodiments, the first high voltage pulser 425 may include any switch described in U.S. patent application Ser. No. 16/178,565, filed Nov. 1, 2018, titled "High Voltage Switch with Isolated Power," which is incorporated into this disclosure in its entirety for all purposes. In some embodiments, the first high voltage pulser 425 may include an RF generator.

The second high voltage pulser 430 may include any or all components of the nanosecond pulser system 100. The second high voltage pulser 430 may include any or all components of the nanosecond pulser system 300. In some embodiments, the second high voltage pulser 430 may include any switch described in U.S. patent application Ser. No. 16/178,565, filed Nov. 1, 2018, titled "High Voltage Switch with Isolated Power," which is incorporated into this disclosure in its entirety for all purposes. In some embodiments, second high voltage pulser 430 may include an RF generator.

In some embodiments, the first high voltage pulser 425 and the second high voltage pulser 430 may provide separately controlled pulse bias voltages or distinct pulse repetition frequencies or pulses that are out of phase such that the voltage pulses applied to the edge of the wafer by the second electrode 420 is distinct from the voltage applied to the center of the wafer by the first electrode 415. Separate voltages may, for example, produce different electric field profiles at the wafer edge compared to center such that the electric field or bias voltage across the wafer 405 is uniform. This may, for example, optimize wafer yield. In some embodiments, the second high voltage pulser 430 may operate at a lower voltage than the first high voltage pulser 425 such as, for example, the second high voltage pulser 430 may operate at 5%, 10%, 15%, 20%, 25%, 30%, etc. of the voltage of the first high voltage pulser 425.

In some embodiments, the pulses provided by the first high voltage pulser 425 may be independently controlled relative to the second high voltage pulser 430.

In some embodiments, the spatially variable wafer bias power system may produce a uniform electric field (e.g., differences less than about 5%, 10%, 15%, or 20%) or uniform voltage across the top of the wafer platform 410 or the wafer 405.

In some embodiments, the spatially variable wafer bias power system may produce a nonuniform electric field or nonuniform voltage across the top of the wafer platform 410 or the wafer 405.

In some embodiments, the first high voltage pulser 425 and the second high voltage pulser 430 may be capacitively coupled with a capacitance between about 1 pF and 100 nF.

In some embodiments, the first high voltage pulser 425 and the second high voltage pulser 430 may be linked. For example, the first high voltage pulser 425 and the second high voltage pulser 430 may comprise a single nanosecond pulser with a voltage divider (e.g., resistive, inductive, or capacitive) that produces different voltages for the first electrode 415 and the second electrode 420. As another example, a single pulser on the primary side of the transformer may be coupled with multiple loads (and energy recovery circuits, resistive output stages, or bias compensation circuits) coupled with different secondary windings on the secondary side of the transformer T2. The different secondary windings may have a different number of windings to produce different voltages.

While two electrodes are shown in FIG. 49A, in some embodiments, any number of electrodes may be used along with any number of nanosecond pulsers. In some embodiments, the first electrode 415 or the second electrode 420 may comprise any geometric region beneath the wafer platform 410 having any geometric shape. Similarly, additional electrodes and nanosecond pulsers may be included and the additional electrodes may have any shape and disposed in any location relative to the other electrodes and relative to the wafer platform.

In some embodiments, the leads from the first high voltage pulser 425 to the first electrode 415 and the leads from the second high voltage pulser 430 to the second electrode 420 may be grouped or bundled together. This bundling, for example, may allow the total stray capacitance to ground of the bundled leads to be less than if each lead was run separately. This bundling, for example, may also conserve power consumption. In some embodiments, the leads may be arranged in a coaxial configuration or in twin lead configuration or as a twisted pair. In some embodiments, the stray capacitance from the outputs to ground may be less than about 100 pF or less than about 1 nF or 10 nF, etc. In some embodiments, the stray inductance of the outputs may be less than about 100 nH, 1 µH, 10 µH, etc. In some embodiments, the capacitive coupling between each output may be less than about 100 pF, 1 nF, 10 nF, etc.

Figure 50:
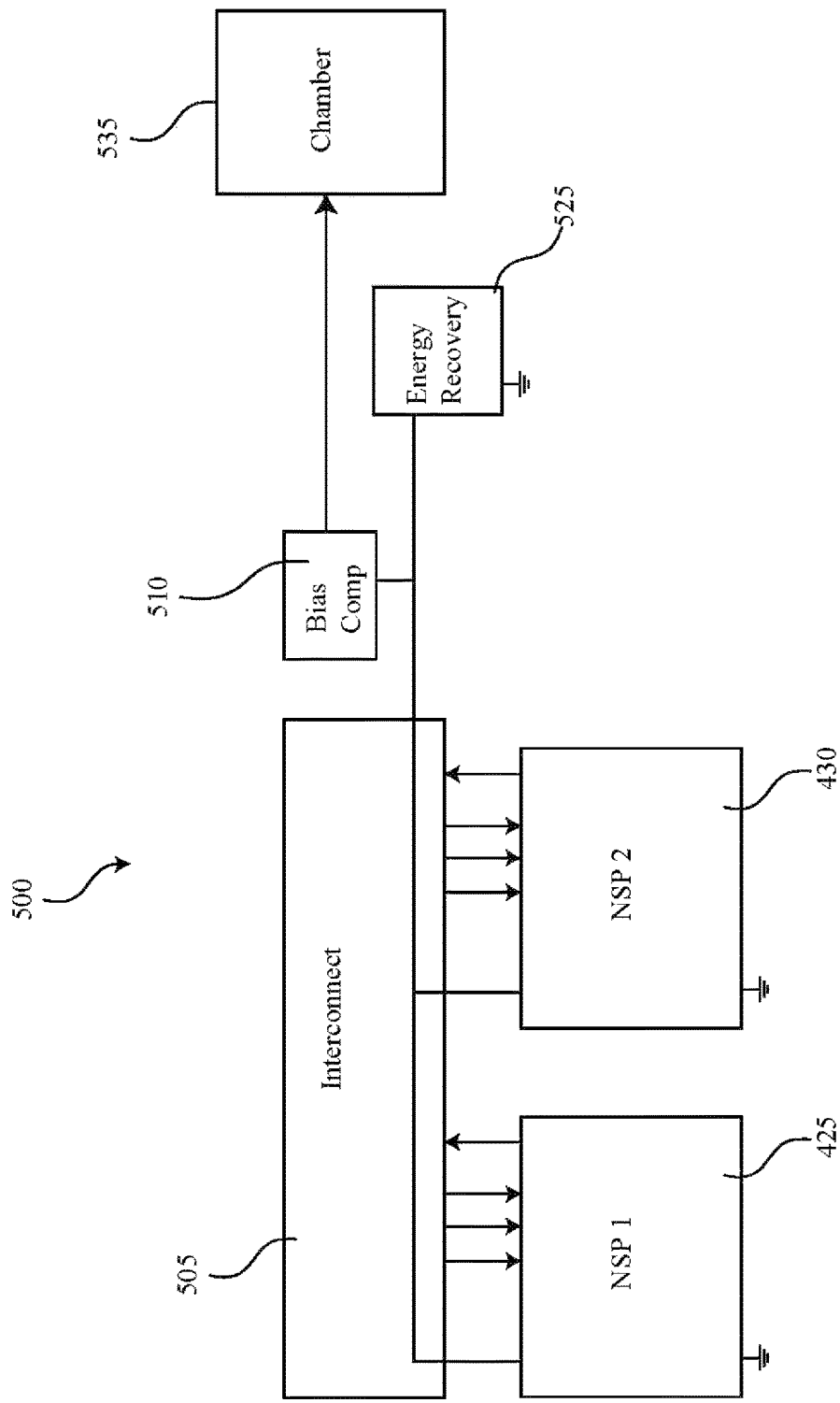
FIG. 50 is a block diagram of a spatially variable wafer bias power system according to some embodiments.

FIG. 50 is a block diagram of a spatially variable wafer bias power system 500 according to some embodiments. The spatially variable wafer bias power system 500 may include the first high voltage pulser 425 and the second high voltage pulser 430.

An interconnect board 505 may be electrically coupled with the first high voltage pulser 425 and the second high voltage pulser 430 or additional high voltage pulsers. In some embodiments, the interconnect board 505 may provide a high DC voltage to each of the first high voltage pulser 425 or the second high voltage pulser 430. In some embodiments, the interconnect board 505 may provide trigger signals to the first high voltage pulser 425 or the second high voltage pulser 430. In some embodiments, the interconnect board 505 may provide low voltage pulses to the first high voltage pulser 425 or the second high voltage pulser 430.

In some embodiments, the interconnect board 505 may include a controller or processor that includes one or more components of computational system 900. In some embodiments, one more sensors may be included that measure a characteristic of the plasma chamber such as, for example, the electric field on the surface of a wafer, the uniformity of an electric field, the voltage on a first electrode 415, the voltage on a second electrode 420, the voltage across a resistor in one or more resistive output stages or one or more energy recovery circuits. Based on the measurement from the sensors, the voltage, pulse width, or pulse repetition frequency of the first high voltage pulser 425 and the second high voltage pulser 430 may be adjusted.

For example, if the voltage on the second electrode 420 is measured and determined to be lower than the voltage on the first electrode 415, which may cause an electric filed non-uniformity (e.g., differences less than about 5%, 10%, 15%, or 20%) on the surface of the wafer. The controller may adjust the pulse width of the control pulse being sent to the second high voltage pulser 430, which may increase the voltage produced by the second high voltage pulser 430 (e.g., by increasing the capacitive charging time) and, therefore, increasing the electric field on the second electrode. The process may repeat until the electric field across the surface of the wafer is uniform (e.g., within 10%, 15%, 20%, 25%, etc.).

As another example, the voltages across a first resistive output stage and a second resistive output stages may be measured. These voltages can correspond to the ion current flowing in the chamber This current may be affected by the electrode voltage. If the ion current to the first electrode and the ion current to the second electrode are nonuniform or misaligned (e.g., a difference greater than 10%, 20% or 30%), then the controller may adjust the pulse width of the control pulse being sent to either the first high voltage pulser 425 or the second high voltage pulser 430, which may increase the voltage produced by the nanosecond pulser (e.g., by increasing the capacitive charging time) and, therefore, increasing the electric field on the corresponding electrode.

In some embodiments, pulses from the first high voltage pulser 425 and the second high voltage pulser 430 may pass to the energy recovery circuit 525 and to the plasma chamber 535 via a chamber interface board or the bias compensation circuit 510. The energy recovery circuit 525, for example, may include the resistive output stage 102 of nanosecond pulser system 100. As another example, the energy recovery circuit 525 may include the energy recovery circuit 305. As another example, the energy recovery circuit 525 may not be required. As another example, an energy recovery circuit 525 may be coupled with either or both the first high voltage pulser 425 or the second high voltage pulser 430. In some embodiments, the plasma chamber 535 may include a plasma chamber, an etch chamber, a deposition chamber, etc. In some embodiments, the effective circuit of the plasma chamber 535 may include load stage 106.

While two high voltage pulsers are shown, any number may be used. For example, multiple rings of electrodes may be coupled with multiple high voltage pulsers.

In some embodiments, the first high voltage pulser 425 may produce pulses that are different than pulses produced by the second high voltage pulser 430. For example, the first high voltage pulser 425 may provide pulses of at least 2 kV of pulsed output. In some embodiments, the second high voltage pulser 430 may provide pulses of at least 2 kV of pulsed output that are either the same or different than the pulses provided by the first high voltage pulser 425.

As another example, the first high voltage pulser 425 may produce pulses with a first pulse repetition frequency and the second high voltage pulser 430 may produce pulses with a second pulse repetition frequency. The first pulse repetition frequency and the second pulse repetition frequency may be the same or different. The first pulse repetition frequency and the second pulse repetition frequency may be in phase or out of phase with respect to each other.

As another example, the first high voltage pulser 425 may produce a first plurality of bursts with a first burst repetition frequency and the second high voltage pulser 430 may produce a second plurality of bursts with a second burst repetition frequency. Each burst may comprise a plurality of pulses. The first burst repetition frequency and the second burst repetition frequency may be the same or different. The first burst repetition frequency and the second burst repetition frequency may be in phase or out of phase with respect to each other.

In some embodiments, the first high voltage pulser 425 and the second high voltage pulser 430 may be water- or dielectric-cooled.

Figure 51:
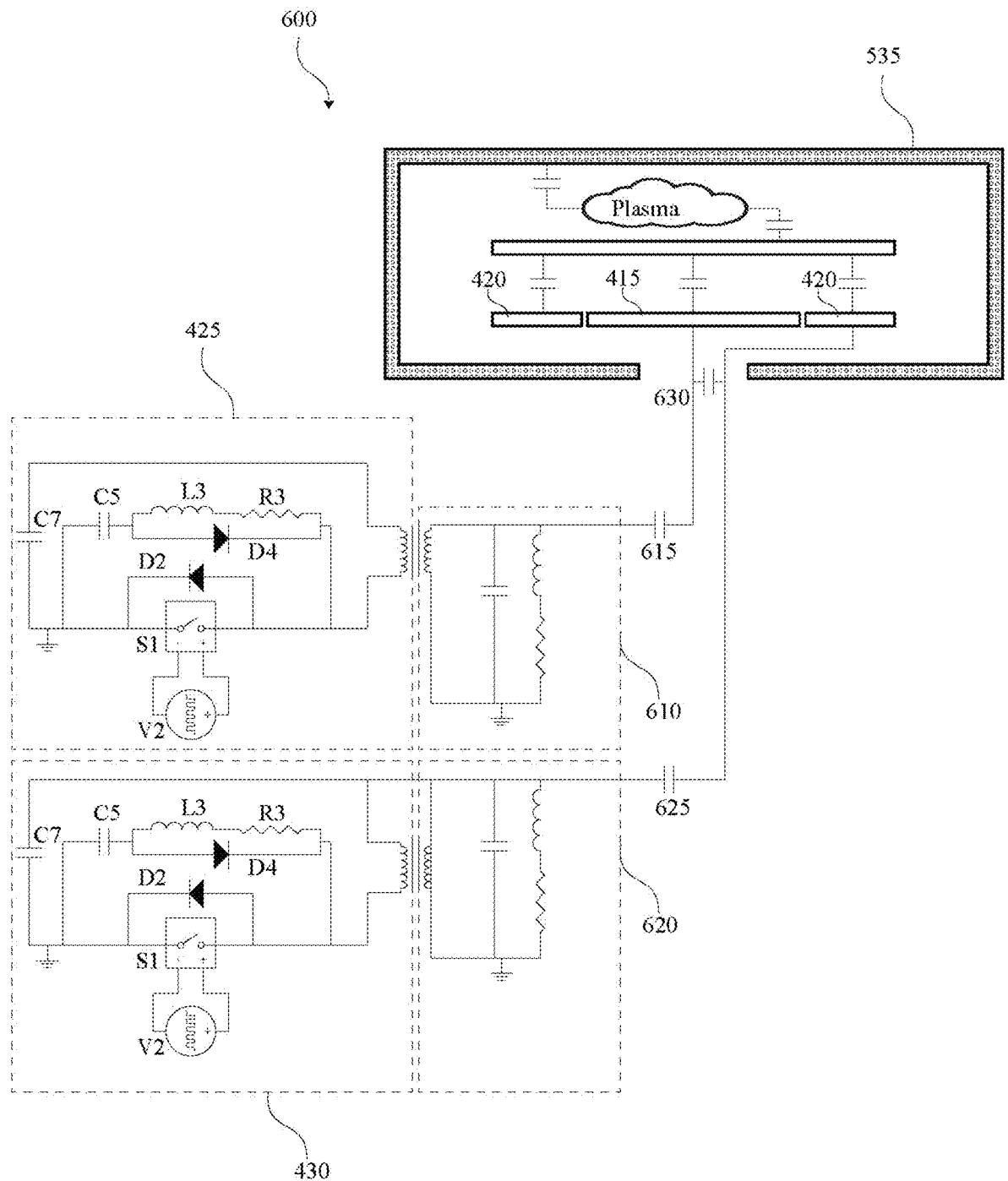
FIG. 51 is a schematic of a spatially variable wafer bias system according to some embodiments.

FIG. 51 is a schematic of a spatially variable wafer bias system 600 according to some embodiments. The spatially variable wafer bias system 600 may include a first high voltage pulser 425 and a second high voltage pulser 430 coupled with a plasma chamber 535.

In this example, the first high voltage pulser 425 includes a first resistive output stage 610 and a first bias capacitor 615. In some embodiments, the first resistive output stage 610 may not be used and an energy recovery circuit may be used such as, for example, as shown in nanosecond pulser system 300.

In this example, the second high voltage pulser 430 includes a second resistive output stage 620 and a second bias capacitor 625. In some embodiments, the second resistive output stage 620 may not be used and an energy recovery circuit may be used such as, for example, as shown in nanosecond pulser system 300.

A first electrode 415 and a second electrode 420 are disposed in the plasma chamber 535. In this example, the first electrode 415 is disc shaped and disposed within a central aperture of the second electrode 420. The first high voltage pulser 425 is electrically coupled with the first electrode 415 and the second high voltage pulser 430 is electrically coupled with the second electrode 420. In some embodiments, a stray coupling capacitance 630 can exist between the first high voltage pulser 425 and the second high voltage pulser 430. The stray coupling capacitance 630, for example, may be less than about 100 pF, about 1 nF, about 10 nF, etc.

Figure 52:
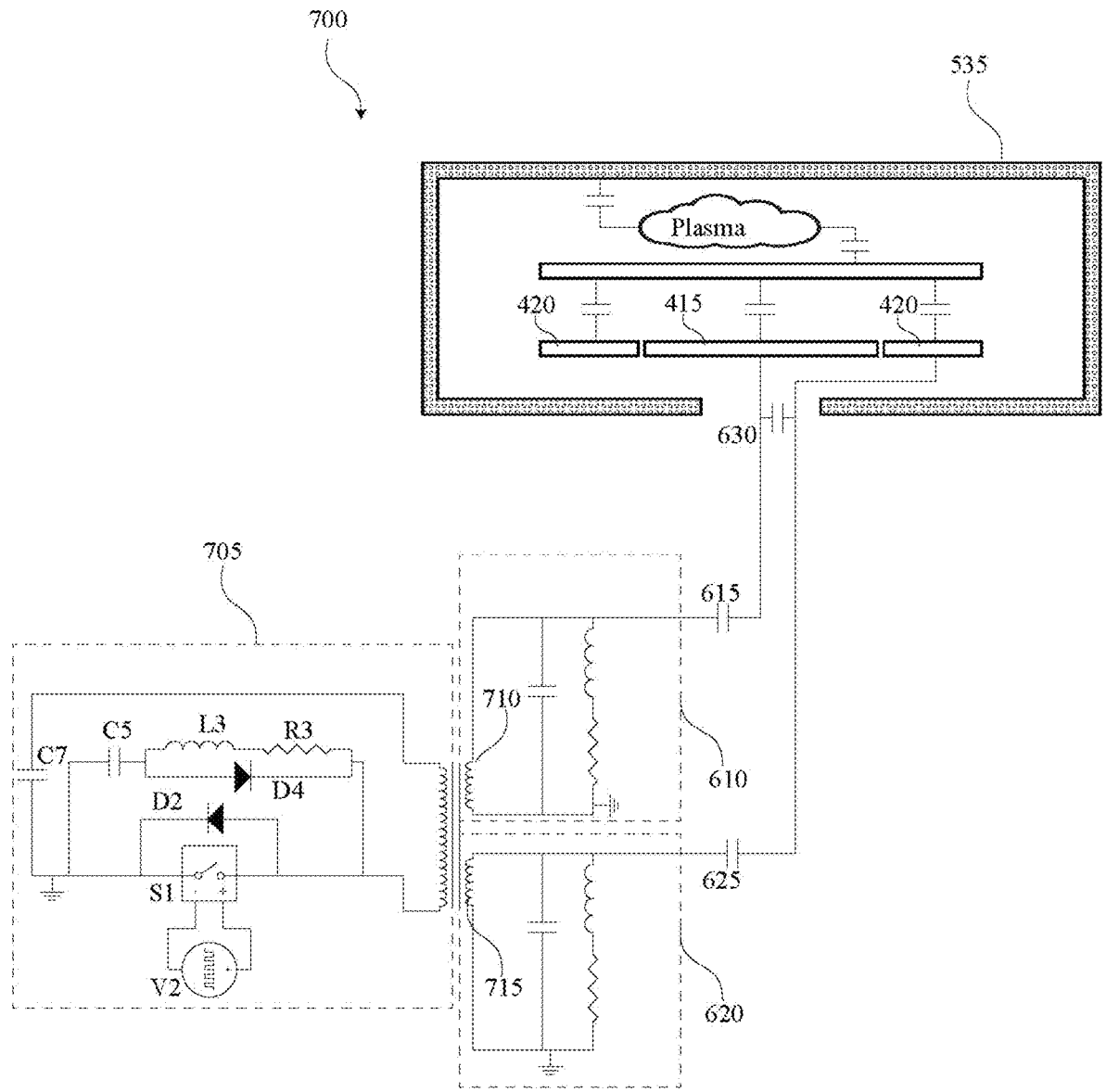
FIG. 52 is a schematic of a spatially variable wafer bias system according to some embodiments.

FIG. 52 is a schematic of a spatially variable wafer bias system 700 according to some embodiments. In this example, the spatially variable wafer bias system 700 utilizes multiple isolated secondary windings to provide different voltages on two different wafer spatial regions. The spatially variable wafer bias system 700 includes a single high voltage pulser 705. The single high voltage pulser 705 may include the pulser and transformer stage 101 shown in FIG. 46 or FIG. 48. In this example, two distinct sets of secondary windings can be wound around the transformer T1. A first secondary winding 710 may be electrically coupled with a first resistive output stage 610 and a first bias capacitor 615 forming a first electrode channel. A second secondary winding 715 may be electrically coupled with a second resistive output stage 620 and a second bias capacitor 625 forming a second electrode channel. In some embodiments, a stray coupling capacitance 630 can exist between the first electrode channel and the second electrode channel. The stray coupling capacitance 630, for example, may be less than about 100 pF, about 1 nF, about 10 nF, etc.

In some embodiments, a first energy recover circuit (e.g., energy recovery circuit 305) can be used instead of the first resistive output stage 610 and a second energy recover circuit (e.g., energy recovery circuit 305) can be used instead of the second resistive output stage 620. The first energy recovery circuit and the second energy recovery circuit may be arranged in parallel.

The voltage on the first electrode 415 and the second voltage on the second electrode 420 may depend on the number of windings of the first secondary windings and the second secondary windings.

Figure 53:
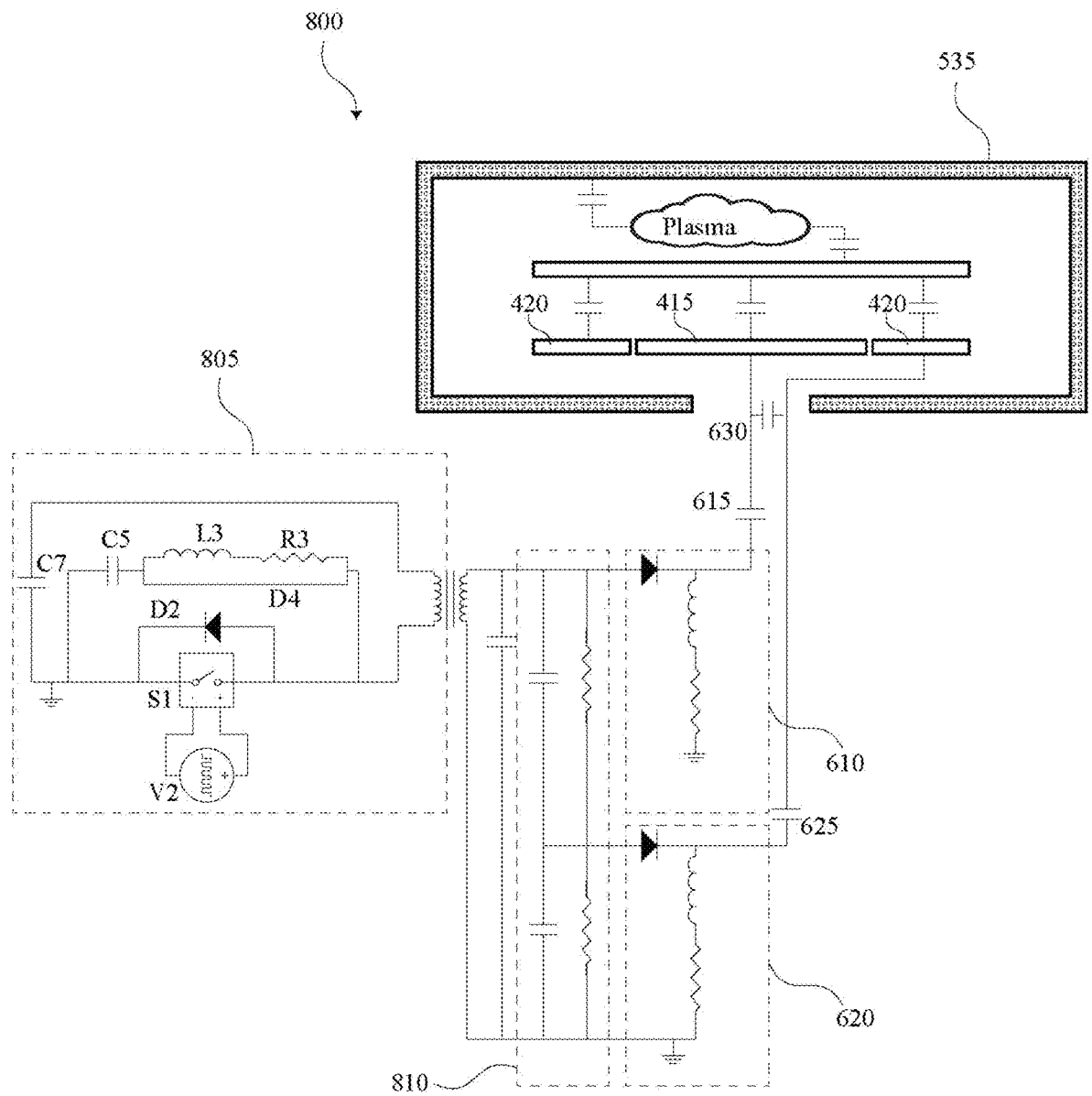
FIG. 53 is a schematic of a spatially variable wafer bias system according to some embodiments.

FIG. 53 is a schematic of a spatially variable wafer bias system 800 according to some embodiments. In this example, the spatially variable wafer bias system 800 utilizes a voltage divider to provide different voltages on two different wafer spatial regions. The spatially variable wafer bias system 800 includes a single high voltage pulser 805 and a voltage divider 810. The voltage divider 810 may include a plurality of resistors and capacitors. The value of the resistors and capacitors can be selected to provide the voltage ratio of the voltage of the pulses provided to the first electrode channel which provides pulses to the first electrode 415 and the voltage of the pulses provided to the second electrode channel which provides pulses to the second electrode 420.

The first electrode channel can include a first resistive output stage 610 and a first bias capacitor 615. The second electrode channel can include a second resistive output stage 620 and a second bias capacitor 625.

In some embodiments, a stray coupling capacitance 630 can exist between the first electrode channel and the second electrode channel. The stray coupling capacitance 630, for example, may be less than about 100 pF, about 1 nF, about 10 nF, etc.

In some embodiments, a first energy recover circuit (e.g., energy recovery circuit 305) can be used instead the first resistive output stage 610 and a second energy recover circuit (e.g., energy recovery circuit 305) can be used instead of the second resistive output stage 620. The first energy recovery circuit and the second energy recovery circuit may be arranged in parallel.

Unless otherwise specified, the term "substantially" means within 5% or 10% of the value referred to or within manufacturing tolerances. Unless otherwise specified, the term "about" means within 5% or 10% of the value referred to or within manufacturing tolerances.

Figure 54:
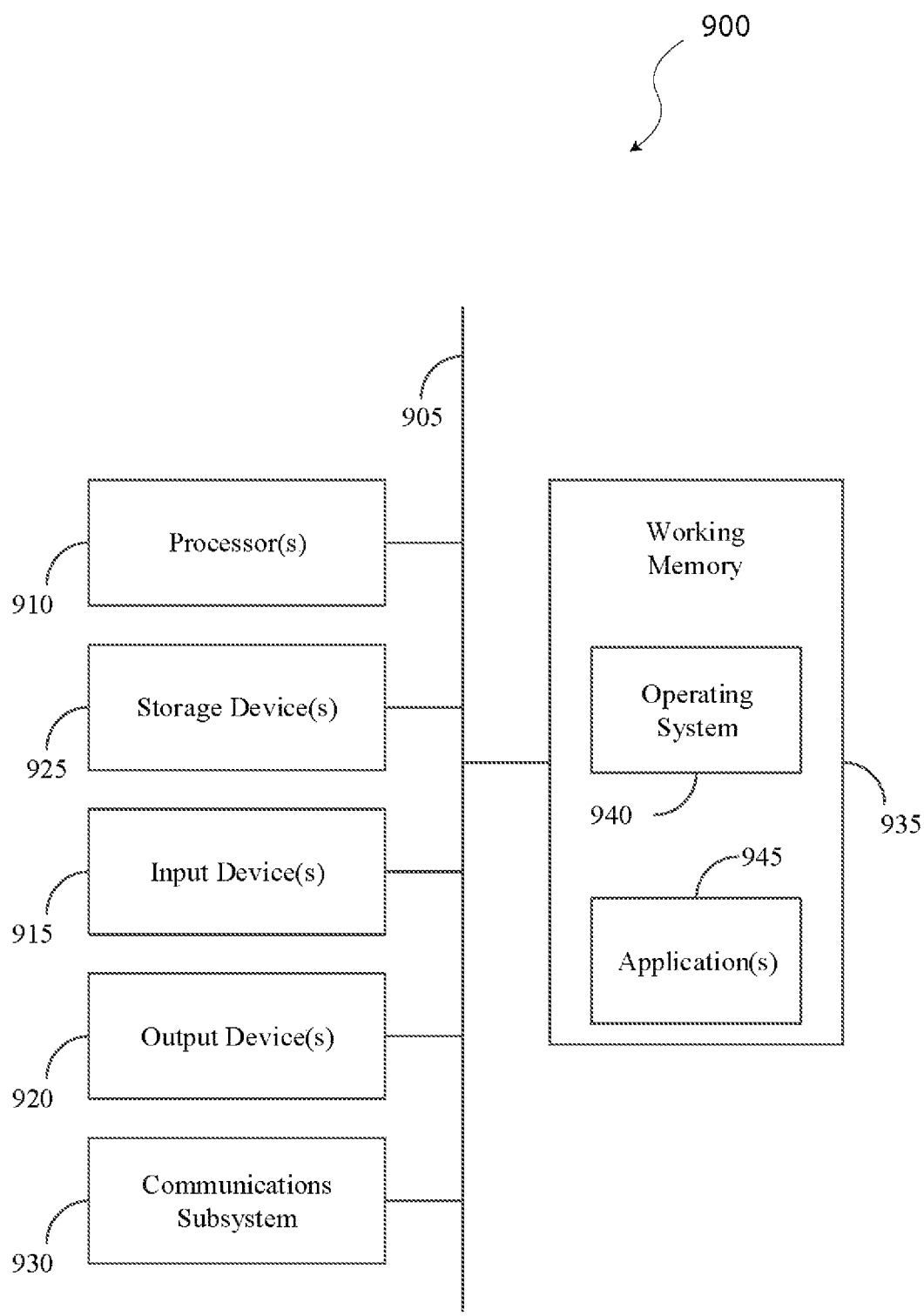
FIG. 54 shows an illustrative computational system for performing functionality to facilitate implementation of embodiments described herein.
Figure 55:
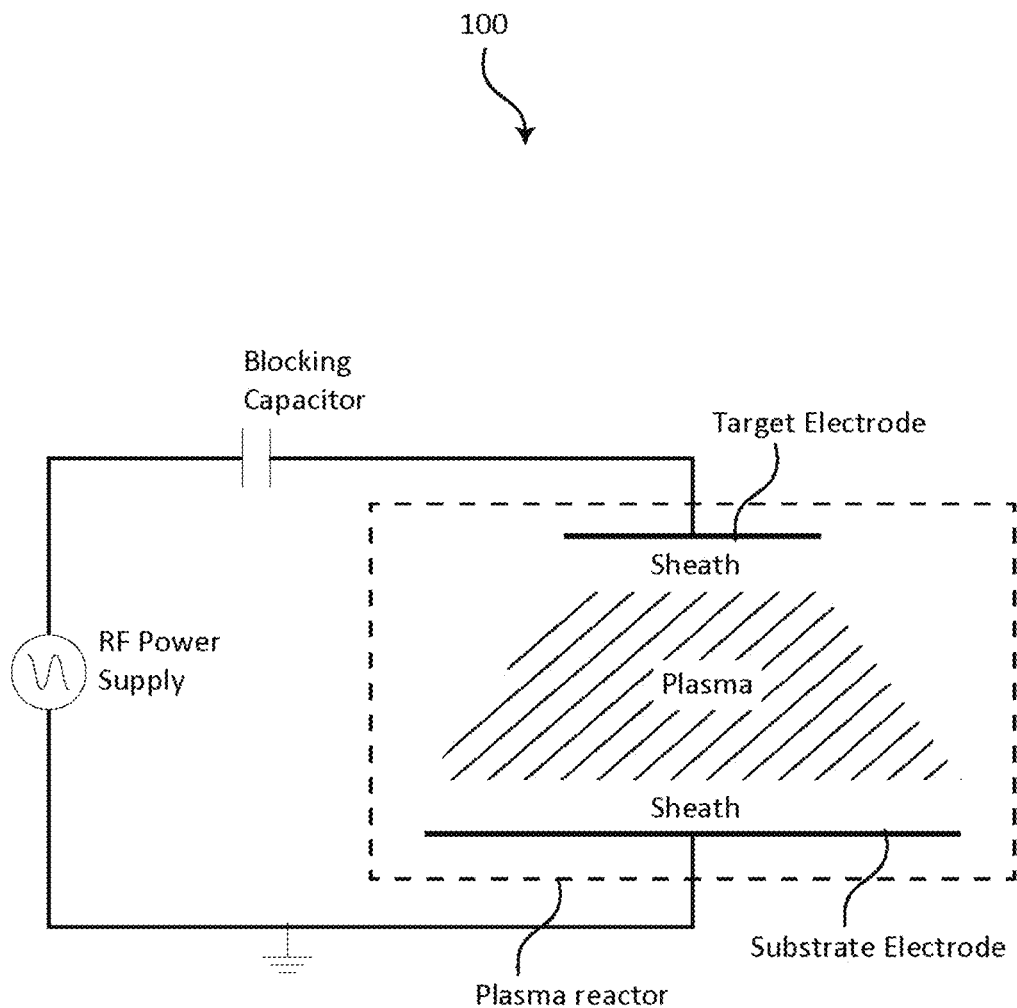
FIG. 55 is a schematic representation of an RF plasma reactor according to some embodiments.

The computational system 900, shown in FIG. 54 can be used to perform any of the embodiments of the invention. As another example, computational system 900 can be used perform any calculation, identification and/or determination described here. The computational system 900 includes hardware elements that can be electrically coupled via a bus 905 (or may otherwise be in communication, as appropriate). The hardware elements can include one or more processors 910, including without limitation one or more general-purpose processors and/or one or more special-purpose processors (such as digital signal processing chips, graphics acceleration chips, and/or the like); one or more input devices 915, which can include without limitation a mouse, a keyboard and/or the like; and one or more output devices 920, which can include without limitation a display device, a printer and/or the like.

The computational system 900 may further include (and/or be in communication with) one or more storage devices 925, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 900 might also include a communications subsystem 930, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 930 may permit data to be exchanged with a network (such as the network described below, to name one example), and/or any other devices described herein. In many embodiments, the computational system 900 will further include a working memory 935, which can include a RAM or ROM device, as described above.

The computational system 900 also can include software elements, shown as being currently located within the working memory 935, including an operating system 940 and/or other code, such as one or more application programs 945, which may include computer programs of the invention, and/or may be designed to implement methods of the invention and/or conFIG. systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 925 described above.

In some cases, the storage medium might be incorporated within the computational system 900 or in communication with the computational system 900. In other embodiments, the storage medium might be separate from a computational system 900 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 900 and/or might take the form of source and/or installable code, which, upon compilation and/or installation on the computational system 900 (e.g., using any of a variety of generally available compilers, installation programs, compression/decompression utilities, etc.) then takes the form of executable code.

A plasma sheath control system is disclosed that includes either or both a diode and a capacitive discharge circuit (e.g., a resistive output stage or an energy recovery circuit) and/or a high voltage switch with a blocking diode. In some embodiments, the plasma sheath control circuit can include a RF bias power supply with a plasma chamber to fabricate semiconductors or similar devices. In some embodiments, a plasma sheath control circuit can produce an output that creates a plasma within a semiconductor fabrication device. For example, such that a more controllable and constant plasma sheath potential can be produced between the plasma and a target electrode or wafer. The enhanced control may allow for a peaked and/or adjustable Ion Energy Distribution of the bombarding ions from the plasma, which may, for example, result in higher application performance such as, for example, in etching, thin film deposition, ion deposition, solar panel, and/or display panel fabrication etc. Additionally or alternatively, a roughly constant voltage potential between the wafer and a chuck may be maintained at approximately 2 kV during periods when the plasma sheath control circuit is turned on and when the plasma sheath control circuit is turned off. In some embodiments, the RF power supply system can produce sinusoidal waveform with peak amplitudes greater than about 1 kV-10 kV.

Figure 56:
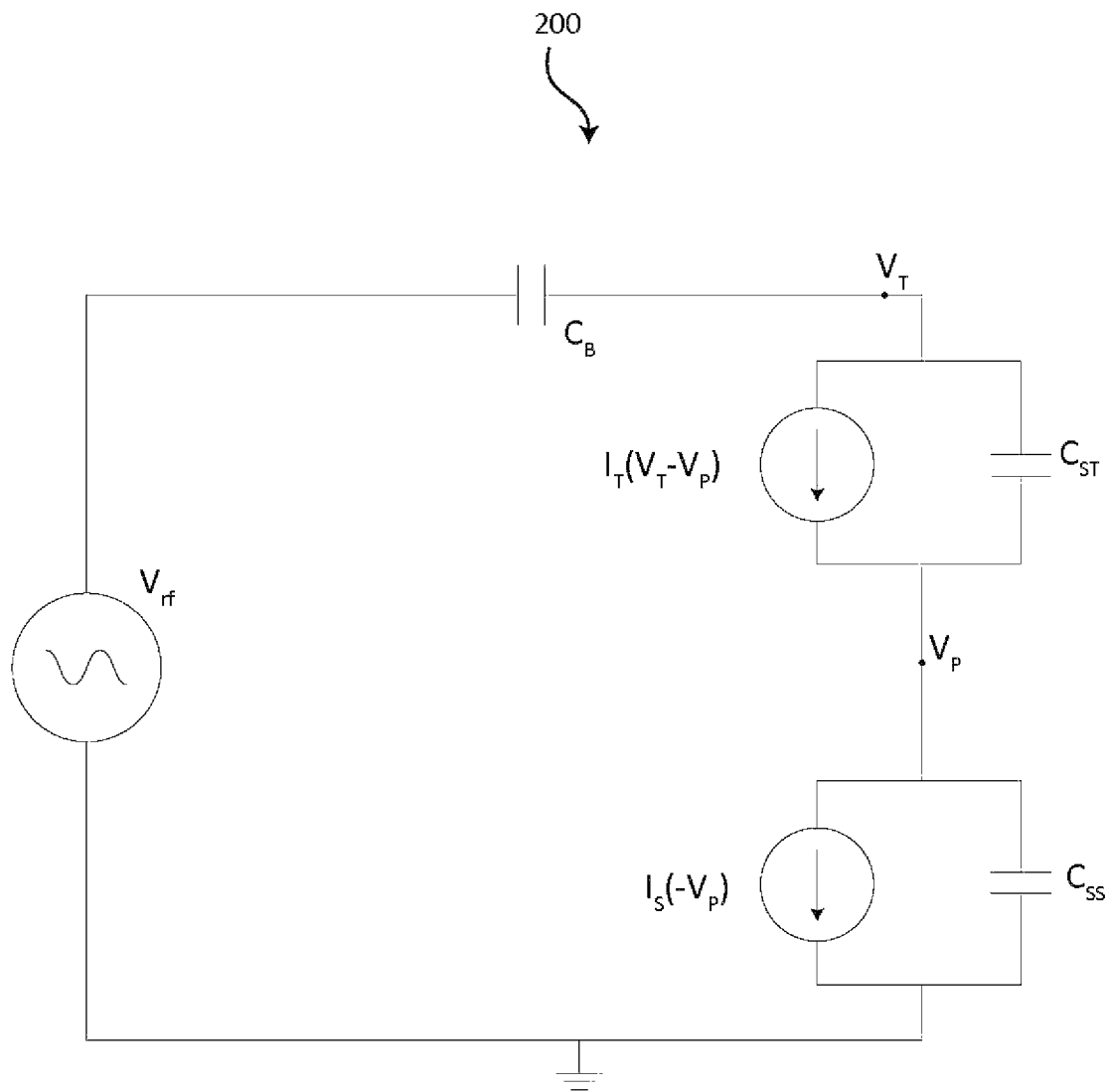
FIG. 56 is schematic of the RF driver for an RF plasma chamber according to some embodiments.

FIG. 56 is schematic of an RF driver of an RF plasma power supply and reactor. Here, $V_{RF}$ is the voltage of the applied Sinusoidal waveform from a matched RF power supply. $V_T$ and $V_P$ are the potentials of the target electrode and the plasma, respectively. In addition, $V_{SS}=V_P$ and $V_{ST}=V_T-V_P$ are the voltages across the substrate or chamber wall plasma sheath and the target plasma sheath, respectively. The blocking capacitor is represented by $C_B$; $C_{ST}$ and $I_T$ represent the capacitance of and conduction current through the sheath adjacent to the target electrode, respectively, while $C_{ss}$ and $I_S$ represent the corresponding values for the sheath adjacent to the substrate electrode.

The electrical resistance of the plasma is small with respect to the sheath resistance for the plasma electron densities and voltage frequency range considered in the present discussion. However, inclusion of the plasma resistance does not introduce any complications for the circuit model.

Figure 57:
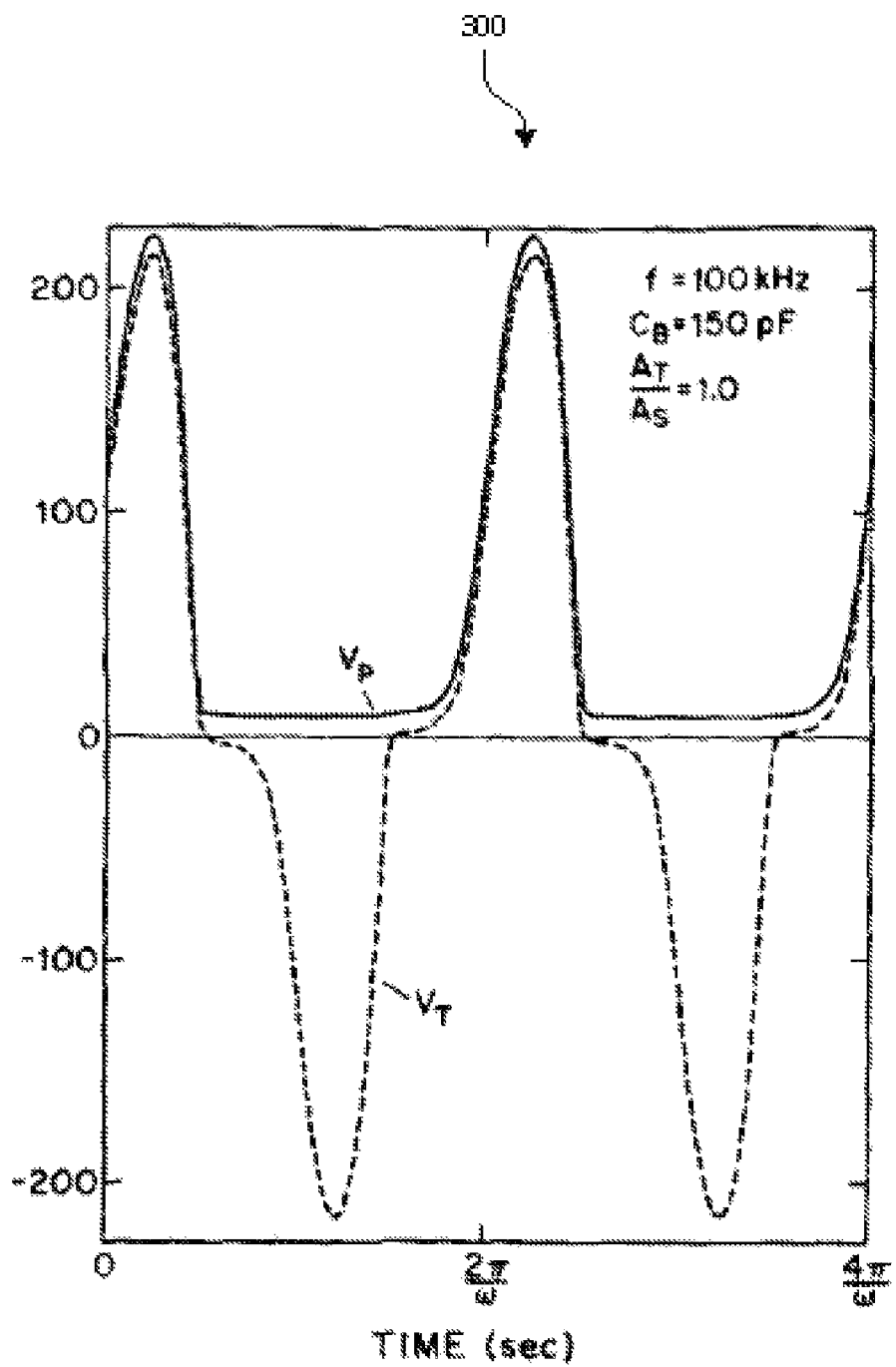
FIG. 57 illustrates waveforms of the voltage $V_r$ across a plasma chamber and the plasma potential $V_P$ for equal areas of the target and substrate electrodes.

FIG. 57. Illustrates waveforms of the voltage $V_r$ across the plasma reactor and the plasma potential $V_P$ for equal areas of the target and substrate electrodes.

Figure 58:
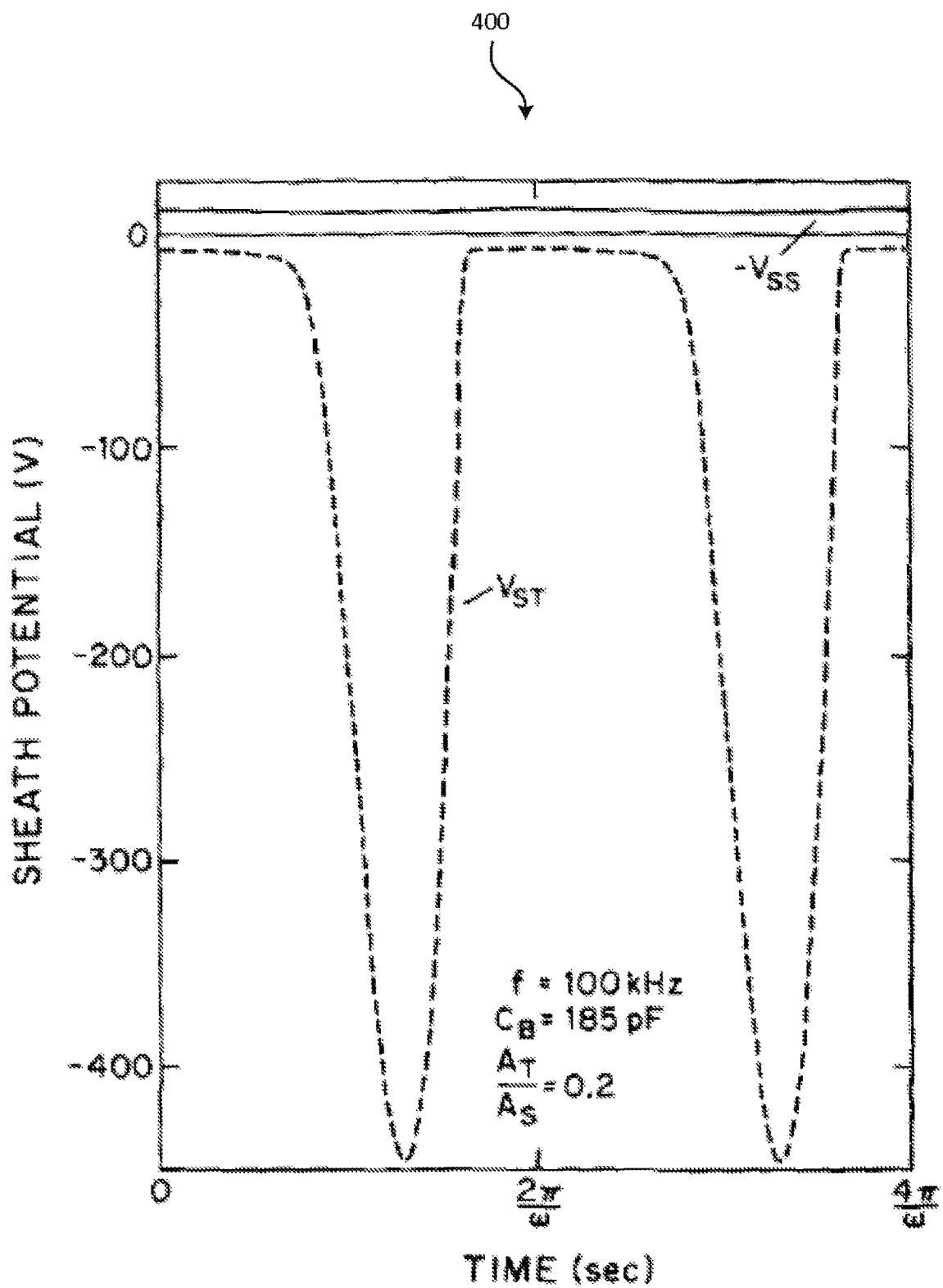
FIG. 58 illustrates waveforms of the potential $V_{ST}$ across a plasma sheath adjacent to the target electrode within a plasma chamber and that of the potential $V_{ss}$ across the sub-strate electrode.

FIG. 58 Illustrates waveforms of the potential $V_{ST}$ across the plasma sheath adjacent to the target electrode and that of the potential $V_{ss}$ across the sub-strate electrode sheath for $A_T/A_S=0.2$. FIG. 58 shows the half sine wave of the sheath potential going from 0 to −450V.

Figure 59:
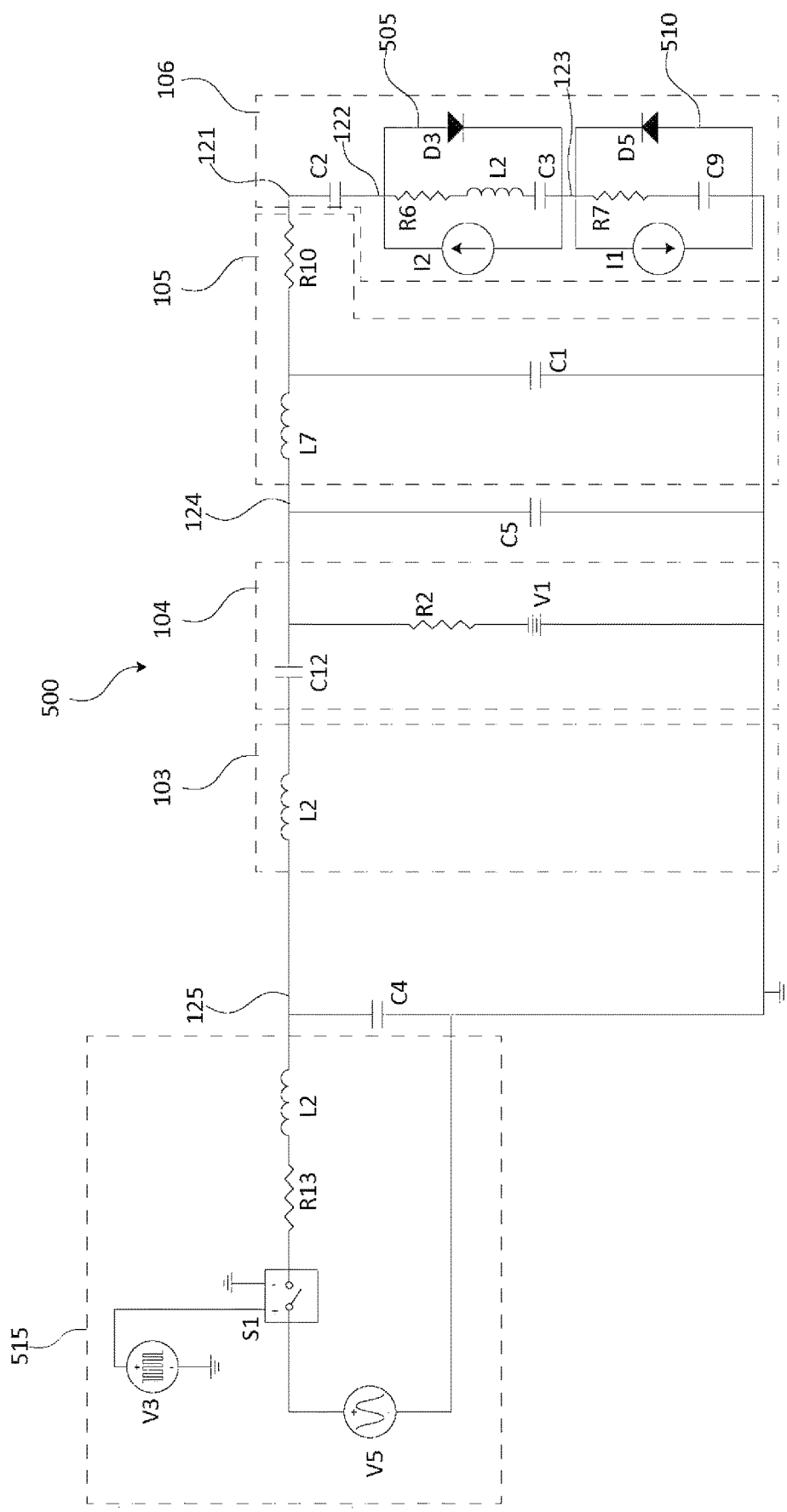
FIG. 59 is a schematic of a plasma sheath control system for an RF chamber according to some embodiments.

FIG. 59 is a schematic of a plasma sheath control system 500 for an RF chamber according to some embodiments. The plasma sheath control system 500 includes a circuit representing the wafer plasma sheath 505 developed on the wafer and a circuit representing the wall plasma sheath 510 on the wall of the plasma chamber. Capacitor C3 represents the sheath capacitance between plasma and the wafer, which may be function of both physical geometry and plasma parameters across the sheath. Capacitor C9 represents the sheath capacitance between plasma and the plasma chamber wall, which may be function of both physical geometry and plasma parameters across the sheath RF power source $V_5$ is the RF voltage supply which provides a high voltage Sinusoidal waveform. Switch S2 can be used to turn on and turn off the RF power source V5, which may be an element for modeling the turning off and on of the RF power source V5. The various other components represent stray capacitance, inductance, and/or resistance.

In some embodiments, the lead stage 103 may represent either or both the leads or traces between the RF generator 515 and the DC bias circuit 104. Either or both the inductor L2 or the inductor L6 may represent the inductance with either or both the leads or traces.

In this example, the DC bias circuit 104 does not include any bias compensation. The DC bias circuit 104 includes an offset supply voltage V1 that may, for example, bias the output voltage either positively or negatively. In some embodiments, the offset supply voltage V1, can be adjusted to change the offset between the wafer voltage and the chuck voltage. In some embodiments, offset supply voltage V1 can have a voltage of about ±5 kV, ±4 kV, ±3 kV, ±2, kV, ±1 kV, etc. kV.

In some embodiments, the bias capacitor C12 can isolate (or separate) the DC bias voltage from either or both the resistive output stage or other circuit elements. The bias capacitor C12, for example, may allow for a potential shift from one portion of the circuit to another. In some embodiments, this potential shift may ensure that the electrostatic force holding the wafer in place on the chuck remains below the voltage threshold. The resistor R2 may isolate the DC bias supply from the high voltage sinusoidal waveform output from the RF generator 515.

The bias capacitor C12, for example, 100 pF, 10 pF, 1 pF, 100 µF, 10 µF, 1 µF, etc. The resistor R2, for example, may have a high resistance such as, for example, a resistance of about 1 kOhm, 10 kOhm, 100 kOhm, 1 MOhm, 10 MOhm, 100 MOhm, etc.

The second lead stage 105 represents circuit elements between the RF power circuit and the load stage 106. The resistor R13, for example, may represent the stray resistance of the leads or transmission lines that connect from the output of the high voltage power system to the electrode (e.g., the load stage 106). The capacitors C1, for example, may represent stray capacitance in the leads or transmissions line.

In some embodiments, the load stage 106 may represent an idealized or effective circuit for semiconductor processing chamber such as, for example, a plasma deposition system, semiconductor fabrication system, plasma sputtering system, etc. The capacitance C2, for example, may represent the capacitance of the chuck upon which the wafer may sit. The chuck, for example, may comprise a dielectric material. For example, the capacitor C1 may have small capacitance (e.g., about 10 pF, 100 pF, 500 pF, 1 nF, 10 nF, 100 nF, etc.).

The capacitor C3, for example, may represent the sheath capacitance between the plasma and the wafer. The resistor R6, for example, may represent the sheath resistance between the plasma and the wafer. The inductor L2, for example, may represent the sheath inductance between the plasma and the wafer. The current source I2, for example, may be represent the ion current through the sheath. For example, the capacitor C1 or the capacitor C3 may have small capacitance (e.g., about 10 pF, 100 pF, 500 pF, 1 nF, 10 nF, 100 nF, etc.).

The capacitor C9, for example, may represent capacitance within the plasma between a chamber wall and the plasma. The resistor R7, for example, may represent resistance within the plasma between a chamber wall and the top surface of the wafer. The current source I1, for example, may be representative of the ion current in the plasma. For example, the capacitor C1 or the capacitor C9 may have small capacitance (e.g., about 10 pF, 100 pF, 500 pF, 1 nF, 10 nF, 100 nF, etc.).

As used in this document the plasma voltage is the voltage measured from ground to circuit point 123; the wafer voltage is the voltage measured from ground to circuit point 122 and may represent the voltage at the surface of the wafer; the chucking voltage is the voltage measured from ground to circuit point 121 to point 122; the electrode voltage is the voltage measure from ground to circuit point 121 and ground; and the input voltage is the voltage measured from ground to circuit point 125.

Figure 60:
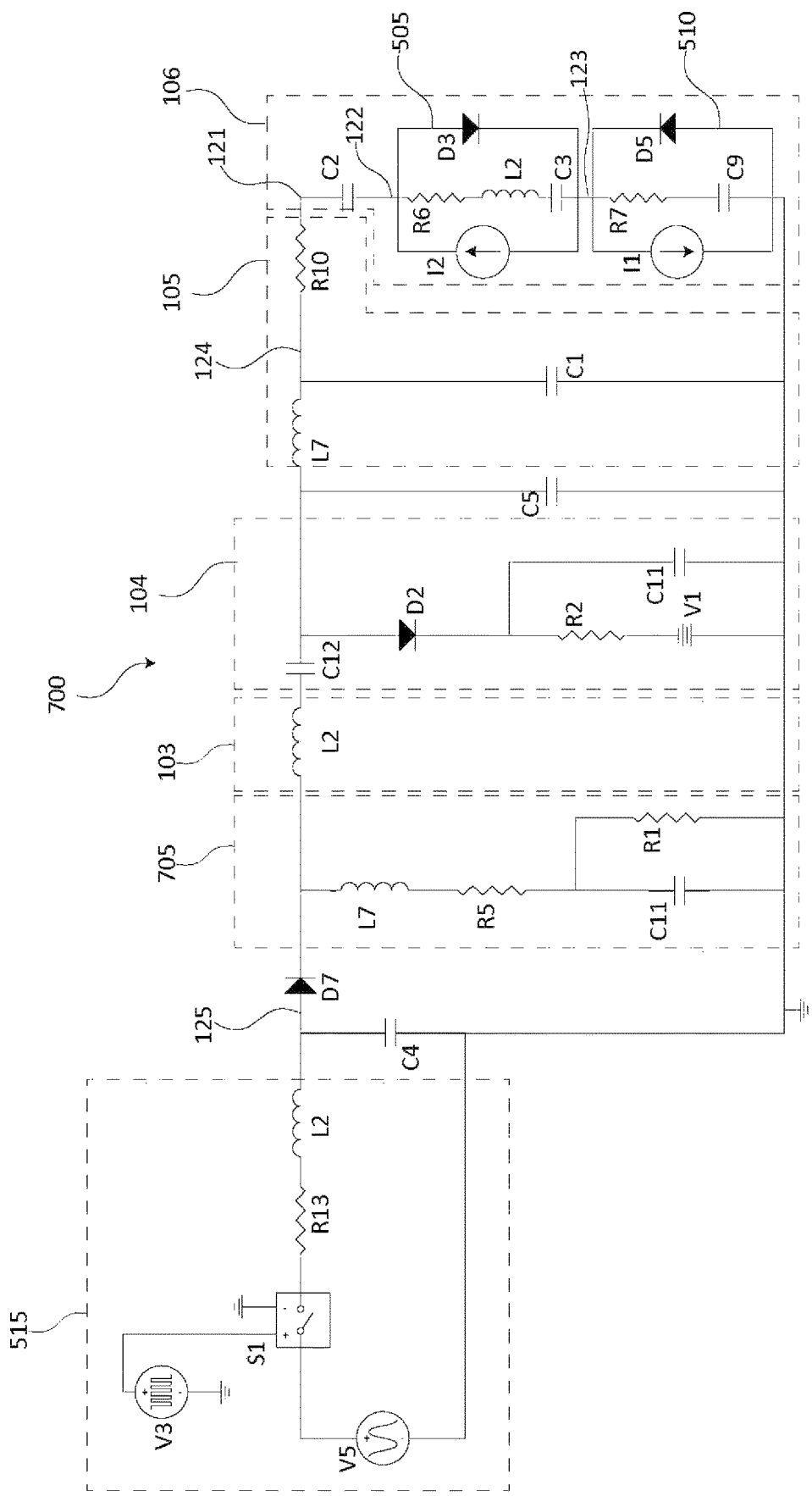
FIG. 60 illustrates waveforms across the sheath (e.g., C3) and at the chuck (e.g., C2).

FIG. 60 illustrates waveforms across the sheath (e.g., across the capacitor C3), which is between circuit point 122 and circuit point 123, and at the chuck (e.g., across the capacitor C2), which is circuit point 121. Waveform 605 shows the voltage across the plasma sheath (e.g., the wafer plasma sheath 505 and/or the wall plasma sheath 510). Waveform 605 is a pure sine wave that is slightly clipped at zero because of the of the diode (D3), which is part of the plasma effect. Waveform 610 shows the voltage at the electrode (or across the chuck). In some embodiments, the difference between the chucking voltage and the wafer voltage (e.g., the difference between waveforms) can be kept around 2 kV or slightly less. At turn off this difference returns to −2 kV. A difference of about 2 kV may be sufficient to electrostatically couple a wafer to a chuck and a difference greater than 2 kV may do so while being destructive to a wafer.

Figure 61:
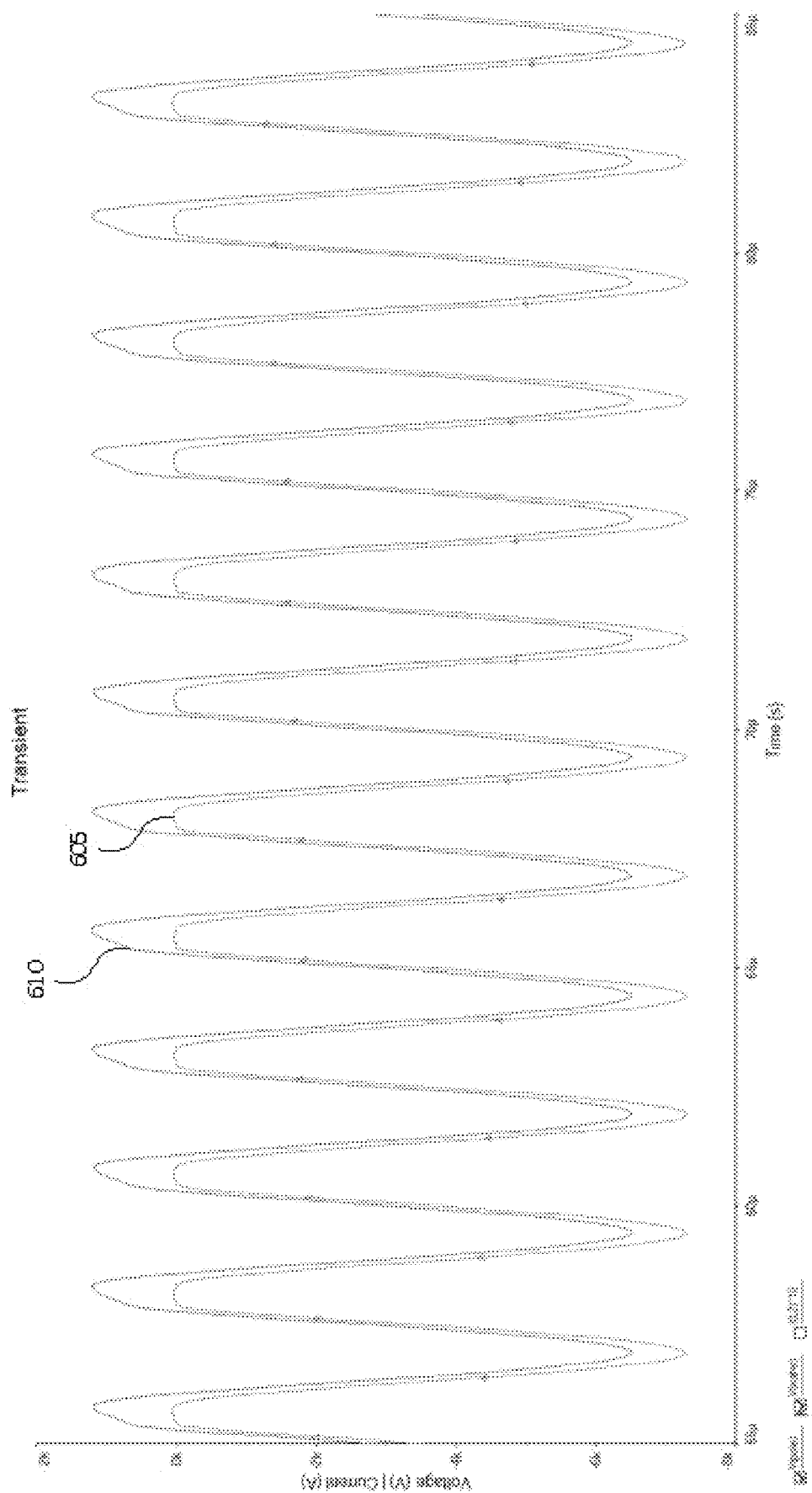
FIG. 61 is another schematic of a plasma sheath control system for an RF chamber with a resistive output stage according to some embodiments.
Figure 63:
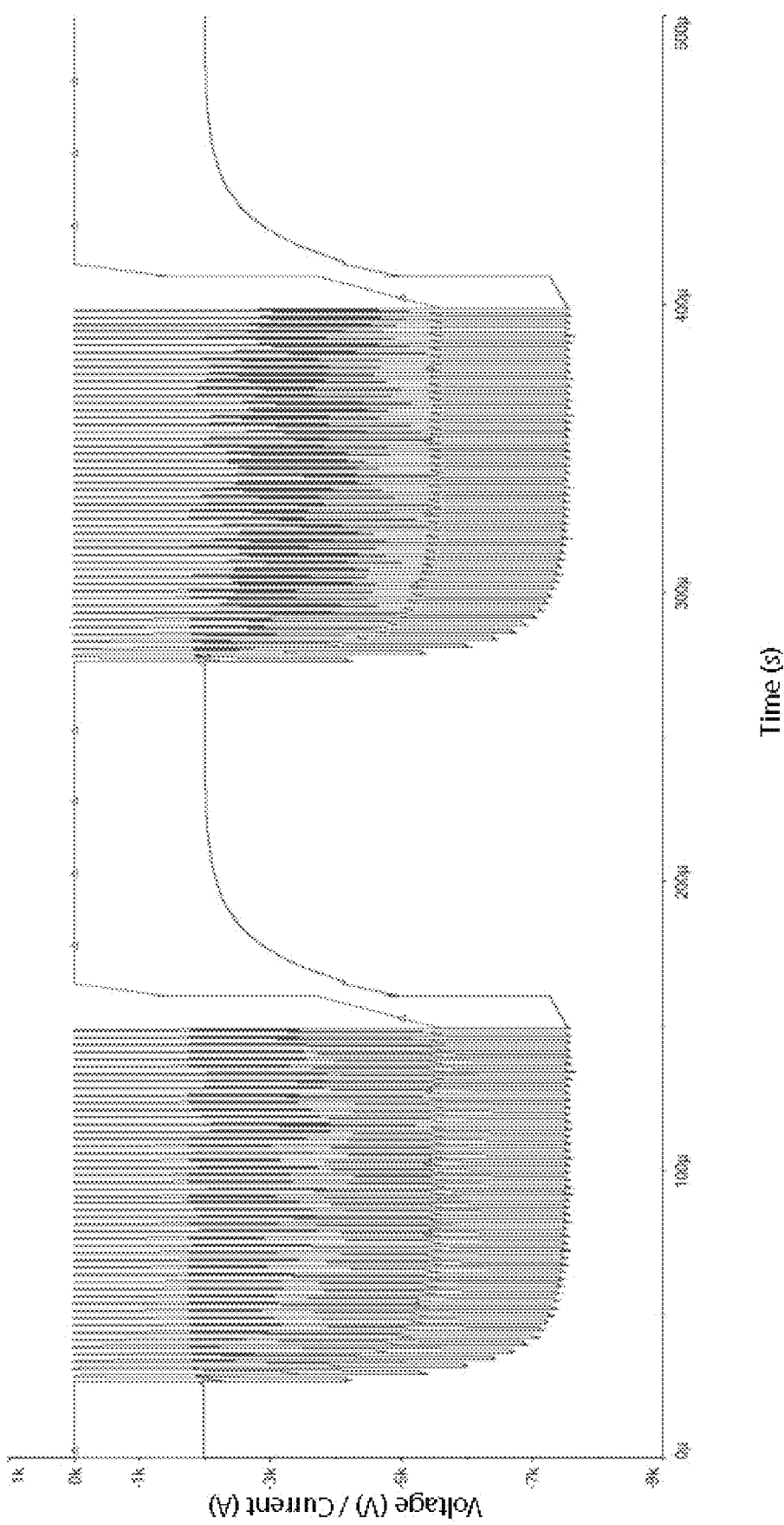
FIG. 63 is a zoomed in view of three cycles of the waveform shown in FIG. 61.

FIG. 61 is another schematic of a plasma sheath control system 700 of an RE plasma reactor with a resistive output stage 705 according to some embodiments. In this example, the plasma sheath control system 700 includes blocking diode D7. The blocking diode D7 may rectify Sinusoidal waveforms that may, for example, produce a flat top on each sinusoidal waveform as shown in FIG. 63. The blocking diode D7, for example, may rectify the Sinusoidal waveform creating a Sinusoidal waveform with a substantially flat portion for at least 10%, 15%, 20%, 25%, 30%, etc. of each period.

The resistive output stage 705 may include one or more inductors L1 and one or more resistors R1. The resistive output stage 705 may include any type of resistive output stage such as, for example, a resistive output stage described in U.S. patent application Ser. No. 15/941,731 entitled "HIGH VOLTAGE RESISTIVE OUTPUT STAGE CIRCUIT", which is incorporated by reference in its entirety for all purposes.

In some embodiments, the resistor R1 may have a resistance less than about 500 ohms, 200 ohms, 100 ohms, etc.

In some embodiments, the resistive output stage 705 may be electrically coupled in parallel with the load stage 106 (e.g., plasma chamber) and the high voltage switching power supply. In some embodiments, the resistive output stage may include at least one resistor (e.g., R1) that discharges a load (e.g., from the wafer plasma sheath or the wall plasma sheath 510). In some embodiments, the resistive output stage may be configured to discharge over about 1 kilowatt of average power during each sinusoidal waveform cycle and/or a joule or less of energy in each sinusoidal waveform cycle. In some embodiments, the resistance of the resistor R1 in the resistive output stage may be less than 200 ohms. In some embodiments, the resistor R1 may comprise a plurality of resistors arranged in series or parallel having a combined capacitance less than about 200 pF (e.g., C11).

In some embodiments, the resistive output stage 705 may include a collection of circuit elements that can be used to control the shape of a voltage waveform on a load. In some embodiments, the resistive output stage 705 may include passive elements only (e.g., resistors, capacitors, inductors, etc.). In some embodiments, the resistive output stage 705 may include active circuit elements (e.g., switches) as well as passive circuit elements. In some embodiments, the resistive output stage 705, for example, can be used to control the voltage rise time of a waveform and/or the voltage fall time of waveform.

In some embodiments, the resistive output stage 705 can discharge capacitive loads (e.g., the capacitive charge from the wafer plasma sheath 505 and/or the wall plasma sheath 510). For example, these capacitive loads may have small capacitance (e.g., about 10 pF, 100 pF, 500 pF, 1 nF, 10 nF, 100 nF, etc.).

In some embodiments, a resistive output stage can be used in circuits with sinusoidal waveforms having a high peak voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.).

In some embodiments, the resistive output stage 705 may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 705 may include a series or parallel network of passive components. For example, the resistive output stage 705 may include a series of a resistor R5, a capacitor C11, and an inductor L7. As another example, the resistive output stage 705 may include a capacitor in parallel with an inductor and the capacitor-inductor combination in series with a resistor. Regardless of the arrangement, the component values may be selected to match the RF frequency of the RF source. The blocking diode D7 may rectify the output of RF generator 515. For example, the blocking diode D7 may rectify the Sinusoidal waveform creating a Sinusoidal waveform with a substantially flat portion for at least 10%, 15%, 20%, 25%, 30%, etc. of each period.

In some embodiments, the resistive output stage 705 may rapidly discharge a high voltage capacitive loads at the load stage 106 (e.g., the capacitive charge from the wafer plasma sheath 505 and/or the wall plasma sheath 510) with fast discharge times. A high voltage load can be a load with a voltage greater than about 1 kV, 10 kV, 20 kV, 50 kV, 100 kV, etc. A fast discharge time can be a time less than about 1 ns, 10 ns, 50 ns, 100 ns, 250 ns, 500 ns, 1,000 ns, etc.

The plasma sheath control system 700 can include the RF generator 515, the resistive output stage 705, the lead stage 103, DC bias circuit 104, and the second lead stage 105. A plasma sheath control system may include the plasma sheath control circuit and the load stage 106, which may include a plasma chamber.

Figure 62:
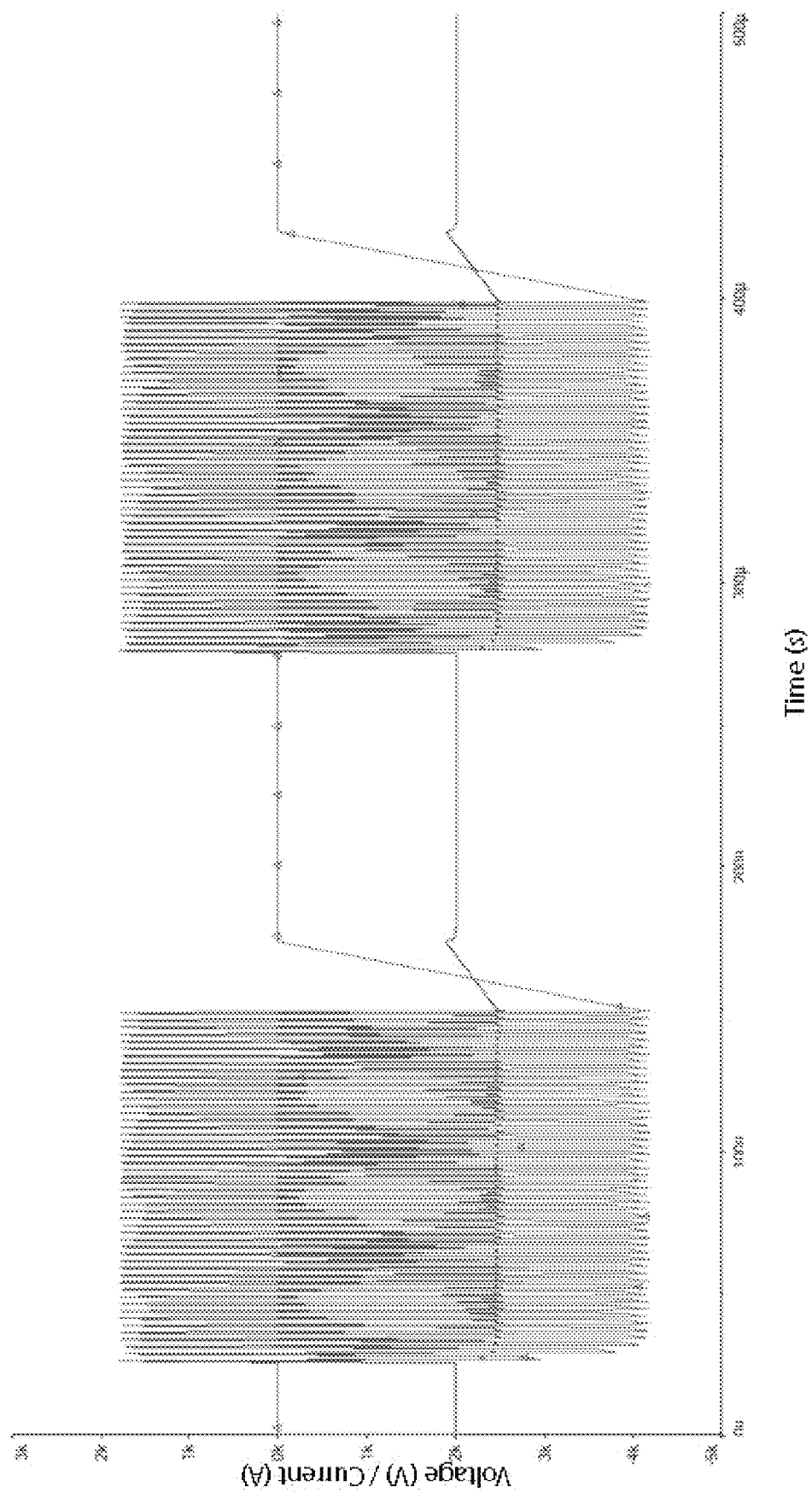
FIG. 62 illustrates waveforms across the sheath (e.g., C3) and at the chuck (e.g., C2) from the circuit shown in FIG. 61.

FIG. 62 illustrates waveforms across the sheath (e.g., across the capacitor C3), which is between circuit point 122 and circuit point 123, and at the chuck (e.g., across the capacitor C2), which is circuit point 121. FIG. 63 is a zoomed in view of three cycles of the waveforms shown in FIG. 62. Waveform 805 shows the voltage across the sheath (e.g., the capacitive charge from the wafer plasma sheath 505 and/or the wall plasma sheath 510). Waveform 805 is a pure sine wave that is slightly clipped at zero because of the of the diode (D3), which is part of the plasma effect. Waveform 810 shows the voltage at the pole (or across the chuck).

When the RF source V5 is on continuously, the flatness may be a consequence of the blocking diode D7 and/or the values of all relevant capacitances including the plasma sheath capacitance in the circuit. The resistive output stage 705 may reset the sheath capacitor during one half period of the RF sinusoid. The waveform 805 is much flatter around −2.5 kV. The flatness of the waveform 805 may, for example, be better for keeping the ions at a constant potential during etching. The resistive output stage 705 and/or the blocking diode D7 may, for example, cause this flatness. The component values may be adjusted to vary the rise times, the fall times, and/or the degree of flatness of portions of the output waveform.

In some embodiments, the blocking diode D7 may be replaced with a switch such as, for example, a high voltage switch. A high voltage switch may include the high voltage switch 1800 shown in FIG. 72. The high voltage switch, for example, may be closed during forward conduction (e.g., when the RF generator 515 output is above a voltage threshold) and open during reverse bias (e.g., when the RF generator 515 output is below the voltage threshold).

Figure 64:
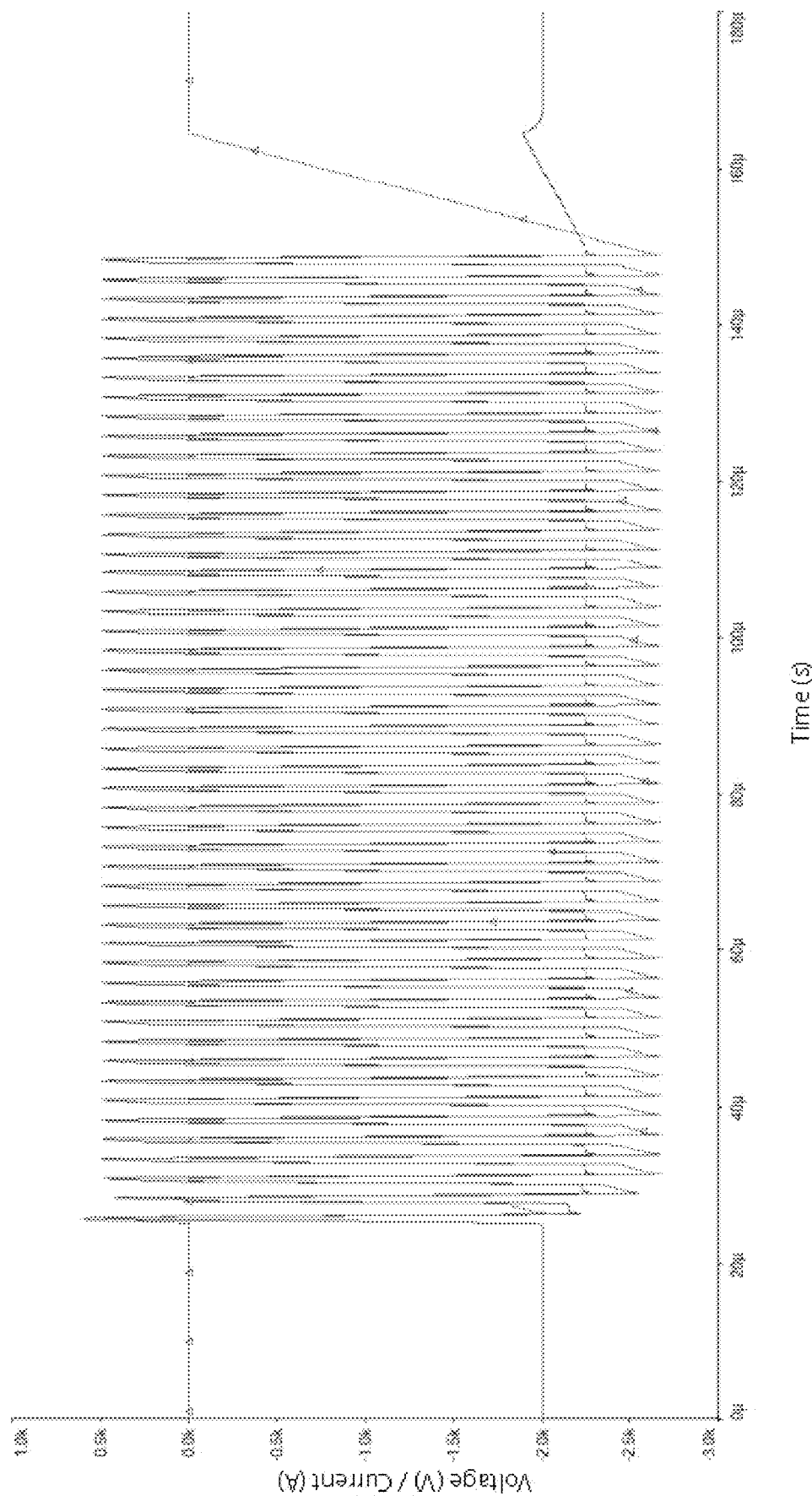
FIG. 64 illustrates waveforms across the sheath (e.g., C3) and at the chuck (e.g., C2) from the circuit shown in FIG. 61.
Figure 65:
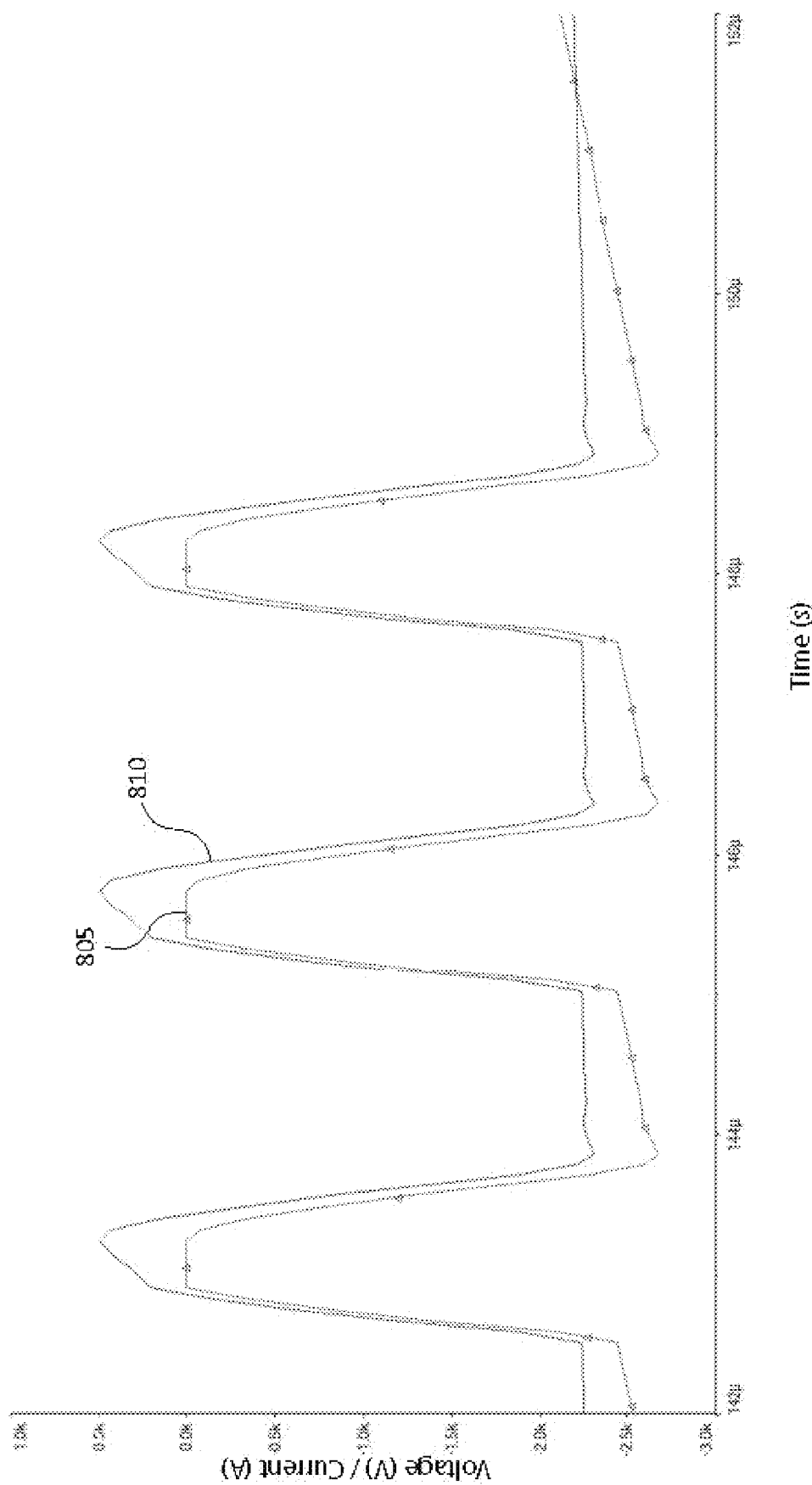
FIG. 65 illustrates waveforms across the sheath (e.g., C3) and at the chuck (e.g., C2) from the circuit shown in FIG. 61.

The chucking voltage may be around 500 V during the burst and about to 2 kV when off, which may be acceptable. Increasing the RF output voltage to around 4 kV the difference can be about 2 kV during both the on and the off periods, as shown in FIG. 64. Increasing the RF output voltage to around 6 kV the difference during the on time can be about 3 kV or greater which may not be acceptable and about 2 kV during the off time, as shown in FIG. 65. With a 3 kV difference, wafer damage may occur.

Figure 66:
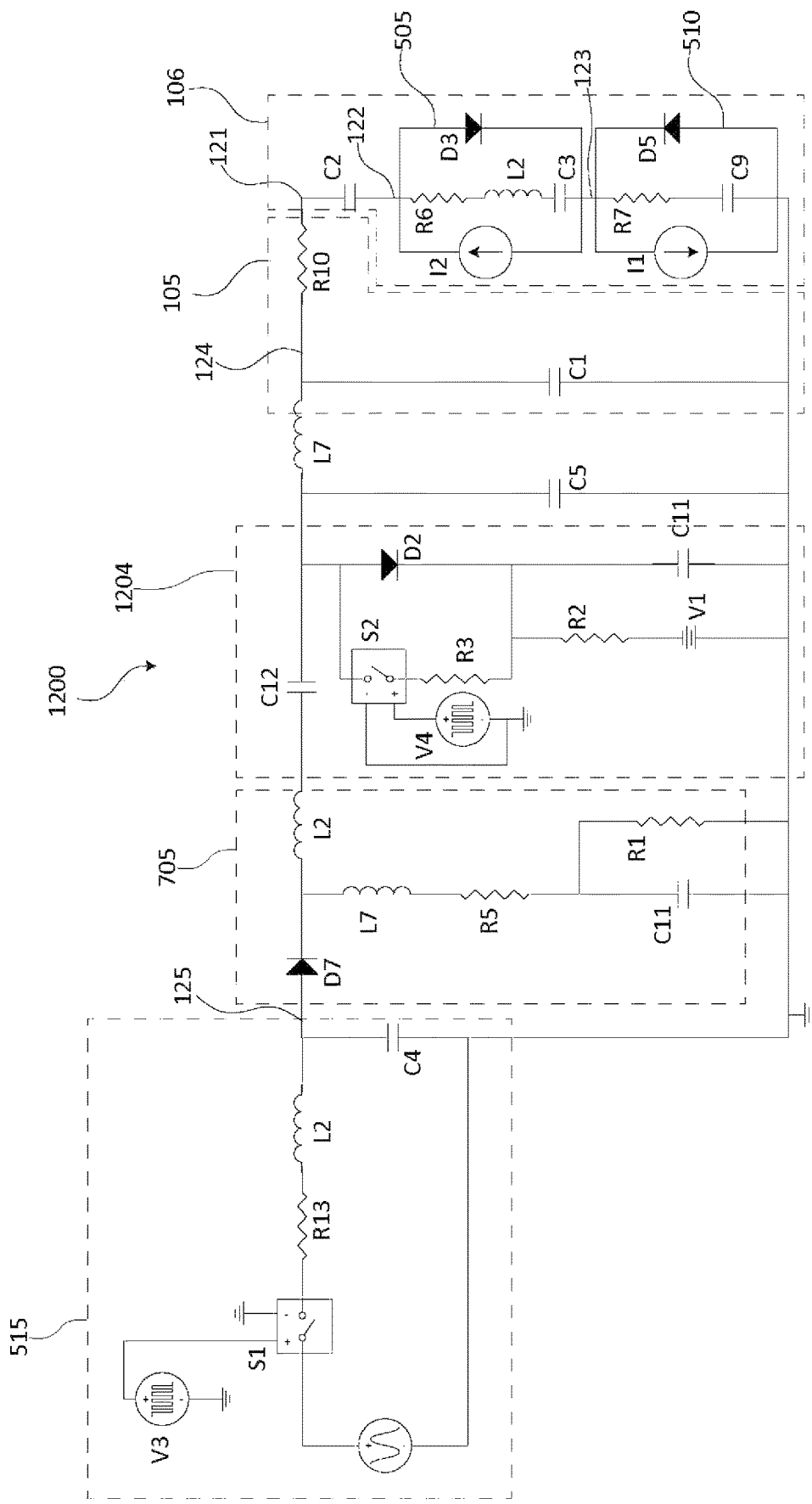
FIG. 66 is another schematic of a plasma sheath control system for an RF chamber with a resistive output stage and a high voltage switch bias compensation stage according to some embodiments.

FIG. 66 is another schematic of a plasma sheath control system 1200 of an RF plasma reactor with the resistive output stage 705 and a DC bias circuit 1204 according to some embodiments.

The DC bias circuit 1204 may include the components shown in DC bias circuit 104. The DC bias circuit 1204 may also include a high voltage switch S1 and/or blocking diode D2. In some embodiments, the high voltage switch S1 may include a plurality of switches arranged in series to collectively open and close high voltages. The high voltage switch S1 may comprise a high voltage switch such as, for example, the high voltage switch 1800 shown in FIG. 72.

In some embodiments, the high voltage switch S1 may be open while the RF power supply V5 voltage waveform is positive and closed when negative. While closed, the high voltage switch S1 may, for example, short current across blocking diode D2. Shorting this current may allow the bias between the wafer and the chuck to be maintained at approximately 2 kV, which may be within acceptable tolerances and/or may be adjusted by changing the DC bias supply voltage V1

Figure 67:
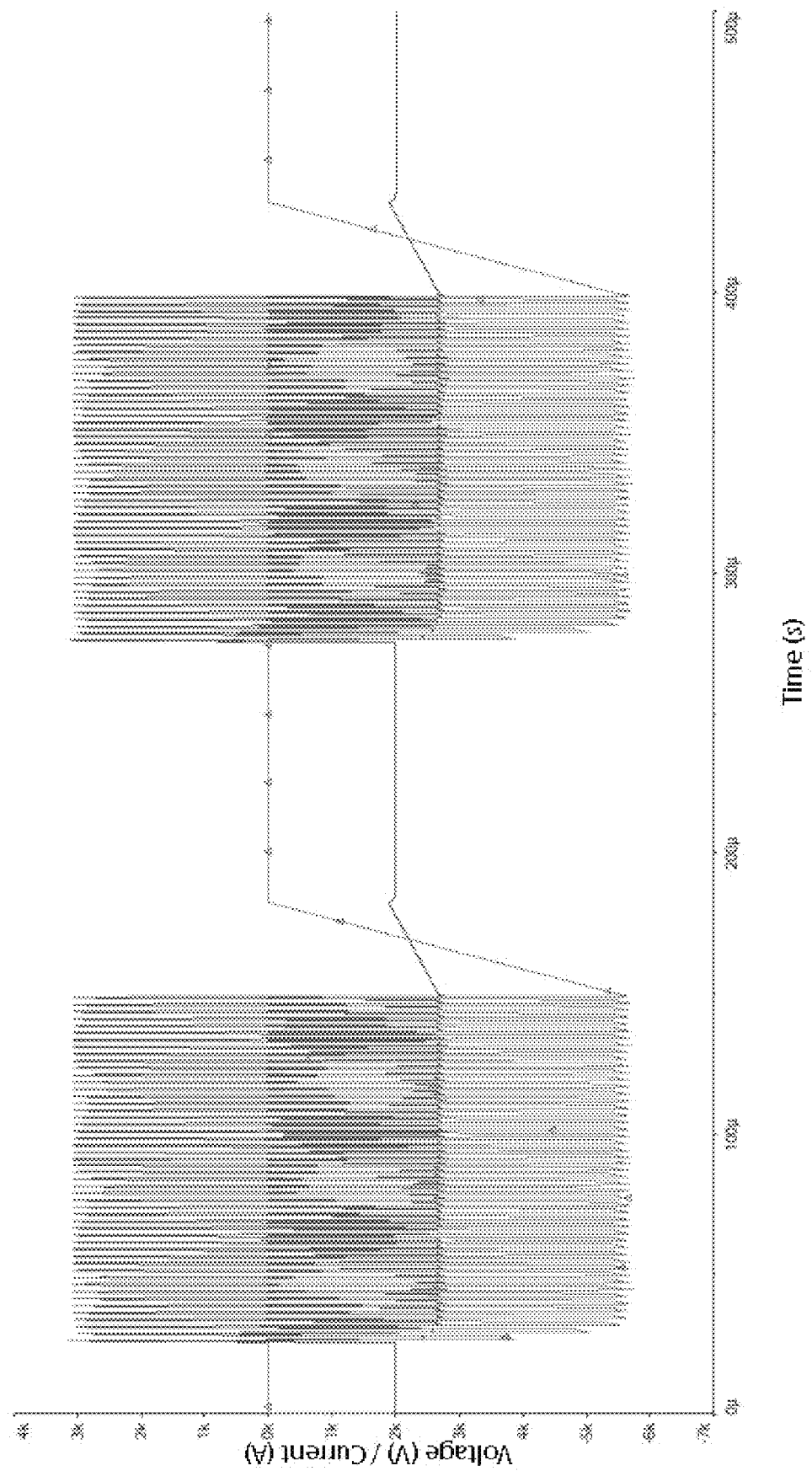
FIG. 67 illustrates waveforms across the sheath (e.g., C3) and at the chuck (e.g., C2) from the circuit shown in FIG. 66.

FIG. 67 illustrates waveforms across the sheath (e.g., C3) and at the chuck (e.g., C2) from the circuit shown in FIG. 66. As shown, the difference between the wafer and chucking voltage stay very close to −2 kV regardless of whether the RF power supply is on or off.

Figure 68:
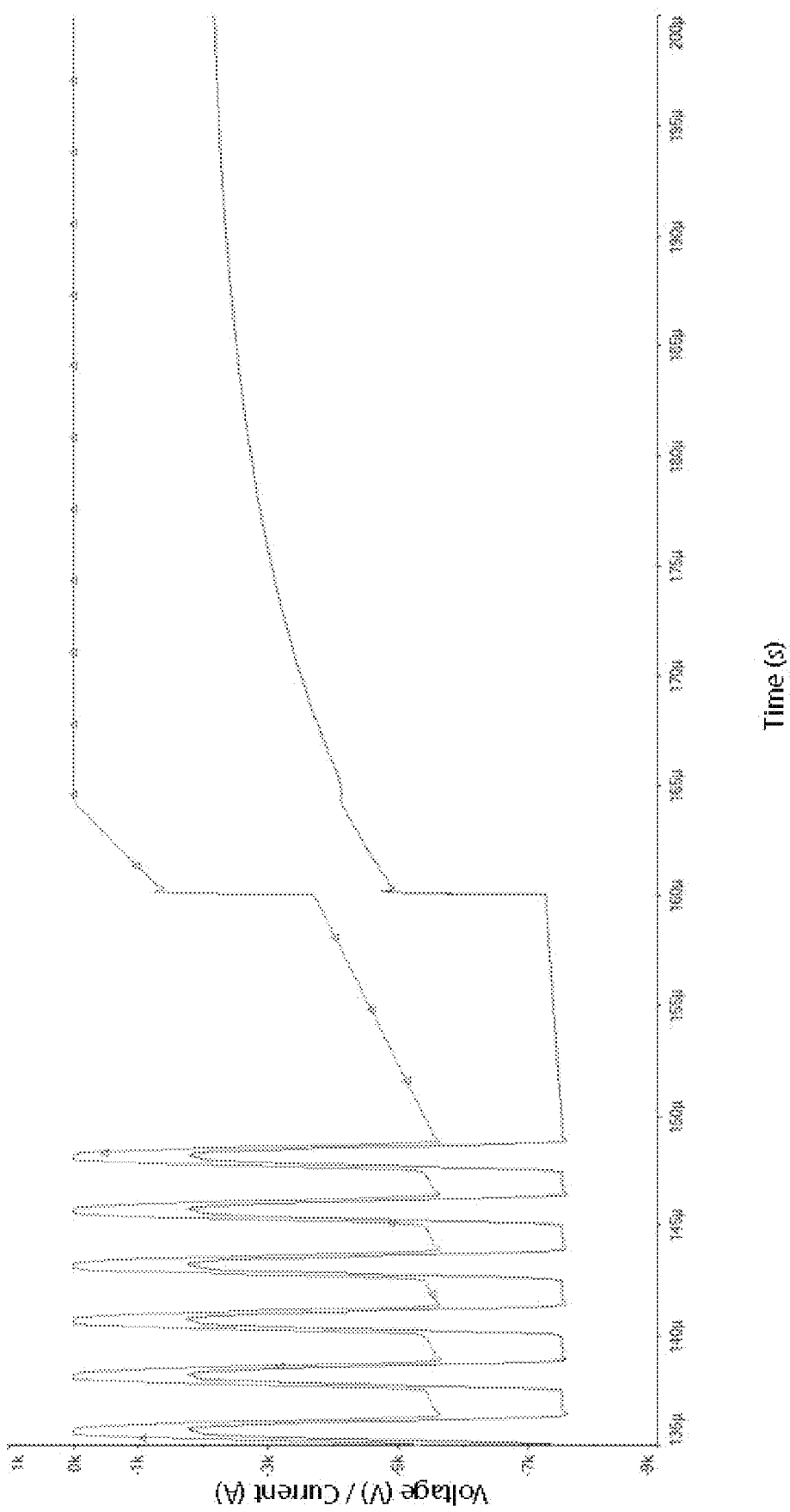
FIG. 68 is a zoomed in view of three cycles of the waveform shown in FIG. 12.

FIG. 68 is a zoomed in view of three cycles of the waveform shown in FIG. 66.

Figure 69:
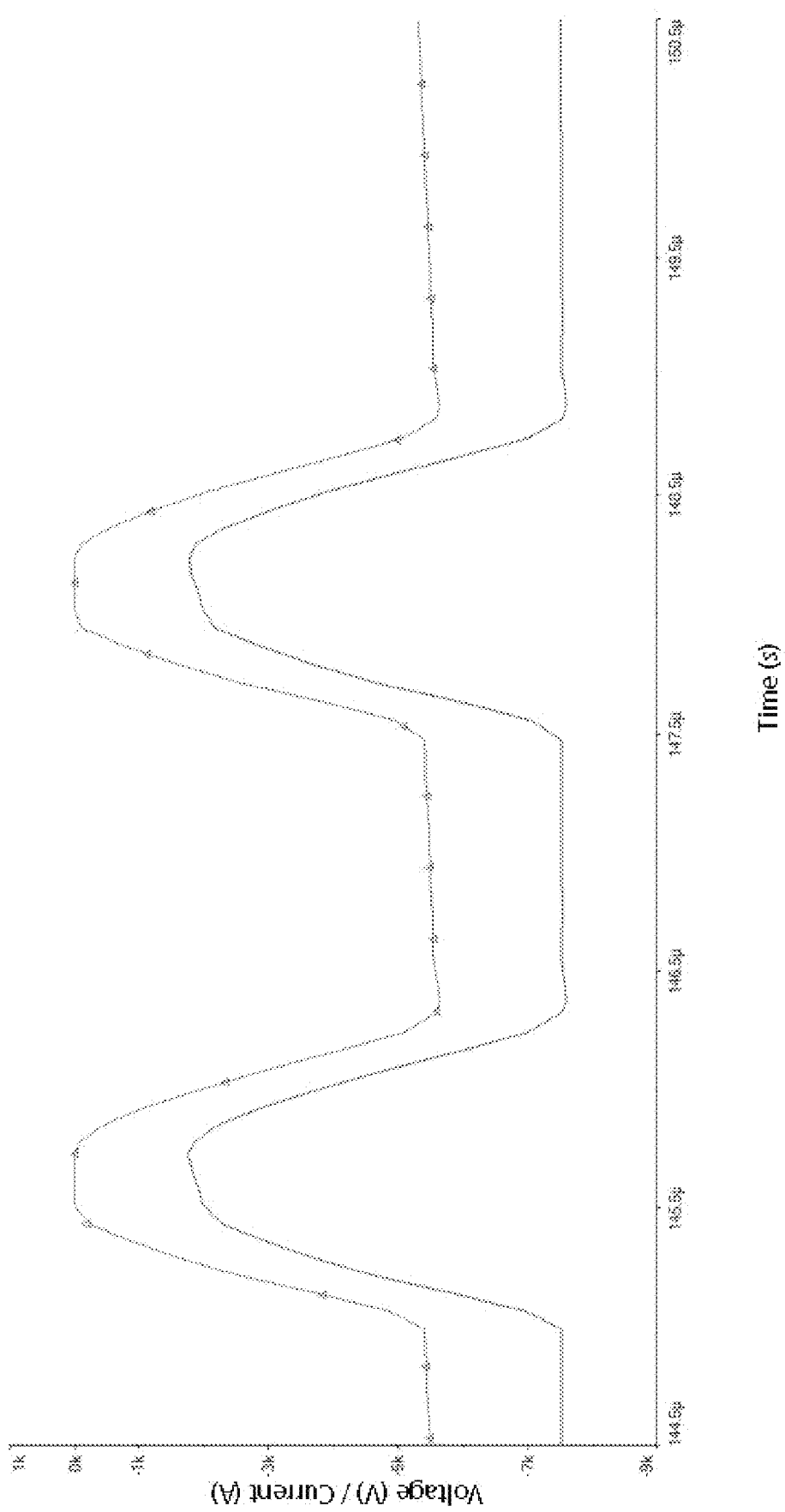
FIG. 69 shows the end of the burst waveform where the voltage on the chuck returns to zero.

FIG. 69 shows the end of the burst waveform where the voltage on the chuck returns to zero.

Figure 70:
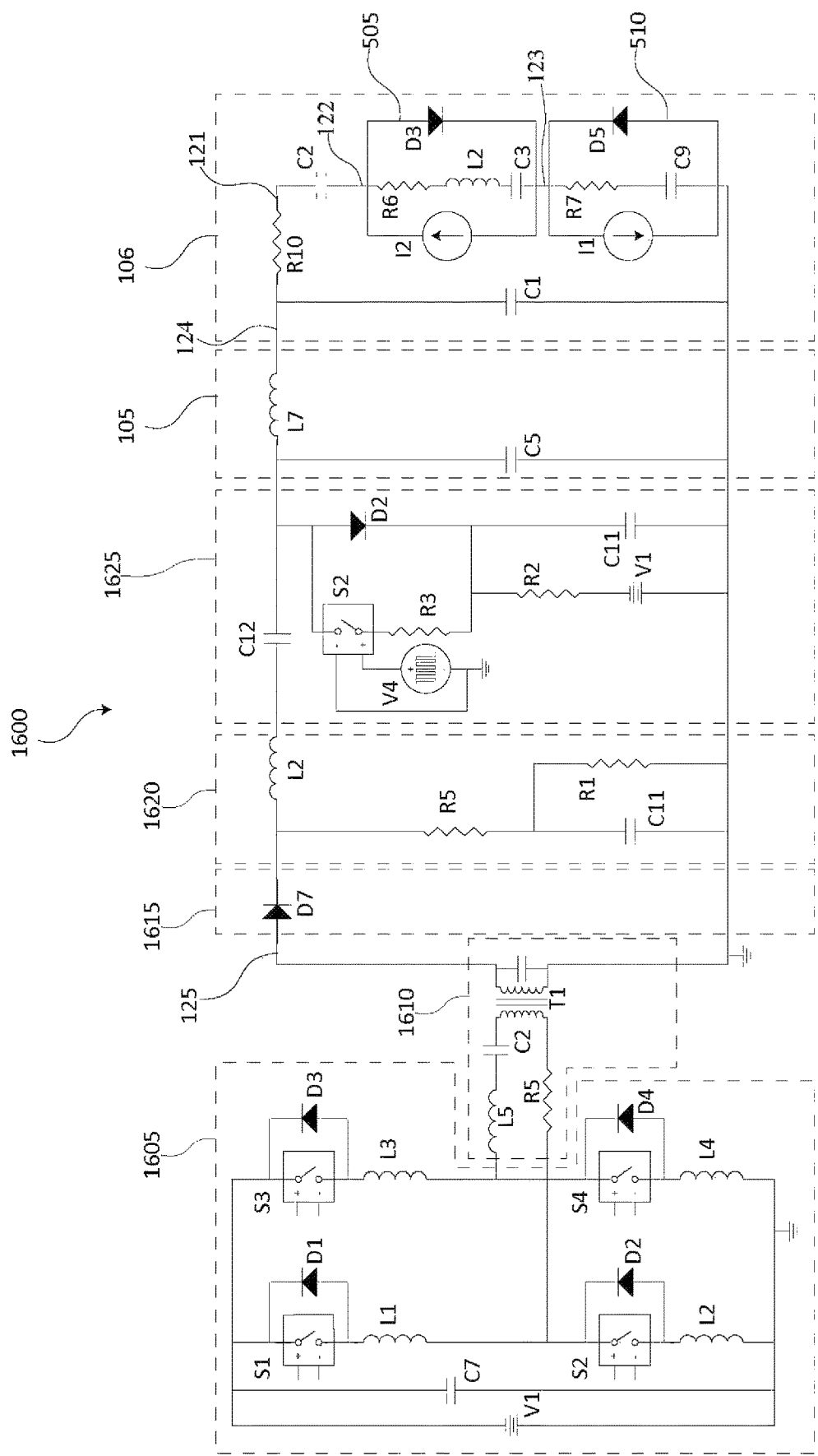
FIG. 70 is a schematic of a plasma sheath control system for an RF chamber having a resonant full-bridge driver according to some embodiments.

FIG. 70 is a circuit diagram of a plasma sheath control system 1600 according to some embodiments. In this example, the plasma sheath control system 1600 may include a full-bridge driver 1605. The full-bridge driver 1605 may include an input voltage source V1 that may be a DC voltage source (e.g., a capacitive source, AC-DC converter, etc.). In some embodiments, the full-bridge driver 1605 may include four switches. In some embodiments, the driver may include a plurality of switches in series or in parallel. These switches, for example, may include any type of solid-state switch such as, for example, IGBTs, a MOSFETs, a SiC MOSFETs, SiC junction transistors, FETs, SiC switches, GaN switches, photoconductive switches, etc. These switches may be switched at high frequencies and/or may produce a high voltage sinusoidal waveform. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

In some embodiments, the full-bridge driver is coupled with a resonant circuit 1610. The resonant circuit 1610 may include a resonant inductor L5 and/or a resonant capacitor C2 coupled with a transformer T1. In some embodiments, the transformer T1 may be removed. The resonant circuit may also include stray resistance R5, for example, that may include the resistance of any leads between the full-bridge driver and the resonant circuit 1610 and/or any component within the resonant circuit 1610 such as, for example, the transformer T1, capacitor C2, the inductor L5, and the resistor R5.

While the inductance and/or capacitance of other circuit elements may affect the driving frequency, the driving frequency can be set largely by choice of the resonant inductor L5 and/or the resonant capacitor C2. Further refinements and/or tuning may be required to create the proper driving frequency. In addition, the rise time across the transformer T1 can be adjusted by changing the inductance of inductor L5 and/or the capacitance of capacitor C2, provided that:

$$f_{resonant} = 1/2\pi\sqrt{(L5)(C2)} = \text{constant}.$$

For example, the capacitor C2, the resistor R5, or the inductor L5 may be tunable such that value for the device can be tuned or modified to ensure that the frequency is constant as other elements change over time In some embodiments, large inductance values for inductor L5 can result in slower or shorter rise times. These values may also affect the burst envelope. Each burst can include transient and steady state sinusoidal waveforms. The transient sinusoidal waveform within each burst are set by L5 and/or the Q of the system until full voltage is reached during the steady state sinusoidal waveforms.

If the switches in the driver circuit are switched at the resonant frequency, $f_{resonant}$, then the output voltage at the transformer will be amplified. In some embodiments, the resonant frequency may be about 20 Hz, 50 Hz, 100 Hz, 250 Hz, 400 kHz, 0.5 MHz, 2.0 MHz, 4.0 MHz, 13.56 MHz, 27.12 MHz, 40.68 MHz, 50 MHz, 100 MHz, etc.

In some embodiments, the resonant capacitor C2 may include the stray capacitance of the transformer T1 and/or a physical capacitor. In some embodiments, the resonant capacitor C2 may have a capacitance of about 10 µF, 1 µF, 100 nF, 10 nF, etc. In some embodiments, the resonant inductor L5 may include the stray inductance of the transformer T1 and/or a physical inductor. In some embodiments, the resonant inductor L5 may have an inductance of about 50 nH, 100 nH, 150 nH, 500 nH, 1,000 nH, etc. In some embodiments, the resonant resistor R5 may have a resistance of about 10 ohms, 25 ohms, 50 ohms, 100 ohms, 150 ohms, 500 ohms, etc.

In some embodiments, the plasma load within the plasma chamber may be a time varying load. This time variance may impact either or both the inductance or the capacitance of the resonant circuit, which may cause a shift in the resonant frequency, $f_{resonant}$. In some embodiments, the plasma sheath control system may include a controller (e.g., a microcontroller, FPGA, or any control device). In some embodiments, this controller may measure the output voltage and/or current of the plasma sheath control system, for example, at point 121. In some embodiments, this voltage or current measurement may be used to determine if the plasma sheath control system is operating at the resonant frequency. In some embodiments, if the system is not operating at the resonant frequency, the controller may change the operating frequency of the plasma sheath control system to match the resonant frequency such as, for example, by adjusting an inductance or capacitance value in the resonant circuit 1610.

In some embodiments, the amplitude of the current or voltage waveform produced by the plasma sheath control system, for example at point 121, 122, 124, 125, or at any point in the circuit may be measured by a controller. In some embodiments, the measured or current and/or voltage may be used to determine the output power of the plasma sheath control system. In some embodiments, the controller may alter the operating frequency, voltage, or duty cycle in response to this measurement to achieve a desired output voltage, current, or power level.

In some embodiments, either or both the operating frequency and output power of the plasma sheath control system may be controlled by the controller. In some embodiments, the controller may detect variation in the output waveforms and adjust the operating frequency and/or power level on a fast timescale, for example, less than about 100 ms, less than about 1 ms, less than about 10 µs, less than about 500 ns, etc.

In some embodiments, the resistor R5 may represent the stray resistance of wires, traces, and/or the transformer windings within the physical circuit. In some embodiments, the resistor R5 may have a resistance of about 10 mohms, 50 mohms, 100 mohms, 200 mohms, 500 mohms, etc.

In some embodiments, the transformer T1 may comprise a transformer as disclosed in U.S. patent application Ser. No. 15/365,094, titled "High Voltage Transformer," which is incorporated into this document for all purposes.

In some embodiments, the output voltage of the resonant circuit 1610 can be changed by changing the duty cycle (e.g., the switch "on" time or the time a switch is conducting) of switches S1, S2, S3, and/or S4. For example, the longer the duty cycle, the higher the output voltage; and the shorter the duty cycle, the shorter the output voltage. In some embodiments, the output voltage of the resonant circuit 1610 can be changed or tuned by adjusting the duty cycle of the switching in the full bridge driver. For example, by adjusting the duty cycle of the signals, for example, Sig1 and Sig2, which open and close the switches S1, S2, S3, and S4, the output voltage of the driver can be adjusted.

In some embodiments, each switch in the resonant circuit (e.g., S1, S2, S3, and/or S4) can be switched independently or in conjunction with one or more of the other switches.

In some embodiments, the resonant circuit 1610 may be coupled with a half-wave rectifier 1615 and/or a blocking diode D7. In some embodiments, the blocking diode D7 may be replaced with a switch such as, for example, a high voltage switch. A high voltage switch may include the high voltage switch 1800 shown in FIG. 72. The high voltage switch, for example, may be closed during forward conduction (e.g., when the RF generator 515 output is above a voltage threshold) and open during reverse bias (e.g., when the RF generator 515 output is below the voltage threshold).

In some embodiments, the blocking diode D7 may rectify the sinusoidal waveform s from the full-bridge driver 1605. For example, the blocking diode D7 may rectify the sinusoidal waveform creating an rectified sinusoidal waveform with a substantially flat portion for at least 10%, 15%, 20%, 25%, 30%, etc. of each period.

In some embodiments, the half-wave rectifier 1615 or the blocking diode D7 may be coupled with the resistive output stage 1620. The resistive output stage 1620 may include any resistive output stage known in the art. For example, the resistive output stage 1620 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes. For example, the resistive output stage 1620 may include elements in resistive output stage 705.

In some embodiments, the resistive output stage may include at least one resistor (e.g., R1) that discharges a load (e.g., the plasma sheath capacitance). In some embodiments, the resistive output stage may be configured to discharge over about 1 kilowatt of average power during each sinusoidal waveform cycle and/or a joule or less of energy in each sinusoidal waveform cycle. In some embodiments, the resistance of the resistor R1 in the resistive output stage may be less than 200 ohms. In some embodiments, the resistor R1 may comprise a plurality of resistors arranged in series or parallel having a combined capacitance less than about 200 pF (e.g., C11).

In some embodiments, the resistive output stage 1620 may include a collection of circuit elements that can be used to control the shape of a voltage waveform on a load. In some embodiments, the resistive output stage 1620 may include passive elements only (e.g., resistors, capacitors, inductors, etc.). In some embodiments, the resistive output stage 1620 may include active circuit elements (e.g., switches) as well as passive circuit elements. In some embodiments, the resistive output stage 1620, for example, can be used to control the voltage rise time of a waveform and/or the voltage fall time of waveform.

In some embodiments, the resistive output stage 1620 can discharge capacitive loads (e.g., the capacitive charge from the wafer plasma sheath 505 and/or the wall plasma sheath 510). For example, these capacitive loads may have small capacitance (e.g., about 10 pF, 100 pF, 500 pF, 1 nF, 10 nF, 100 nF, etc.).

In some embodiments, a resistive output stage 1620 can be used in circuits with sinusoidal waveform having a high peak voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.) and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage 1620 may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 1620 may include a series or parallel network of passive components. For example, the resistive output stage 1620 may include a series of a resistor, a capacitor, and an inductor. As another example, the resistive output stage 1620 may include a capacitor in parallel with an inductor and the capacitor-inductor combination in series with a resistor. For example, L11 can be chosen large enough so that there is no significant energy injected into the resistive output stage when there is voltage out of the rectifier. The values of R3 and R1 can be chosen so that the L/R time can drain the appropriate capacitors in the load faster than the RF frequency In some embodiments, the resistive output stage 1620 may be coupled with the bias compensation circuit 1625.

The bias compensation circuit 1625 may include any bias and/or bias compensation circuit known in the art. For example, the bias compensation circuit 1625 may include any bias and/or bias compensation circuit described in U.S. Patent Application No. 162/711,406 titled "NANOSECOND PULSER BIAS COMPENSATION," which is incorporated into this disclosure in its entirety for all purposes.

In some embodiments, the bias compensation circuit 1625 may include a bias capacitor C7, blocking capacitor C12, a blocking diode D8, switch S8 (e.g., a high voltage switch), offset supply voltage V1, resistance R2, and/or resistance R4. In some embodiments, the switch S8 comprises a high voltage switch such as, for example, the high voltage switch 1800 shown in FIG. 72.

In some embodiments, the offset supply voltage V5 may include a DC voltage source that can bias the output voltage either positively or negatively. In some embodiments, the capacitor C12 may isolate/separate the offset supply voltage V5 from the resistive output stage 1620 and/or other circuit elements. In some embodiments, the bias compensation circuit 1625 may allow for a potential shift of power from one portion of the circuit to another. In some embodiments, the bias compensation circuit 1625 may be used to hold a wafer in place as high voltage sinusoidal waveforms are active within the chamber. Resistance R2 may protect/isolate the DC bias supply from the bridge driver.

In some embodiments, the switch S8 may be open while the full-bridge driver 1605 is pulsing and closed when the full-bridge driver 1605 is not pulsing. While closed, the switch S8 may, for example, short current across the blocking diode D8. Shorting this current may allow the bias between the wafer and the chuck to be less than 2 kV, which may be within acceptable tolerances.

In some embodiments, the plasma sheath control system 1600 may or may not include a traditional matching network such as, for example, a 50 ohm matching network or an external matching network or standalone matching network. The embodiments described within this document may or may not require a 50 ohm matching network to tune the switching power applied to the wafer chamber. Typically, tuning of the matching network can take at least 100 µs-200 µs. In some embodiments, power changes can occur within one or two RF cycles, for example, 2.5 µs-5.0 µs at 400 kHz.

Figure 71:
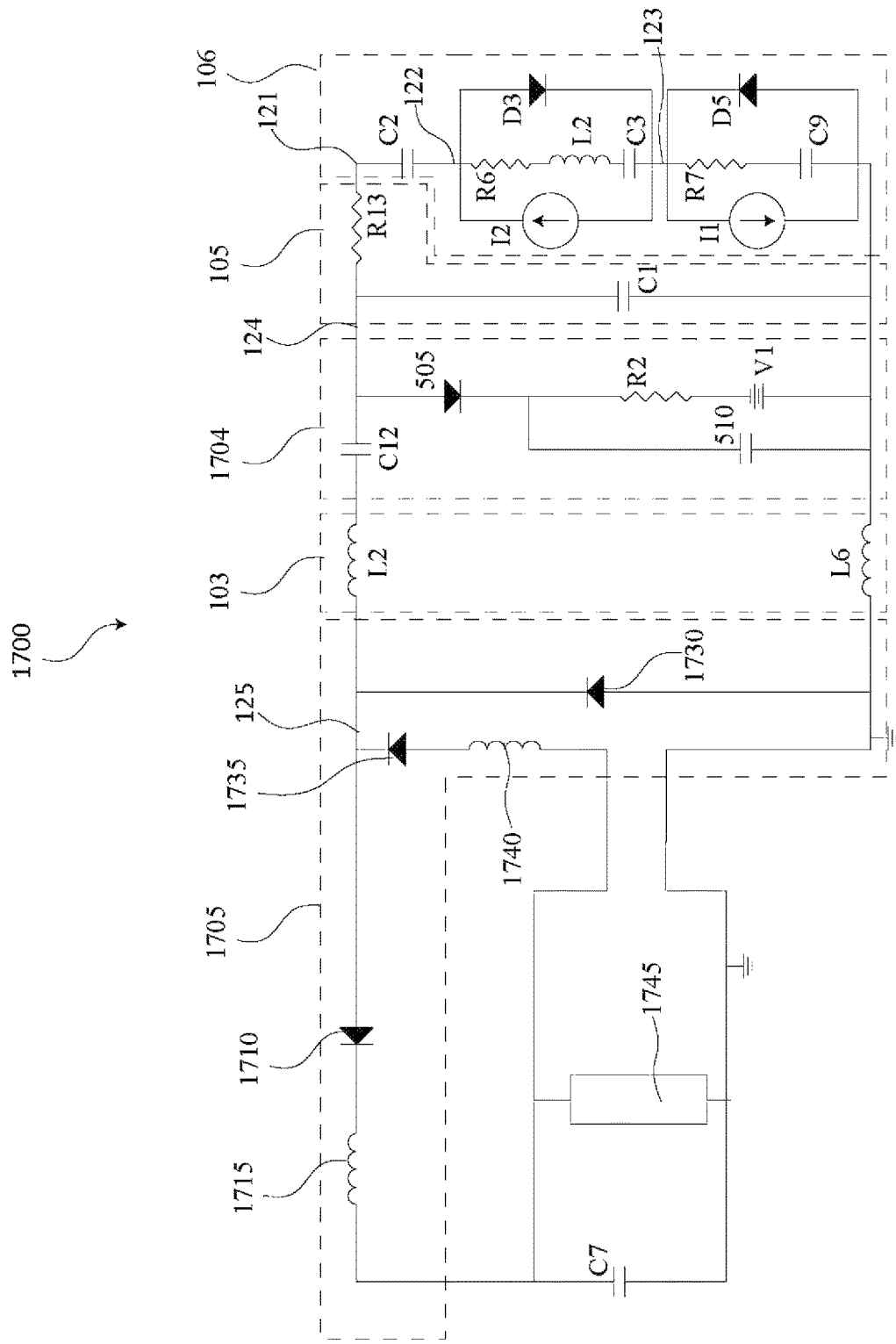
FIG. 71 is a circuit diagram of a plasma sheath control system with an energy recovery circuit according to some embodiments.

FIG. 71 is a circuit diagram of a plasma sheath control system 1700 according to some embodiments. The plasma sheath control system 1700 includes waveform generator 1745 that produces high voltage and high frequency sinusoidal waveforms such as, for example, to drive a plasma chamber. In some embodiments, the waveform generator 1745 may include any device that produces sinusoidal waveforms with a peak voltage greater than 1 kV, 10 kV, 20 kV, 50 kV, 100 kV, etc. and high frequencies greater than 1 kHz, 10 kHz, 100 kHz, 200 kHz, 500 kHz, 1 MHz, etc.

In some embodiments, the waveform generator 1745 may include the RF generator 515, the full-bridge driver 1605, or the half-bridge driver 1905. In some embodiments, the waveform generator 1745 may or may not include a transformer.

In some embodiments, the waveform generator 1745 may be couple with an energy recovery circuit 1705. If the waveform generator 1745 includes a transformer, then the energy recovery circuit 1705 may be positioned on or electrically coupled with the secondary side of the transformer T1.

The energy recovery circuit 1705, for example, may include a diode 1730 (e.g., a crowbar diode) across the secondary side of the transformer T1. The energy recovery circuit 1705, for example, may include diode 1710 and inductor 1715 (arranged in series), which can allow current to flow from a discharge of the load stage 106 (e.g., a capacitive load) to charge the power supply C7. The diode 1710 and the inductor 1715 may be electrically connected with the load stage 106 and the power supply C7.

In some embodiments, the energy recovery circuit 1705 may include blocking diode 1735. The blocking diode 1735 may be similar to blocking diode D7 or may operate in a manner similar to blocking diode D7. For example, blocking diode 1735 may rectify Sinusoidal waveforms that may, for example, produce a flat top on each sinusoidal waveform (e.g., as shown in FIG. 63). For example, the blocking diode 1735 may rectify the Sinusoidal waveform creating an Sinusoidal waveform with a substantially flat portion for at least 10%, 15%, 20%, 25%, 30%, etc. of each period.

In some embodiments, the blocking diode 1735 may be replaced with a switch such as, for example, a high voltage switch. A high voltage switch may include the high voltage switch 1800 shown in FIG. 72. The high voltage switch, for example, may be closed during forward conduction (e.g., when the RF generator 515 output is above a voltage threshold) and open during reverse bias (e.g., when the RF generator 515 output is below the voltage threshold).

In some embodiments, the energy recovery circuit 1705 may include inductor 1740, which may be electrically coupled with the load stage 106. The inductor 1740 may represent the stray inductance of a transformer within the waveform generator 1745 and/or may include the stray inductance between the waveform generator 1745 and the energy recovery circuit 1705 (e.g., the inductance transformer T1).

When the waveform generator 1745 is turned on, current may charge the load stage 106 (e.g., charge the capacitor C3, capacitor C2, or capacitor C9). Some current, for example, may flow through inductor 1715 when the voltage on the secondary side of the transformer T1 rises above the charge voltage on the power supply C7. When the waveform generator 1745 is turned off, current may flow from the capacitors within the load stage 106 through the inductor 1715 to charge the power supply C7 until the voltage across the inductor 1715 is zero. The diode 1730 may prevent the capacitors within the load stage 106 from ringing with the inductance in the load stage 106 or the DC bias circuit 104.

The diode 1710 may, for example, prevent charge from flowing from the power supply C7 to the capacitors within the load stage 106.

The value of inductor 1715 can be selected to control the current fall time. In some embodiments, the inductor 1715 can have an inductance value between 1 µH-500 µH.

In some embodiments, the energy recovery circuit 1705 may include a switch that can be used to control the flow of current through the inductor 1715. The switch, for example, may be placed in series with the inductor 1715. In some embodiments, the switch may be closed when the switch S1 is open and/or no longer pulsing to allow current to flow from the load stage 106 back to the high voltage load C7. The switch, for example, may include a high voltage switch such as, for example, the high voltage switch 1800.

The energy recovery circuit 1705 may be added to the plasma sheath control system 500, plasma sheath control system 700, plasma sheath control system 1200, plasma sheath control system 1600, or plasma sheath control system 1900. In some embodiments the energy recovery circuit 1705 may replace a resistive output stage such as, for example, resistive output stage 705 or resistive output stage 1620.

The DC bias circuit 1704 may include a DC bias circuit 1704, the bias compensation circuit 1625, the DC bias circuit 1204, or the DC bias circuit 104.

The second lead stage 105 may represent circuit elements between the waveform generator 1745 and the load stage 106.

In this example, plasma sheath control system 1700 may be coupled with and may provide a sinusoidal waveform to a load stage 106, which may, for example, include any or elements of load stage 106.

Figure 72:
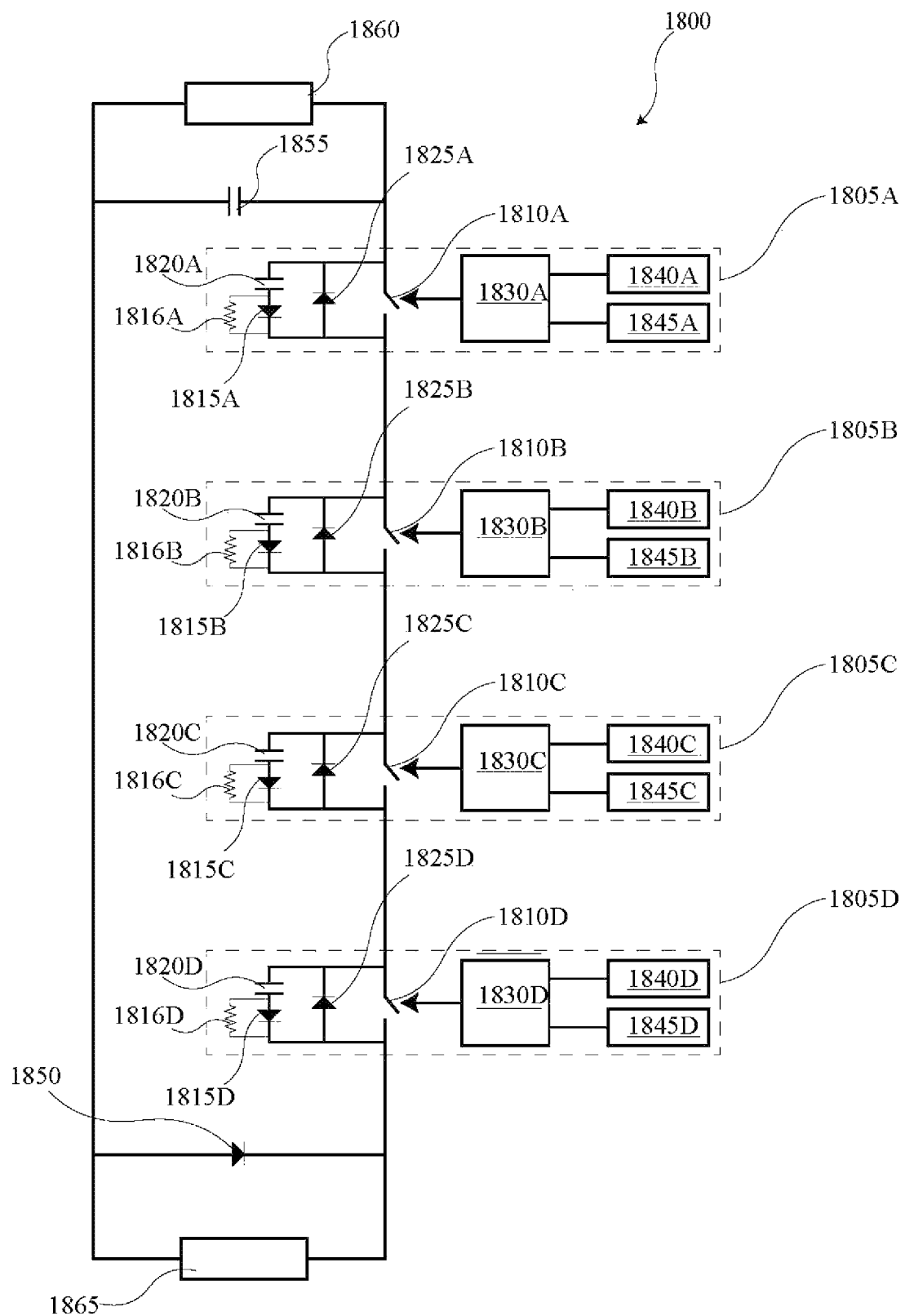
FIG. 72 is a block diagram of a high voltage switch with isolated power according to some embodiments.

FIG. 72 is a block diagram of a high voltage switch 1800 with isolated power according to some embodiments. The high voltage switch 1800 may include a plurality of switch modules 1805 (collectively or individually 1805, and individually 1805A, 1805B, 1805C, and 1805D) that may switch voltage from a high voltage source 1860 with fast rise times and/or high frequencies and/or with variable periods. Each switch module 1805 may include a switch 1810 such as, for example, a solid state switch.

In some embodiments, the switch 1810 may be electrically coupled with a gate driver circuit 1830 that may include a power supply 1840 (e.g., 1840A, 1840B, 1840C, or 1840D) and/or an isolated fiber trigger 1845 (e.g., 1845A, 1845B, 1845C, or 1845D) (also referred to as a gate trigger or a switch trigger). For example, the switch 1810 may include a collector, an emitter, and a gate (or a drain, a source, and a gate) and the power supply 1840 may drive the gate of the switch 1810 via the gate driver circuit 1830. The gate driver circuit 1830 may, for example, be isolated from the other components of the high voltage switch 1800.

In some embodiments, the power supply 1840 may be isolated, for example, using an isolation transformer. The isolation transformer may include a low capacitance transformer. The low capacitance of the isolation transformer may, for example, allow the power supply 1840 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 25 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 1800. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 1840 may include any type of power supply that can provide high voltage standoff (isolation) or have low capacitance (e.g., less than about 1,000 pF, 100 pF, 10 pF, etc.). In some embodiments, the control voltage power source may supply 1820 V AC or 240 V AC at 60 Hz.

In some embodiments, each power supply 1840 may be inductively electrically coupled with a single control voltage power source. For example, the power supply 1840A may be electrically coupled with the power source via a first transformer; the power supply 1840B may be electrically coupled with the power source via a second transformer; the power supply 1840C may be electrically coupled with the power source via a third transformer; and the power supply 1840D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 1840A, the power supply 1840B, the power supply 1840C, and/or the power supply 1840D may not share a return reference ground or a local ground.

The isolated fiber trigger 1845, for example, may also be isolated from other components of the high voltage switch 1800. The isolated fiber trigger 1845 may include a fiber optic receiver that allows each switch module 1805 to float relative to other switch modules 1805 and/or the other components of the high voltage switch 1800, and/or, for example, while allowing for active control of the gates of each switch module 1805.

In some embodiments, return reference grounds or local grounds or common grounds for each switch module 1805, for example, may be isolated from one another, for example, using an isolation transformer.

Electrical isolation of each switch module 1805 from common ground, for example, can allow multiple switches to be arranged in a series configuration for cumulative high voltage switching. In some embodiments, some lag in switch module timing may be allowed or designed. For example, each switch module 1805 may be configured or rated to switch 1 kV, each switch module may be electrically isolated from each other, and/or the timing of closing each switch module 1805 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 1810 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 1810 may include any type of solid state switching device such as, for example, an IGBT, a MOSFET, a SiC MOSFET, SiC junction transistor, FETs, SiC switches, GaN switches, photoconductive switch, etc. The switch 1810, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches the greater the timing issues that may be required.

The high voltage switch 1800 shown in FIG. 72 includes four switch modules 1805. While four are shown in this figure, any number of switch modules 1805 may be used such as, for example, two, eight, twelve, sixteen, twenty, twenty-four, etc. For example, if each switch in each switch module 1805 is rated at 1200 V, and sixteen switches are used, then the high voltage switch can switch up to 19.2 kV. As another example, if each switch in each switch module 1805 is rated at 1700 V, and sixteen switches are used, then the high voltage switch can switch up to 27.2 kV.

In some embodiments, the high voltage switch 1800 may include a fast capacitor 1855. The fast capacitor 1855, for example, may include one or more capacitors arranged in series and/or in parallel. These capacitors may, for example, include one or more polypropylene capacitors. The fast capacitor 1855 may store energy from the high voltage source 1860.

In some embodiments, the fast capacitor 1855 may have low capacitance. In some embodiments, the fast capacitor 1855 may have a capacitance value of about 1 µF, about 5 µF, between about 1 µF and about 5 µF, between about 100 nF and about 1,000 nF etc.

In some embodiments, the high voltage switch 1800 may or may not include a crowbar diode 1850. The crowbar diode 1850 may include a plurality of diodes arranged in series or in parallel that may, for example, be beneficial for driving inductive loads. In some embodiments, the crowbar diode 1850 may include one or more Schottky diodes such as, for example, a silicon carbide Schottky diode. The crowbar diode 1850 may, for example, sense whether the voltage from the switches of the high voltage switch is above a certain threshold. If it is, then the crowbar diode 1850 may short the power from switch modules to ground. The crowbar diode, for example, may allow an alternating current path to dissipate energy stored in the inductive load after switching. This may, for example, prevent large inductive voltage spikes. In some embodiments, the crowbar diode 1850 may have low inductance such as, for example, 1 nH, 10 nH, 100 nH, etc. In some embodiments, the crowbar diode 1850 may have low capacitance such as, for example, 100 pF, 1 nF, 10 nF, 100 nF, etc.

In some embodiments, the crowbar diode 1850 may not be used such as, for example, when the load 1865 is primarily resistive.

In some embodiments, each gate driver circuit 1830 may produce less than about 1000 ns, 100 ns, 10.0 ns, 5.0 ns, 3.0 ns, 1.0 ns, etc. of jitter. In some embodiments, each switch 1810 may have a minimum switch on time (e.g., less than about 10 µs, 1 µs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 1805 may have the same or substantially the same (±5%) stray inductance. Stray inductance may include any inductance within the switch module 1805 that is not associated with an inductor such as, for example, inductance in leads, diodes, resistors, switch 1810, and/or circuit board traces, etc. The stray inductance within each switch module 1805 may include low inductance such as, for example, an inductance less than about 300 nH, 100 nH, 10 nH, 1 nH, etc. The stray inductance between each switch module 1805 may include low inductance such as, for example, an inductance less than about 300 nH, 100 nH, 10 nH, 1 nH, etc.

In some embodiments, each switch module 1805 may have the same or substantially the same (±5%) stray capacitance. Stray capacitance may include any capacitance within the switch module 1805 that is not associated with a capacitor such as, for example, capacitance in leads, diodes, resistors, switch 1810 and/or circuit board traces, etc. The stray capacitance within each switch module 1805 may include low capacitance such as, for example, less than about 1,000 pF, 100 pF, 10 pF, etc. The stray capacitance between each switch module 1805 may include low capacitance such as, for example, less than about 1,000 pF, 100 pF, 10 pF, etc.

Imperfections in voltage sharing can be addressed, for example, with a passive snubber circuit (e.g., the snubber diode 1815, the snubber capacitor 1820, and/or the freewheeling diode 1825). For example, small differences in the timing between when each of the switches 1810 turn on or turn off or differences in the inductance or capacitances may lead to voltage spikes. These spikes can be mitigated by the various snubber circuits (e.g., the snubber diode 1815, the snubber capacitor 1820, and/or the freewheeling diode 1825).

A snubber circuit, for example, may include a snubber diode 1815, a snubber capacitor 1820, a snubber resistor 1816, and/or a freewheeling diode 1825. In some embodiments, the snubber circuit may be arranged together in parallel with the switch 1810. In some embodiments, the snubber capacitor 1820 may have low capacitance such as, for example, a capacitance less than about 100 pF.

In some embodiments, the high voltage switch 1800 may be electrically coupled with or include a load 1865 (e.g., a resistive or capacitive or inductive load). The load 1865, for example, may have a resistance from 50 ohms to 500 ohms. Alternatively or additionally, the load 1865 may be an inductive load or a capacitive load.

Figure 73:
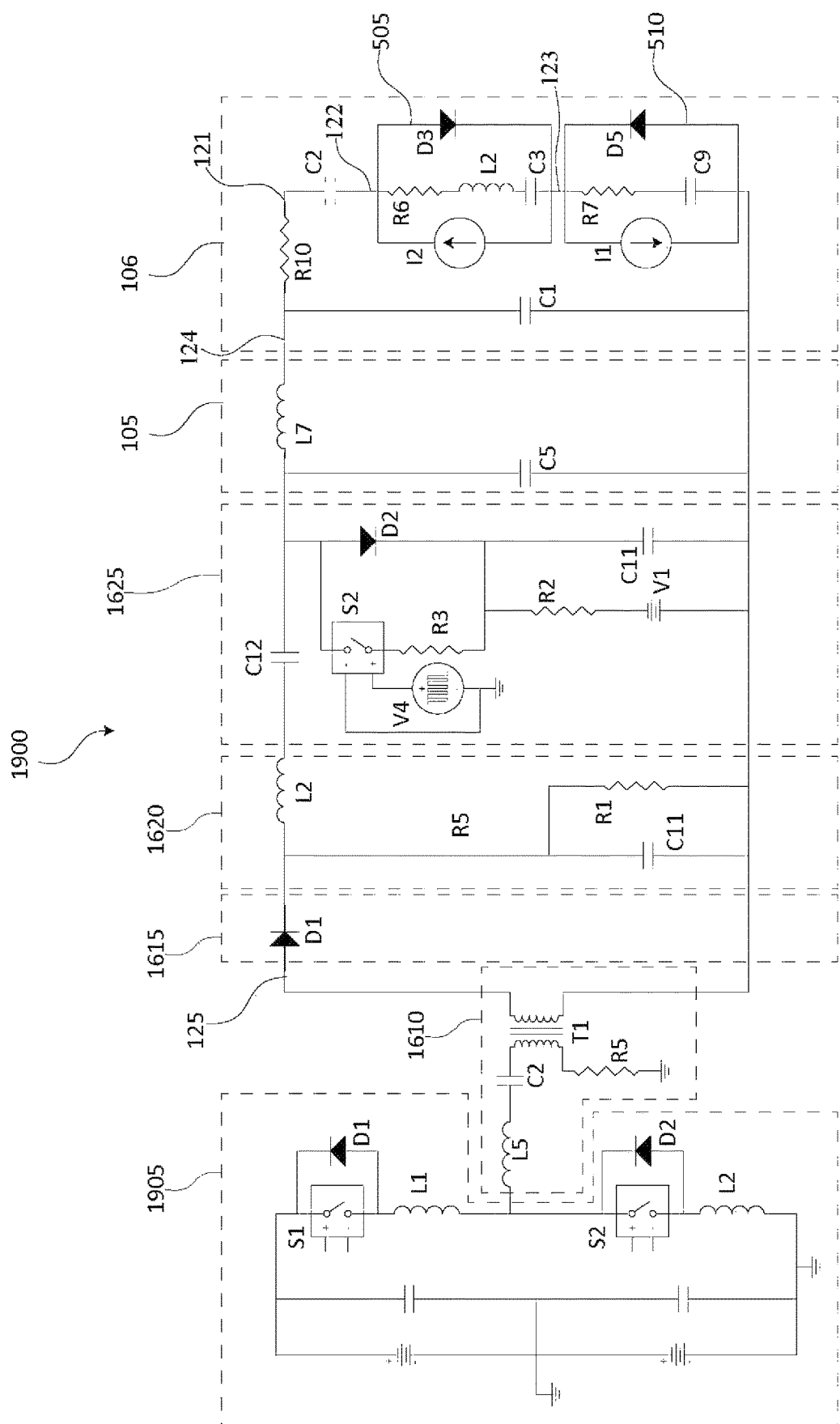
FIG. 73 is a circuit diagram of a plasma sheath control system with a half bridge resonant circuit according to some embodiments.

FIG. 73 is a circuit diagram of a plasma sheath control system 1900 according to some embodiments. In this example, the plasma sheath control system 1900 may include a half-bridge driver 1905 rather than the full-bridge driver 1605 shown in FIG. 70. The switches S1 and S2 may be alternately opened to allow current to flow in one direction through the load during a first time period, and allow current to flow in the opposite direction through the load during a second time period In some embodiments, a matching network may be included to is used to match the impedance of the plasma chamber to the impedance of the RF generator in order, for example, to deliver the maximum power to the plasma. This may be beneficial, for example, when using a 50 ohm system. For example, in plasma sheath control system 500, plasma sheath control system 700, or plasma sheath control system 1200 may include a matching network near resistor R13. As another example, the plasma sheath control system 1600, the plasma sheath control system 1700, or plasma sheath control system 1900 may include a matching network prior to inductor L2.

Some embodiments include a plasma system that includes a plasma chamber, an RF plasma generator, a bias generator, and a controller. The RF plasma generator may be electrically coupled with the plasma chamber and may produce a plurality of RF bursts, each of the plurality of RF bursts including RF waveforms, each of the plurality of RF bursts having an RF burst turn on time and an RF burst turn off time. The bias generator may be electrically coupled with the plasma chamber and may produce a plurality of bias bursts, each of the plurality of bias bursts including bias pulses, each of the plurality of bias bursts having an bias burst turn on time and an bias burst turn off time. In some embodiments the controller is in communication with the RF plasma generator and the bias generator that controls the timing of various bursts or waveforms.

As used throughout this disclosure, the term "high voltage" may include a voltage greater than 500 V, 1 kV, 10 kV, 20 kV, 50 kV, 100 kV, etc.; the term "high frequency" may be a frequency greater than 1 kHz, 10 kHz, 100 kHz, 200 kHz, 500 kHz, 1 MHz, etc., the term "fast rise time" may include a rise time less than about 1 ns, 10 ns, 50 ns, 100 ns, 250 ns, 500 ns, 1,000 ns, etc.; the term "fast fall time" may include a fall time less than about 1 ns, 10 ns, 50 ns, 100 ns, 250 ns, 500 ns, 1,000 ns, etc.); and the term short pulse width may include pulse widths less than about 1 ns, 10 ns, 50 ns, 100 ns, 250 ns, 500 ns, 1,000 ns, etc.).

Figure 74:
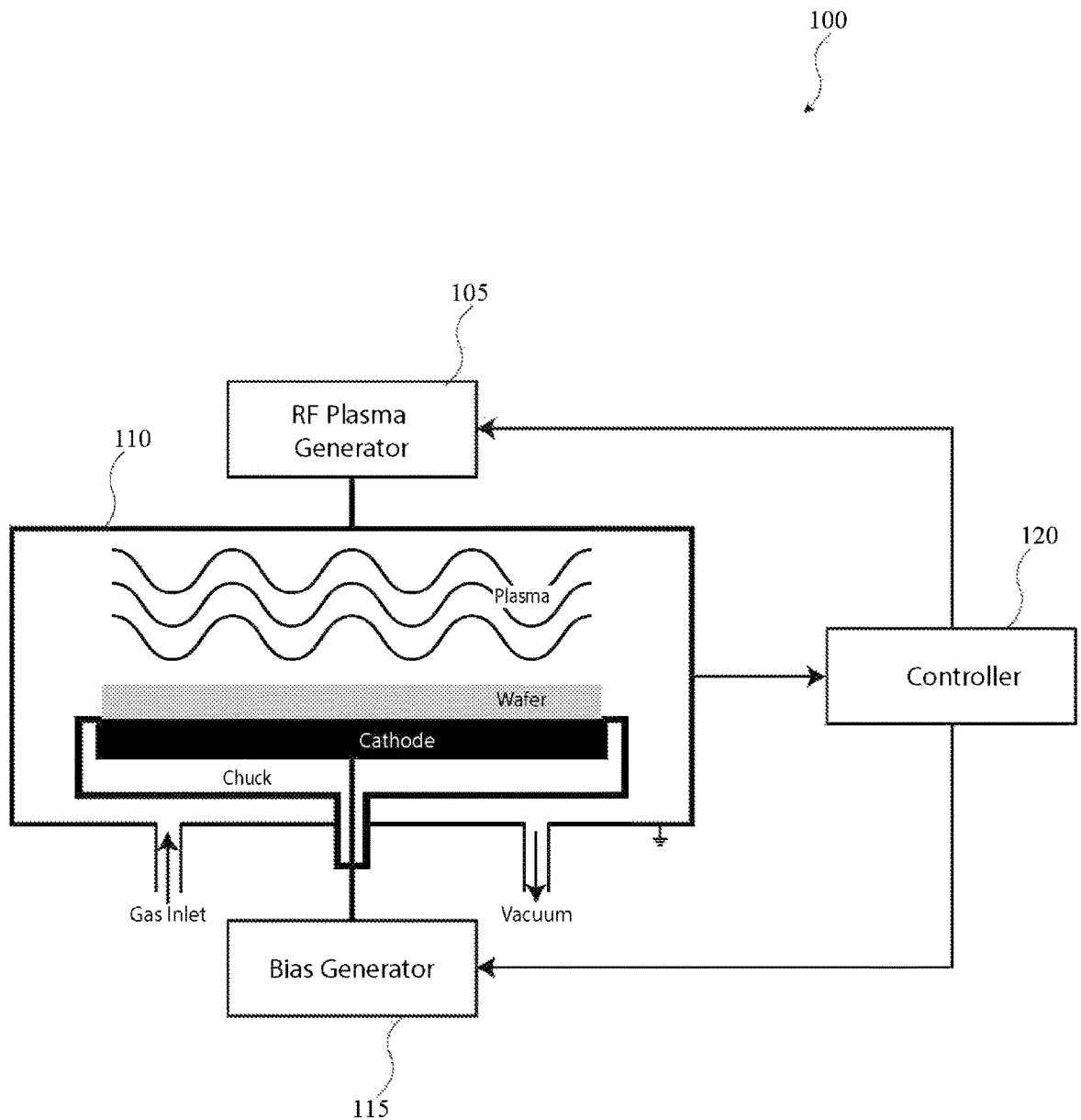
FIG. 74 is a block diagram of a plasma system according to some embodiments.

FIG. 74 is a block diagram of a plasma system 100 according to some embodiments. In some embodiments, the plasma system 100 includes a plasma chamber 110, an RF plasma generator 105, a bias generator 115, and/or a controller 120. In some embodiments, the RF plasma generator 105 may be used to create a plasma within the plasma chamber. In some embodiments, the bias generator 115 may provide pulses that can be used to accelerate ions within the plasma created within the plasma chamber 110.

In some embodiments, the controller 120 may include any type of controller such as, for example, an FPGA, microcontroller, etc. In some embodiments, the controller 120 may receive signals from the plasma chamber 110 (or elsewhere) and change or adapt the timing, duration, frequency, amplitude, etc. of bursts or pulses provided be either the RF plasma generator 105 and/or the bias generator 115.

In some embodiments, the controller 120 may comprise any type of controller such as, for example, an FPGA, ASIC, complex programmable logic device, microcontroller, system on a chip (SoC), supervisory control, data acquisition (SCADA) and programmable logic controller (PLC), or any combination thereof. In some embodiments, the controller 120 may include any or all the components of the computational system 2600. In some embodiments, the controller 120 may include a standard microcontroller such as, for example, Broadcom Arm Cortex, Intel ARM Cortex, PIC32, etc.

In some embodiments, the RF plasma generator 105 may produce plasma within the plasma chamber on microsecond timescales (e.g., 1 to 1000 microseconds). In some embodiments, the RF plasma generator 105 may allow for plasma sustainment and/or plasma drive on microsecond timescales to DC, adjustable in microsecond increments. In some embodiments, the RF plasma generator 105 may deliver very high peak powers (e.g., 1 to 10000 kW). In some embodiments, the RF plasma generator 105 may produce a variable CW power delivered (e.g., 0.1 to 100 kW).

In some embodiments, the RF plasma generator 105 may include RF plasma generator 1200 or RF plasma generator 1300. Any RF power supply may be used.

In some embodiments, the RF plasma generator 105 may induce plasma formation in the plasma chamber 110 on small timescales such as, for example, on timescales from about 1 µs to about 1,000 µs. In some embodiments, the RF plasma generator 105 may produce waveforms with arbitrary and/or controllable pulse widths, pulse repetition frequencies, pulse durations, maximum voltages, etc. In some embodiments, the RF plasma generator 105 may produce waveforms with high peak power such as, for example, from about 1 kW to about 10,000 kW. In some embodiments, the RF plasma generator 105 may produce waveforms with variable and/or continuous wave (CW) power such as, for example, from about 1 kW to about 100 kW.

In some embodiments, the bias generator 115 may control a wafer bias voltage on small timescales such as, for example, from about 1 µs to about 1,000 µs. In some embodiments, the bias generator 115 may produce waveforms with arbitrary and/or controllable pulse widths, pulse repetition frequencies, pulse durations, maximum voltages, etc. In some embodiments, the bias generator 115 may produce waveforms with high peak power such as, for example, from about 1 kW to about 100,000 kW. In some embodiments, the bias generator 115 may produce waveforms with variable continuous power such as, for example, from about 1 kW to about 100 kW.

In some embodiments, the bias generator 115 may include bias generator 600, bias generator 900, bias generator 1000, bias generator 1100, bias generator 1600, bias generator 1700, bias generator 1800, bias generator 1900, bias generator 2000, bias generator 2100, bias generator 2200, bias generator 2400, and bias generator 2500. In some embodiments, the bias generator 115 may include RF plasma generator 1200 or RF plasma generator 1300.

In some embodiments, the controller 120 may provide timing control of pulses from both the RF plasma generator 105 and the bias generator 115. The RF waveform 305 is an example output from the RF plasma generator 105 and the bias burst 310 is an example output from the bias generator 115.

In some embodiments, the timing from the controller 120 may contribute, for example, to faster plasma etch within the plasma chamber 110, allow for less/more erosion of various masks; straighter deeper holes/trenches, control of specific plasma properties such as temperature and density while etch voltage is present, different chemistry/reactions driven, varying speed of reactions, control of some etching parameters, and/or control some plasma generation.

Figure 75:
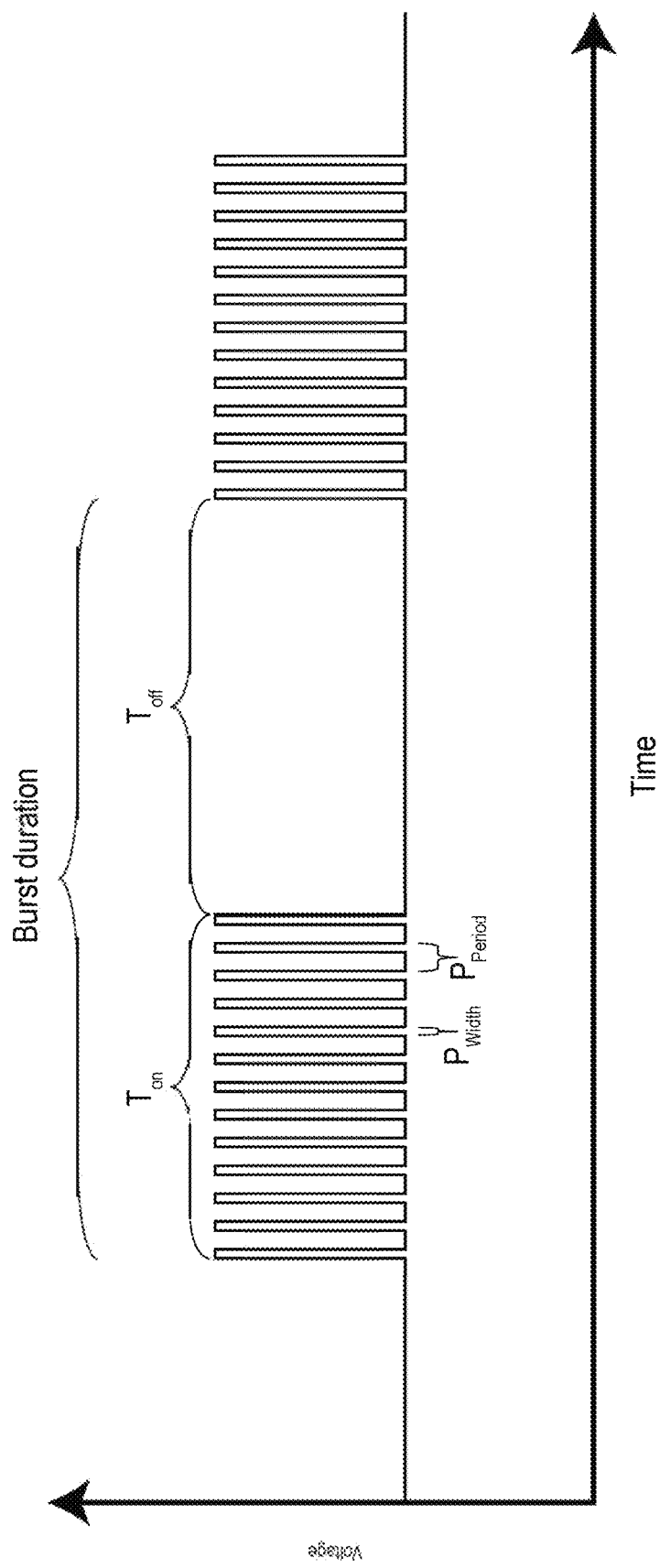
FIG. 75 is an illustration of an example waveform showing two bursts of pulses according to some embodiments.

FIG. 75 is an illustration of an example waveform showing two bursts of pulses according to some embodiments. A single burst may include a plurality of pulses. A burst duration is the time period when a burst is on, $T_{on}$, and the burst is off, $T_{off}$. A pulse width, $P_{width}$, is the period of time that the pulse is on. The pulse period, $P_{period}$, is the time period when the pulse is on and off. The duty cycle may be represented by the on time, $T_{on}$, divided by the burst duration:

$$DC = \frac{T_{on}}{T_{on} + T_{off}}.$$

The burst repetition frequency can be represented by the reciprocal of the burst period: $f_{burst}=1/T_{on}+T_{off})$. The pulse repetition frequency can be represented by the reciprocal of the pulse period: $f_{pulse}=1/P_{period}$.

In some embodiments, the burst repetition frequency may be between about 10 Hz and about 1,000 Hz. In some embodiments, the pulse repetition frequency may be greater than about 10 kHz.

Figure 76:
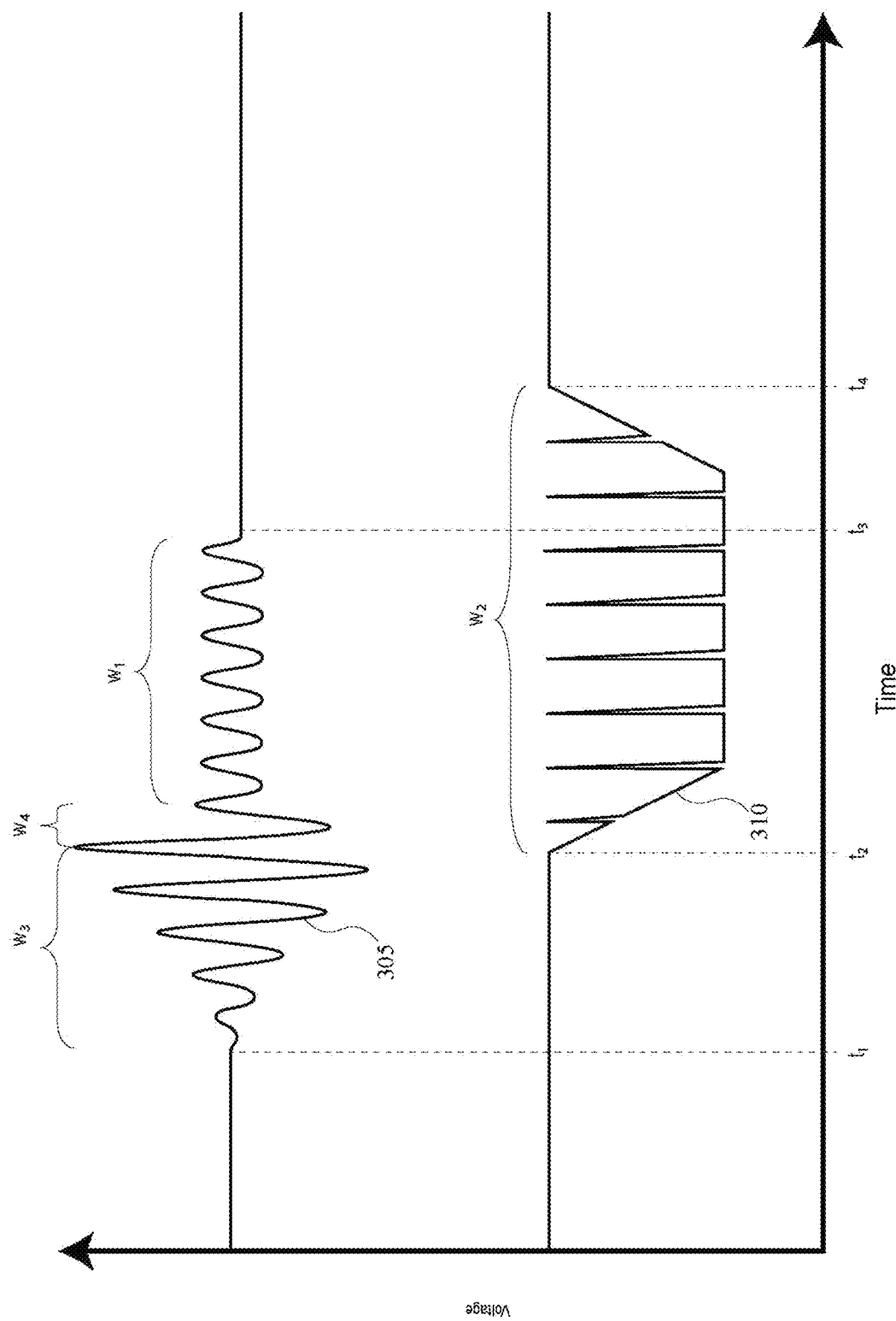
FIG. 76 is an illustration of an example RF burst and example bias burst according to some embodiments.

FIG. 76 is an illustration of an example RF burst and an example bias burst according to some embodiments.

The time $t_1$ represents the beginning of the RF waveform 305 (e.g., the RF burst turn on time). The time $t_3$ represents the end of the RF waveform 305 (e.g., the RF burst turn off time). The time period $w_1$ may represent the period of the portion of the RF waveform 305 when the RF waveform is driving the plasma. The time $t_2$ represents the beginning of the bias burst 310 (e.g., the bias burst turn on time). The time $t_4$ represents the end of the bias burst 310 (e.g., the bias burst turn off time). The time period $w_2$ may represent the period of the bias burst 310.

The RF waveform 305 may create and drive a plasma within the plasma chamber 110. For example, time period $w_3$ may include a period of time with an initial ring up. The time period $w_4$ may be the time period when the plasma forms. The period of time $w_1$ may be when the plasma is driven by the RF signal within the chamber.

In some embodiments, $t_3$ may begin when a plasma has formed in the chamber 110 such as, for example, at the end of either or both $w_3$ or $w_4$. In some embodiments, the controller 120 may sense the formation of the plasma such as, for example, by sensing the amplitude of the initial ring up in the RF waveform 305 or via sensors disposed within the chamber 110 or by sensing the number of cycles of the RF waveform 305. The controller 120 may, for example, begin the burst 310 based on the controller sensing the formation of the plasma or anticipating the formation of the plasma within the chamber 110.

In some embodiments, $t_1$ may precede $t_2$ be less than about 10 ms. In some embodiments, $t_3$ may precede $t_4$ by less than about 10 ms.

In some embodiments, the difference between $t_2$ and $t_1$ may be between about 10 µs and about 10 ms. In some embodiments, the difference between $t_2$ and $t_1$ may be less than about 1 µs. In some embodiments, the difference between $t_2$ and $t_1$ may be less than about 740 ns. In some embodiments, the difference between $t_2$ and $t_1$ may be about 10 cycles or periods or greater than about 10 cycles or periods of the RF waveform 305.

In some embodiments, $t_2$ and $t_1$ may occur at substantially the same time. In some embodiments, $t_2$ may trigger based on when the controller 120 detects that plasma formation has occurred within the plasma chamber 110.

In some embodiments, the difference between $t_4$ and $t_2$ (or $w_2$) may be between about 10 µs and about 10 ms. In some embodiments, $w_1$ may be between about 10 µs and about 10 ms. In some embodiments, $w_2$ may be continuous.

In some embodiments, the frequency of the RF waveform 305 may have a frequency of between about 10 kHz and about 10 MHz. In some embodiments, the RF waveform 305 may have a frequency of 13.56 MHz or any multiples thereof (e.g., 27.12 MHz, 40.68 MHz, etc.). In some embodiments, the frequency of the RF waveform 305 may have a frequency greater than 10 MHz.

In some embodiments, $w_1$ may be continuous such as, for example, greater than 10 ms, 1 ms, 1 second, 10 seconds, etc. In some embodiments, the frequency of the of the pulses in the bias burst 310 may be between about 10 Hz and about 10 kHz. In some embodiments, the frequency of the pulses in the bias burst 310 may be greater than 1 kHz. In some embodiments, the frequency of the of the pulses in the bias burst 310 may be greater than 10 kHz. In some embodiments, the frequency of the of the pulses in the bias burst 310 may be between 10 kHz and 20 MHz. In some embodiments, the frequency of the pulses in the bias burst 310 may be greater than about 400 kHz.

In some embodiments, $w_3$ (e.g., $t_3-w_1-t_1-w_4$) may be less than about 10 ms.

In some embodiments, a flat or ramped or other segment of the bias burst 310 may be between 10 µs and 10 ms in duration.

In some embodiments, a flat or ramped or other segment of the RF waveform 305 may be between 10 µs and 10 ms in duration.

In some embodiments, $t_2$ may precede $t_3$ by less than about 10 ms.

In some embodiments, $t_3$ may precede $t_2$ by less than about 10 ms.

In some embodiments, $t_2$ may occur any time during $w_4$. In some embodiments, $t_2$ may occur any time before the start of $w_1$. In some embodiments, $t_2$ may occur during plasma formation. In some embodiments, $t_2$ may occur during or after or during the initial ring up of the of the RF waveform 305.

In some embodiments, $t_2$ may precede $t_4$ by less than about 10 ms.

In some embodiments, the controller 120 may control the RF plasma generator 105 and/or the bias generator 115 to produce multiple bursts of pulses with arbitrary or selectable pulse widths (e.g., $w_1+w_3+w_4$ or $w_2$), duty cycles, pulse repetition frequencies, and/or burst frequencies.

In some embodiments, the controller 120 may control the RF plasma generator 105 and/or the bias generator 115 to include slow start and/or slow DC stop abilities as well.

In some embodiments, the controller 120 may send and/or receive external commands from an external controller (e.g., an industrial controller). These external commands may control the pulse widths, duty cycles, pulse repetition frequencies, and/or burst frequencies of either or both the RF plasma generator 105 and/or the bias generator 115.

In some embodiments, the controller 120 may automate control of high voltage DC power supplies including turning them on/off, changing the voltage and amperage settings, and/or making the units safe in case of an emergency.

In some embodiments, the controller 120 may have a feedback circuit from the output of the RF plasma generator 105 thus allowing it to analyze the waveforms going into the plasma chamber. This allows the controller 120 to self-adjust for different loads and load conditions In some embodiments, the controller 120 may control the bias generator 115 based on the settings going to the RF plasma generator 105.

In some embodiments, the controller 120 may control the bias generator 115 to produce pulses having pulse widths of 40 ns-200 ns.

In some embodiments, the controller 120 may produce bursts having a duty cycle of 1%-100%.

In some embodiments, the controller 120 may control the bias generator 115 to produce pulses having a burst repetition frequency of 200-1000 Hz.

In some embodiments, the controller 120 may control the bias generator 115 to begin producing pulses at a minimum pulse width (e.g., ~40 ns) and ramp up to longer pulse widths in 4 ns increments (e.g., 40 ns, 44 ns, 48 ns, 52 ns, etc.)

In some embodiments, the controller 120 may control the bias generator 115 to produce pulses that ramp DC voltage down from max voltage to 0 V in selectable steps.

In some embodiments, the controller 120 may control the bias generator 115 to produce arbitrary pulses at low jitter such as, for example, jitter less than about 10 nanoseconds.

In some embodiments, the controller 120 may self-correct for load condition.

In some embodiments, the plasma chamber 110 may include any type of plasma chamber.

In some embodiments, the plasma chamber 110 can have a load capacitance of less than 20 nF. In some embodiments, a potential can be established in the plasma chamber 110 to accelerate ions into a surface through the action of the bias generator 115. In some embodiments, the plasma in the plasma chamber 110 may be largely capacitive in nature. In some embodiments, the plasma in the plasma chamber 110 can include a dielectric barrier discharge In some embodiments, the plasma chamber 110 may be modeled as a capacitor, a capacitor in series with a resistor, a capacitor in series with an inductor, a dielectric barrier discharge, a plasma load, a semiconductor wafer processing load, and any arbitrary arrangement of capacitors, inductors, resistors, and/or other active and/or passive components, etc. In some embodiments, the load within the chamber may include any load that when voltage is applied, and charge is delivered, the charge/voltage may remain present for longer than desired (e.g., longer than the designed or desired fall time). For instance, this may often occur in high voltage switching applications.

In some embodiments, the plasma chamber 110 may include a capacitive load, one or more electrodes, a plasma load, one or more dielectric barriers, semiconductor fabrication plasmas, semiconductor loads, grids, medical loads, etc. In some embodiments, the plasma chamber 110 may include a plasma deposition system, a plasma etch system, or a plasma sputtering system.

In some embodiments, the RF plasma generator 105 may include circuits and/or processes for driving switching power to a plasma chamber without a matching network. In some embodiments, the RF plasma generator 105 may include a full (or half) bridge circuit topology that may be used to drive a resonant circuit at or near its resonant frequency. Because the resonant circuit is being driven at its resonant frequency, the output voltage of the resonant circuit may be higher than the input voltage. In some embodiments, this resonant condition may allow for a drive voltage of a few hundred volts to generate about 4 kV or more.

Figure 77:
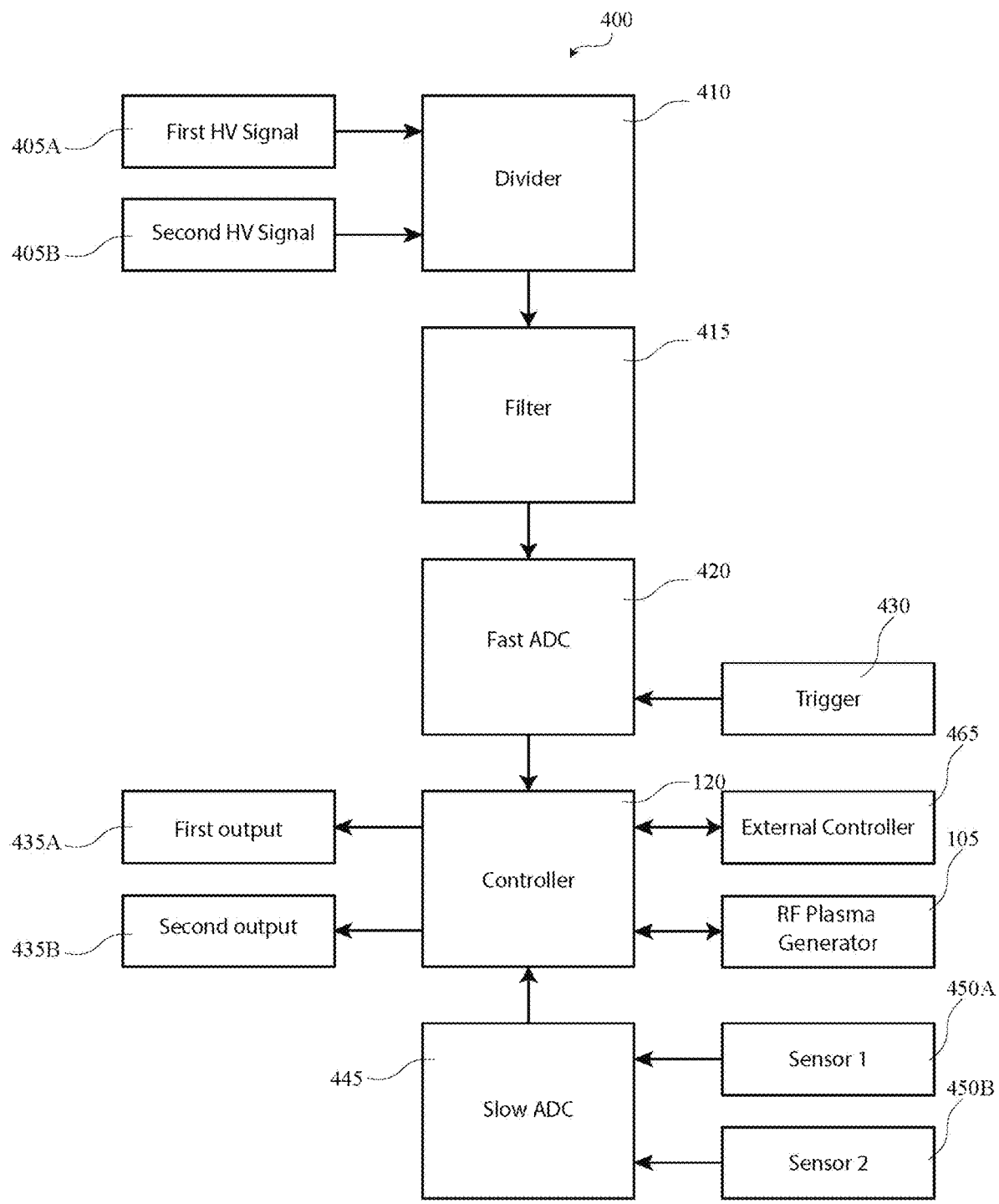
FIG. 77 is a block diagram of a plasma control system according to some embodiments.

FIG. 77 is a block diagram of a plasma control system 400 with a bias generator and an RF plasma generator according to some embodiments. In some embodiments, the plasma control system 400 may be electrically coupled with the bias generator 115 at one or more locations and/or the RF plasma generator 105 at one or more locations. For example, a first HV signal 405A (or a second HV signal 405B) may include the voltage signal at a point of the bias generator 115 between a pulser and a transformer stage and a bias compensation circuit. As another example, a first HV signal 405A (or a second HV signal 405B) may include the voltage signal at a point between a load stage and a bias compensation circuit. As another example, a first HV signal 405A (or a second HV signal 405B) may include the voltage at a point prior to a resistive output stage or an energy recovery state. As another example, a first HV signal 405A (or a second HV signal 405B) may include the voltage on the wafer, chuck, or electrode. While two signals are shown, any number of signals may be received. As another example, a first HV signal 405A (or a second HV signal 405B) may include the voltage across a resistor in a resistive output stage or an energy recovery circuit, which may be representative of the ion current in the chamber. As another example, a first HV signal 405A (or a second HV signal 405B) may include the voltage in an energy recovery circuit, such as, for example, the voltage across an energy recovery inductor, which may be representative of the ion current in the chamber.

In some embodiments, the first HV signal 405A and the second HV signal 405B may include the voltage or current signals on each side of a capacitor of a bias compensation circuit (e.g., (e.g., capacitor C12 of bias compensation circuit 104 or bias compensation circuit 134). Any number or type of other signals may be received.

In some embodiments, the first HV signal 405A or the second HV signal 405B may include the voltage signals provided to the load. In some embodiments, the first HV signal 405A or the second HV signal 405B may include the voltage signals provided to a bias compensation circuit. In some embodiments, the first HV signal 405A or the second HV signal 405B may include the voltage signals provided to the pulser and a transformer stage may be measured. In some embodiments, the first HV signal 405A or the second HV signal 405B may include the voltage signals provided to the resistive output stage or an energy recovery circuit.

The first HV signal 405A and the second HV signal 405B collectively or individually may be referred to as the HV input signal 405. The HV signal 405 may provide waveforms from the bias generator 115 and/or the RF plasma generator 105.

In some embodiments, the HV input signal 405 may be divided at voltage divider 410. The voltage divider 410, for example, may include high value resistors or low value capacitors to divide the high voltage HV input signal (e.g., greater than 1 KV) to a low voltage signal (e.g., less than 50 V). The voltage divider 410, for example, may divide the voltage with a 500:1 ratio, 1,000:1 ratio, a 10,000:1 ratio, a 100,000:1 ratio, etc. The voltage divider 410, for example, may divide the HV input signal 405 voltage of 0-10 kV to a voltage of 0-20 V. The voltage divider 410, for example, may divide the voltage with minimal power loss such as, for example, less than about 5 W of power loss.

In some embodiments, the voltage divider 410 may include a low value capacitor, a large value capacitor, a low value resistor, and a large value resistor. The low value capacitor, for example, may comprise a capacitor that has a capacitance value of about 0.1 pF, 0.5 pF, 1.0 pF, 2.5 pF, 5.0 pF, 10.0 pF, 100 pF, 1 nF, 10 nF, etc. The large value capacitor, for example, may comprise a capacitor that has a capacitance value of about 500 pF. In some embodiments, the large value capacitor may have a capacitance value that is about 50, 100, 250, 500, 1,000, 2,500, 5,000 pF, etc. greater than the capacitance value of the low value capacitor.

The low value resistor may have a resistance value of about 1.0 kΩ, 2.5 kΩ, 5.0 kΩ, 10 kΩ, 25 kΩ, 50 kΩ, 100 kΩ, etc. The large value resistor may have a resistance value of about 0.5 MΩ, 1.0 MΩ, 2.5 MΩ, 5.0 MΩ, 10 MΩ, 25 MΩ, 50 MΩ, 100 MΩ, etc. In some embodiments, the large value resistor may have a resistance value that is about 50Ω, 100Ω, 250Ω, 500Ω, 1,000Ω, 2,500Ω, 5,000Ω, etc. greater than the resistance value of the low value resistor. In some embodiments, the ratio of the low value capacitor to the large value capacitor may be substantially the same as the ratio of the low value resistor to the large value resistor.

In some embodiments, the voltage divider 410 may receive the HV input signal and output a divided voltage signal. The divided voltage signal, for example, may be 100, 250, 500, 750, 1,000, etc. times smaller than the HV input signal.

In some embodiments, a filter 415 may be included such as, for example, to filter out any noise from the divided voltage signal. The filter, for example, may include any type of low pass filter, a band pass filter, a band stop filter, or a high pass filter.

In some embodiments, the divided voltage signal may be digitized by the first ADC 420. The first ADC 420 may include an analog to digital converter. Any type of analog to digital converter may be used. The first ADC 420 may produce a digitized waveform signal. In some embodiments, the first ADC 420 may capture data at 100, 250, 500, 1,000, 2,000, 5,000 MSPS (megasamples per second or millions of samples per second). In some embodiments, the digitized waveform signal may be communicated to the controller 120 using any type of communication protocol such as, for example, SPI, UART, RS-232, USB, I2C, etc.

In some embodiments, any of the voltage divider 410, the filter 415, or the first ADC 420 may be isolated from the bias generator 115 via galvanic isolation or via fiber optic link.

In some embodiments, the controller 120 may send and/or receive signals or data to or from the RF plasma generator 105. For example, the controller 120 may send timing signals to the RF plasma generator 105 that instruct the RF plasma generator regarding burst repetition frequency, burst voltage, burst frequency, burst duty cycle, burst duration, etc.

In some embodiments, the controller 120 may send and/or receive signals or data to or from the bias generator 115 via the output 435. For example, the controller 120 may send timing signals to the bias generator 115 that instruct the bias generator regarding burst repetition frequency, burst voltage, burst frequency, burst duty cycle, burst duration, etc.

In some embodiments, the controller 120 may receive a trigger signal from trigger 430. In other embodiments, the first ADC 420 may receive the trigger signal from trigger 430. The trigger signal may provide the timing of data acquisition at the first ADC 420. The trigger signal, for example, may be a 5V TTL trigger. The trigger signal, for example, may, have a 50 ohm termination.

The digitized signal may then be output from the controller 120 via one or more output ports such as, for example, a first output 435A or a second output 435B (individually or collectively output 435). These outputs may be coupled with one or more nanosecond pulsers (e.g., bias generator 115). Either or both the output 435 may include an electrical connecter such as, for example, an LVDS, TTL, LVTTL connector. Either or both the output 435 may provide data to the nanosecond pulser controller using any type of communication protocol such as, for example, SPI, UART, RS-232, USB, I2C, EtherCat, Ethernet, Profibus, PROFINET.

In some embodiments, the plasma control system 400 may couple with the bias generator 115 via a 4 mm Multilam receptacles on the plasma control system 400.

In some embodiments, the plasma control system 400 may include a second ADC 445, which may receive inputs from a first sensor 450A and a second sensor 450B (individually or collectively sensor 450) (or any number of sensors). The second ADC 445 may include an analog to digital converter. In some embodiments, the second ADC 445 may digitize analog signals from the sensors 450. The sensors 450 may include, for example, a sensor that senses inlet water temperature, dielectric fluid temperature, dielectric fluid pressure, chassis air temperature, voltage, fluid flow, fluid leak sensor, etc. In some embodiments, the second ADC 445 may include ARM, PIC32, AVR, PSOC, or PIC32.

In some embodiments, the second ADC 445 and the first ADC 420 may comprise a single ADC device. In some embodiments, either or both the second ADC 445 or the first ADC 420 may be part of the controller 120. In some embodiments, the first ADC 420 may operate at a higher acquisition rate than the second ADC.

In some embodiments, the control system may measure the full-width half-max, peak voltage, DC bias, rise time, fall time, etc. of pulses in the bias generator 115.

In some embodiments, the plasma control system 400 may monitor the voltage, frequency, pulse width, etc. of pulses and, in response, may adjust the voltage, pulse repetition frequency, pulse width, burst repetition frequency (where a burst includes a plurality of pulses), RF burst turn on time, RF burst turn off time, bias burst turn on time, bias burst turn off time, etc. provided to the input of the bias generator 115 and/or the RF plasma generator 105. For example, the first ADC 420 may monitor the voltage amplitude of a waveform. This voltage data may be provided to the controller 120, which may communicate to the nanosecond pulser or the RF plasma generator to adjust the amplitude or frequency of the signal.

In some embodiments, the plasma control system 400 may output arbitrary pulse signals via output 435 to one or more bias generator 115. The output 435, for example, may include either fiber or electric connections. In some embodiments, plasma control system 400 can include a plurality of output pulse channels (e.g., 1, 2, 5, 8, 20, 50, 100, etc.) that may, for example, be independent from each other. The plurality of output pulse channels may, for example, output pulses with sub-nanosecond resolution.

For example, if a pulse voltage is less than a predetermined voltage, the controller 120 may send a signal to the bias generator 115 or the RF plasma generator 105 to produce pulses with a higher voltage. If the pulse voltage is greater than a predetermined voltage, the first ADC 420 may send a signal to the bias generator 115 or the RF plasma generator 105 to produce pulses with a lower voltage. In some embodiments, the signal to the nanosecond pulser to increase the pulse voltage may comprise a low voltage pulse that has a longer pulse width than the previously sent signal, and the signal to the nanosecond pulser to decrease the pulse voltage may comprise a low voltage pulse that has a shorter pulse width than the previously sent signal.

As another example, if the pulse repetition frequency is greater than a desired pulse repetition frequency, the controller 120 may send a signal to the bias generator 115 or the RF plasma generator 105 to produce pulses with a lower frequency. If the burst repetition frequency is less than an desired burst repetition frequency, the controller 120 may send a signal to the bias generator 115 or the RF plasma generator 105 to produce burst with a higher burst repetition frequency. If the full width half max of the measured pulse is different than an desired burst repetition frequency, the controller 120 may send a signal to the bias generator 115 or the RF plasma generator 105 to produce a pulses with an adjusted pulse width or pulse repetition frequency.

As another example, if the waveform pulse width is longer than an desired pulse width, the first ADC 420 may send a signal to the bias generator 115 or the RF plasma generator 105 to produce a waveform with a shorter or longer pulse width. If the waveform duty cycle is shorter or longer than an desired duty cycle, the first ADC 420 may send a signal to the bias generator 115 or the RF plasma generator 105 to produce a pulses with the appropriate duty cycle.

The plasma control system 400 may monitor other waveform characteristics and/or adjust these other characteristics.

In some embodiments, the plasma control system 400 may output arbitrary pulse signals via output 435 to one or more bias generator 115 or the RF plasma generator 105. For example, the control system may comprise an arbitrary RF plasma generator. The output 435, for example, may include either fiber or electric connections. In some embodiments, plasma control system 400 can include a plurality of output pulse channels (e.g., 1, 2, 5, 8, 20, 50, 100, etc.) that may, for example, be independent from each other. The plurality of output pulse channels may, for example, output pulses with sub-nanosecond resolution. In some embodiments, the plasma control system 400 may output pulses with resolution less than about 0.1 ns. In some embodiments, the plasma control system 400 may output pulses with jitter less than about 100 μs.

In some embodiments, each output pulse channel of the plasma control system 400 may output pulses to a bias generator 115 that triggers the bias generator 115. The plasma control system 400 may, for example, adjust parameters of the output pulses in real-time or between pulses. These parameters may include pulse width, pulse repetition frequency, duty cycle, burst repetition frequency, voltage, number of pulses in a burst, the number of burst, etc. In some embodiments, one or more parameters may be adjusted or changed based on input to the plasma control system 400 or based on a recipe or a program.

For example, a recipe may include alternating high bursts and low bursts from the bias generator 115. A high burst, for example, may include a plurality of high voltage pulses. A low burst, for example, may include a plurality of lower voltage pulses. The high burst and the low burst may, for example, include the same number of pulses or a different number of pulses within each burst. A low burst, for example, may have a voltage that is 10%, 20%, 30%, 40%, 50%, etc. lower than the voltage of the high burst voltage.

The alternating high bursts and low bursts from the bias generator 115 may include 5%, 20%, 50%, 100%, 125%, 150%, etc. ratio of low bursts to high bursts (low-high ratio). For example, a 20% low-high ratio may include a train of 10 bursts, where each burst includes about 500 pulses (or any number of pulses from 1 to 10,000 pulses. In a train of 10 bursts with a 10% low-high ratio, 2 bursts may be low voltage bursts and 8 bursts may be high voltage bursts.

In some embodiments, the controller 120 may communicate pulses with longer low voltage pulses to produce the high bursts and communicate pulses with shorter low voltage pulses to produce the low bursts to the nanosecond pulser to produce alternating high bursts and low bursts as described in U.S. patent application Ser. No. 16/114,195, titled "ARBITRARY WAVEFORM GENERATION USING NANOSECOND PULSES," which is incorporated herein for all purposes.

In some embodiments, one of the sensors 450 may include a DC voltage sensor that may be coupled with a DC power supply in the bias generator 115. For example, if multiple DC power supply systems are used in bias generator 115 and during operation the voltage varies by more than a set percentage (e.g., 1%, 5%, 10%, 20%, etc.) or more than an absolute voltage (e.g., 5V, 10V, 50V, 100V, etc.) then the controller 120 may turn off the bias generator 115. As another example, if power supply systems are used and during operation the voltage output differs by more than a percentage from a set voltage (e.g., 1%, 5%, 10%, 20%, etc.) or more than an absolute voltage from the set voltage (e.g., 5V, 10V, 50V, 100V, etc.) then the controller 120 may turn off pulsing.

In some embodiments, the controller 120 may send and/or receive communication and/or commands from an external controller 465 such as, for example, an industrial controller.

In some embodiments, the external controller 465 may communicate with the controller 120 via an EtherCat module. In some embodiments, the EtherCat module may comprise any type of communication module. In some embodiments, the EtherCat may include one or more components of the computational system 2600.

In some embodiments, the control system may control the operation of a pulsing system such as, for example, pulse width, duty cycle, high voltage set point, on/off, returns current output voltage, high voltage current set point, returns current output current, enable high voltage output, returns high voltage enable state, emergency shutdown, etc.

Figure 78:
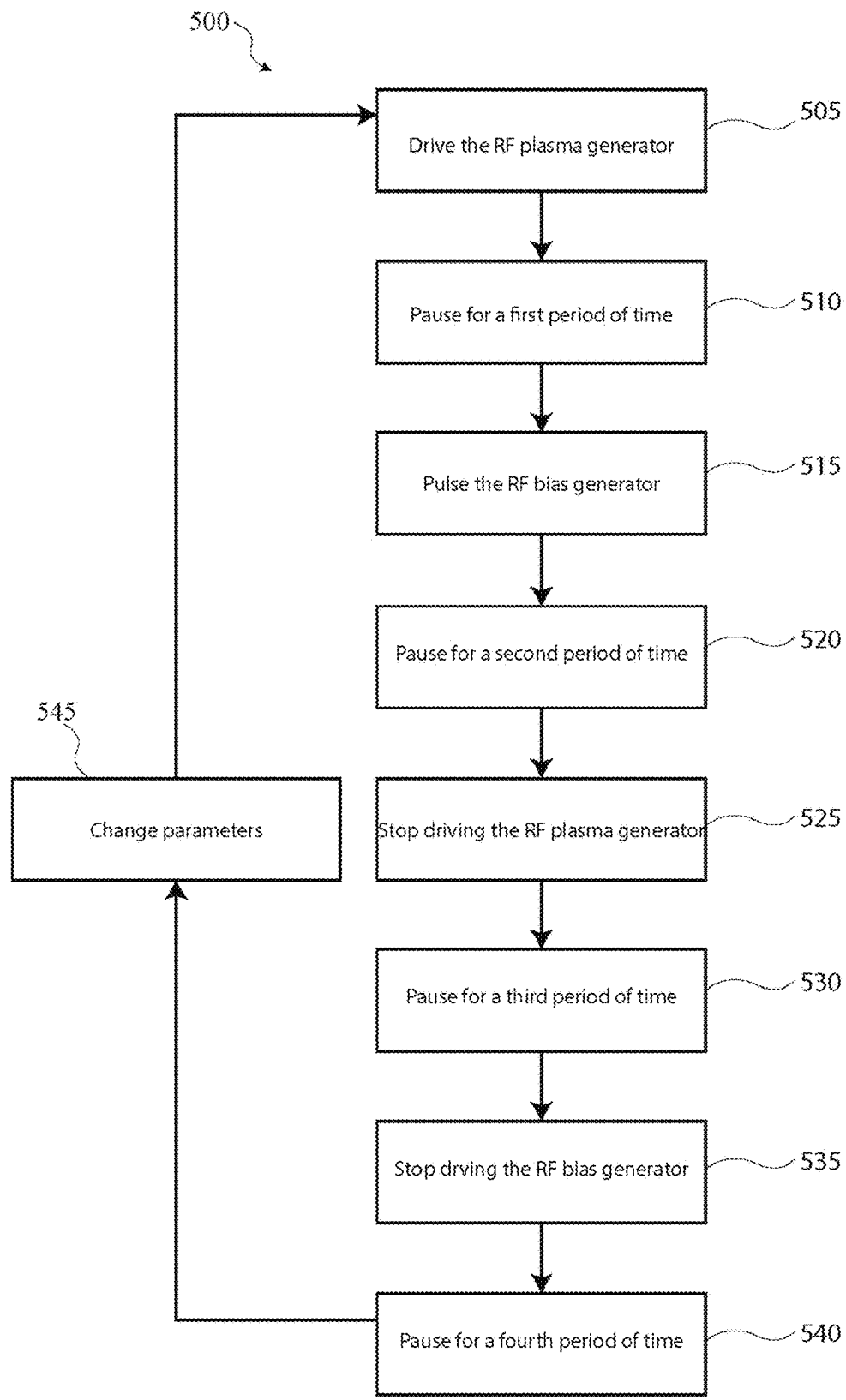
FIG. 78 is a process for controlling a plasma system according to some embodiments.

FIG. 78 is a process 500 for controlling the plasma system 100 according to some embodiments. In some embodiments, the process 500 may be executed by the controller 120.

The process 500 begins at block 505. At block 505 the controller 120 may begin to drive the RF plasma generator 105 to create a first RF burst. The first RF burst, for example, may include a waveform similar to the RF waveform 305. The first RF burst may include RF burst parameters such as, for example, an RF frequency and/or an RF voltage. The first burst from the RF plasma generator 105 may create a plasma within the chamber 110.

At block 510 the process 500 may pause for a first period of time. The first period of time, for example, may be between about 10 μs and about 10 ms. In some embodiments, the first period of time may be 0 seconds. The first period of time may be the time between the beginning of the RF waveform 305 (e.g., $t_1$ or the RF burst turn on time) and the beginning of the bias burst 310 (e.g., $t_2$ or the bias burst turn on time).

At block 515 the controller 120 may pulse the bias generator 115 to create a first bias burst. The first bias burst, for example, may include a waveform similar to the bias burst 310. The first bias burst may include bias burst parameters such as, for example, a pulse repetition frequency and/or a bias voltage.

At block 520 the process 500 may pause for a second period of time. The second period of time, for example, may be between about 10 μs and about 10 ms. The second period of time may be the time between the beginning of the bias burst 310 (e.g., $t_2$ or the bias burst turn on time) and the end of the RF waveform 305 (e.g., $t_3$ or the RF burst turn off time).

At block 525 the RF plasma generator may stop driving the chamber with an RF waveform. For example, the controller may send a signal to the RF plasma generator 105 to end the burst.

At block 530 the process 500 may pause for a third period of time. The third period of time, for example, may be between about 10 μs and about 10 ms. The third period of time, for example, may be zero seconds. The third period of time maybe the time between the end of the RF waveform 305 (e.g., $t_3$ or the RF burst turn off time) and the end of the bias burst 310 (e.g., $t_4$ or the bias burst turn off time). In some embodiments, the first time period, the second time period, or the third time period may be the same. In some embodiments, the first time period, the second time period, or the third time period may be different.

At block 535 the bias generator 115 may stop pulsing. For example, the controller may send a signal to the bias generator 115 to end the burst and discontinue pulsing.

At block 540 the process 500 may pause for a fourth period of time. The fourth period of time, for example, may be the time between the end of the bias burst 310 (e.g., $t_4$ or the bias burst turn off time) and the start of the next RF burst or the beginning of the next RF waveform 305 (e.g., $t_1$ for the next RF waveform or the RF burst turn on time for the next RF waveform). In some embodiments, fourth period of time may be greater than the first period of time, the second period of time, and/or the fourth period of time. The fourth period of time may define the duty cycle of the RF waveform and/or the duty cycle of the bias burst.

At block 545 the process parameters may be changed. The process parameters may include the RF parameters, the bias parameters, the first period of time, the second period of time, the third period of time, the fourth period of time, etc. In some embodiments, the RF parameters and/or the bias parameters may be changed based on feedback from the chamber such as, for example, RF voltage, bias voltage, RF frequency, pulse repetition frequency, temperature, pressure, etc. In some embodiments, the RF parameters and/or the bias parameters may be changed based on feedback from the chamber via the HV signals 405 or the sensors 450.

After block 545, the process may repeat.

Figure 79:
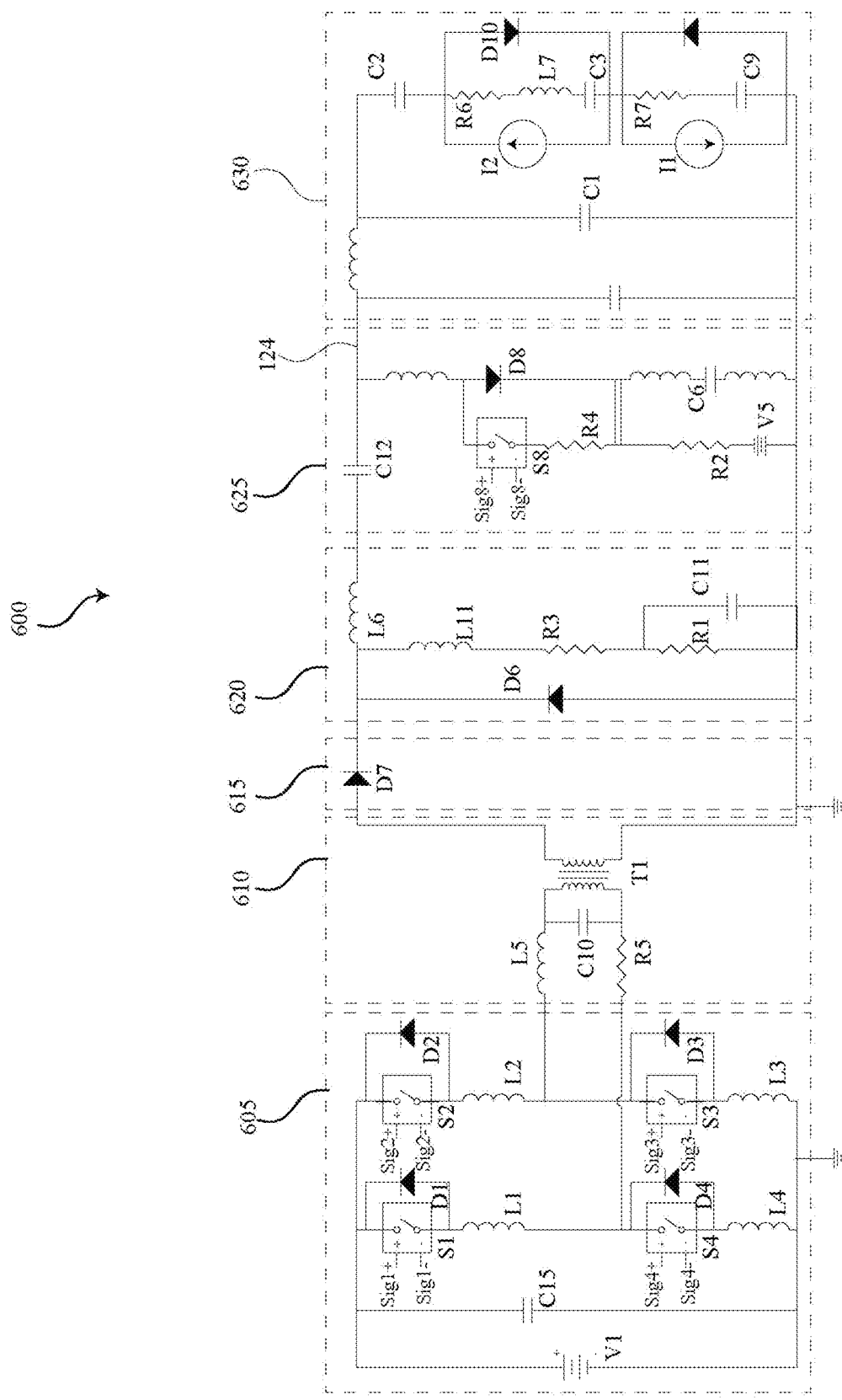
FIG. 79 is a circuit diagram of a bias generator according to some embodiments.

FIG. 79 is a circuit diagram of a bias generator 600 according to some embodiments.

In this example, the bias generator 600 may include an RF driver 605. The RF driver 605, for example, may be a half-bridge driver or a full-bridge driver as shown in FIG. 79. The RF driver 605 may include an input voltage source V1 that may be a DC voltage source (e.g., a capacitive source, AC-DC converter, etc.). In some embodiments, the RF driver 605 may include four switches S1, S2, S3, and S4. In some embodiments, the RF driver 605 may include a plurality of switches S1, S2, S3, and S4 in series or in parallel. These switches S1, S2, S3, and S4, for example, may include any type of solid-state switch such as, for example, IGBTs, a MOSFETs, a SiC MOSFETs, SiC junction transistors, FETs, SiC switches, GaN switches, photoconductive switches, etc. These switches S1, S2, S3, and S4 may be switched at high frequencies and/or may produce a high voltage pulses. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

Each switch of switches S1, S2, S3, and S4 may be coupled in parallel with a respective diode D1, D2, D3, and D4 and may include stray inductance represented by inductor L1, L2, L3, and L4. In some embodiments, the inductances of inductor L1, L2, L3, and L4 may be equal. In some embodiments, the inductances of inductor L1, L2, L3, and L4 may be less than about 50 nH, 100 nH, 150 nH, 500 nH, 1,000 nH, etc. The combination of a switch (S1, S2, S3, or S4) and a respective diode (D1, D2, D3, or D4) may be coupled in series with a respective inductor (L1, L2, L3, or L4). Inductors L3 and L4 are connected with ground. Inductor L1 is connected with switch S4 and the resonant circuit 610. And inductor L2 is connected with switch S3 and the opposite side of the resonant circuit 610.

In some embodiments, the RF driver 605 may be coupled with a resonant circuit 610. The resonant circuit 610 may include a resonant inductor L5 and/or a resonant capacitor C2 coupled with a transformer T1. The resonant circuit 610 may include a resonant resistance R5, for example, that may include the stray resistance of any leads between the RF driver 605 and the resonant circuit 610 and/or any component within the resonant circuit 610 such as, for example, the transformer T1, the capacitor C2, and/or the inductor L5. In some embodiments, the resonant resistance R5 comprises only stray resistances of wires, traces, or circuit elements. While the inductance and/or capacitance of other circuit elements may affect the driving frequency, the driving frequency can be set largely by choice of the resonant inductor L5 and/or the resonant capacitor C2. Further refinements and/or tuning may be required to create the proper driving frequency in light of stray inductance or stray capacitance. In addition, the rise time across the transformer T1 can be adjusted by changing L5 and/or C2, provided that:

$$f_{resonant} = \frac{1}{2\pi\sqrt{(L5)(C2)}} = \text{constant.}$$

In some embodiments, large inductance values for L5 can result in slower or shorter rise times. These values may also affect the burst envelope. As shown in FIG. 7, each burst can include transient and steady state pulses. The transient pulses within each burst may be set by L5 and/or the Q of the system until full voltage is reached during the steady state pulses.

If the switches in the RF driver 605 are switched at the resonant frequency, $f_{resonant}$, then the output voltage at the transformer T1 will be amplified. In some embodiments, the resonant frequency may be about 400 kHz, 0.5 MHz, 2.0 MHz, 4.0 MHz, 13.56 MHz, 27.12 MHz, 40.68 MHz, 50 MHz, etc.

In some embodiments, the resonant capacitor C2 may include the stray capacitance of the transformer T1 and/or a physical capacitor. In some embodiments, the resonant capacitor C2 may have a capacitance of about 10 μF, 1 μF, 100 nF, 10 nF, etc. In some embodiments, the resonant inductor L5 may include the stray inductance of the transformer T1 and/or a physical inductor. In some embodiments, the resonant inductor L5 may have an inductance of about 50 nH, 100 nH, 150 nH, 500 nH, 1,000 nH, etc. In some embodiments, the resonant resistor R5 may have a resistance of about 10 ohms, 25 ohms, 50 ohms, 100 ohms, 150 ohms, 500 ohms, etc.

In some embodiments, the resonant resistor R5 may represent the stray resistance of wires, traces, and/or the transformer windings within the physical circuit. In some embodiments, the resonant resistor R5 may have a resistance of about 10 mohms, 50 mohms, 100 mohms, 200 mohms, 500 mohms, etc.

In some embodiments, the transformer T1 may comprise a transformer as disclosed in U.S. patent application Ser. No. 15/365,094, titled "High Voltage Transformer," which is incorporated into this document for all purposes. In some embodiments, the output voltage of the resonant circuit 610 can be changed by changing the duty cycle (e.g., the switch "on" time or the time a switch is conducting) of switches S1, S2, S3, and/or S4. For example, the longer the duty cycle, the higher the output voltage; and the shorter the duty cycle, the lower the output voltage. In some embodiments, the output voltage of the resonant circuit 610 can be changed or tuned by adjusting the duty cycle of the switching in the RF driver 605.

For example, the duty cycle of the switches can be adjusted by changing the duty cycle of signal Sig1, which opens and closes switch S1; changing the duty cycle of signal Sig2, which opens and closes switch S2; changing the duty cycle of signal Sig3, which opens and closes switch S3; and changing the duty cycle of signal Sig4, which opens and closes switch S4. By adjusting the duty cycle of the switches S1, S2, S3, or S4, for example, the output voltage of the resonant circuit 610 can be controlled.

In some embodiments, each switch S1, S2, S3, or S4 in the RF driver 605 can be switched independently or in conjunction with one or more of the other switches. For example, the signal Sig1 may be the same signal as signal Sig3. As another example, the signal Sig2 may be the same signal as signal Sig4. As another example, each signal may be independent and may control each switch S1, S2, S3, or S4 independently or separately.

In some embodiments, the resonant circuit 610 may be coupled with a half-wave rectifier 615 that may include a blocking diode D7.

In some embodiments, the half-wave rectifier 615 may be coupled with the resistive output stage 620. The resistive output stage 620 may include any resistive output stage known in the art. For example, the resistive output stage 620 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes.

For example, the resistive output stage 620 may include an inductor L11, resistor R3, resistor R1, and capacitor C11. In some embodiments, inductor L11 may include an inductance of about 5 μH to about 25 μH. In some embodiments, the resistor R1 may include a resistance of about 50 ohms to about 250 ohms. In some embodiments, the resistor R3 may comprise the stray resistance in the resistive output stage 620.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, the resistor R1 may discharge the load (e.g., a plasma sheath capacitance). In some embodiments, the resistive output stage 620 may be configured to discharge over about 1 kilowatt of average power during each pulse cycle and/or a joule or less of energy in each pulse cycle. In some embodiments, the resistance of the resistor R1 in the resistive output stage 620 may be less than 200 ohms. In some embodiments, the resistor R1 may comprise a plurality of resistors arranged in series or parallel having a combined capacitance less than about 200 pF (e.g., C11).

In some embodiments, the resistive output stage 620 may include a collection of circuit elements that can be used to control the shape of a voltage waveform on a load. In some embodiments, the resistive output stage 620 may include passive elements only (e.g., resistors, capacitors, inductors, etc.). In some embodiments, the resistive output stage 620 may include active circuit elements (e.g., switches) as well as passive circuit elements. In some embodiments, the resistive output stage 620, for example, can be used to control the voltage rise time of a waveform and/or the voltage fall time of waveform.

In some embodiments, the resistive output stage 620 can discharge capacitive loads (e.g., a wafer and/or a plasma). For example, these capacitive loads may have small capacitance (e.g., about 10 pF, 100 pF, 500 pF, 1 nF, 10 nF, 100 nF, etc.).

In some embodiments, a resistive output stage can be used in circuits with pulses having a high pulse voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.)

and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 620 may include a series or parallel network of passive components. For example, the resistive output stage 620 may include a series of a resistor, a capacitor, and an inductor. As another example, the resistive output stage 620 may include a capacitor in parallel with an inductor and the capacitor-inductor combination in series with a resistor. For example, L11 can be chosen large enough so that there is no significant energy injected into the resistive output stage when there is voltage out of the rectifier. The values of R3 and R1 can be chosen so that the L/R time can drain the appropriate capacitors in the load faster than the RF frequency In some embodiments, the resistive output stage 620 may be coupled with the bias compensation circuit 625. The bias compensation circuit 625 may include any bias and/or bias compensation circuit known in the art. For example, the bias compensation circuit 625 may include any bias and/or bias compensation circuit described in U.S. patent application Ser. No. 16/523,840 titled "NANOSECOND PULSER BIAS COMPENSATION," which is incorporated into this disclosure in its entirety for all purposes.

In some embodiments, the bias compensation circuit 625 may include a bias capacitor C7, blocking capacitor C12, a blocking diode D8, switch S8 (e.g., a high voltage switch), offset supply voltage V1, resistance R2, and/or resistance R4. In some embodiments, the switch S8 comprises a high voltage switch described in U.S. Patent Application No. 62/717,637, titled "HIGH VOLTAGE SWITCH FOR NANOSECOND PULSING," and/or in U.S. patent application Ser. No. 16/178,565, titled "HIGH VOLTAGE SWITCH FOR NANOSECOND PULSING," which is incorporated into this disclosure in its entirety for all purposes.

In some embodiments, the offset supply voltage V5 may include a DC voltage source that can bias the output voltage either positively or negatively. In some embodiments, the capacitor C12 may isolate/separate the offset supply voltage V5 from the resistive output stage 620 and/or other circuit elements. In some embodiments, the bias compensation circuit 625 may allow for a potential shift of power from one portion of the circuit to another. In some embodiments, the bias compensation circuit 625 may be used to hold a wafer in place as high voltage pulses are active within the chamber. Resistance R2 may protect/isolate the DC bias supply from the driver.

In some embodiments, the switch S8 may be open while the RF driver 605 is pulsing and closed when the RF driver 605 is not pulsing. While closed, the switch S8 may, for example, short current across the blocking diode D8. Shorting this current may allow the bias between the wafer and the chuck to be less than 2 kV, which may be within acceptable tolerances.

In some embodiments, the plasma and chamber 630 may be coupled with the bias compensation circuit 625. The plasma and chamber 630, for example, may be represented by the various circuit elements shown in FIG. 79.

FIG. 79 does not include a traditional matching network such as, for example, a 50 ohm matching network or an external matching network or standalone matching network. Indeed, the embodiments described within this document do not require a 50 ohm matching network to tune the switching power applied to the wafer chamber. In addition, embodiments described within this document provide a variable output impedance RF generator without a traditional matching network. This can allow for rapid changes to the power drawn by the plasma chamber. Typically, this tuning of the matching network can take at least 100 µs-200 µs. In some embodiments, power changes can occur within one or two RF cycles, for example, 2.5 µs-5.0 µs at 400 kHz.

Figure 80A:
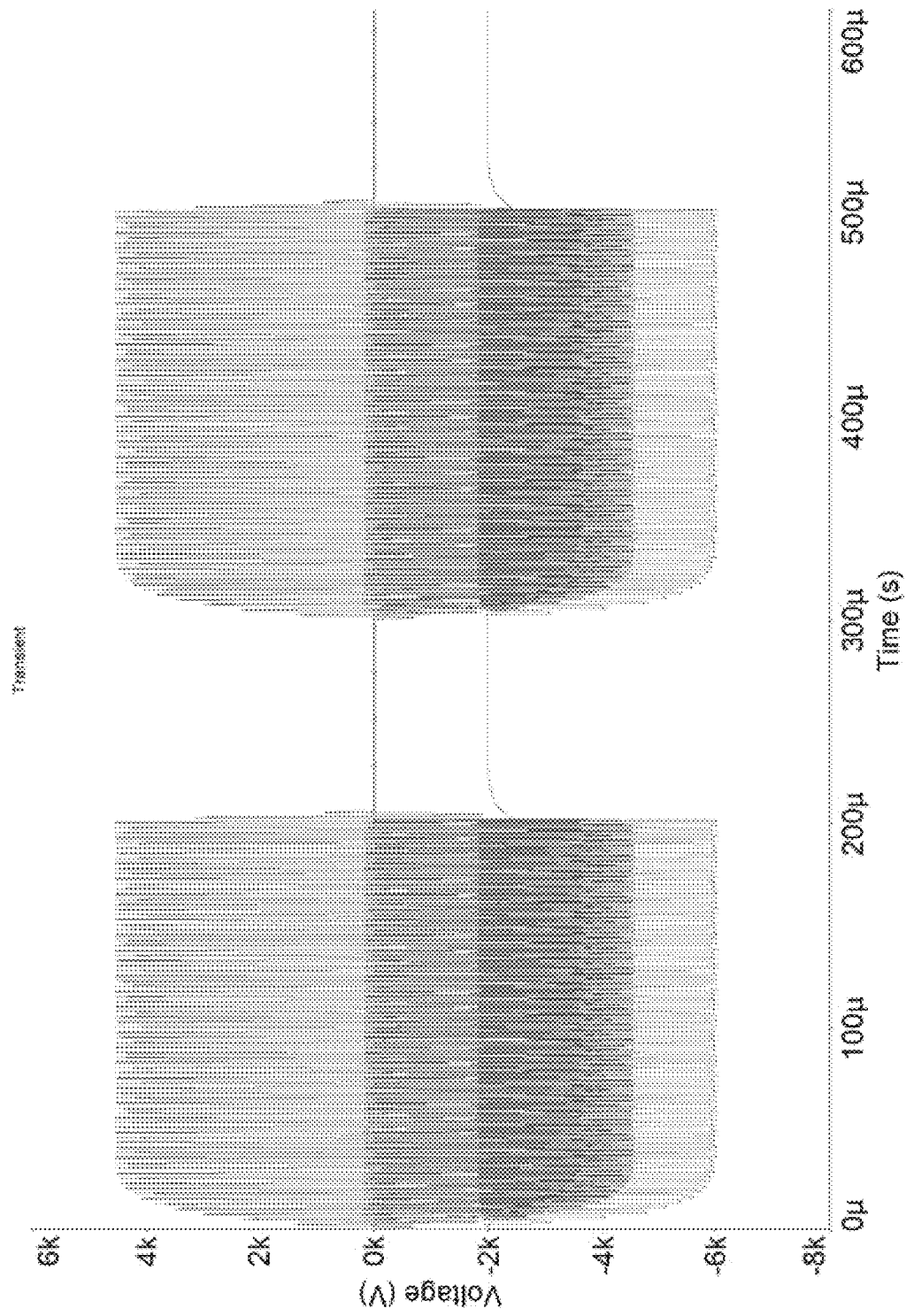
FIG. 80A is a waveform of the voltage across a transformer.
Figure 80B:
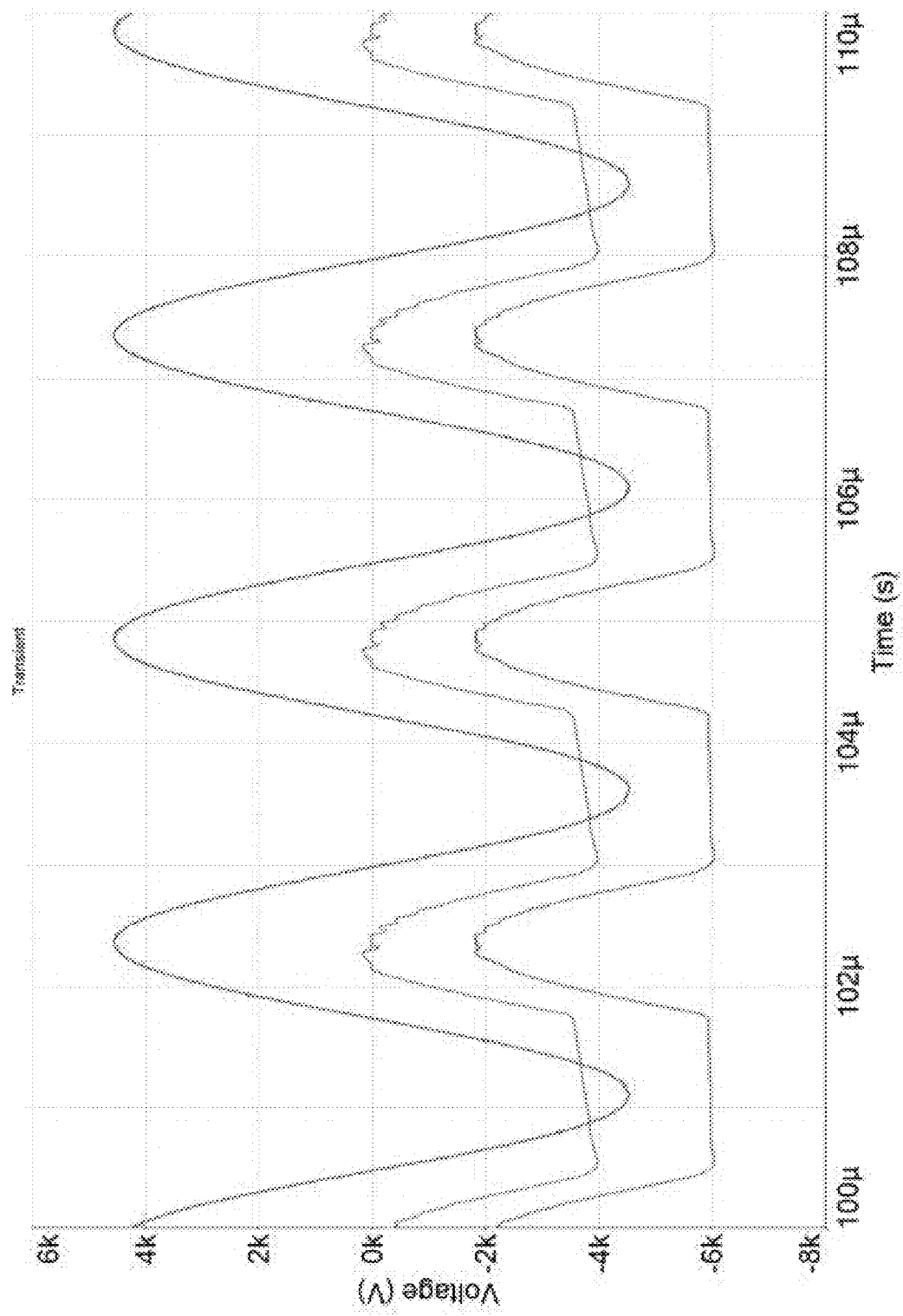
FIG. 80B is a waveform of the voltage across a transformer.

FIG. 80A and FIG. 80B are waveforms of the voltage across the transformer T1 (red), at the Pole (green), and at the wafer (blue) for a time frame of 600 µs.

Figure 81:
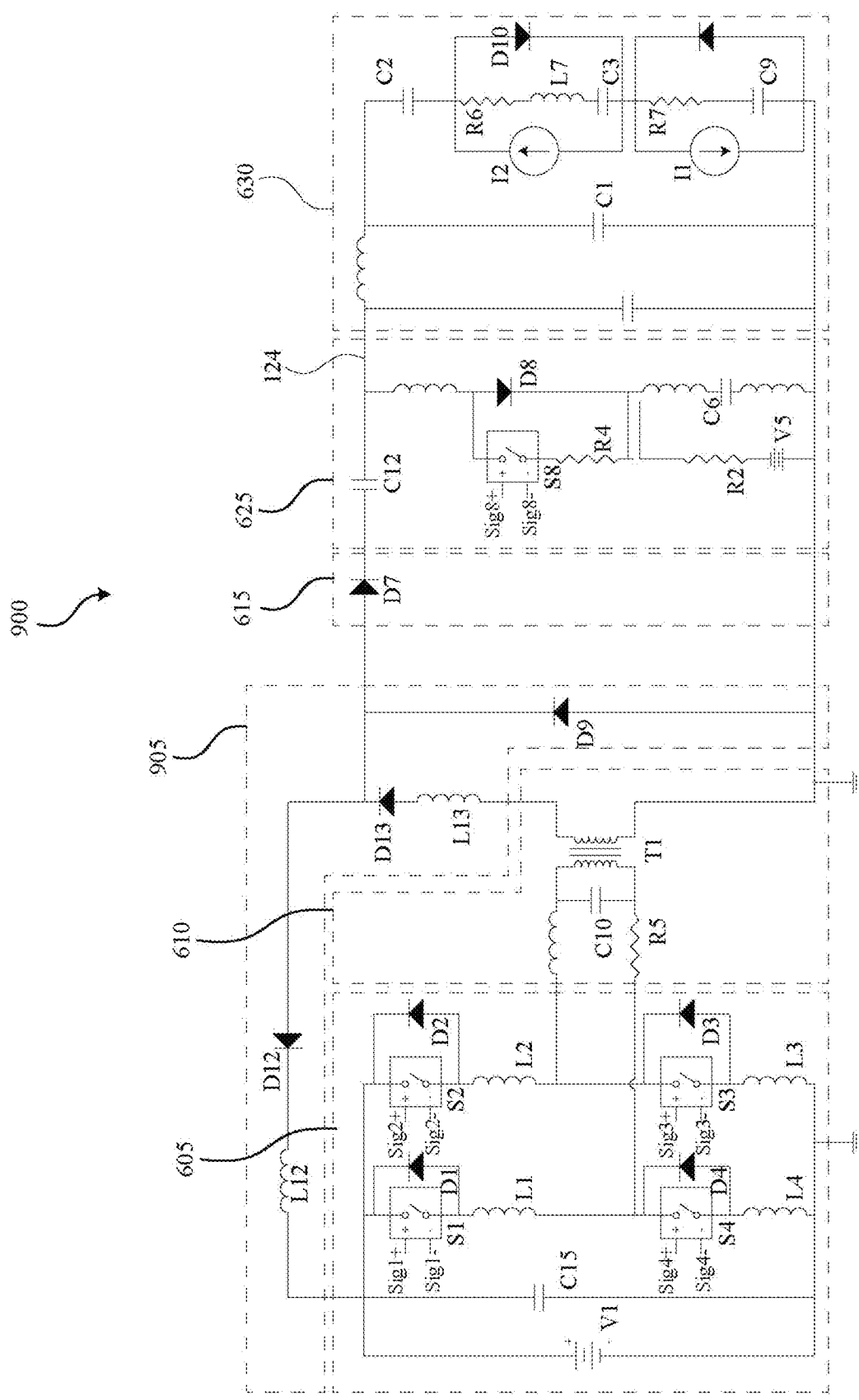
FIG. 81 is a circuit diagram of a bias generator according to some embodiments.

FIG. 81 is a circuit diagram of a bias generator 900 according to some embodiments. The bias generator 900, for example, may include the RF driver 605, the resonant circuit 610, the bias compensation circuit 625, and the plasma and chamber 630. The bias generator 900 is similar to the bias generator 600 but without the resistive output stage 620 and includes an energy recovery circuit 905.

In this example, the energy recovery circuit 905 may be positioned on or electrically coupled with the secondary side of the transformer T1. The energy recovery circuit 905, for example, may include a diode D9 (e.g., a crowbar diode) across the secondary side of the transformer T1. The energy recovery circuit 905, for example, may include diode D10 and inductor L12 (arranged in series), which can allow current to flow from the secondary side of the transformer T1 to charge the power supply C15 and current to flow to the plasma and chamber 630. The diode D12 and the inductor L12 may be electrically connected with the secondary side of the transformer T1 and coupled with the power supply C15. In some embodiments, the energy recovery circuit 905 may include diode D13 and/or inductor L13 electrically coupled with the secondary of the transformer T1. The inductor L12 may represent the stray inductance and/or may include the stray inductance of the transformer T1.

When the nanosecond pulser is turned on, current may charge the plasma and chamber 630 (e.g., charge the capacitor C3, capacitor C2, or capacitor C9). Some current, for example, may flow through inductor L12 when the voltage on the secondary side of the transformer T1 rises above the charge voltage on the power supply C15. When the nanosecond pulser is turned off, current may flow from the capacitors within the plasma and chamber 630 through the inductor L12 to charge the power supply C15 until the voltage across the inductor L12 is zero. The diode D9 may prevent the capacitors within the plasma and chamber 630 from ringing with the inductance in the plasma and chamber 630 or the bias compensation circuit 625.

The diode D12 may, for example, prevent charge from flowing from the power supply C15 to the capacitors within the plasma and chamber 630.

The value of inductor L12 can be selected to control the current fall time. In some embodiments, the inductor L12 can have an inductance value between 1 µH-500 µH.

In some embodiments, the energy recovery circuit 905 may include a switch that can be used to control the flow of current through the inductor L12. The switch, for example, may be placed in series with the inductor L12. In some embodiments, the switch may be closed when the switch S1 is open and/or no longer pulsing to allow current to flow from the plasma and chamber 630 back to the power supply C15.

A switch in the energy recovery circuit 905, for example, may include a high voltage switch such as, for example, the high voltage switch disclosed in U.S. patent application Ser.

No. 16/178,565 filed Nov. 1, 2018, titled "HIGH VOLTAGE SWITCH WITH ISOLATED POWER," which claims priority to U.S. Provisional Patent Application No. 62/717,637 filed Aug. 10, 2018, both of which are incorporated by reference in the entirety. In some embodiments, the RF driver 605 may include a high voltage switch in place of or in addition to the various components shown in RF driver 605. In some embodiments, using a high voltage switch may allow for removal of at least the transformer T1 and the switch S1.

Figure 82:
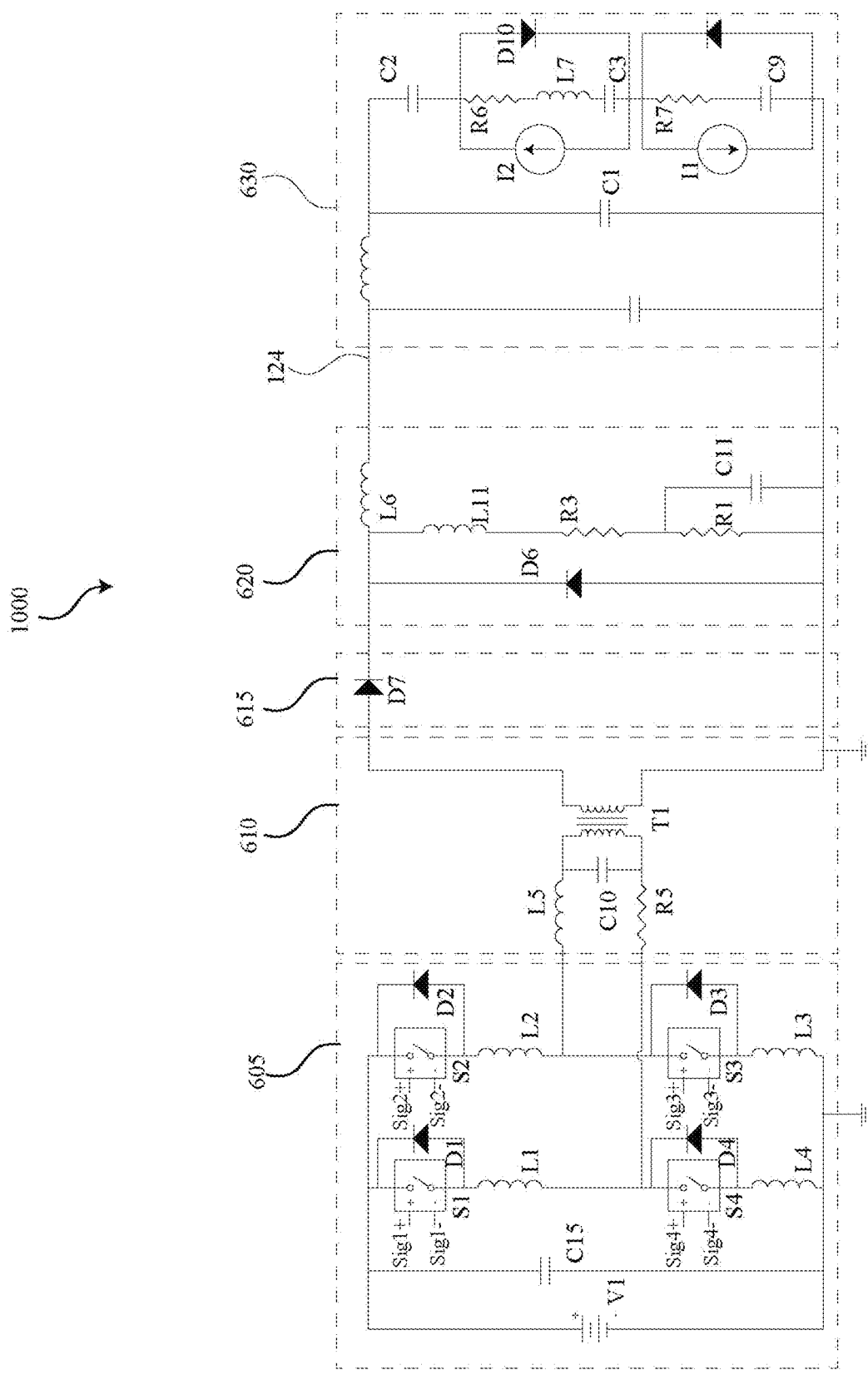
FIG. 82 is a circuit diagram of a bias generator according to some embodiments.

FIG. 82 is a circuit diagram of a bias generator 1000 according to some embodiments. The bias generator 1000, for example, may include the RF driver 605, the resonant circuit 610, the resistive output stage 620, and the plasma and chamber 630. Thus, bias generator 1000 is similar to the bias generator 600 without the bias compensation circuit 625.

Figure 83:
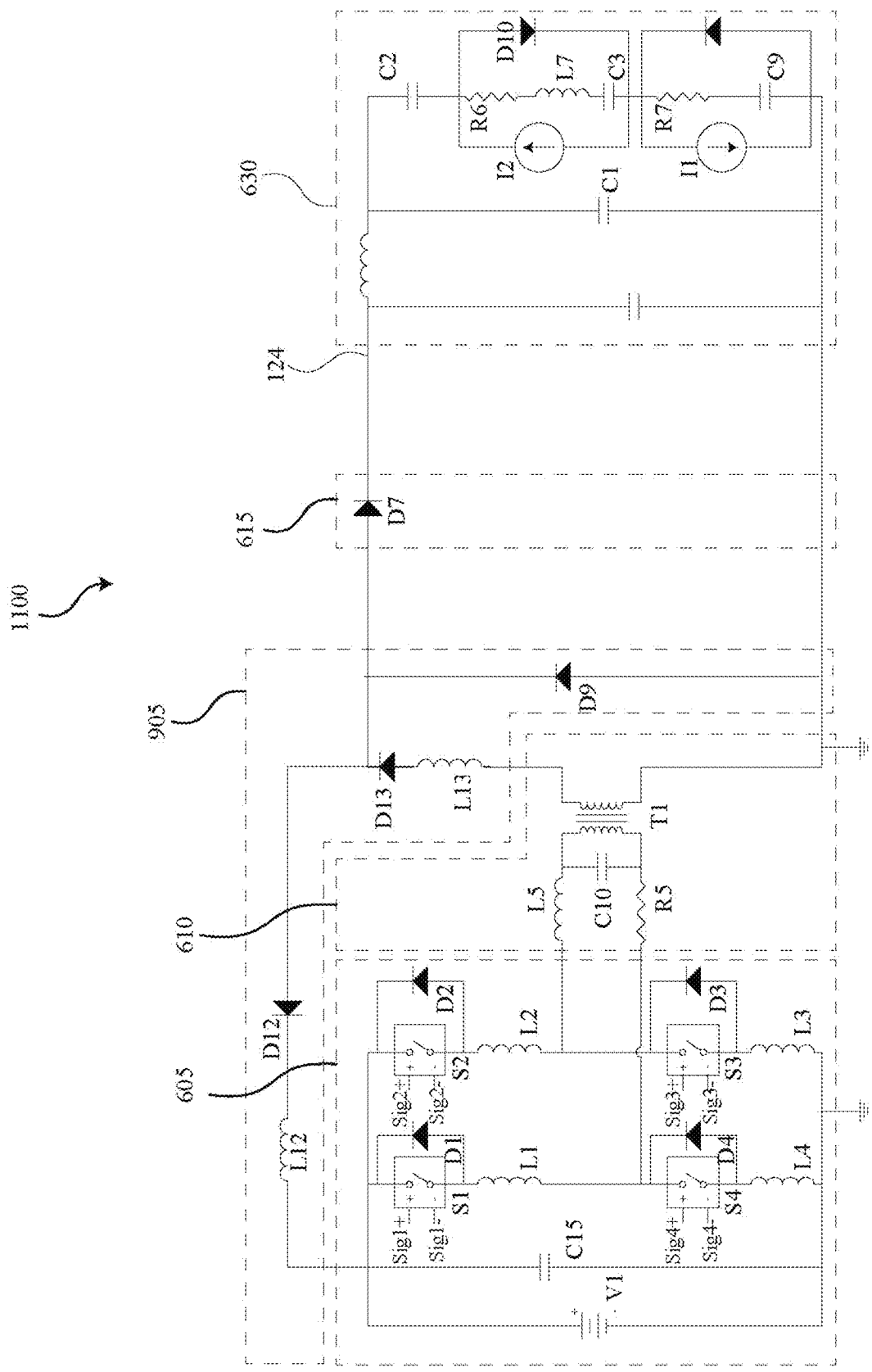
FIG. 83 is a circuit diagram of a bias generator according to some embodiments.

FIG. 83 is a circuit diagram of a bias generator 1100 according to some embodiments. The bias generator 1100, for example, may include the RF driver 605, the resonant circuit 610, the energy recovery circuit 905, and the plasma and chamber 630. Thus, bias generator 1100 is similar to the bias generator 900 without the bias compensation circuit 625.

Figure 84:
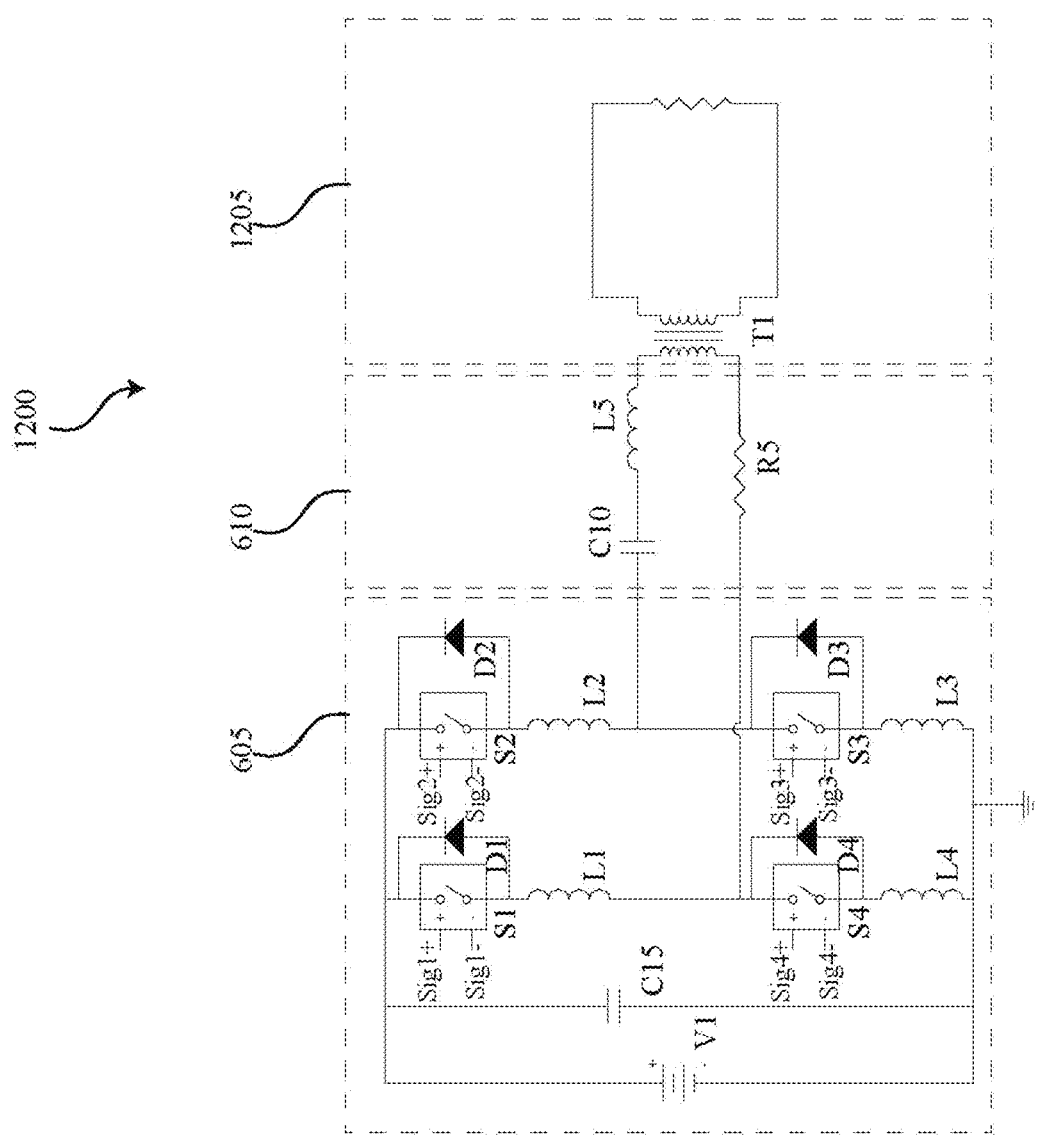

FIG. 84 is a circuit diagram of an RF plasma generator 1200 according to some embodiments. The RF plasma generator 1200, for example, may include the RF driver 605, the resonant circuit 610, and an inductively discharged plasma 1205. In this example, the inductor L5 may include the antenna that is coupled with or disposed within the inductively discharged plasma 1205. The transformer T1 may represent how the inductively discharged plasma 1205 couples with the antenna, which is represented at least in part by the inductor L5. The capacitor C2 may resonate with the inductor L5 to determine the resonate frequency. The RF driver 605 may produce pulses that are driven with this resonant frequency.

Figure 85:
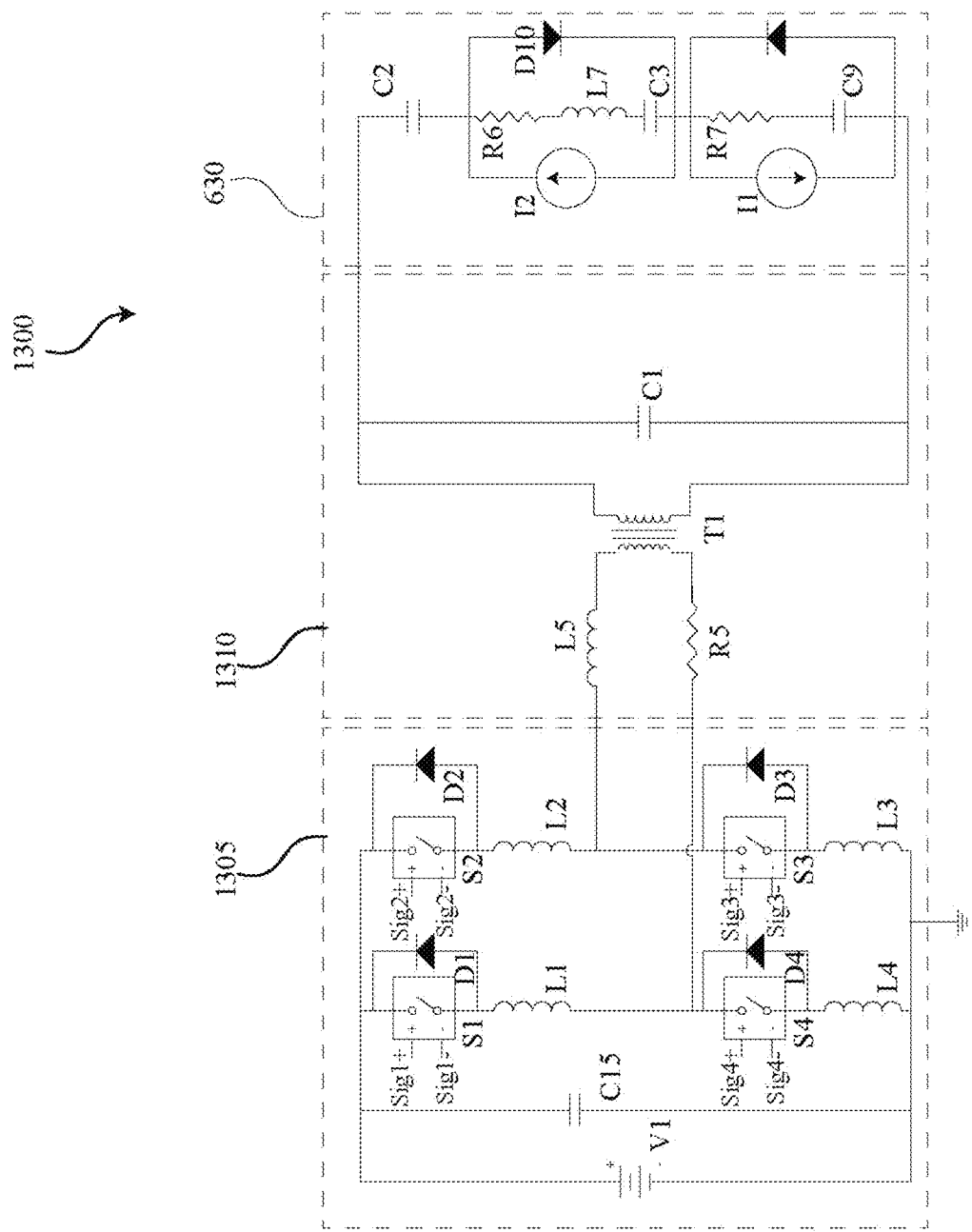
Figure 86A:
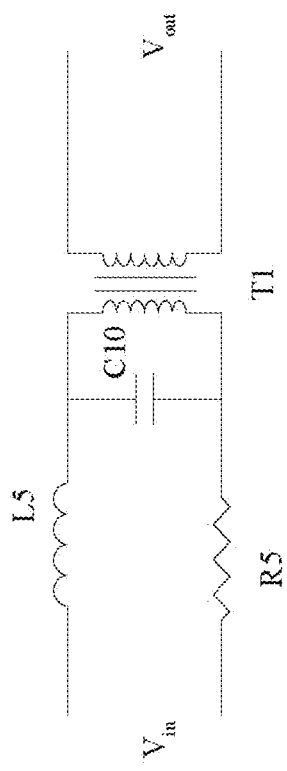
Figure 86B:
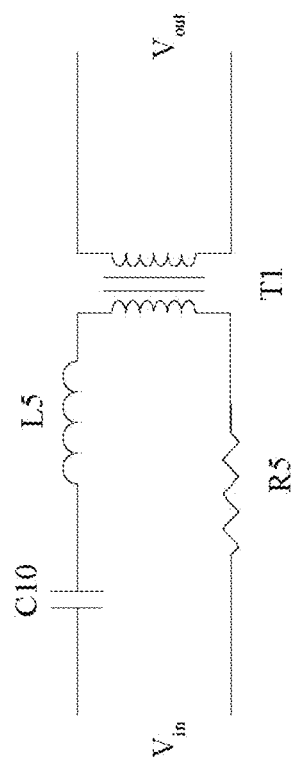
Figure 87A:
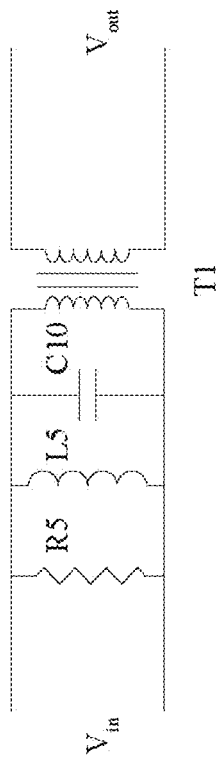
Figure 87B:
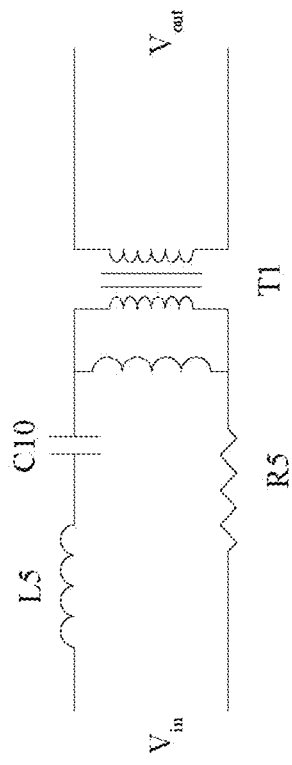

FIG. 85 is a circuit diagram of an RF plasma generator 1300 according to some embodiments. The RF plasma generator 1300, for example, may include the RF driver 1305, the resonant circuit 1310, which may include the transformer, and the chamber 630. The capacitor C1 may represent the capacitance of the discharge geometry, any stray capacitance in the circuit, or the capacitance of any capacitors in the circuit. L5 may represent the inductance of any stray inductance in the circuit or the inductance of any inductance in the circuit. The RF driver 1305 may drive the resonant circuit 1310 with a pulse frequency that is substantially equal to the resonate frequency of the resonant circuit.

In some embodiments, each switch S1, S2, S3, or S4 in the RF driver 1305 can be switched independently or in conjunction with one or more of the other switches. For example, the signal Sig1 may be the same signal as signal Sig3. As another example, the signal Sig2 may be the same signal as signal Sig4. As another example, each signal may be independent and may control each switch S1, S2, S3, or S4 independently or separately.

In some embodiments, the transformer T1 may or may not be included in the RF plasma generator 1300.

FIGS. 86A, 86B, 87A, and 87B are circuit diagrams of example resonant circuits that may be used in place of resonant circuit 610 in FIG. 79. These circuits may or may not include the transformer shown in each figure.

FIG. 89 is a circuit diagram of a bias generator 1600 that includes a nanosecond pulser stage 101 with an energy recovery circuit 1610, a transformer T1, a lead stage 103, a DC bias circuit 104, and a load stage 106.

In some embodiments, the load stage 106 may represent an idealized or effective circuit for semiconductor processing chamber such as, for example, a plasma deposition system, semiconductor fabrication system, plasma sputtering system, etc. The capacitance C2, for example, may represent the capacitance of an electrostatic chuck upon which a semiconductor process wafer may sit. The chuck, for example, may comprise a dielectric material (e.g., aluminum oxide, or other ceramic materials and a conductor housed within the dialectic material). For example, the capacitor C1 may have small capacitance (e.g., about 10 pF, 100 pF, 500 pF, 1 nF, 10 nF, 100 nF, etc.).

The capacitor C3, for example, may represent the sheath capacitance between the plasma to the wafer. The resistor R6, for example, may represent the sheath resistance between the plasma and the wafer. The inductor L2, for example, may represent the sheath inductance between the plasma and the wafer. The current source I2, for example, may be represent the ion current through the sheath. For example, the capacitor C1 or the capacitor C3 may have small capacitance (e.g., about 10 pF, 100 pF, 500 pF, 1 nF, 10 nF, 100 nF, etc.).

The capacitor C9, for example, may represent the plasma sheath capacitance to the wall of the chamber. The resistor R7, for example, may represent resistance between the plasma and the chamber wall. The current source I1, for example, may be representative of the ion current in the plasma. For example, the capacitor C1 or the capacitor C9 may have small capacitance (e.g., about 10 pF, 100 pF, 500 pF, 1 nF, 10 nF, 100 nF, etc.).

In some embodiments, the plasma voltage may be the voltage measured from ground to circuit point 123; the wafer voltage is the voltage measured from ground to circuit point 122 and may represent the voltage at the surface of the wafer; the chucking voltage is the voltage measured from ground to circuit point 121; the electrode voltage is the voltage measure from ground to circuit point labeled 124 (e.g., on the electrode); and the input voltage is the voltage measured from ground to circuit point 125.

In this example, the DC bias circuit 104 does not include any bias compensation. The DC bias circuit 104 includes an offset supply voltage V5 that may, for example, bias the output voltage either positively or negatively. In some embodiments, the offset supply voltage V5, can be adjusted to change the potential between the wafer voltage and the chuck voltage. In some embodiments, offset supply voltage V5 can have a voltage of about ±5 kV, ±4 kV, ±3 kV, ±2, kV, ±1 kV, etc. kV.

In some embodiments, the bias capacitor C12 can isolate (or separate) the DC bias voltage from other circuit elements. The bias capacitor C12, for example, may allow for a potential shift from one portion of the circuit to another. In some embodiments, this potential shift may ensure that the electrostatic force holding the wafer in place on the chuck remains below the voltage threshold. The resistor R2 may isolate the DC bias supply from the high voltage pulsed output from the nanosecond pulser stage 101.

The bias capacitor C12, for example, may have a capacitance less than about 100 μF, 10 pF, 1 pF, 100 μF, 10 μF, 1 μF, etc. The resistor R2, for example, may have a high resistance such as, for example, a resistance of about 1 kOhm, 10 kOhm, 100 kOhm, 1 MOhm, 10 MOhm, 100 MOhm, etc.

The resistor R13, for example, may represent the resistance of the leads or transmission lines that connect from the output of the high voltage power system to the electrode (e.g., the load stage 106). The capacitors C1, for example, may represent stray capacitance in the leads or transmissions line.

In some embodiments, the nanosecond pulser stage 101 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the nanosecond pulser stage 101 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the nanosecond pulser stage 101 may include one or more nanosecond pulsers coupled together in any number of ways.

In some embodiments, the nanosecond pulser stage 101 may include a DC power supply providing a consistent DC voltage that is switched by switch S6 and provides the switched power to the transformer T1. The DC power supply may include a voltage source V5 and an energy storage capacitor C7. If the transformer T1 has a 1:10 turn ratio, then the transformer may produce 10 kV on the load C1.

In some embodiments, if the load capacitance (e.g., capacitance C3 and capacitance C9) is small in comparison with the capacitance of the energy storage capacitor C7, voltage doubling may (or may not) occur at the transformer input. For example, if the energy storage capacitor C7 provides 500 V, then 1 kV may be measured at the input of the transformer T1.

The switch S6, for example, may include one or more solid state switches such as, for example, an IGBT, a MOSFET, a SiC MOSFET, SiC junction transistor, FETs, SiC switches, GaN switches, photoconductive switch, etc. The switch S6 may be switched based on a signal from a controller labeled Sig6+ and Sig6−.

In some embodiments, the nanosecond pulser stage 101 may include snubber circuit that may include any type of snubber circuit. In some embodiments, the snubber circuit may include a capacitor. In some embodiments, the snubber circuit may include a capacitor and a resistor. In some embodiments, the snubber circuit may include a capacitor, an inductor, and a resistor In some embodiments, the snubber circuit may include snubber resistor R3 in parallel with snubber diode D4, and a snubber capacitor C5. The snubber circuit may also include stray inductance. In some embodiments, the snubber resistor R3 and/or the snubber diode D4 may be placed between the collector of switch S6 and the primary winding of the transformer T1. The snubber diode D4 may be used to snub out any over voltages in the switching. A large and/or fast capacitor C5 may be coupled on the emitter side of the switch S6. The freewheeling diode D2 may also be coupled with the emitter side of the switch S1. Various other components may be included that are not shown in the figures. One or more switches and or circuits can be arranged in parallel or series.

In some embodiments, the switch S6 may switch so fast that the switched voltage may never be at full voltage (e.g., the voltage of the energy storage capacitor C7 and/or the voltage source V5). In some embodiments, a gate resistor coupled with the switch S6 may be set with short turn on pulses.

In some embodiments, the nanosecond pulser stage 101 may include a freewheeling diode D2. In some embodiments, the freewheeling diode D2 may be used in combination with inductive loads to ensure that energy stored in the inductive load may be allowed to dissipate after the switch S6 is opened by allowing current to keep flowing in the same direction through the inductor and energy is dissipated in the resistive elements of the circuit. If a freewheeling diode D2 is not included, then this can, for example, lead to a large reverse voltage on the switch S6.

In some embodiments, the nanosecond pulser stage 101 may include stray inductance L1 and/or stray resistance R1. The stray inductance L1, for example, may be less than about 10 nH, 100 nH, 1,000 nH, 10,000 nH, etc. The stray resistance R1, for example, may be less than about 1 Ohm, 100 mOhm, 10 mOhm, etc.

In some embodiments, the energy recovery circuit 1610 may be electrically coupled with the secondary side of the transformer and/or with the energy storage capacitor C7. The energy recovery circuit 1610, for example, may include a diode 130 (e.g., a crowbar diode) across the secondary side of the transformer T1. The energy recovery circuit 1610, for example, may include energy recovery diode 1620 and the energy recovery inductor 1615 (arranged in series), which can allow current to flow from the secondary side of the transformer T1 to charge the energy storage capacitor C7. The energy recovery diode 1620 and the energy recovery inductor 1615 may be electrically connected with the secondary side of the transformer T1 and the energy storage capacitor C7. In some embodiments, the energy recovery circuit 1610 may include diode 130 and/or inductor 140 electrically coupled with the secondary of the transformer T1. The inductor 140 may represent the stray inductance and/or may include the stray inductance of the transformer T1.

In some embodiments, the energy recovery inductor 1615 may include any type of inductor such as, for example, a ferrite core inductor or an air core inductor. In some embodiments, the energy recovery inductor 1615 may have any type of geometry such as, for example, a solenoidal winding, a toroidal winding, etc. In some embodiments, the energy recovery inductor 1615 may have an inductance greater then about 10 µH, 50 µH, 100 µH, 500 µH, etc. In some embodiments, the energy recovery inductor 1615 may have an inductance of about 1 µH to about 100 mH.

In some embodiments, when the nanosecond pulser is turned on, current may charge the load stage 106 (e.g., charge the capacitor C3, capacitor C2, or capacitor C9). Some current, for example, may flow through energy recovery inductor 1615 when the voltage on the secondary side of the transformer T1 rises above the charge voltage on the energy storage capacitor C7. When the nanosecond pulser is turned off, current may flow from the capacitors within the load stage 106 (e.g., capacitor C1) through the energy recovery inductor 1615 to charge the energy storage capacitor C7 until the voltage across the energy recovery inductor 1615 is zero. The diode 130 may prevent the capacitors within the load stage 106 from ringing with the inductance in the load stage 106 or the DC bias circuit 104.

The energy recovery diode 1620 may, for example, prevent charge from flowing from the energy storage capacitor C7 to the capacitors within the load stage 106.

The value of energy recovery inductor 1615 can be selected to control the current fall time. In some embodiments, the energy recovery inductor 1615 can have an inductance value between 1 µH-600 µH. In some embodiments, the energy recovery inductor 1615 can have an inductance value greater than 50 µH. In some embodiments, the energy recovery inductor 1615 may have an inductance less than about 50 µH, 100 µH, 150 µH, 200 µH, 250 µH, 300 µH, 350 µH, 350 µH, 400 µH, 400 µH, 500 µH, etc.

For example, if the energy storage capacitor C7 provides 500 V, then 1 kV will be measured at the input of the transformer T1 (e.g., as noted above due to voltage doubling). The 1 kV at the transformer T1 may be divided among the components of the energy recovery circuit 1610 when the switch S6 is open. If the values are chosen appropriately (e.g., inductor L3 has an inductance less than the inductance of energy recovery inductor 1615), the voltage across the energy recovery diode 1620 and the energy recovery inductor 1615 may be greater than 500 V. Current may then flow through energy recovery diode 1620 and/or charge the energy storage capacitor C7. Current may also flow through diode D3 and inductor L6. Once the energy storage capacitor C7 is charged, the current may no longer flow through diode D3 and energy recovery inductor 1615.

In some embodiments, the energy recovery circuit 1610 may transfer energy (or transfer charge) from the load stage 106, for example, on fast time scales (e.g., 1 ns, 10 ns, 50 ns, 100 ns, 250 ns, 500 ns, 1,000 ns, etc. time scales). The stray resistance of the energy recovery circuit may be low to ensure the pulse across the load stage 106 has a fast fall time $t_f$. The stray resistance of the energy recovery circuit 1610, for example, may have a resistance less than about 1 Ohm, 100 mOhm, 10 mOhm, etc. In some embodiments, the energy transfer efficiency from the load stage 106 may be high such as, for example, greater than about 60%, 70%, 80%, or 90%, etc.

Any number of components shown in FIG. 90 may or may not be required such as, for example, the diode 135 or the diode 130 or the inductor 140.

In some embodiments, a diode may be placed between the voltage source V1 and the point where the energy recovery circuit 1610 connects with the voltage source V1 and/or the energy storage capacitor C7. This diode, for example, may be arranged to allow current to flow from the voltage source V1 to the energy storage capacitor C7 but may not allow current to flow from the energy recovery circuit to the energy storage capacitor C7.

1700 is a circuit diagram of a bias generator 1700 that includes a nanosecond pulser stage 101 with an active energy recovery circuit 111 having an energy recover switch S5 according to some embodiments. The energy recovery switch S5 may be switched based on a signal from a controller labeled Sig5+ and Sig5−.

In FIG. 90, the active energy recovery circuit 111 may include an energy recovery switch S5 that can be used to control the flow of current through the energy recovery inductor 1615. In some embodiments, the energy recovery switch S5 may include a freewheeling diode arranged across the energy recovery switch. The energy recovery switch S5, for example, may be placed in series with the energy recovery inductor 1615. In some embodiments, the energy recovery switch S5 may be opened and closed based on a signal from Sig5+ and/or Sig5−. In some embodiments, the switching input V5 may close the energy recovery switch when the switch S1 is open and/or no longer pulsing to allow current to flow from the load stage 106 back to the high voltage load C7. In some embodiments, the switching signal from Sig5+ and/or Sig5− may open the energy recovery switch when the switch S1 is closed and/or pulsing to restrict current from flowing to the high voltage load C7.

The energy recovery switch S5 in FIG. 90 is shown in series with the energy recovery diode 1620 and the energy recovery inductor 1615 and is placed between the secondary side of the transformer T1 and both the energy recovery diode 1620 and the energy recovery inductor 1615. In some embodiments, both the energy recovery diode 1620 and the energy recovery inductor 1615 may be placed between the energy recovery switch S5 and the secondary side of the transformer T1. In some embodiments, the energy recovery switch S5 may be placed between the energy recovery diode 1620 and the energy recovery inductor 1615. The energy recovery diode 1620, the energy recovery inductor 1615, and the energy recovery switch S5 may be arranged in any order.

The energy recovery switch S5, for example, may include a high voltage switch such as, for example, the high voltage switch 2300.

In some embodiments, the load stage 106 may be charged by the nanosecond pulser stage 101 while the energy recovery switch S5 is open. It may be beneficial to remove the charge from the load stage 106 such as, for example, on fast time scales (e.g., less than about 1 ns, 10 ns, 50 ns, 100 ns, 250 ns, 500 ns, 1,000 ns, etc.). To remove the charge from the load stage 106, the energy recovery switch S5 may be closed.

FIG. 91 is a circuit diagram of a bias generator 1800 that includes a passive bias compensation circuit 114 with the energy recovery circuit 1610 according to some embodiments.

In this example, the passive bias compensation circuit 114 is a passive bias compensation circuit and can include a bias compensation diode 1805 and a bias compensation capacitor 1810. The bias compensation diode 1805 can be arranged in series with offset supply voltage V5. The bias compensation capacitor 1810 can be arranged across either or both the offset supply voltage V5 and the resistor R2. The bias compensation capacitor 1810 can have a capacitance less than 100 nF to 100 µF such as, for example, about 100 µF, 50 µF, 25 µF, 10 µF, 2 µF, 500 nF, 200 nF, etc.

In some embodiments, the bias compensation diode 1805 can conduct currents of between 10 A and 1 kA at a frequency of between 10 Hz and 500 kHz.

In some embodiments, the bias capacitor C12 may allow for a voltage offset between the output of the nanosecond pulser stage 101 (e.g., at the position labeled 125) and the voltage on the electrode (e.g., at the position labeled 124). In operation, the electrode may, for example, be at a DC voltage of −2 kV during a burst (a burst may include a plurality of pulses), while the output of the nanosecond pulser alternates between +6 kV during pulses and 0 kV between pulses.

The bias capacitor C12, for example, 100 nF, 10 nF, 1 nF, 100 µF, 10 µF, 1 µF, etc. The resistor R2, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor 1810 and the bias compensation diode 1805 may allow for the voltage offset between the output of the nanosecond pulser stage 101 (e.g., at the position labeled 125) and the voltage on the electrode (e.g., at the position labeled 124) to be established at the beginning of each burst, reaching the needed equilibrium state. For example, charge is transferred from capacitor C12 into bias compensation capacitor 1810 at the beginning of each burst, over the course of a plurality of pulses (e.g., maybe about 5-100 pulses), establishing the correct voltages in the circuit.

In some embodiments, the pulse repetition frequency (e.g., the frequency of pulses within a burst) may be between 200 kHz and 800 MHz such as, for example, 2 MHz, 13.56 MHz, 27 MHz, 60 MHz, and 80 MHz etc. In some embodiments, the burst repetition frequency (e.g., the frequency of bursts) may be about 10 kHz, 50 Hz, 100 kHz, 500 kHz, 1 MHz, etc. such as, for example, 400 kHz The energy recovery circuit 1610 may or may not include an energy recovery switch as shown in FIG. 90.

FIG. 92 is a circuit diagram of a bias generator 1900 that includes an active bias compensation circuit 134 with the energy recovery circuit 1610 according to some embodiments.

The active bias compensation circuit 134 may include any bias and/or bias compensation circuit known in the art. For example, the active bias compensation circuit 134 may include any bias and/or bias compensation circuit described in U.S. patent application Ser. No. 16/523,840 titled "NANOSECOND PULSER BIAS COMPENSATION," which is incorporated into this disclosure in its entirety for all purposes.

In some embodiments, the active bias compensation circuit 134 of bias generator 1900 shown in FIG. 92 may include a bias capacitor C6, blocking capacitor C12, a blocking diode D8, bias compensation bias compensation switch S8 (e.g., a high voltage switch), an offset supply voltage V5, resistance R2, and/or resistance R4. In some embodiments, the switch S8, for example, may include a high voltage switch such as, for example, the high voltage switch 2300 shown in FIG. 98. The bias compensation switch S8 may be switched based on a signal from a controller labeled Sig8+ and Sig8−.

In some embodiments, the offset supply voltage V5 may include a DC voltage source that can bias the output voltage either positively or negatively. In some embodiments, the capacitor C12 may isolate/separate the offset supply voltage V5 from other circuit elements. In some embodiments, the active bias compensation circuit 134 may allow for a potential shift of power from one portion of the circuit to another. In some embodiments, the active bias compensation circuit 134 may be used maintain a constant chucking force between a process wafer and an electrostatic chuck. Resistance R2, for example, may protect/isolate the DC bias supply from the driver. As another example, the resistance R2 may be used to ensure that the DC supply V5 does not go into overcurrent failure.

In some embodiments, the bias compensation switch S8 may be open while the nanosecond pulser stage 101 is not actively producing pulses at greater than 10 kHz or providing a burst of pulses and closed when the nanosecond pulser stage 101 is not pulsing. While closed, the bias compensation switch S8 may, for example, allow current in the direction prevented by the blocking diode D8. Shorting this current may allow the bias between the wafer and the chuck to be less than 2 kV, which may be within acceptable tolerances.

In some embodiments, the load stage 106 may be coupled with the active bias compensation circuit 134. In some embodiments, the energy recovery circuit 1610 may or may not include an energy recovery switch as shown in FIG. 90.

FIG. 93 is a circuit diagram of a bias generator 2000 that includes an active bias compensation circuit 134 with an active energy recovery circuit 111 according to some embodiments.

FIG. 94 is a circuit diagram of a bias generator 2100 with the energy recovery circuit 1610 according to some embodiments. In this example, the bias generator 2100 is similar to the bias generator 1600 with the nanosecond pulser stage 101 switching the other polarity of the energy storage capacitor C7. When switch S6 is open, charge on the capacitor C1 flows through the energy recovery circuit 1610 to the high voltage energy storage capacitor C7 and may charge the high voltage energy storage capacitor C7. When the charge on the capacitor C1 is less than the charge on the high voltage energy storage capacitor C7 the current stops flowing through the energy recovery circuit 1610. In some embodiments, the DC bias circuit 104 may be replaced with the passive bias compensation circuit 114 or the active bias compensation circuit 134. In some embodiments, the energy recovery circuit 1610 may be replaced with the active energy recovery circuit 111.

In some embodiments, a nanosecond pulser (or switches) are included that switch the ground side (see e.g., FIG. 90) or the positive side of the power supply V1 and/or C7 (see e.g., FIG. 94 or FIG. 95). Either arrangement may be used. A FIG. showing one arrangement may be replaced with the other arrangement.

FIG. 95 is a circuit diagram of a bias generator 2200 with the energy recovery circuit 1610 driving a capacitive load 2205 according to some embodiments. In this example, the bias generator 2200 is similar to the bias generator 1600 without the DC bias circuit 104 and is driving a capacitive load 2205. The capacitive load 2205 may include any type of load such as, for example, a plasma load, a plurality of grids, a plurality of electrodes, physical capacitor, a photoconductive switch capacitance, etc.

FIG. 96 is a block diagram of a high voltage switch 2300 with isolated power according to some embodiments. The high voltage switch 2300 may include a plurality of switch modules 2305 (collectively or individually 2305, and individually 2305A, 2305B, 2305C, and 2305D) that may switch voltage from a high voltage source 2360 with fast rise times and/or high frequencies and/or with variable pulse widths. Each switch module 2305 may include a switch 2310 such as, for example, a solid state switch.

In some embodiments, the switch 2310 may be electrically coupled with a gate driver circuit 2330 that may include a power supply 2340 and/or an isolated fiber trigger 2345 (also referred to as a gate trigger or a switch trigger). For example, the switch 2310 may include a collector, an emitter, and a gate (or a drain, a source, and a gate) and the power supply 2340 may drive the gate of the switch 2310 via the gate driver circuit 2330. The gate driver circuit 2330 may, for example, be isolated from the other components of the high voltage switch 2300.

In some embodiments, the power supply 2340 may be isolated, for example, using an isolation transformer. The isolation transformer may include a low capacitance transformer. The low capacitance of the isolation transformer may, for example, allow the power supply 2340 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 23 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 2300. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 2340 may include any type of power supply that can provide high voltage standoff (isolation) or have low capacitance (e.g., less than about 1,000 pF, 100 pF, 10 pF, etc.). In some embodiments, the control voltage power source may supply 1420 V AC or 240 V AC at 60 Hz.

In some embodiments, each power supply 2340 may be inductively and/or electrically coupled with a single control voltage power source. For example, the power supply 2340A may be electrically coupled with the power source via a first transformer; the power supply 2340B may be electrically coupled with the power source via a second transformer; the power supply 2340C may be electrically coupled with the power source via a third transformer; and the power supply 2340D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 2340A, the power supply 2340B, the power supply 2340C, and/or the power supply 2340D may not share a return reference ground or a local ground.

The isolated fiber trigger 2345, for example, may also be isolated from other components of the high voltage switch 2300. The isolated fiber trigger 2345 may include a fiber optic receiver that allows each switch module 2305 to float relative to other switch modules 2305 and/or the other components of the high voltage switch 2300, and/or, for example, while allowing for active control of the gates of each switch module 2305.

In some embodiments, return reference grounds or local grounds or common grounds for each switch module 2305, for example, may be isolated from one another, for example, using an isolation transformer.

Electrical isolation of each switch module 2305 from common ground, for example, can allow multiple switches to be arranged in a series configuration for cumulative high voltage switching. In some embodiments, some lag in switch module timing may be allowed or designed. For example, each switch module 2305 may be configuration or rated to switch 1 kV, each switch module may be electrically isolated from each other, and/or the timing of closing each switch module 2305 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 2310 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 2310 may include any type of solid state switching device such as, for example, an IGBT, a MOSFET, a SiC MOSFET, SiC junction transistor, FETs, SiC switches, GaN switches, photoconductive switch, etc. The switch 2310, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 23 ns) and/or with long pulse lengths (e.g., greater than about 10 ms). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches, for example, the greater the need for switch timing precision.

The high voltage switch 2300 shown in FIG. 96 includes four switch modules 2305. While four are shown in this figure, any number of switch modules 2305 may be used such as, for example, two, eight, twelve, sixteen, twenty, twenty-four, etc. For example, if each switch in each switch module 2305 is rated at 1200 V, and sixteen switches are used, then the high voltage switch can switch up to 19.2 kV. As another example, if each switch in each switch module 2305 is rated at 1700 V, and sixteen switches are used, then the high voltage switch can switch up to 27.2 kV.

In some embodiments, the high voltage switch 2300 may switch voltages greater than 5 kV, 10 kV, 14 kV, 20 kV, 23 kV, etc.

In some embodiments, the high voltage switch 2300 may include a fast capacitor 2355. The fast capacitor 2355, for example, may include one or more capacitors arranged in series and/or in parallel. These capacitors may, for example, include one or more polypropylene capacitors. The fast capacitor 2355 may store energy from the high voltage source 2360.

In some embodiments, the fast capacitor 2355 may have low capacitance. In some embodiments, the fast capacitor 2355 may have a capacitance value of about 1 μF, about 5 μF, between about 1 μF and about 5 μF, between about 100 nF and about 1,000 nF etc.

In some embodiments, the high voltage switch 2300 may or may not include a crowbar diode 2350. The crowbar diode 2350 may include a plurality of diodes arranged in series or in parallel that may, for example, be beneficial for driving inductive loads. In some embodiments, the crowbar diode 2350 may include one or more Schottky diodes such as, for example, a silicon carbide Schottky diode. The crowbar diode 2350 may, for example, sense whether the voltage from the switches of the high voltage switch is above a certain threshold. If it is, then the crowbar diode 2350 may short the power from switch modules to ground. The crowbar diode, for example, may allow an alternating current path to dissipate energy stored in the inductive load after switching. This may, for example, prevent large inductive voltage spikes. In some embodiments, the crowbar diode 2350 may have low inductance such as, for example, 1 nH, 10 nH, 100 nH, etc. In some embodiments, the crowbar diode 2350 may have low capacitance such as, for example, 100 μF, 1 nF, 10 nF, 100 nF, etc.

In some embodiments, the crowbar diode 2350 may not be used such as, for example, when the load 2365 is primarily resistive.

In some embodiments, each gate driver circuit 2330 may produce less than about 1000 ns, 100 ns, 10.0 ns, 5.0 ns, 3.0 ns, 1.0 ns, etc. of jitter. In some embodiments, each switch 2310 may have a minimum switch on time (e.g., less than about 10 μs, 1 μs, 500 ns, 100 ns, 50 ns, 10, 5 ns, etc.) and a maximum switch on time (e.g., greater than 23 s, 10 s, 5 s, 1 s, 500 ms, etc.).

In some embodiments, during operation each of the high voltage switches may be switched on and/or off within 1 ns of each other.

In some embodiments, each switch module 2305 may have the same or substantially the same (±5%) stray inductance. Stray inductance may include any inductance within the switch module 2305 that is not associated with an inductor such as, for example, inductance in leads, diodes, resistors, switch 2310, and/or circuit board traces, etc. The stray inductance within each switch module 2305 may include low inductance such as, for example, an inductance less than about 300 nH, 100 nH, 10 nH, 1 nH, etc. The stray inductance between each switch module 2305 may include low inductance such as, for example, an inductance less than about 300 nH, 100 nH, 10 nH, 1 nH, etc.

In some embodiments, each switch module 2305 may have the same or substantially the same (±5%) stray capacitance. Stray capacitance may include any capacitance within the switch module 2305 that is not associated with a capacitor such as, for example, capacitance in leads, diodes, resistors, switch 2310 and/or circuit board traces, etc. The stray capacitance within each switch module 2305 may include low capacitance such as, for example, less than about 1,000 pF, 100 pF, 10 pF, etc. The stray capacitance between each switch module 2305 may include low capacitance such as, for example, less than about 1,000 pF, 100 pF, 10 pF, etc.

Imperfections in voltage sharing can be addressed, for example, with a passive snubber circuit (e.g., the snubber diode 2315, the snubber capacitor 2320, and/or the freewheeling diode 2325). For example, small differences in the timing between when each of the switches 2310 turn on or turn off or differences in the inductance or capacitances may lead to voltage spikes. These spikes can be mitigated by the various snubber circuits (e.g., the snubber diode 2315, the snubber capacitor 2320, and/or the freewheeling diode 2325).

A snubber circuit, for example, may include a snubber diode 2315, a snubber capacitor 2320, a snubber resistor 2316, and/or a freewheeling diode 2325. In some embodiments, the snubber circuit may be arranged together in parallel with the switch 2310. In some embodiments, the snubber capacitor 2320 may have low capacitance such as, for example, a capacitance less than about 100 pF.

In some embodiments, the high voltage switch 2300 may be electrically coupled with or include a load 2365 (e.g., a resistive or capacitive or inductive load). The load 2365, for example, may have a resistance from 50 ohms to 500 ohms. Alternatively or additionally, the load 2365 may be an inductive load or a capacitive load.

In some embodiments, the energy recovery circuit 1610 or the active energy recovery circuit 111 can decrease the energy consumption of a high voltage bias generator and/or the voltage required to drive a given load with the same energy output performance as systems without an energy recover circuit. For example, the energy consumption, for the same energy output performance as systems without an energy recover circuit, can be reduced as much as 10%, 15% 20%, 23%, 30%, 40%, 45%, 50%, etc. or more.

In some embodiments, the diode 130, the diode 135, and/or the energy recovery diode 1620 may comprise a high voltage diode.

FIG. 97 is a circuit diagram of a bias generator 2400 that includes an RF source 2405, the active bias compensation circuit 134, and the energy recovery circuit 1610 according to some embodiments. In this example, the bias generator 2400 is similar to the bias generator 900 with the RF driver 605 and resonant circuit 610 replaced by an RF source 2405. The RF driver 605 shown in FIG. 82 comprises a full wave rectifier and a resonant circuit 610, which is replaced with an RF source 2405.

In some embodiments, the RF source 2405 may include a plurality of high frequency solid state switch(es), an RF generator, an amplifier tube based RF generator, or a tube based RF generator.

The bias generator 2400 may or may not include a traditional matching network such as, for example, a 50 ohm matching network or an external matching network or standalone matching network. In some embodiments, the bias generator 2400 does not require a 50 ohm matching network to optimize the switching power applied to the wafer chamber. An RF generator without a traditional matching network can allow for rapid changes to the power drawn by the plasma chamber. Typically, this optimization of the matching network can take at least 100 µs-200 µs. In some embodiments, power changes can occur within one or two RF cycles, for example, 2.5 µs-5.0 µs at 400 kHz.

In some embodiments, the RF source 2405 may operate at frequency about 400 kHz, 0.5 MHz, 2.0 MHz, 4.0 MHz, 13.56 MHz, 27.12 MHz, 40.68 MHz, 50 MHz, etc.

Figure 98:
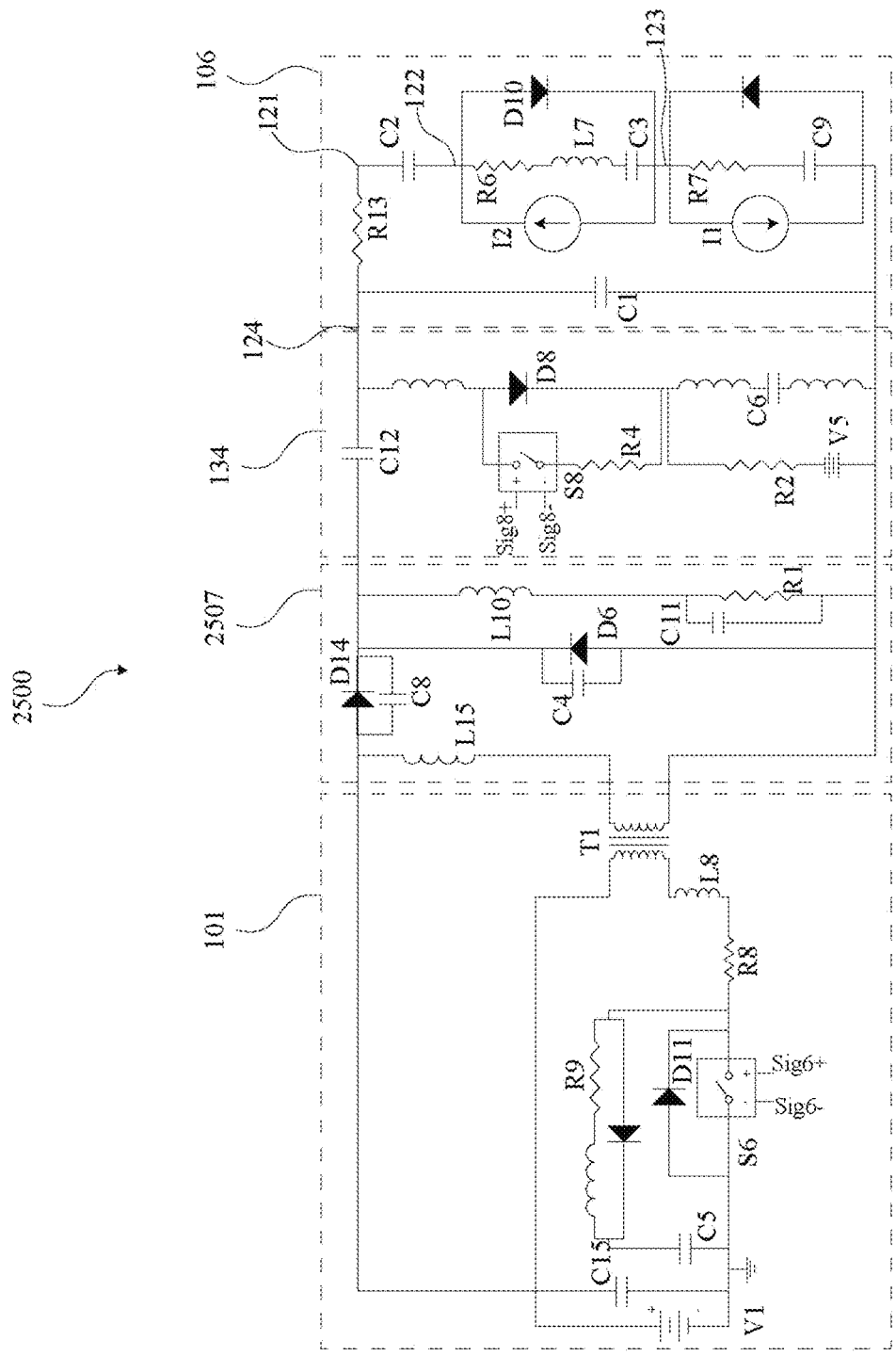

FIG. 98 shows another example bias generator 2500 according to some embodiments. The bias generator 2500 can be generalized into five stages (these stages could be broken down into other stages or generalized into fewer stages). The bias generator 2500 includes nanosecond pulser stage 101, a resistive output stage 2507, the bias compensation circuit 134, and a load stage 106.

In this example, the load stage 106 may represent an effective circuit for a plasma deposition system, plasma etch system, or plasma sputtering system. The capacitance C2 may represent the capacitance of the dielectric material upon which a wafer may sit. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the sheath.

In this example, the resistive output stage 2507 may include one or more inductive elements represented by inductor L1 and/or inductor L5. The inductor L5, for example, may represent the stray inductance of the leads in the resistive output stage 2507. Inductor L1 may be set to minimize the power that flows directly from the nanosecond pulser stage 101 into resistor R1.

In some embodiments, the resistor R1 may dissipate charge from the load stage 2515, for example, on fast time scales (e.g., 1 ns, 10 ns, 50 ns, 100 ns, 250 ns, 500 ns, 100 ns, etc. time scales). The resistance of resistor R1 may be low to ensure the pulse across the load stage 2515 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of nanosecond pulser stage 2506 can be ganged up in parallel and coupled with the resistive output stage 2507 across the inductor L1 and/or the resistor R1. Each of the plurality of pulser and transformer stages 906 may each also include diode D1 and/or diode D6.

In some embodiments, the capacitor C8 may represent the stray capacitance of the blocking diode D1. In some embodiments, the capacitor C4 may represent the stray capacitance of the diode D6.

The computational system 2600, shown in FIG. 26 can be used to perform any of the embodiments of the invention. For example, computational system 2600 can be used to execute process 500. As another example, computational system 2600 can be used perform any calculation, identification and/or determination described here. Computational system 2600 includes hardware elements that can be electrically coupled via a bus 2605 (or may otherwise be in communication, as appropriate). The hardware elements can include one or more processors 2610, including without limitation one or more general-purpose processors and/or one or more special-purpose processors (such as digital signal processing chips, graphics acceleration chips, and/or the like); one or more input devices 2615, which can include without limitation a mouse, a keyboard and/or the like; and one or more output devices 2620, which can include without limitation a display device, a printer and/or the like.

The computational system 2600 may further include (and/or be in communication with) one or more storage devices 2625, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 2600 might also include a communications subsystem 2630, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 2630 may permit data to be exchanged with a network (such as the network described below, to name one example), and/or any other devices described in this document. In many embodiments, the computational system 2600 will further include a working memory 2635, which can include a RAM or ROM device, as described above.

The computational system 2600 also can include software elements, shown as being currently located within the working memory 2635, including an operating system 2640 and/or other code, such as one or more application programs 2645, which may include computer programs of the invention, and/or may be designed to implement methods of the invention and/or conFIG. systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 2625 described above.

In some cases, the storage medium might be incorporated within the computational system 2600 or in communication with the computational system 2600. In other embodiments, the storage medium might be separate from a computational system 2600 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 2600 and/or might take the form of source and/or installable code, which, upon compilation and/or installation on the computational system 2600 (e.g., using any of a variety of generally available compilers, installation programs, compression/decompression utilities, etc.) then takes the form of executable code.

The term "about" and the term "substantially" shall mean plus or minus 5% or 10% or within manufacturing tolerances.

As used in this document, the conjunction "or" is inclusive.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions may be presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art.

What is claimed is:

1. A method for wafer biasing in a plasma chamber, the method comprising:
    generating a first high voltage pulse with a voltage greater than 1 kV by a first pulsed voltage source using DC voltages;
    generating a second high voltage pulse with a voltage greater than 1 kV by a second pulsed voltage source; and
    coupling the first high voltage pulse and the second high voltage pulse to an output;
    wherein either or both the first pulsed voltage source and the second pulsed voltage source have a stray inductance of about 100 nH to about 10 µH.

2. The method of claim 1, wherein either or both the first pulse and the second pulse comprises a bipolar pulse.

3. The method of claim 1, wherein either or both the first pulse and the second pulse comprises a polarized pulse.

4. The method of claim 1, wherein either or both the first pulse and the second pulse comprises a square pulse.

5. The method of claim 1, wherein the first pulsed voltage source and/or the second pulsed voltage source comprise a plurality of switches arranged in an H bridge configuration.

6. The method of claim 5, wherein the first pulsed voltage source and/or the second pulsed voltage source include a rectifier.

7. The method of claim 6, wherein the first pulsed voltage source and/or the second pulsed voltage source include a transformer.

8. The method of claim 1, wherein either or both the first high voltage pulse and/or the second high voltage pulse comprises a bipolar pulse.

9. The method of claim 1, wherein either or both the first high voltage pulse and the second high voltage pulse has a rise time of about 1-200 ns.

10. The method of claim 1, wherein either or both the first pulsed voltage source and the second pulsed voltage source have a stray capacitance of about 100 pF to about 10 nF.

11. The method of claim 1, further comprising: pulsing either or both the first high voltage pulser and or the second high voltage pulser with a duty cycle of about 50%.

12. The method of claim 1, further comprising: pulsing either or both the first high voltage pulser and or the second high voltage pulser with a duty cycle of about 100%.

13. The method of claim 1, further comprising: generating a first pre-pulse with the first pulsed voltage source.

14. The method of claim 1, further comprising: generating a second pre-pulse with the second pulsed voltage source.

* * * * *